US009641179B2

(12) United States Patent
Masuoka et al.

(10) Patent No.: US 9,641,179 B2
(45) Date of Patent: May 2, 2017

(54) SEMICONDUCTOR DEVICE

(71) Applicant: Unisantis Electronics Singapore Pte. Ltd., Singapore (SG)

(72) Inventors: Fujio Masuoka, Toyko (JP); Masamichi Asano, Musashino (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/214,880

(22) Filed: Jul. 20, 2016

(65) Prior Publication Data

US 2016/0329898 A1 Nov. 10, 2016

Related U.S. Application Data

(63) Continuation of application No. PCT/JP2014/060361, filed on Apr. 10, 2014.

(51) Int. Cl.
*H03K 19/09* (2006.01)
*H01L 27/02* (2006.01)
(Continued)

(52) U.S. Cl.
CPC . *H03K 19/0948* (2013.01); *H01L 21/823885* (2013.01); *H01L 27/0207* (2013.01);
(Continued)

(58) Field of Classification Search
CPC ....... G11C 8/10; G11C 16/0483; G11C 16/08; H03M 13/1105; H03M 13/1111;
(Continued)

(56) References Cited

U.S. PATENT DOCUMENTS 5,416,350 A 5/1995 Watanabe
5,742,187 A * 4/1998 Pascucci ................ H03M 7/22 326/106

(Continued)

FOREIGN PATENT DOCUMENTS

JP 06-268173 A 9/1994
JP 2007-179652 A 7/2007

(Continued)

OTHER PUBLICATIONS

Yoshizawa, H., "CMOS OP AMP Kairo Jitsumu Sekkei No Kiso", *CMOS OP Amplifier Circuit, Basis of Practical Design*, CQ Publishing Co., Ltd., May 15, 2007, 8 pages. (English language translation included).

(Continued)

*Primary Examiner* — Vibol Tan
(74) *Attorney, Agent, or Firm* — Brinks Gilson & Lione

(57) ABSTRACT

A semiconductor device includes a 3-input NOR decoder having six MOS transistors arranged in a line. The MOS transistors of the decoder are formed in a planar silicon layer disposed on a substrate and each have a structure in which a drain, a gate, and a source are arranged vertically and the gate surrounds a silicon pillar. The planar silicon layer includes a first active region having a first conductivity type and a second active region having a second conductivity type. The first and second active regions are connected to each other via a silicon layer on a surface of the planar silicon layer.

28 Claims, 80 Drawing Sheets

101 (3-INPUT NOR DECODER)

101 (3-INPUT NOR DECODER)

(51) Int. Cl.

| | |
|---|---|
| ***H03K 19/0948*** | (2006.01) |
| ***H03K 19/0944*** | (2006.01) |
| ***H01L 21/8238*** | (2006.01) |
| ***H01L 29/786*** | (2006.01) |
| ***H03K 19/20*** | (2006.01) |

(52) U.S. Cl.
CPC ... *H01L 29/78642* (2013.01); *H03K 19/0944* (2013.01); *H03K 19/20* (2013.01)

(58) Field of Classification Search
CPC ......... H03M 13/1128; H03M 13/1145; H03M 13/37; H03M 13/43; H01L 27/11803; H03K 3/356017; H03K 19/0944; H03K 19/20; H03K 19/0948; H03K 19/0963; H03K 19/215; H04J 3/047
See application file for complete search history.

(56) References Cited

U.S. PATENT DOCUMENTS 5,804,989 A * 9/1998 Sato ................ H03K 19/01742 326/108
8,319,288 B2 * 11/2012 Masuoka ........ H01L 21/823821 257/369
9,117,528 B2 * 8/2015 Masuoka ............... G11C 16/08
2007/0147163 A1 6/2007 Murata et al.
2011/0260259 A1 10/2011 Masuoka et al.
2016/0329348 A1 * 11/2016 Masuoka ................ H01L 29/78

FOREIGN PATENT DOCUMENTS

| | | | |
|---|---|---|---|
| JP | 4756221 | B | 8/2011 |
| JP | 2011-228519 | A | 11/2011 |
| JP | 5031809 | B | 9/2012 |
| JP | 5130596 | B | 1/2013 |
| WO | WO 2009/096464 | A1 | 8/2009 |
| WO | WO 2009/096465 | A1 | 8/2009 |
| WO | WO 2011/043402 | A1 | 4/2011 |

OTHER PUBLICATIONS

International Search Report, and English language translation thereof, in corresponding International Application No. PCT/JP2014/060361, dated May 20, 2014, 9 pages.
English language translation of International Preliminary Report on Patentability in corresponding International Application No. PCT/JP2014/030361, dated Oct. 20, 2016, 7 pages.

* cited by examiner

8-DECODER CONFIGURATION WITH ADDRESS SIGNAL LINES A1 TO A6

FIG. 8

ADDRESS MAP FOR ADDRESS SIGNAL LINES A1 TO A6

| | A1 | A2 | A3 | A4 | A5 | A6 |
|---|---|---|---|---|---|---|
| DEC1 / SEL1 | ○ | - | ○ | - | ○ | - |
| DEC2 / SEL2 | - | ○ | ○ | - | ○ | - |
| DEC3 / SEL3 | ○ | - | - | ○ | ○ | - |
| DEC4 / SEL4 | - | ○ | - | ○ | ○ | - |
| DEC5 / SEL5 | ○ | - | ○ | - | - | ○ |
| DEC6 / SEL6 | - | ○ | ○ | - | - | ○ |
| DEC7 / SEL7 | ○ | - | - | ○ | - | ○ |
| DEC8 / SEL8 | - | ○ | - | ○ | - | ○ |

○ : Contact

BLOCKS 100-1 TO 100-4 AMONG 8 BLOCKS

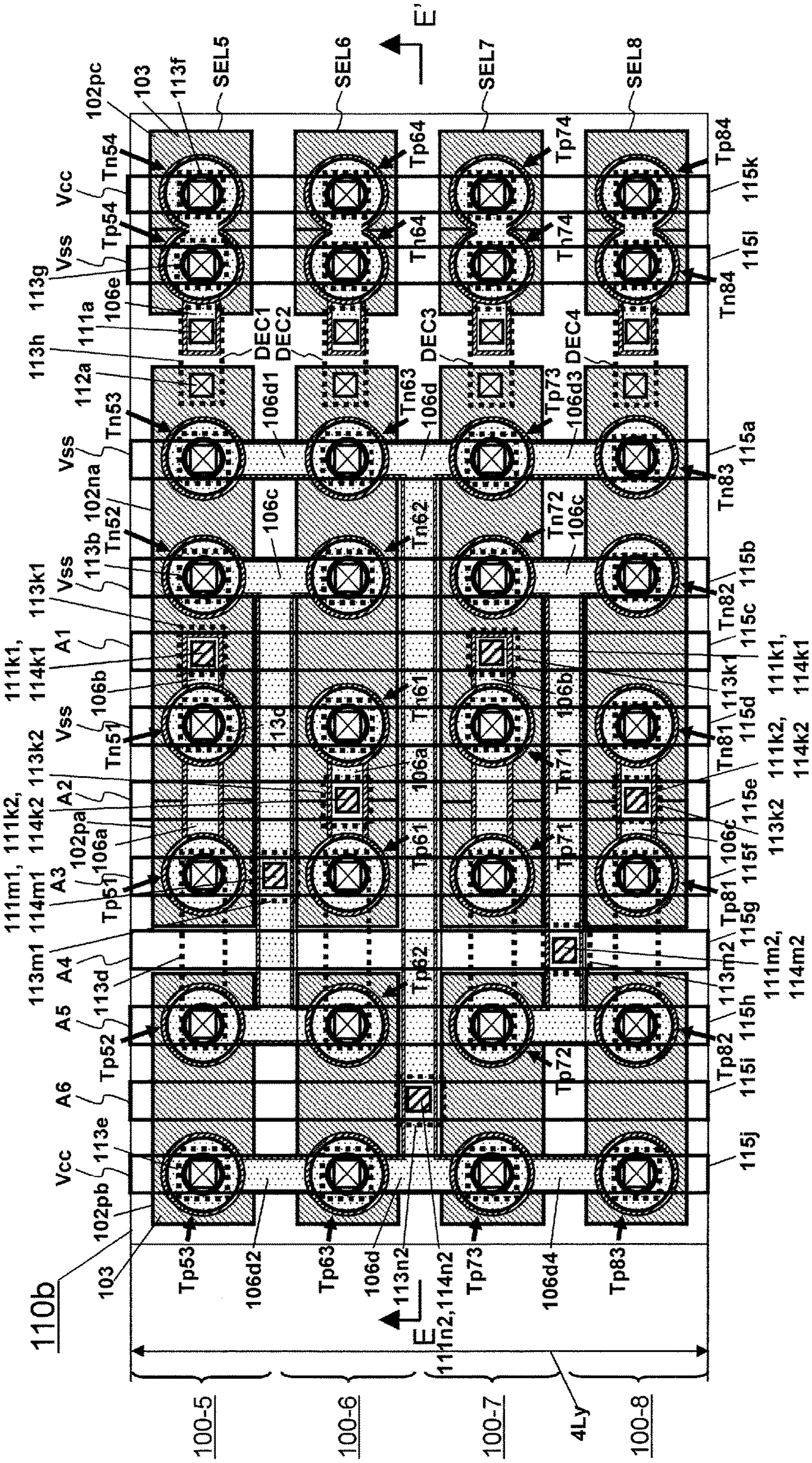
FIG. 9B BLOCKS 100-5 TO 100-8 AMONG 8 BLOCKS

BLOCKS 100-1 TO 100-4 AMONG 8 BLOCKS

BLOCKS 100-5 TO 100-8 AMONG 8 BLOCKS 201 (3-INPUT NOR DECODER)

FIG. 18A

ADDRESS MAP FOR ADDRESS SIGNAL LINES A1 TO A12

| | | A1 | A2 | A3 | A4 | A5 | A6 | A7 | A8 | A9 | A10 | A11 | A12 |
|---|---|---|---|---|---|---|---|---|---|---|---|---|---|
| DECODER 200-1 | DEC1 / SEL1 | ○ | - | - | - | ○ | - | - | - | ○ | - | - | - |
| DECODER 200-2 | DEC2 / SEL2 | - | ○ | - | - | ○ | - | - | - | ○ | - | - | - |
| DECODER 200-3 | DEC3 / SEL3 | - | - | ○ | - | ○ | - | - | - | ○ | - | - | - |
| DECODER 200-4 | DEC4 / SEL4 | - | - | - | ○ | ○ | - | - | - | ○ | - | - | - |
| DECODER 200-5 | DEC5 / SEL5 | ○ | - | - | - | - | ○ | - | - | ○ | - | - | - |
| DECODER 200-6 | DEC6 / SEL6 | - | ○ | - | - | - | ○ | - | - | ○ | - | - | - |
| DECODER 200-7 | DEC7 / SEL7 | - | - | ○ | - | - | ○ | - | - | ○ | - | - | - |
| DECODER 200-8 | DEC8 / SEL8 | - | - | - | ○ | - | ○ | - | - | ○ | - | - | - |
| DECODER 200-9 | DEC9 / SEL9 | ○ | - | - | - | - | - | ○ | - | ○ | - | - | - |
| DECODER 200-10 | DEC10 / SEL10 | - | ○ | - | - | - | - | ○ | - | ○ | - | - | - |
| DECODER 200-11 | DEC11 / SEL11 | - | - | ○ | - | - | - | ○ | - | ○ | - | - | - |
| DECODER 200-12 | DEC12 / SEL12 | - | - | - | ○ | - | - | ○ | - | ○ | - | - | - |
| DECODER 200-13 | DEC13 / SEL13 | ○ | - | - | - | - | - | - | ○ | ○ | - | - | - |
| DECODER 200-14 | DEC14 / SEL14 | - | ○ | - | - | - | - | - | ○ | ○ | - | - | - |
| DECODER 200-15 | DEC15 / SEL15 | - | - | ○ | - | - | - | - | ○ | ○ | - | - | - |
| DECODER 200-16 | DEC16 / SEL16 | - | - | - | ○ | - | - | - | ○ | ○ | - | - | - |
| DECODER 200-17 | DEC17 / SEL17 | ○ | - | - | - | ○ | - | - | - | - | ○ | - | - |
| DECODER 200-18 | DEC18 / SEL18 | - | ○ | - | - | ○ | - | - | - | - | ○ | - | - |
| DECODER 200-19 | DEC19 / SEL19 | - | - | ○ | - | ○ | - | - | - | - | ○ | - | - |
| DECODER 200-20 | DEC20 / SEL20 | - | - | - | ○ | ○ | - | - | - | - | ○ | - | - |
| DECODER 200-21 | DEC21 / SEL21 | ○ | - | - | - | - | ○ | - | - | - | ○ | - | - |
| DECODER 200-22 | DEC22 / SEL22 | - | ○ | - | - | - | ○ | - | - | - | ○ | - | - |
| DECODER 200-23 | DEC23 / SEL23 | - | - | ○ | - | - | ○ | - | - | - | ○ | - | - |
| DECODER 200-24 | DEC24 / SEL24 | - | - | - | ○ | - | ○ | - | - | - | ○ | - | - |
| DECODER 200-25 | DEC25 / SEL25 | ○ | - | - | - | - | - | ○ | - | - | ○ | - | - |
| DECODER 200-26 | DEC26 / SEL26 | - | ○ | - | - | - | - | ○ | - | - | ○ | - | - |
| DECODER 200-27 | DEC27 / SEL27 | - | - | ○ | - | - | - | ○ | - | - | ○ | - | - |
| DECODER 200-28 | DEC28 / SEL28 | - | - | - | ○ | - | - | ○ | - | - | ○ | - | - |
| DECODER 200-29 | DEC29 / SEL29 | ○ | - | - | - | - | - | - | ○ | - | ○ | - | - |
| DECODER 200-30 | DEC30 / SEL30 | - | ○ | - | - | - | - | - | ○ | - | ○ | - | - |
| DECODER 200-31 | DEC31 / SEL31 | - | - | ○ | - | - | - | - | ○ | - | ○ | - | - |
| DECODER 200-32 | DEC32 / SEL32 | - | - | - | ○ | - | - | - | ○ | - | ○ | - | - |

○ : Contact

FIG. 18B ADDRESS MAP FOR ADDRESS SIGNAL LINES A1 TO A12

| | | A1 | A2 | A3 | A4 | A5 | A6 | A7 | A8 | A9 | A10 | A11 | A12 |
|---|---|---|---|---|---|---|---|---|---|---|---|---|---|
| DECODER 200-33 | DEC33 / SEL33 | O | - | - | - | O | - | - | - | - | - | O | - |
| DECODER 200-34 | DEC34 / SEL34 | - | O | - | - | O | - | - | - | - | - | O | - |
| DECODER 200-35 | DEC35 / SEL35 | - | - | O | - | O | - | - | - | - | - | O | - |
| DECODER 200-36 | DEC36 / SEL36 | - | - | - | O | O | - | - | - | - | - | O | - |
| DECODER 200-37 | DEC37 / SEL37 | O | - | - | - | - | O | - | - | - | - | O | - |
| DECODER 200-38 | DEC38 / SEL38 | - | O | - | - | - | O | - | - | - | - | O | - |
| DECODER 200-39 | DEC39 / SEL39 | - | - | O | - | - | O | - | - | - | - | O | - |
| DECODER 200-40 | DEC40 / SEL40 | - | - | - | O | - | O | - | - | - | - | O | - |
| DECODER 200-41 | DEC41 / SEL41 | O | - | - | - | - | - | O | - | - | - | O | - |
| DECODER 200-42 | DEC42 / SEL42 | - | O | - | - | - | - | O | - | - | - | O | - |
| DECODER 200-43 | DEC43 / SEL43 | - | - | O | - | - | - | O | - | - | - | O | - |
| DECODER 200-44 | DEC44 / SEL44 | - | - | - | O | - | - | O | - | - | - | O | - |
| DECODER 200-45 | DEC45 / SEL45 | O | - | - | - | - | - | - | O | - | - | O | - |
| DECODER 200-46 | DEC46 / SEL46 | - | O | - | - | - | - | - | O | - | - | O | - |
| DECODER 200-47 | DEC47 / SEL47 | - | - | O | - | - | - | - | O | - | - | O | - |
| DECODER 200-48 | DEC48 / SEL48 | - | - | - | O | - | - | - | O | - | - | O | - |
| DECODER 200-49 | DEC49 / SEL49 | O | - | - | - | O | - | - | - | - | - | - | O |
| DECODER 200-50 | DEC50 / SEL50 | - | O | - | - | O | - | - | - | - | - | - | O |
| DECODER 200-51 | DEC51 / SEL51 | - | - | O | - | O | - | - | - | - | - | - | O |
| DECODER 200-52 | DEC52 / SEL52 | - | - | - | O | O | - | - | - | - | - | - | O |
| DECODER 200-53 | DEC53 / SEL53 | O | - | - | - | - | O | - | - | - | - | - | O |
| DECODER 200-54 | DEC54 / SEL54 | - | O | - | - | - | O | - | - | - | - | - | O |
| DECODER 200-55 | DEC55 / SEL55 | - | - | O | - | - | O | - | - | - | - | - | O |
| DECODER 200-56 | DEC56 / SEL56 | - | - | - | O | - | O | - | - | - | - | - | O |
| DECODER 200-57 | DEC57 / SEL57 | O | - | - | - | - | - | O | - | - | - | - | O |
| DECODER 200-58 | DEC58 / SEL58 | - | O | - | - | - | - | O | - | - | - | - | O |
| DECODER 200-59 | DEC59 / SEL59 | - | - | O | - | - | - | O | - | - | - | - | O |
| DECODER 200-60 | DEC60 / SEL60 | - | - | - | O | - | - | O | - | - | - | - | O |
| DECODER 200-61 | DEC61 / SEL61 | O | - | - | - | - | - | - | O | - | - | - | O |
| DECODER 200-62 | DEC62 / SEL62 | - | O | - | - | - | - | - | O | - | - | - | O |
| DECODER 200-63 | DEC63 / SEL63 | - | - | O | - | - | - | - | O | - | - | - | O |
| DECODER 200-64 | DEC64 / SEL64 | - | - | - | O | - | - | - | O | - | - | - | O |

O : Contact

210b

210d

SUPPLY PATHS OF ADDRESS SIGNAL LINES

SEMICONDUCTOR DEVICE

RELATED APPLICATIONS

The present application is a continuation of International Application No. PCT/JP2014/060361, with an international filing date of Apr. 10, 2014, the entire contents of which are incorporated herein by reference.

BACKGROUND OF THE INVENTION

1. Field of the Invention

The present invention relates to a semiconductor device.

2. Description of the Related Art

With the recent increase in the integration of semiconductor integrated circuits, semiconductor chips having as large a number of transistors as 1,000,000,000 (1 Giga (G)), have been developed for state-of-the-art micro-processing units (MPUs). As disclosed by Hirokazu YOSHIZAWA in "Shi mosu opi anpu kairo jitsumu sekkei no kiso (Fundamentals on CMOS OP amp circuit design for practical use)", CQ Publishing Co., Ltd., Aug. 1, 2007, p. 23, traditional transistors formed in a planar manner, called planar transistors, require complete isolation of an n-well region that forms a p-channel metal-oxide semiconductor (PMOS) and a p-type silicon substrate (or p-well region) that forms an n-channel metal-oxide semiconductor (NMOS) from each other. In addition, the n-well region and the p-type silicon substrate require body terminals for applying potentials thereto, which will contribute to a further increase in the area of the transistors.

To address the issues described above, a surrounding gate transistor (SGT) having a structure in which a source, a gate, and a drain are arranged in a direction perpendicular to a substrate and in which the gate surrounds an island-shaped semiconductor layer has been proposed, and a method for manufacturing an SGT and a complementary metal-oxide semiconductor (CMOS) inverter, a NAND circuit, or a static random access memory (SRAM) cell which employs SGTs are disclosed (see, for example, Japanese Patent No. 5130596, Japanese Patent No. 5031809, Japanese Patent No. 4756221, and International Publication No. WO2009/096465).

FIGS. 21, 22, and 23 illustrate a circuit diagram and layout diagrams of an inverter that employs SGTs.

FIG. 21 is a circuit diagram of the inverter. The symbol Qp denotes a p-channel MOS transistor (hereinafter referred to as a "PMOS transistor"), the symbol Qn denotes an n-channel MOS transistor (hereinafter referred to as an "NMOS transistor"), the symbol IN denotes an input signal, the symbol OUT denotes an output signal, the symbol Vcc denotes a power supply, and the symbol Vss denotes a reference power supply.

FIG. 22 illustrates a plan view of the layout of the inverter illustrated in FIG. 21, which is formed by SGTs. FIG. 23 illustrates a cross-sectional view taken along the cut-line A-A' in the plan view of FIG. 22.

In FIGS. 22 and 23, planar silicon layers 2*p* and 2*n* are formed on top of an insulating film such as a buried oxide (BOX) film layer 1 disposed on a substrate. The planar silicon layers 2*p* and 2*n* are formed as a p+ diffusion layer and an n+ diffusion layer, respectively, through impurity implantation or the like. Reference numeral 3 denotes a silicide layer disposed on surfaces of the planar silicon layers (2*p* and 2*n*). The silicide layer 3 connects the planar silicon layers 2*p* and 2*n* to each other. Reference numeral 4*n* denotes an n-type silicon pillar, and reference numeral 4*p* denotes a p-type silicon pillar. Reference numeral 5 denotes a gate insulating film that surrounds the silicon pillars 4*n* and 4*p*. Reference numeral 6 denotes a gate electrode, and reference numeral 6*a* denotes a gate line. A p+ diffusion layer 7*p* and an n+ diffusion layer 7*n* are formed in top portions of the silicon pillars 4*n* and 4*p*, respectively, through impurity implantation or the like. Reference numeral 8 denotes a silicon nitride film for protecting the gate insulating film 5 and the like, and reference numerals 9*p* and 9*n* denote silicide layers for connection to the p+ diffusion layer 7*p* and the n+ diffusion layer 7*n*, respectively. Reference numerals 10*p* and 10*n* denote contacts that respectively connect the silicide layers 9*p* and 9*n* to metal lines 13*a* and 13*b*. Reference numeral 11 denotes a contact that connects the gate line 6*a* to a metal line 13*c*.

The silicon pillar 4*n*, the diffusion layer 2*p*, the diffusion layer 7*p*, the gate insulating film 5, and the gate electrode 6 constitute the PMOS transistor Qp. The silicon pillar 4*p*, the diffusion layer 2*n*, the diffusion layer 7*n*, the gate insulating film 5, and the gate electrode 6 constitute the NMOS transistor Qn. The diffusion layers 7*p* and 7*n* serve as sources, and the diffusion layers 2*p* and 2*n* serve as drains. The power supply Vcc is supplied to the metal line 13*a*, and the reference power supply Vss is supplied to the metal line 13*b*. The input signal IN is connected to the metal line 13*c*. The output signal OUT is output from the silicide layer 3, which connects the drain of the PMOS transistor Qp, or the diffusion layer 2*p*, to the drain of the NMOS transistor Qn, or the diffusion layer 2*n*.

In the inverter illustrated in FIGS. 21, 22, and 23, which employs SGTs, the PMOS transistor and the NMOS transistor are structurally isolated completely from each other. This configuration eliminates the need for isolation of wells, unlike planar transistors. In addition, the silicon pillars act as floating bodies. This configuration eliminates the need for any body terminals for supplying potentials to the wells unlike planar transistors. The layout (arrangement) of the inverter is thus compact.

SUMMARY OF THE INVENTION

The present invention provides a semiconductor device that takes advantage of the features of SGTs described above and that includes a decoder with a minimum area, in which a NOR decoder that adopts a 3-input NOR circuit and an inverter are arranged in a line.

(1) To this end, according to an aspect of the present invention, a semiconductor device includes a NOR decoder. The NOR decoder includes six transistors, each having a source, a drain, and a gate arranged in a layered manner in a direction perpendicular to a substrate, the six transistors being arranged on the substrate in a line in a first direction. Each of the six transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The six transistors includes a first n-channel MOS transistor, a second n-channel MOS transistor, a third n-channel MOS transistor, a first p-channel MOS transistor, a second p-channel MOS transistor, and a third p-channel MOS transistor. The gate of the first n-channel MOS transistor and the gate of the first p-channel MOS transistor are connected to each other. The gate of the second n-channel MOS transistor and the gate of the second p-channel MOS transistor are connected to each other. The gate of the third n-channel MOS transistor and the gate of the third p-channel MOS transistor are connected to each other. The drain regions of the first n-channel MOS transistor, the second n-channel MOS transistor, the third n-channel MOS transistor, and the first p-channel MOS transistor are located closer to the substrate than the silicon pillars of the first n-channel MOS transistor, the second n-channel MOS transistor, the third n-channel MOS transistor, and the first p-channel MOS transistor, respectively, and are connected to one another via silicide regions to form an output terminal. The source region of the second p-channel MOS transistor and the drain region of the third p-channel MOS transistor are located closer to the substrate than the silicon pillars of the second p-channel MOS transistor and the third p-channel MOS transistor. The source region of the first p-channel MOS transistor is connected to the drain region of the second p-channel MOS transistor via a contact. The source region of the second p-channel MOS transistor is connected to the drain region of the third p-channel MOS transistor via a lower diffusion layer and a silicide layer. The source regions of the first n-channel MOS transistor, the second n-channel MOS transistor, and the third n-channel MOS transistor are connected to a reference power supply line via contacts. The source region of the third p-channel MOS transistor is connected to a power supply line via a contact. The decoder further includes a first address signal line, a second address signal line, and a third address signal line. The gate of the first n-channel MOS transistor and the gate of the first p-channel MOS transistor, which are connected to each other, are connected to the first address signal line. The gate of the second n-channel MOS transistor and the gate of the second p-channel MOS transistor, which are connected to each other, are connected to the second address signal line. The gate of the third n-channel MOS transistor and the gate of the third p-channel MOS transistor, which are connected to each other, are connected to the third address signal line. The power supply line, the reference power supply line, the first address signal line, the second address signal line, and the third address signal line are arranged to extend in a second direction perpendicular to the first direction.

(2) The six transistors may be arranged in a line in an order of the third n-channel MOS transistor, the second n-channel MOS transistor, the first re-channel MOS transistor, the first p-channel MOS transistor, the second p-channel MOS transistor, and the third p-channel MOS transistor.

(3) At least the gates of the first n-channel MOS transistor and the first p-channel MOS transistor, the gates of the second n-channel MOS transistor and the second p-channel MOS transistor, or the gates of the third n-channel MOS transistor and the third p-channel MOS transistor may be connected to the corresponding one of the first to third address signal lines, each of which is formed of a line of a second metal wiring layer arranged to extend in the second direction, at least via a line of a first metal wiring layer arranged to extend in the first direction.

(4) According to another aspect of the present invention, a semiconductor device includes a first address signal lines, the number of which is equal to a, b second address signal lines, the number of which is equal to b, c third address signal lines, the number of which is equal to c, and a×b×c NOR decoders, the number of which is given by a×b×c. Each of the a×b×c NOR decoders includes six transistors, each having a source, a drain, and a gate arranged in a layered manner in a direction perpendicular to a substrate, the six transistors being arranged on the substrate in a line in a first direction. Each of the six transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located, the six transistors at least includes a first n-channel MOS transistor, a second n-channel MOS transistor, a third n-channel MOS transistor, a first p-channel MOS transistor, a second p-channel MOS transistor, and a third p-channel MOS transistor, the gate of the first n-channel MOS transistor and the gate of the first p-channel MOS transistor are connected to each other. The gate of the second n-channel MOS transistor and the gate of the second p-channel MOS transistor are connected to each other. The gate of the third n-channel MOS transistor and the gate of the third p-channel MOS transistor are connected to each other. The drain regions of the first n-channel MOS transistor, the second n-channel MOS transistor, the third n-channel MOS transistor, and the first p-channel MOS transistor are located closer to the substrate than the silicon pillars of the first n-channel MOS transistor, the second n-channel MOS transistor, the third n-channel MOS transistor, and the first p-channel MOS transistor, respectively, and are connected to one another via silicide regions to form an output terminal. The source region of the second p-channel MOS transistor and the drain region of the third p-channel MOS transistor are located closer to the substrate than the silicon pillars of the second p-channel MOS transistor and the third p-channel MOS transistor. The source region of the first p-channel MOS transistor is connected to the drain region of the second p-channel MOS transistor via a contact. The source region of the second p-channel MOS transistor is connected to the drain region of the third p-channel MOS transistor via a lower diffusion layer and a silicide layer. The source regions of the first n-channel MOS transistor, the second n-channel MOS transistor, and the third n-channel MOS transistor are connected to a reference power supply line via contacts. The source region of the third p-channel MOS transistor is connected to a power supply line via a contact. Each of the a×b×c NOR decoders is configured such that the gate of the first n-channel MOS transistor and the gate of the first p-channel MOS transistor, which are connected to each other, are connected to any one of the a first address signal lines, the gate of the second n-channel MOS transistor and the gate of the second p-channel MOS transistor, which are connected to each other, are connected to any one of the b second address signal lines, and the gate of the third n-channel MOS transistor and the gate of the third p-channel MOS transistor, which are connected to each other, are connected to any one of the c third address signal lines. The power supply line, the reference power supply line, the a first address signal lines, the b second address signal lines, and the c third address signal lines are arranged to extend in a second direction perpendicular to the first direction.

(5) The six transistors may be arranged in a line in an order of the third n-channel MOS transistor, the second n-channel MOS transistor, the first n-channel MOS transistor, the first p-channel MOS transistor, the second p-channel MOS transistor, and the third p-channel MOS transistor.

(6) In each of the a×b×c NOR decoders, at least the gates of the first n-channel MOS transistor and the first p-channel MOS transistor, the gates of the second n-channel MOS transistor and the second p-channel MOS transistor, or the gates of the third n-channel MOS transistor and the third p-channel MOS transistor may be connected to the corresponding one of the first to third address signal lines, each of which is formed of a line of a second metal wiring layer arranged to extend in the second direction, at least via a line of a first metal wiring layer arranged to extend in the first direction.

(7) According to still another aspect of the present invention, a semiconductor device includes a NOR decoder. The NOR decoder includes six transistors, each having a source, a drain, and a gate arranged in a layered manner in a direction perpendicular to a substrate, the six transistors being arranged on the substrate in a line in a first direction. Each of the six transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The six transistors includes a first n-channel MOS transistor, a second n-channel MOS transistor, a third n-channel MOS transistor, a first p-channel MOS transistor, a second p-channel MOS transistor, and a third p-channel MOS transistor. The gate of the first n-channel MOS transistor and the gate of the first p-channel MOS transistor are connected to each other. The gate of the second n-channel MOS transistor and the gate of the second p-channel MOS transistor are connected to each other. The gate of the third n-channel MOS transistor and the gate of the third p-channel MOS transistor are connected to each other. The source regions of the first n-channel MOS transistor, the second n-channel MOS transistor, the third n-channel MOS transistor, and the first p-channel MOS transistor are located closer to the substrate than the silicon pillars of the first n-channel MOS transistor, the second n-channel MOS transistor, the third n-channel MOS transistor, and the first p-channel MOS transistor. The drain region of the second p-channel MOS transistor and the source region of the third p-channel MOS transistor are located closer to the substrate than the silicon pillars of the second p-channel MOS transistor and the third p-channel MOS transistor. The drain regions of the first n-channel MOS transistor, the second n-channel MOS transistor, the third n-channel MOS transistor, and the first p-channel MOS transistor are connected to one another via contacts to form an output terminal. The source regions of the first n-channel MOS transistor, the second n-channel MOS transistor, and the third n-channel MOS transistor are connected to a reference power supply line via lower diffusion layers and silicide regions. The source region of the first p-channel MOS transistor is connected to the drain region of the second p-channel MOS transistor via a lower diffusion layer and a silicide region. The source region of the second p-channel MOS transistor is connected to the drain region of the third p-channel MOS transistor via a contact. The source region of the third p-channel MOS transistor is connected to a power supply line via a lower diffusion layer and a silicide region. The NOR decoder further includes a first address signal line, a second address signal line, and a third address signal line. The gate of the first n-channel MOS transistor and the gate of the first p-channel MOS transistor, which are connected to each other, are connected to the first address signal line. The gate of the second n-channel MOS transistor and the gate of the second p-channel MOS transistor, which are connected to each other, are connected to the second address signal line. The gate of the third n-channel MOS transistor and the gate of the third p-channel MOS transistor, which are connected to each other, are connected to the third address signal line. The power supply line, the reference power supply line, the first address signal line, the second address signal line, and the third address signal line are arranged to extend in a second direction perpendicular to the first direction.

(8) The six transistors may be arranged in a line in an order of the third n-channel MOS transistor, the second n-channel MOS transistor, the first re-channel MOS transistor, the first p-channel MOS transistor, the second p-channel MOS transistor, and the third p-channel MOS transistor.

(9) At least the gates of the first n-channel MOS transistor and the first p-channel MOS transistor, the gates of the second n-channel MOS transistor and the second p-channel MOS transistor, or the gates of the third n-channel MOS transistor and the third p-channel MOS transistor may be connected to the corresponding one of the first to third address signal lines, each of which is formed of a line of a second metal wiring layer arranged to extend in the second direction, at least via a line of a first metal wiring layer arranged to extend in the first direction.

(10) According to still another aspect of the present invention, a semiconductor device includes a first address signal lines, the number of which is equal to a, b second address signal lines, the number of which is equal to b, c third address signal lines, the number of which is equal to c, and a×b×c NOR decoders, the number of which is given by a×b×c. Each of the a×b×c NOR decoders includes six transistors, each having a source, a drain, and a gate arranged in a layered manner in a direction perpendicular to a substrate, the six transistors being arranged on the substrate in a line in a first direction. Each of the six transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The six transistors at least includes a first re-channel MOS transistor, a second n-channel MOS transistor, a third n-channel MOS transistor, a first p-channel MOS transistor, a second p-channel MOS transistor, and a third p-channel MOS transistor, the gate of the first n-channel MOS transistor and the gate of the first p-channel MOS transistor are connected to each other. The gate of the second n-channel MOS transistor and the gate of the second p-channel MOS transistor are connected to each other. The gate of the third n-channel MOS transistor and the gate of the third p-channel MOS transistor are connected to each other. The source regions of the first n-channel MOS transistor, the second n-channel MOS transistor, the third n-channel MOS transistor, and the first p-channel MOS transistor are located closer to the substrate than the silicon pillars of the first n-channel MOS transistor, the second n-channel MOS transistor, the third n-channel MOS transistor, and the first p-channel MOS transistor. The drain region of the second p-channel MOS transistor and the source region of the third p-channel MOS transistor are located closer to the substrate than the silicon pillars of the second p-channel MOS transistor and the third p-channel MOS transistor. The drain regions of the first n-channel MOS transistor, the second n-channel MOS transistor, the third n-channel MOS transistor, and the first p-channel MOS transistor are connected to one another via contacts to form an output terminal. The source regions of the first n-channel MOS transistor, the second n-channel MOS transistor, and the third n-channel MOS transistor are connected to a reference power supply line via lower diffusion layers and silicide layers. The source region of the first p-channel MOS transistor is connected to the drain region of the second p-channel MOS transistor via a lower diffusion layer and a silicide layer. The source region of the second p-channel MOS transistor is connected to the drain region of the third p-channel MOS transistor via a contact. The source region of the third p-channel MOS transistor is connected to a power supply line via a lower diffusion layer and a silicide layer. Each of the a×b×c NOR decoders is configured such that the gate of the first n-channel MOS transistor and the gate of the first p-channel MOS transistor, which are connected to each other, are connected to any one of the a first address signal lines, the gate of the second n-channel MOS transistor and the gate of the second p-channel MOS transistor, which are connected to each other, are connected to any one of the b second address signal lines, and the gate of the third n-channel MOS transistor and the gate of the third p-channel MOS transistor, which are connected to each other, are connected to any one of the c third address signal lines. The power supply line, the reference power supply line, the a first address signal lines, the b second address signal lines, and the c third address signal lines are arranged to extend in a second direction perpendicular to the first direction.

(11) The six transistors may be arranged in a line in an order of the third n-channel MOS transistor, the second n-channel MOS transistor, the first n-channel MOS transistor, the first p-channel MOS transistor, the second p-channel MOS transistor, and the third p-channel MOS transistor.

(12) The source regions of the first n-channel MOS transistors, the second n-channel MOS transistors, and the third n-channel MOS transistors in the a×b×c NOR decoders may be connected in common via a silicide layer.

(13) In each of the a×b×c NOR decoders, at least the gates of the first n-channel MOS transistor and the first p-channel MOS transistor, the gates of the second n-channel MOS transistor and the second p-channel MOS transistor, or the gates of the third n-channel MOS transistor and the third p-channel MOS transistor may be connected to the corresponding one of the first to third address signal lines, each of which is formed of a line of a second metal wiring layer arranged to extend in the second direction, at least via a line of a first metal wiring layer arranged to extend in the first direction.

(14) According to still another aspect of the present invention, a semiconductor device includes a NOR decoder and an inverter. The NOR decoder and the inverter include eight transistors, each having a source, a drain, and a gate arranged in a layered manner in a direction perpendicular to a substrate, the eight transistors being arranged on the substrate in a line in a first direction. Each of the eight transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The eight transistors include a first p-channel MOS transistor, a second p-channel MOS transistor, a third p-channel MOS transistor, a fourth p-channel MOS transistor, a first n-channel MOS transistor, a second n-channel MOS transistor, a third n-channel MOS transistor, and a fourth n-channel MOS transistor. The NOR decoder includes the first re-channel MOS transistor, the second n-channel MOS transistor, the third n-channel MOS transistor, the first p-channel MOS transistor, the second p-channel MOS transistor, and the third p-channel MOS transistor. The inverter includes the fourth n-channel MOS transistor and the fourth p-channel MOS transistor. The gate of the first n-channel MOS transistor and the gate of the first p-channel MOS transistor are connected to each other. The gate of the second n-channel MOS transistor and the gate of the second p-channel MOS transistor are connected to each other. The gate of the third n-channel MOS transistor and the gate of the third p-channel MOS transistor are connected to each other. The drain regions of the first n-channel MOS transistor, the second n-channel MOS transistor, the third n-channel MOS transistor, and the first p-channel MOS transistor are located closer to the substrate than the silicon pillars of the first n-channel MOS transistor, the second n-channel MOS transistor, the third n-channel MOS transistor, and the first p-channel MOS transistor, respectively, and are connected to one another via silicide layers to form a first output terminal. The source region of the second p-channel MOS transistor and the drain region of the third p-channel MOS transistor are located closer to the substrate than the silicon pillars of the second p-channel MOS transistor and the third p-channel MOS transistor. The source regions of the first n-channel MOS transistor, the second n-channel MOS transistor, and the third n-channel MOS transistor are connected to a reference power supply line via contacts. The source region of the first p-channel MOS transistor is connected to the drain region of the second p-channel MOS transistor via a contact. The source region of the second p-channel MOS transistor is connected to the drain region of the third p-channel MOS transistor via a silicide layer. The source region of the third p-channel MOS transistor is connected to a power supply line via a contact. The gate of the fourth n-channel MOS transistor and the gate of the fourth p-channel MOS transistor are connected to each other and are connected to the first output terminal. The drain region of the fourth n-channel MOS transistor and the drain region of the fourth p-channel MOS transistor are connected to each other to form a second output terminal. The source region of the fourth n-channel MOS transistor and the source region of the fourth p-channel MOS transistor are respectively connected to the reference power supply line and the power supply line. The NOR decoder further includes a first address signal line, a second address signal line, and a third address signal line. The gate of the first n-channel MOS transistor and the gate of the first p-channel MOS transistor, which are connected to each other, are connected to the first address signal line. The gate of the second n-channel MOS transistor and the gate of the second p-channel MOS transistor, which are connected to each other, are connected to the second address signal line. The gate of the third n-channel MOS transistor and the gate of the third p-channel MOS transistor, which are connected to each other, are connected to the third address signal line. The power supply line, the reference power supply line, the first address signal line, the second address signal line, and the third address signal line are arranged to extend in a second direction perpendicular to the first direction.

(15) The eight transistors may be arranged in a line in an order of one of the fourth n-channel MOS transistor and the fourth p-channel MOS transistor, the other of the fourth n-channel MOS transistor and the fourth p-channel MOS transistor, the third p-channel MOS transistor, the second p-channel MOS transistor, the first p-channel MOS transistor, the first n-channel MOS transistor, the second n-channel MOS transistor, and the third n-channel MOS transistor.

(16) At least the gates of the first n-channel MOS transistor and the first p-channel MOS transistor, the gates of the second n-channel MOS transistor and the second p-channel MOS transistor, or the gates of the third n-channel MOS transistor and the third p-channel MOS transistor may be connected to the corresponding one of the first to third address signal lines, each of which is formed of a line of a second metal wiring layer arranged to extend in the second direction, at least via a line of a first metal wiring layer arranged to extend in the first direction.

(17) According to still another aspect of the present invention, a semiconductor device includes a first address signal lines, the number of which is equal to a, b second address signal lines, the number of which is equal to b, c third address signal lines, the number of which is equal to c, and a×b×c pairs of NOR decoders and inverters, the number of which is given by a×b×c. Each of the a×b×c pairs of NOR decoders and inverters includes eight transistors, each having a source, a drain, and a gate arranged in a layered manner in a direction perpendicular to a substrate, the eight transistors being arranged on the substrate in a line in a first direction. Each of the eight transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The eight transistors include a first p-channel MOS transistor, a second p-channel MOS transistor, a third p-channel MOS transistor, a fourth p-channel MOS transistor, a first n-channel MOS transistor, a second n-channel MOS transistor, a third n-channel MOS transistor, and a fourth n-channel MOS transistor. The NOR decoder in each of the a×b×c pairs at least includes the first n-channel MOS transistor, the second n-channel MOS transistor, the third n-channel MOS transistor, the first p-channel MOS transistor, the second p-channel MOS transistor, and the third p-channel MOS transistor. The inverter in each of the a×b×c pairs includes the fourth n-channel MOS transistor and the fourth p-channel MOS transistor. The gate of the first n-channel MOS transistor and the gate of the first p-channel MOS transistor are connected to each other. The gate of the second n-channel MOS transistor and the gate of the second p-channel MOS transistor are connected to each other. The gate of the third n-channel MOS transistor and the gate of the third p-channel MOS transistor are connected to each other. The drain regions of the first n-channel MOS transistor, the second n-channel MOS transistor, the third n-channel MOS transistor, and the first p-channel MOS transistor are located closer to the substrate than the silicon pillars of the first n-channel MOS transistor, the second n-channel MOS transistor, the third n-channel MOS transistor, and the first p-channel MOS transistor, respectively, and are connected to one another via silicide layers to form a first output terminal. The source region of the second p-channel MOS transistor and the drain region of the third p-channel MOS transistor are located closer to the substrate than the silicon pillars of the second p-channel MOS transistor and the third p-channel MOS transistor. The source regions of the first n-channel MOS transistor, the second n-channel MOS transistor, and the third n-channel MOS transistor are connected to a reference power supply line via contacts. The source region of the first p-channel MOS transistor is connected to the drain region of the second p-channel MOS transistor via a contact. The source region of the second p-channel MOS transistor is connected to the drain region of the third p-channel MOS transistor via a silicide layer. The source region of the third p-channel MOS transistor is connected to a power supply line via a contact. The gate of the fourth n-channel MOS transistor and the gate of the fourth p-channel MOS transistor are connected to each other and are connected to the first output terminal. The drain region of the fourth re-channel MOS transistor and the drain region of the fourth p-channel MOS transistor are connected to each other to form a second output terminal. The source region of the fourth n-channel MOS transistor and the source region of the fourth p-channel MOS transistor are respectively connected to the reference power supply line and the power supply line. Each of the a×b×c pairs of NOR decoders and inverters are configured such that the gate of the first n-channel MOS transistor and the gate of the first p-channel MOS transistor, which are connected to each other, are connected to any one of the a first address signal lines, the gate of the second n-channel MOS transistor and the gate of the second p-channel MOS transistor, which are connected to each other, are connected to any one of the b second address signal lines, and the gate of the third n-channel MOS transistor and the gate of the third p-channel MOS transistor, which are connected to each other, are connected to any one of the c third address signal lines. The power supply line, the reference power supply line, the a first address signal lines, the b second address signal lines, and the c third address signal lines are arranged to extend in a second direction perpendicular to the first direction.

(18) The eight transistors may be arranged in a line in an order of one of the fourth p-channel MOS transistor and the fourth n-channel MOS transistor, the other of the fourth n-channel MOS transistor and the fourth p-channel MOS transistor, the third n-channel MOS transistor, the second n-channel MOS transistor, the first n-channel MOS transistor, first p-channel MOS transistor, the second p-channel MOS transistor, and the third p-channel MOS transistor.

(19) In each of the a×b×c pairs of NOR decoders and inverters, at least the gates of the first n-channel MOS transistor and the first p-channel MOS transistor, the gates of the second n-channel MOS transistor and the second p-channel MOS transistor, or the gates of the third n-channel MOS transistor and the third p-channel MOS transistor may be connected to the corresponding one of the first to third address signal lines, each of which is formed of a line of a second metal wiring layer arranged to extend in the second direction, at least via a line of a first metal wiring layer arranged to extend in the first direction.

(20) According to still another aspect of the present invention, a semiconductor device includes a NOR decoder and an inverter. The NOR decoder and the inverter include eight transistors, each having a source, a drain, and a gate arranged in a layered manner in a direction perpendicular to a substrate, the eight transistors being arranged on the substrate in a line in a first direction. Each of the eight transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The eight transistors include a first p-channel MOS transistor, a second p-channel MOS transistor, a third p-channel MOS transistor, a fourth p-channel MOS transistor, a first n-channel MOS transistor, a second n-channel MOS transistor, a third n-channel MOS transistor, and a fourth n-channel MOS transistor. The NOR decoder includes the first n-channel MOS transistor, the second n-channel MOS transistor, the third n-channel MOS transistor, the first p-channel MOS transistor, the second p-channel MOS transistor, and the third p-channel MOS transistor. The inverter includes the fourth n-channel MOS transistor and the fourth p-channel MOS transistor. The gate of the first n-channel MOS transistor and the gate of the first p-channel MOS transistor are connected to each other. The gate of the second n-channel MOS transistor and the gate of the second p-channel MOS transistor are connected to each other. The gate of the third n-channel MOS transistor and the gate of the third p-channel MOS transistor are connected to each other. The source regions of the first n-channel MOS transistor, the second n-channel MOS transistor, the third n-channel MOS transistor, and the first p-channel MOS transistor are located closer to the substrate than the silicon pillars of the first n-channel MOS transistor, the second n-channel MOS transistor, the third n-channel MOS transistor, and the first p-channel MOS transistor. The drain region of the second p-channel MOS transistor and the source region of the third p-channel MOS transistor are located closer to the substrate than the silicon pillars of the second p-channel MOS transistor and the third p-channel MOS transistor. The drain regions of the first n-channel MOS transistor, the second n-channel MOS transistor, the third n-channel MOS transistor, and the first p-channel MOS transistor are connected to one another via contacts to form a first output terminal. The source regions of the first n-channel MOS transistor, the second n-channel MOS transistor, and the third n-channel MOS transistor are connected to a reference power supply line via silicide regions. The source region of the first p-channel MOS transistor is connected to the drain region of the second p-channel MOS transistor via a silicide layer. The source region of the second p-channel MOS transistor is connected to the drain region of the third p-channel MOS transistor via a contact. The source region of the third p-channel MOS transistor is connected to a power supply line via a silicide layer. The gate of the fourth n-channel MOS transistor and the gate of the fourth p-channel MOS transistor are connected to each other and are connected to the first output terminal. The drain region of the fourth n-channel MOS transistor and the drain region of the fourth p-channel MOS transistor are connected to each other to form a second output terminal. The source region of the fourth n-channel MOS transistor and the source region of the fourth p-channel MOS transistor are respectively connected to the reference power supply line and the power supply line. The NOR decoder further includes a first address signal line, a second address signal line, and a third address signal line. The gate of the first n-channel MOS transistor and the gate of the first p-channel MOS transistor, which are connected to each other, are connected to the first address signal line. The gate of the second n-channel MOS transistor and the gate of the second p-channel MOS transistor, which are connected to each other, are connected to the second address signal line. The gate of the third n-channel MOS transistor and the gate of the third p-channel MOS transistor, which are connected to each other, are connected to the third address signal line. The power supply line, the reference power supply line, the first address signal line, the second address signal line, and the third address signal line are arranged to extend in a second direction perpendicular to the first direction.

(21) The eight transistors may be arranged in a line in an order of one of the fourth p-channel MOS transistor and the fourth n-channel MOS transistor, the other of the fourth n-channel MOS transistor and the fourth p-channel MOS transistor, the third n-channel MOS transistor, the second n-channel MOS transistor, the first n-channel MOS transistor, the first p-channel MOS transistor, the second p-channel MOS transistor, and the third p-channel MOS transistor.

(22) The source regions of the fourth n-channel MOS transistor and the fourth p-channel MOS transistor may be located closer to the substrate than the silicon pillars of the fourth n-channel MOS transistor and the fourth p-channel MOS transistor, and the eight transistors may be arranged in a line in an order of the fourth p-channel MOS transistor, the fourth n-channel MOS transistor, the third n-channel MOS transistor, the second n-channel MOS transistor, the first n-channel MOS transistor, the first p-channel MOS transistor, the second p-channel MOS transistor, and the third p-channel MOS transistor.

(23) At least the gates of the first n-channel MOS transistor and the first p-channel MOS transistor, the gates of the second n-channel MOS transistor and the second p-channel MOS transistor, or the gates of the third n-channel MOS transistor and the third p-channel MOS transistor may be connected to the corresponding one of the first to third address signal lines, each of which is formed of a line of a second metal wiring layer arranged to extend in the second direction, at least via a line of a first metal wiring layer arranged to extend in the first direction.

(24) According to still another aspect of the present invention, a semiconductor device includes a first address signal lines, the number of which is equal to a, b second address signal lines, the number of which is equal to b, c third address signal lines, the number of which is equal to c, and a×b×c pairs of NOR decoders and inverters, the number of which is given by a×b×c. Each of the a×b×c pairs of NOR decoders and inverters includes eight transistors, each having a source, a drain, and a gate arranged in a layered manner in a direction perpendicular to a substrate, the eight transistors being arranged on the substrate in a line in a first direction. Each of the eight transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The eight transistors includes a first p-channel MOS transistor, a second p-channel MOS transistor, a third p-channel MOS transistor, a fourth p-channel MOS transistor, a first n-channel MOS transistor, a second n-channel MOS transistor, a third n-channel MOS transistor, and a fourth n-channel MOS transistor. The NOR decoder in each of the a×b×c pairs includes the first n-channel MOS transistor, the second n-channel MOS transistor, the third n-channel MOS transistor, the first p-channel MOS transistor, the second p-channel MOS transistor, and the third p-channel MOS transistor. The inverters in each of the a×b×c pairs includes the fourth n-channel MOS transistor, and the fourth n-channel MOS transistor. The gate of the first n-channel MOS transistor and the gate of the first p-channel MOS transistor are connected to each other. The gate of the second n-channel MOS transistor and the gate of the second p-channel MOS transistor are connected to each other. The gate of the third n-channel MOS transistor and the gate of the third p-channel MOS transistor are connected to each other. The source regions of the first n-channel MOS transistor, the second n-channel MOS transistor, the third n-channel MOS transistor, and the first p-channel MOS transistor are located closer to the substrate than the silicon pillars of the first n-channel MOS transistor, the second n-channel MOS transistor, the third n-channel MOS transistor, and the first p-channel MOS transistor. The drain region of the second p-channel MOS transistor and the source region of the third p-channel MOS transistor are located closer to the substrate than the silicon pillars of the second p-channel MOS transistor and the third p-channel MOS transistor. The drain regions of the first n-channel MOS transistor, the second n-channel MOS transistor, the third n-channel MOS transistor, and the first p-channel MOS transistor are connected to one another via contacts to form a first output terminal. The source regions of the first n-channel MOS transistor, the second n-channel MOS transistor, and the third n-channel MOS transistor are connected to a reference power supply line via silicide regions. The source region of the first p-channel MOS transistor is connected to the drain region of the second p-channel MOS transistor via a silicide layer. The source region of the second p-channel MOS transistor is connected to the drain region of the third p-channel MOS transistor via a contact. The source region of the third p-channel MOS transistor is connected to a power supply line via a silicide layer. The gate of the fourth n-channel MOS transistor and the gate of the fourth p-channel MOS transistor are connected to each other and are connected to the first output terminal. The drain region of the fourth n-channel MOS transistor and the drain region of the fourth p-channel MOS transistor are connected to each other to form a second output terminal. The source region of the fourth n-channel MOS transistor and the source region of the fourth p-channel MOS transistor are respectively connected to the reference power supply line and the power supply line. Each of the a×b×c pairs of NOR decoders and inverters are configured such that the gate of the first n-channel MOS transistor and the gate of the first p-channel MOS transistor, which are connected to each other, are connected to any one of the a first address signal lines, the gate of the second n-channel MOS transistor and the gate of the second p-channel MOS transistor, which are connected to each other, are connected to any one of the b second address signal lines, and the gate of the third n-channel MOS transistor and the gate of the third p-channel MOS transistor, which are connected to each other, are connected to any one of the c third address signal lines. The power supply line, the reference power supply line, the a first address signal lines, the b second address signal lines, and the c third address signal lines are arranged to extend in a second direction perpendicular to the first direction.

(25) The eight transistors may be arranged in a line in an order of one of the fourth p-channel MOS transistor and the fourth n-channel MOS transistor, the other of the fourth n-channel MOS transistor and the fourth p-channel MOS transistor, the third n-channel MOS transistor, the second n-channel MOS transistor, the first n-channel MOS transistor, the first p-channel MOS transistor, the second p-channel MOS transistor, and the third p-channel MOS transistor.

(26) The source regions of the fourth n-channel MOS transistor and the fourth p-channel MOS transistor may be located closer to the substrate than the silicon pillars of the fourth n-channel MOS transistor and the fourth p-channel MOS transistor, and the eight transistors may be arranged in a line in an order of the fourth p-channel MOS transistor, the fourth n-channel MOS transistor, the third n-channel MOS transistor, the second n-channel MOS transistor, the first n-channel MOS transistor, the first p-channel MOS transistor, the second p-channel MOS transistor, and the third p-channel MOS transistor.

(27) The source regions of the first n-channel MOS transistors, the second n-channel MOS transistors, the third n-channel MOS transistors, and the fourth n-channel MOS transistors in the a×b×c NOR decoders and the a×b×c inverters may be connected in common via a silicide layer.

(28) In each of the a×b×c pairs of NOR decoders and inverters, at least the gates of the first n-channel MOS transistor and the first p-channel MOS transistor, the gates of the second n-channel MOS transistor and the second p-channel MOS transistor, or the gates of the third n-channel MOS transistor and the third p-channel MOS transistor may be connected to the corresponding one of the first to third address signal lines, each of which is formed of a line of a second metal wiring layer arranged to extend in the second direction, at least via a line of a first metal wiring layer arranged to extend in the first direction.

BRIEF DESCRIPTION OF THE DRAWINGS

FIG. 8 is an address map of the decoder according to the third exemplary embodiment of the present invention.

FIG. 9B is a plan view of the decoder according to the third exemplary embodiment of the present invention.

FIG. 18A is an address map of the decoder according to the sixth exemplary embodiment of the present invention.

FIG. 18B is an address map of the decoder according to the sixth exemplary embodiment of the present invention.

DETAILED DESCRIPTION OF THE PREFERRED EMBODIMENTS

First Exemplary Embodiment

Equivalent Circuit Applicable to Exemplary Embodiment of Present Invention

Figure 1:
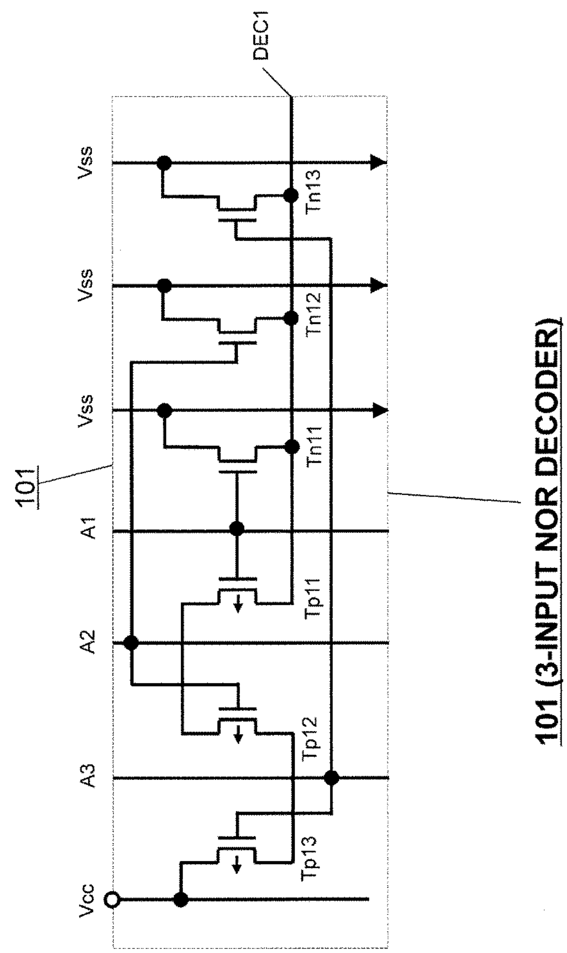
FIG. 1 is an equivalent circuit diagram illustrating a decoder according to a first exemplary embodiment of the present invention.

FIG. 1 illustrates a circuit diagram of transistors arranged in accordance with an arrangement according to an exemplary embodiment. The transistors constitute a 3-input NOR decoder including a 3-input NOR circuit applicable to the present invention. Reference numerals Tn11, Tn12, and Tn13 denote NMOS transistors formed of SGTs, and reference numerals Tp11, Tp12, and Tp13 denote PMOS transistors formed of SGTs. The sources of the NMOS transistors Tn11, Tn12, and Tn13 are connected to a reference power supply Vss, and the drains of the NMOS transistors Tn11, Tn12, and Tn13 are connected in common to an output terminal DEC1. The drain of the PMOS transistor Tp11 is connected to the output terminal DEC1, and the source of the PMOS transistor Tp11 is connected to the drain of the PMOS transistor Tp12. The source of the PMOS transistor Tp12 is connected to the drain of the PMOS transistor Tp13, and the source of the PMOS transistor Tp13 is connected to a power supply Vcc. An address signal line A1 is connected to the gate of the NMOS transistor Tn11 and the gate of the PMOS transistor Tp11, an address signal line A2 is connected to the gate of the NMOS transistor Tn12 and the gate of the PMOS transistor Tp12, and an address signal line A3 is connected to the gate of the NMOS transistor Tn13 and the gate of the PMOS transistor Tp13.

The NMOS transistors Tn11, Tn12, and Tn13 and the PMOS transistors Tp11, Tp12, and Tp13 constitute a 3-input NOR decoder 101. The NOR decoder 101 is a decoder with a positive logic output (the output of a selected decoder is logic "1"). In a case where a negative logic output (the output of a selected decoder is logic "0") is necessary, as described below, a combination of inverters may be used.

Figure 2A:
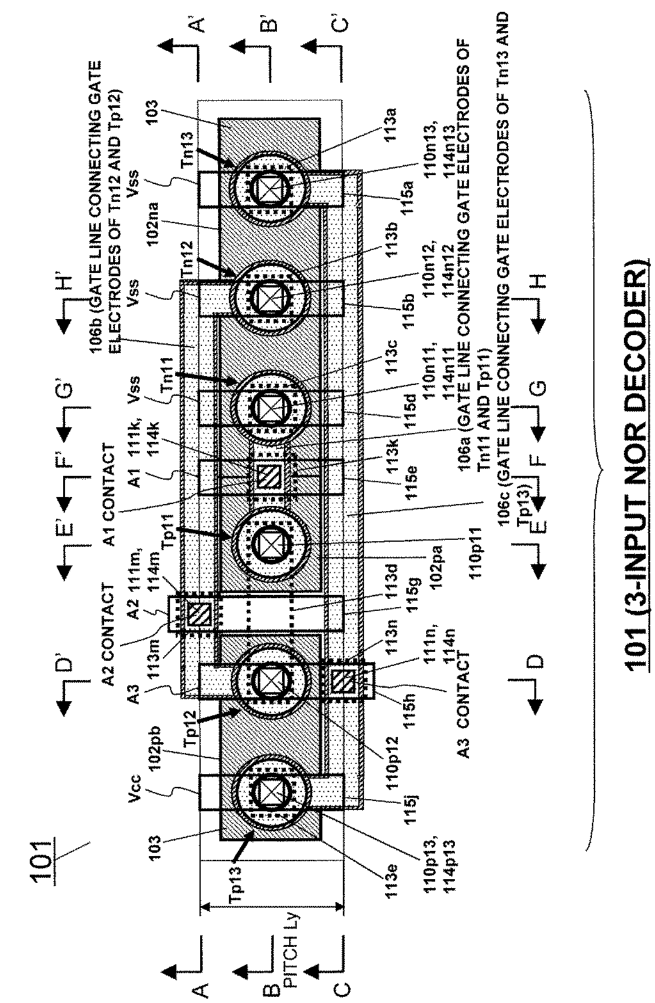
FIG. 2A is a plan view of the decoder according to the first exemplary embodiment of the present invention.
Figure 2B:
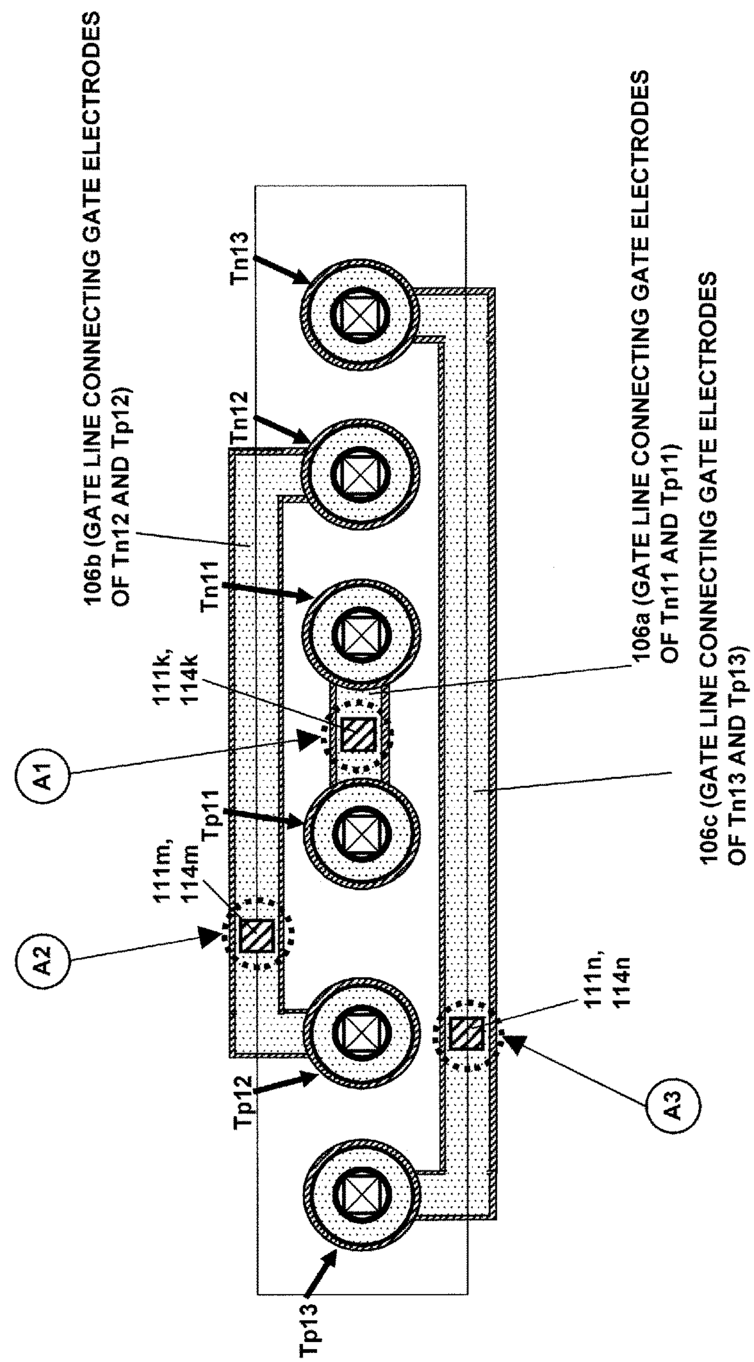
FIG. 2B is a plan view of the decoder according to the first exemplary embodiment of the present invention.
Figure 3A:
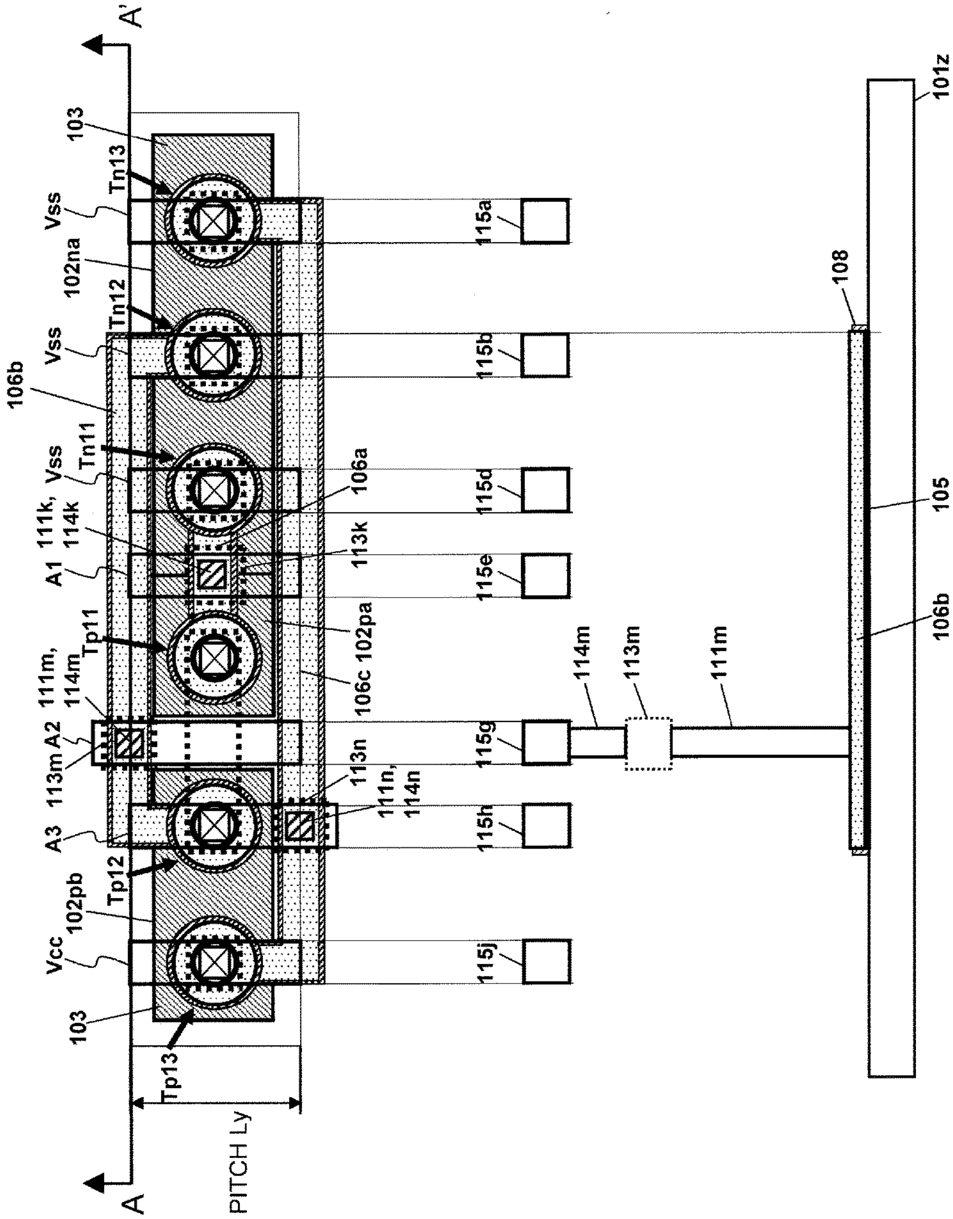
FIG. 3A is a cross-sectional view of the decoder according to the first exemplary embodiment of the present invention.
Figure 3B:
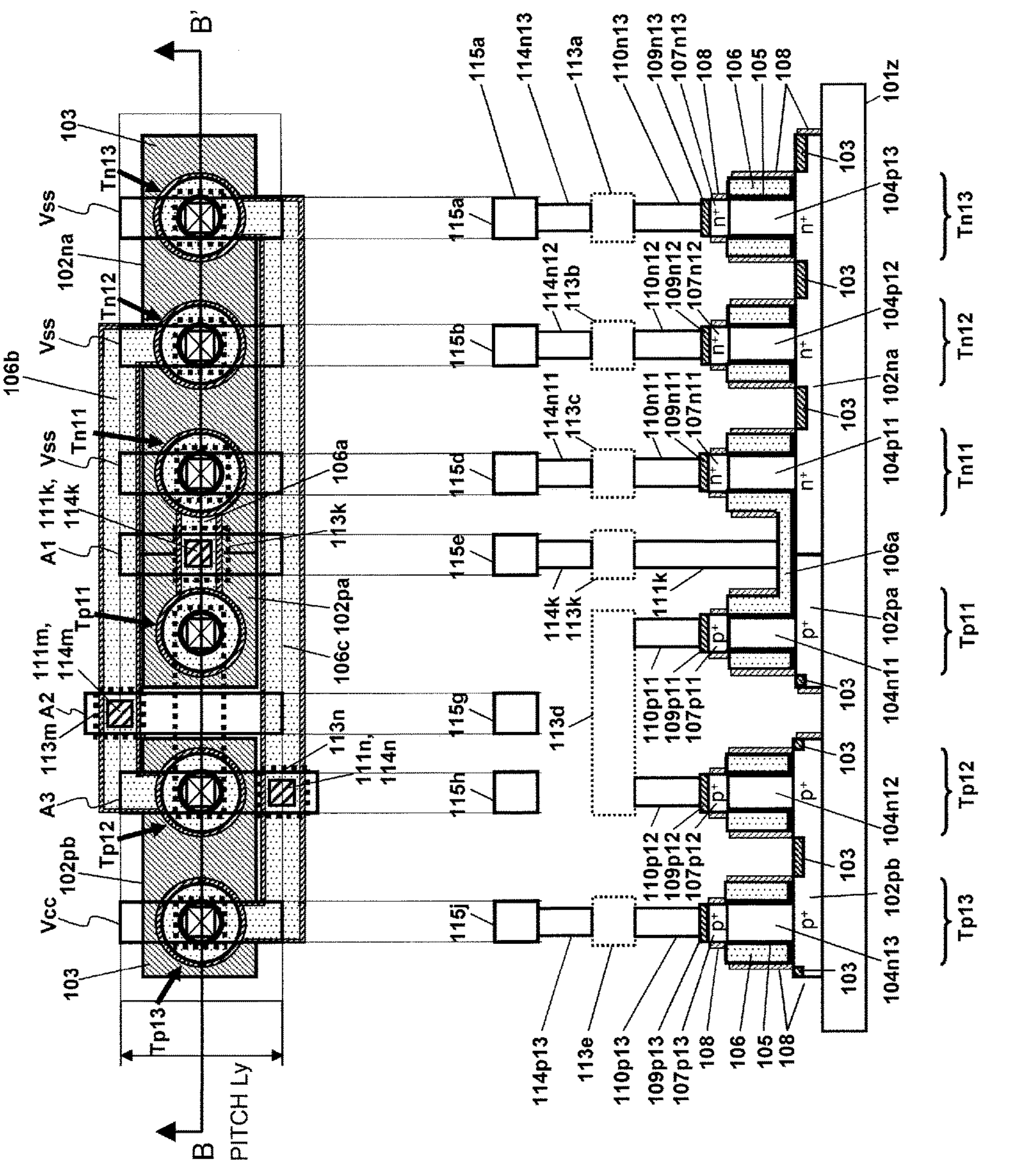
FIG. 3B is a cross-sectional view of the decoder according to the first exemplary embodiment of the present invention.
Figure 3C:
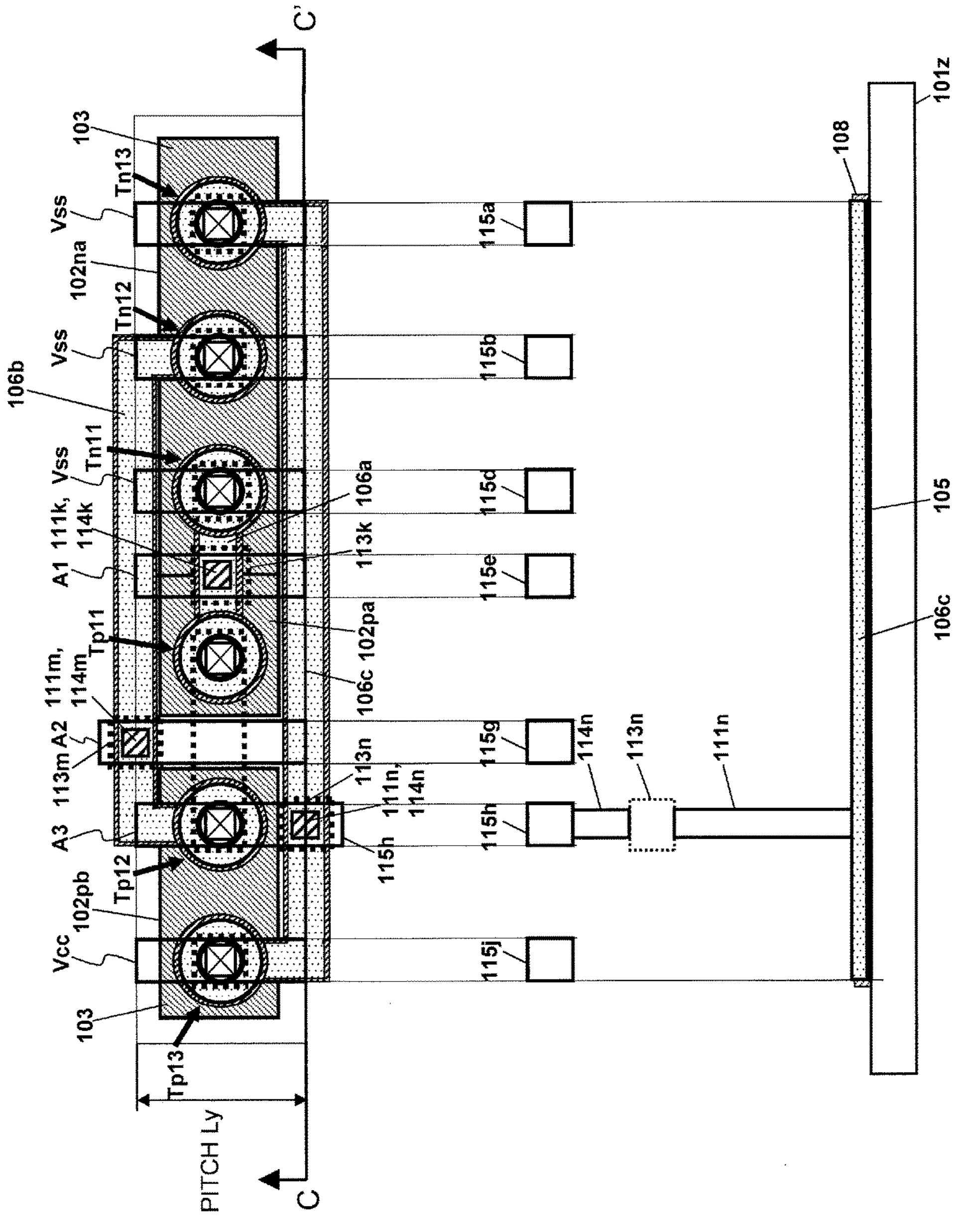
FIG. 3C is a cross-sectional view of the decoder according to the first exemplary embodiment of the present invention.
Figure 3D:
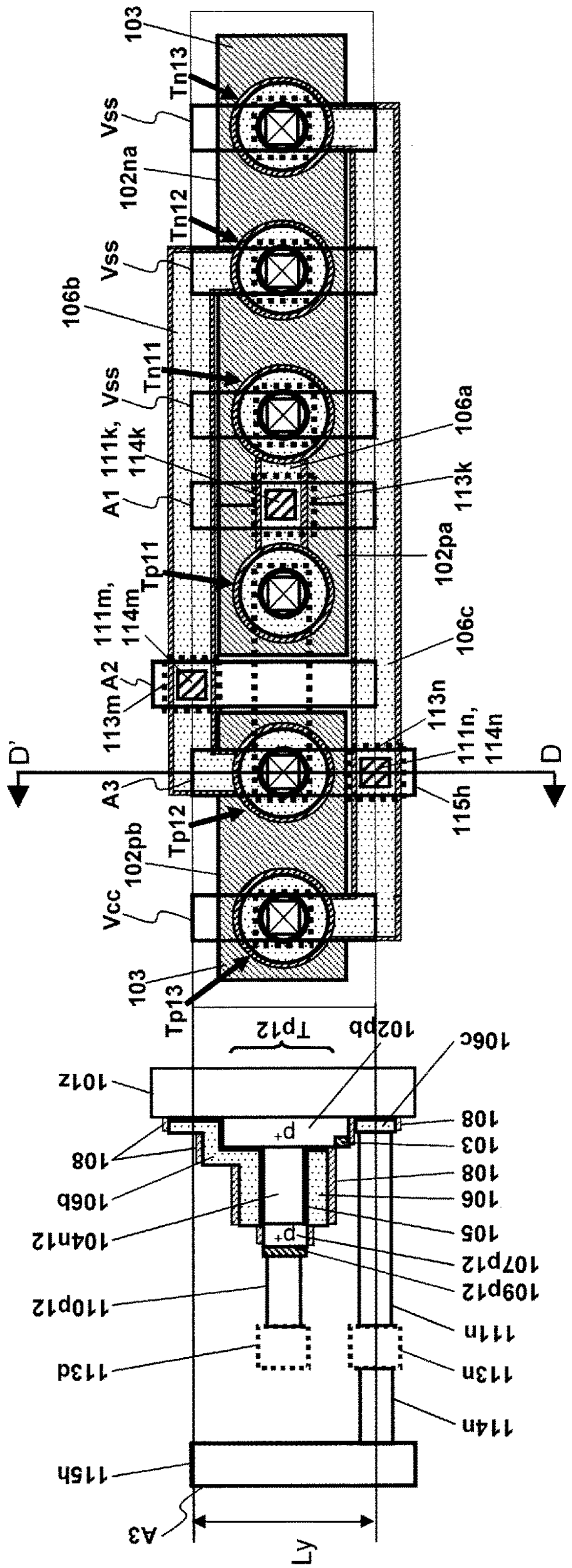
FIG. 3D is a cross-sectional view of the decoder according to the first exemplary embodiment of the present invention.
Figure 3E:
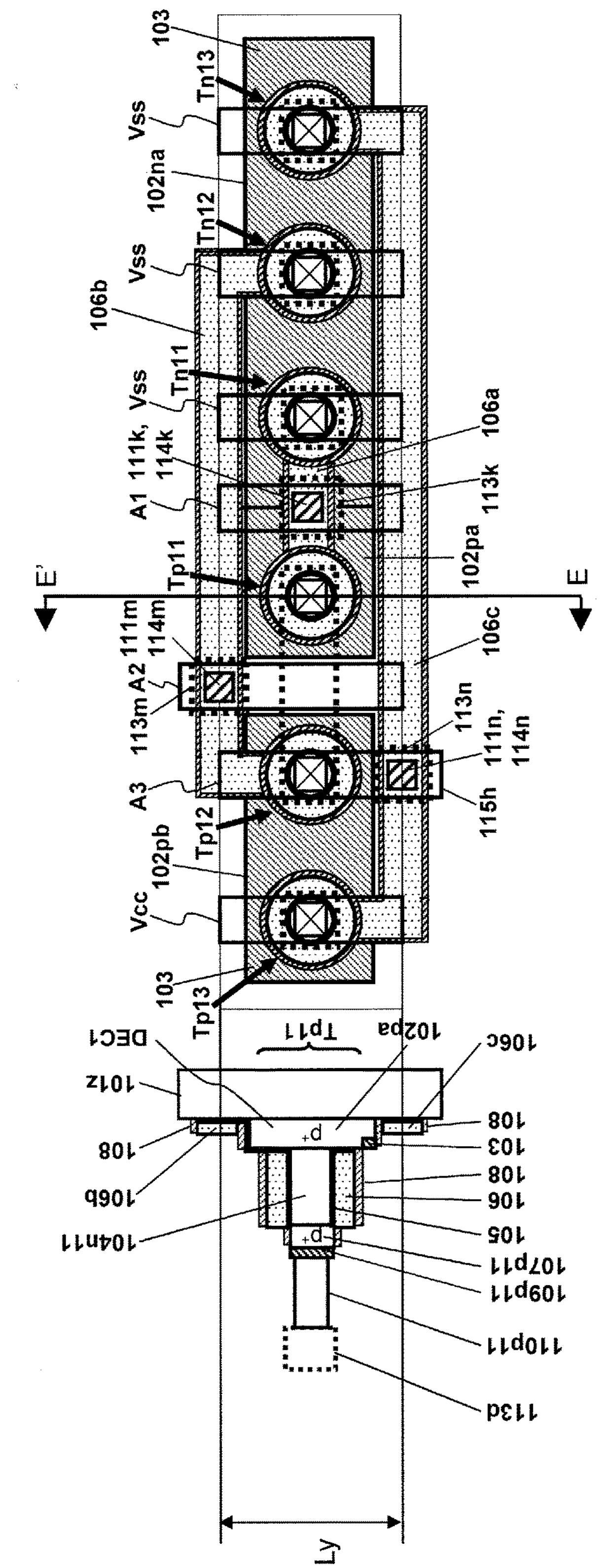
FIG. 3E is a cross-sectional view of the decoder according to the first exemplary embodiment of the present invention.
Figure 3F:
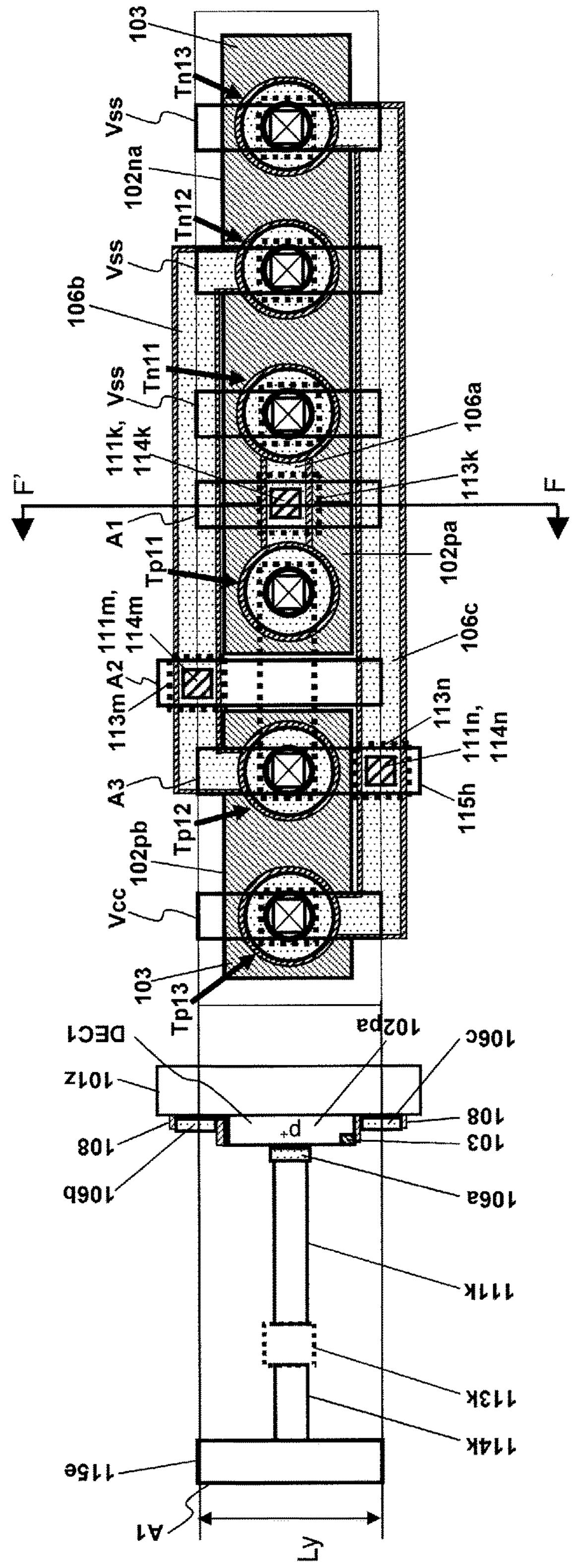
FIG. 3F is a cross-sectional view of the decoder according to the first exemplary embodiment of the present invention.
Figure 3G:
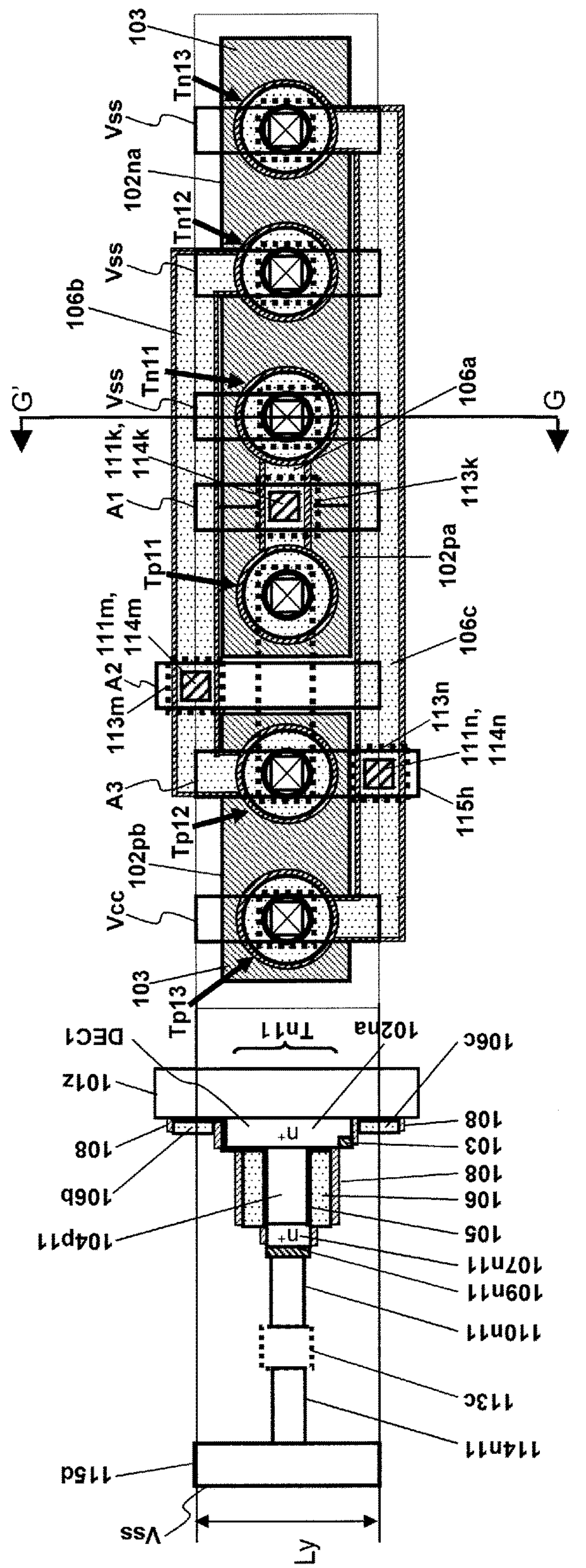
FIG. 3G is a cross-sectional view of the decoder according to the first exemplary embodiment of the present invention.
Figure 3H:
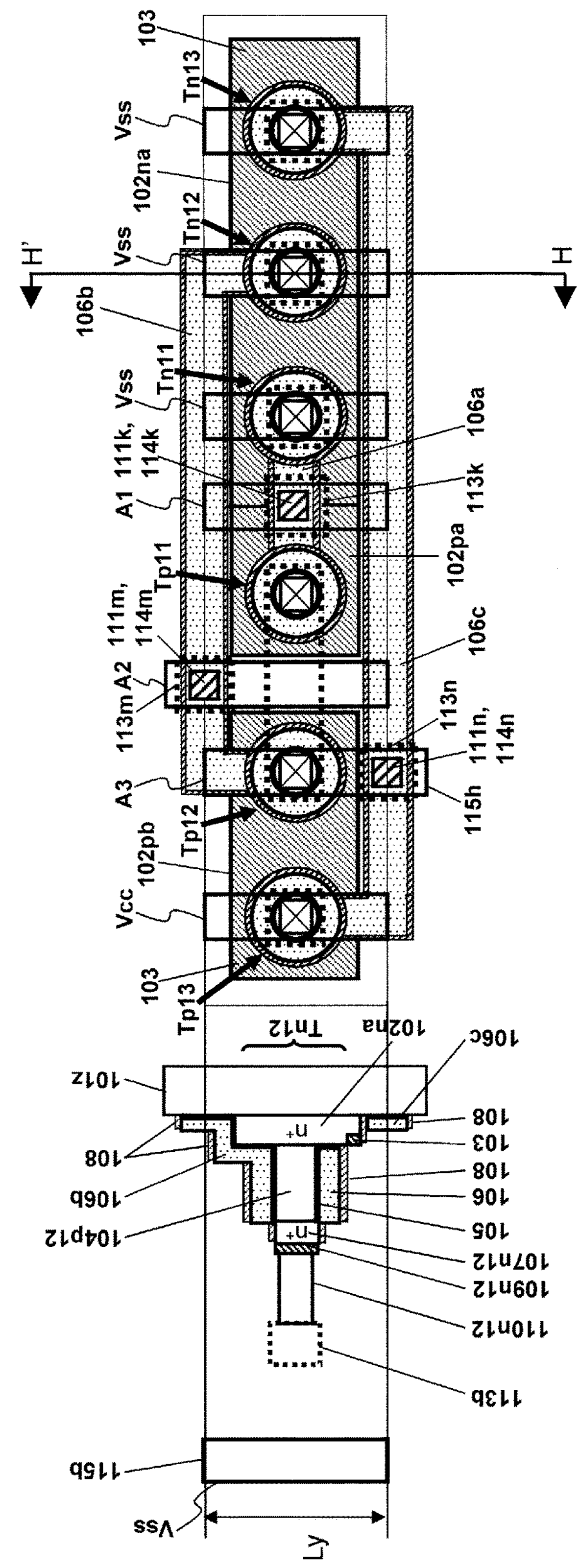
FIG. 3H is a cross-sectional view of the decoder according to the first exemplary embodiment of the present invention.

FIGS. 2A and 2B and FIGS. 3A to 3H illustrate a first exemplary embodiment as an exemplary embodiment in which the equivalent circuit illustrated in FIG. 1 is applied to the present invention. FIG. 2A is a plan view of the layout (arrangement) of the 3-input NOR decoder 101 according to this exemplary embodiment. FIG. 2B is a plan view of transistors and gate lines and illustrates connection relationships between the address signal lines and the gate lines, in particular. FIG. 3A is a cross-sectional view taken along the cut-line A-A' in FIG. 2A, FIG. 3B is a cross-sectional view taken along the cut-line B-B' in FIG. 2A, FIG. 3C is a cross-sectional view taken along the cut-line C-C' in FIG. 2A, FIG. 3D is a cross-sectional view taken along the cut-line D-D' in FIG. 2A, FIG. 3E is a cross-sectional view taken along the cut-line E-E' in FIG. 2A, FIG. 3F is a cross-sectional view taken along the cut-line F-F' in FIG. 2A, FIG. 3G is a cross-sectional view taken along the cut-line G-G' in FIG. 2A, and FIG. 3H is a cross-sectional view taken along the cut-line H-H' in FIG. 2A.

Figure 21:
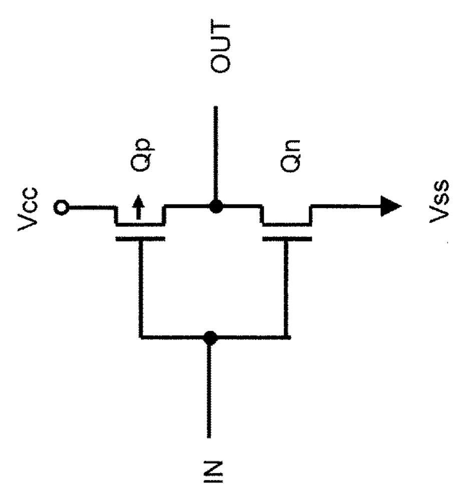
FIG. 21 illustrates an equivalent circuit of an inverter of related art.
Figure 22:
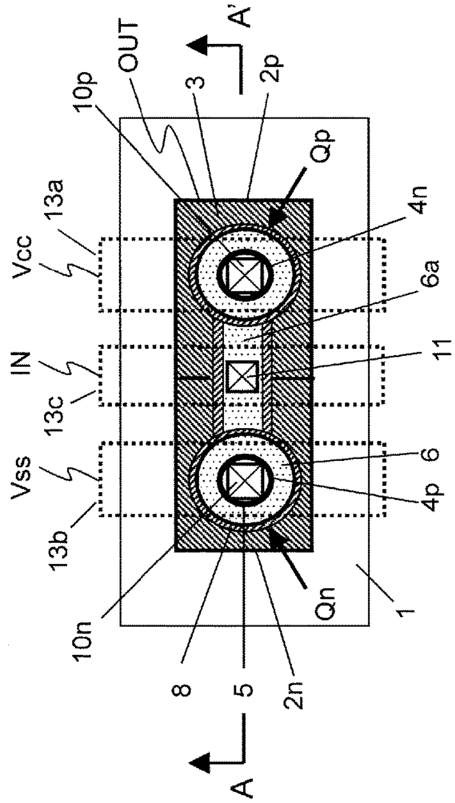
FIG. 22 is a plan view of a traditional inverter constituted by SGTs.
Figure 23:
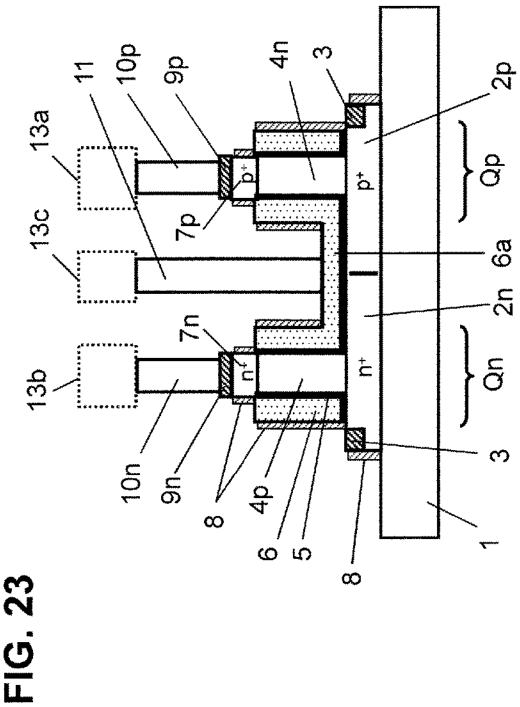
FIG. 23 is a cross-sectional view of the traditional inverter constituted by SGTs.

In FIGS. 2A and 2B and FIGS. 3A to 3H, portions having the same or substantially the same structures as those illustrated in FIGS. 21, 22, and 23 are denoted by equivalent reference numerals in the 100s.

In FIG. 2A, the NMOS transistors Tn13, Tn12, and Tn11 and the PMOS transistors Tp11, Tp12, and Tp13, which are six SGTs constituting the NOR decoder 101 illustrated in FIG. 1, are arranged in a line in a lateral direction (defined as a "first direction") from right to left in this figure.

Further provided in a longitudinal direction (defined as a "second direction perpendicular to the first direction") in this figure are lines 115*a*, 115*b*, 115*d*, 115*e*, 115*g*, 115*h*, and 115*j* of a second metal wiring layer described below. The lines 115*a*, 115*b*, 115*d*, 115*e*, 115*g*, 115*h*, and 115*j* of the second metal wiring layer are arranged to extend in the longitudinal direction (the second direction) and respectively form a reference power supply line Vss, a reference power supply line Vss, a reference power supply line Vss, an address signal line A1, an address signal line A2, an address signal line A3, and a power supply line Vcc. A feature of this exemplary embodiment is that six transistors constituting a 3-input NOR decoder are arranged in a line to provide efficient circuit connections so as to minimize the area of the arrangement of the transistors. As is apparent from FIGS. 2A and 2B, a gate electrode 106 of the NMOS transistor Tn11 and a gate electrode 106 of the PMOS transistor Tp11 are directly connected to each other by using a gate line 106*a*, a gate electrode 106 of the NMOS transistor Tn12 and a gate electrode 106 of the gate electrode 106 of the PMOS transistor Tp12 are directly connected to each other by using a gate line 106*b* (located in an upper portion of FIGS. 2A and 2B), and a gate electrode 106 of the NMOS transistor Tn13 and a gate electrode 106 of the PMOS transistor Tp13 are directly connected to each other by using a gate line 106*c* (located in a lower portion of FIGS. 2A and 2B). This configuration enables a 3-input NOR decoder to be arranged in a line. In addition, address signal lines are connected to gate lines by using lines of the second metal wiring layer that are arranged to extend vertically (in the second direction). Specifically, the address signal line A1, which is connected to the line 115*e* of the second metal wiring layer, is connected to the gate line 106*a* via an A1-contact portion formed of a contact 111*k*, a line 113*k* of a first metal wiring layer, and a contact 114*k*, the address signal line A2, which is connected to the line 115*g* of the second metal wiring layer, is connected to the gate line 106*b* via an A2-contact portion formed of a contact 111*m*, a line 113*m* of the first metal wiring layer, and a contact 114*m*, and the address signal line A3, which is connected to the line 115*h* of the second metal wiring layer, is connected to the gate line 106*c* via an A3-contact portion formed of a contact 111*n*, a line 113*n* of the first metal wiring layer, and a contact 114*n*.

While this exemplary embodiment provides a single 3-input NOR decoder, a plurality of 3-input NOR decoders are arranged in the longitudinal direction at a repeating pitch (size) Ly. The pitch Ly is set because, as described below, the upper gate line 106*b* is shared with an upper adjacent decoder and the lower gate line 106*c* is shared with a lower adjacent decoder. That is, the upper and lower adjacent decoders are each constructed by arranging the 3-input NOR decoder according to this exemplary embodiment in an inverted configuration, which results in the area of the arrangement being minimized. This exemplary embodiment will be described in detail hereinafter.

Planar silicon layers 102*na*, 102*pa*, and 102*pb* are formed on top of an insulating film such as a buried oxide (BOX) film layer 101*z* disposed on a substrate. The planar silicon layers 102*na*, 102*pa*, and 102*pb* are formed as an n+ diffusion layer, a p+ diffusion layer, and a p+ diffusion layer, respectively, through impurity implantation or the like. Reference numeral 103 denotes a silicide layer disposed on surfaces of the planar silicon layers (102*na*, 102*pa*, and 102*pb*). The silicide layer 103 connects the planar silicon layers 102*na* and 102*pa* to each other. Reference numerals 104*p*11, 104*p*12, and 104*p*13 denote p-type silicon pillars, and reference numerals 104*n*11, 104*n*12, and 104*n*13 denote n-type silicon pillars. Reference numeral 105 denotes a gate insulating film that surrounds the silicon pillars 104*p*11, 104*p*12, 104*p*13, 104*n*11, 104*n*12, and 104*n*13. Reference numeral 106 denotes a gate electrode, and reference numerals 106*a*, 106*b*, and 106*c* denote gate lines. The gate insulating film 105 is also formed to underlie the gate electrode 106 and the gate lines 106*a*, 106*b*, and 106*c*.

In top portions of the silicon pillars 104*p*11, 104*p*12, and 104*p*13, n+ diffusion layers 107*n*11, 107*n*12, and 107*n*13 are respectively formed through impurity implantation or the like. In top portions of the silicon pillars 104*n*11, 104*n*12, and 104*n*13, p+ diffusion layers 107*p*11, 107*p*12, and 107*p*13 are respectively formed through impurity implantation or the like. Reference numeral 108 denotes a silicon nitride film for protecting the gate insulating film 105, and reference numerals 109*n*11, 109*n*12, 109*n*13, 109*p*11, 109*p*12, and 109*p*13 denote silicide layers to be respectively connected to the n+ diffusion layers 107*n*11, 107*n*12, and 107*n*13 and the p+ diffusion layers 107*p*11, 107*p*12, and 107*p*13.

Reference numerals 110*n*11, 110*n*12, 110*n*13, 110*p*11, 110*p*12, and 110*p*13 denote contacts that respectively connect the silicide layers 109*n*11, 109*n*12, 109*n*13, 109*p*11, 109*p*12, and 109*p*13 to lines 113*c*, 113*b*, 113*a*, 113*d*, 113*d*, and 113*e* of a first metal wiring layer. Reference numeral 111*k* denotes a contact that connects the gate line 106*a* to the line 113*k* of the first metal wiring layer, reference numeral 111*m* denotes a contact that connects the gate line 106*b* to the line 113*m* of the first metal wiring layer, and reference numeral 111*n* denotes a contact that connects the gate line 106*c* to the line 113*n* of the first metal wiring layer. Reference numeral 114*n*11 denotes a contact that connects the line 113*c* of the first metal wiring layer to the line 115*d* of the second metal wiring layer, reference numeral 114*n*12 denotes a contact that connects the line 113*b* of the first metal wiring layer to the line 115*b* of the second metal wiring layer, reference numeral 114*n*13 denotes a contact that connects the line 113*a* of the first metal wiring layer to the line 115*a* of the second metal wiring layer, reference numeral 114*p*13 denotes a contact that connects the line 113*e* of the first metal wiring layer to the line 115*j* of the second metal wiring layer, reference numeral 114*k* denotes a contact that connects the line 113*k* of the first metal wiring layer to the line 115*e* of the second metal wiring layer, reference numeral 114*m* denotes a contact that connects the line 113*m* of the first metal wiring layer to the line 115*g* of the second metal wiring layer, and reference numeral 114*n* denotes a contact that connects the line 113*n* of the first metal wiring layer to the line 115*h* of the second metal wiring layer.

The silicon pillar 104*p*11, the lower diffusion layer 102*na*, the upper diffusion layer 107*n*11, the gate insulating film 105, and the gate electrode 106 constitute the NMOS transistor Tn11. The silicon pillar 104*p*12, the lower diffusion layer 102*na*, the upper diffusion layer 107*n*12, the gate insulating film 105, and the gate electrode 106 constitute the NMOS transistor Tn12. The silicon pillar 104*p*13, the lower diffusion layer 102*na*, the upper diffusion layer 107*n*13, the gate insulating film 105, and the gate electrode 106 constitute the NMOS transistor Tn13. The silicon pillar 104*n*11, the lower diffusion layer 102*pa*, the upper diffusion layer 107*p*11, the gate insulating film 105, and the gate electrode 106 constitute the PMOS transistor Tp11. The silicon pillar 104*n*12, the lower diffusion layer 102*pb*, the upper diffusion layer 107*p*12, the gate insulating film 105, and the gate electrode 106 constitute the PMOS transistor Tp12. The silicon pillar 104*n*13, the lower diffusion layer 102*pb*, the upper diffusion layer 107*p*13, the gate insulating film 105, and the gate electrode 106 constitute the PMOS transistor Tp13.

Further, the gate line 106*a* is connected to the gate electrode 106 of the NMOS transistor Tn11 and the gate electrode 106 of the PMOS transistor Tp11, the gate line 106*b* is connected to the gate electrode 106 of the NMOS transistor Tn12 and the gate electrode 106 of the PMOS transistor Tp12, and the gate line 106*c* is connected to the gate electrode 106 of the NMOS transistor Tn13 and the gate electrode 106 of the PMOS transistor Tp13.

The lower diffusion layers 102*na* and 102*pa* are connected to each other by using the silicide layer 103 to serve as a common drain of the NMOS transistor Tn11, the NMOS transistor Tn12, the NMOS transistor Tn13, and the PMOS transistor Tp11, and are connected to an output DEC1. The upper diffusion layer 107*n*11, which is the source of the NMOS transistor Tn11, is connected to the line 113*c* of the first metal wiring layer via the silicide layer 109*n*11 and the contact 110*n*11. The line 113*c* of the first metal wiring layer is connected to the line 115*d* of the second metal wiring layer via the contact 114*n*11. The reference power supply Vss is supplied to the line 115*d* of the second metal wiring layer.

The upper diffusion layer 107*n*12, which is the source of the NMOS transistor Tn12, is connected to the line 113*b* of the first metal wiring layer via the silicide layer 109*n*12 and the contact 110$n$12. The line 113$b$ of the first metal wiring layer is connected to the line 115$b$ of the second metal wiring layer via the contact 114$n$12. The reference power supply Vss is supplied to the line 115$b$ of the second metal wiring layer.

The upper diffusion layer 107$n$13, which is the source of the NMOS transistor Tn13, is connected to the line 113$a$ of the first metal wiring layer via the silicide layer 109$n$13 and the contact 110$n$13. The line 113$a$ of the first metal wiring layer is connected to the line 115$a$ of the second metal wiring layer via the contact 114$n$13. The reference power supply Vss is supplied to the line 115$a$ of the second metal wiring layer.

The upper diffusion layer 107$p$11, which is the source of the PMOS transistor Tp11, is connected to the line 113$d$ of the first metal wiring layer via the silicide layer 109$p$11 and the contact 110$p$11. The upper diffusion layer 107$p$12, which is the drain of the PMOS transistor Tp12, is connected to the line 113$d$ of the first metal wiring layer via the silicide layer 109$p$12 and the contact 110$p$12. Here, the source of the PMOS transistor Tp11 and the drain of the PMOS transistor Tp12 are connected to each other via the line 113$d$ of the first metal wiring layer. Further, the lower diffusion layer 102$pb$, which is covered with the silicide layer 103, serves as a source region of the PMOS transistor Tp12 and a drain region of the PMOS transistor Tp13, to which the source of the PMOS transistor Tp12 and the drain of the PMOS transistor Tp13 are connected, respectively. The upper diffusion layer 107$p$13, which is the source of the PMOS transistor Tp13, is connected to the line 115$j$ of the second metal wiring layer via the silicide layer 109$p$13, the contact 110$p$13, the line 113$e$ of the first metal wiring layer, and the contact 114$p$13. The power supply Vcc is supplied to the line 115$j$ of the second metal wiring layer.

The line 115$e$ of the second metal wiring layer is supplied with an address signal A1. The line 115$e$ of the second metal wiring layer is connected to the gate line 106$a$ via the contact 114$k$, the line 113$k$ of the first metal wiring layer, and the contact 111$k$, and accordingly the address signal A1 is supplied to the gate electrode 106 of the NMOS transistor Tn11 and the gate electrode 106 of the PMOS transistor Tp11.

The line 115$g$ of the second metal wiring layer is supplied with an address signal A2. The line 115$g$ of the second metal wiring layer is connected to the gate line 106$b$ via the contact 114$m$, the line 113$m$ of the first metal wiring layer, and the contact 111$m$, and accordingly the address signal A2 is supplied to the gate electrode 106 of the NMOS transistor Tn12 and the gate electrode 106 of the PMOS transistor Tp12.

The line 115$h$ of the second metal wiring layer is supplied with an address signal A3. The line 115$h$ of the second metal wiring layer is connected to the gate line 106$c$ via the contact 114$n$, the line 113$n$ of the first metal wiring layer, and the contact 111$n$, and accordingly the address signal A3 is supplied to the gate electrode 106 of the NMOS transistor Tn13 and the gate electrode 106 of the PMOS transistor Tp13.

It is to be noted that, in FIG. 2A, a size in the longitudinal direction (the second direction) is a minimum processing size determined by the size of an SGT, a margin between an SGT and a lower diffusion layer, and an interval between diffusion layers, and is defined as Ly. That is, a plurality of 3-input NOR decoders, each of which is the 3-input NOR decoder 101 according to this exemplary embodiment, can be arranged vertically adjacent to one another at a minimum pitch (minimum interval) Ly.

According to this exemplary embodiment, six SGTs constituting a 3-input NOR decoder are arranged in a line in a first direction and the reference power supply line Vss, the power supply line Vcc, and the address signal lines A1, A2, and A3 are arranged to extend in a second direction perpendicular to the first direction. This configuration provides a semiconductor device including a 3-input NOR decoder with a reduced area without using any extra lines or contact regions.

Second Exemplary Embodiment

Equivalent Circuit Applicable to Exemplary Embodiment of Present Invention

Figure 4:
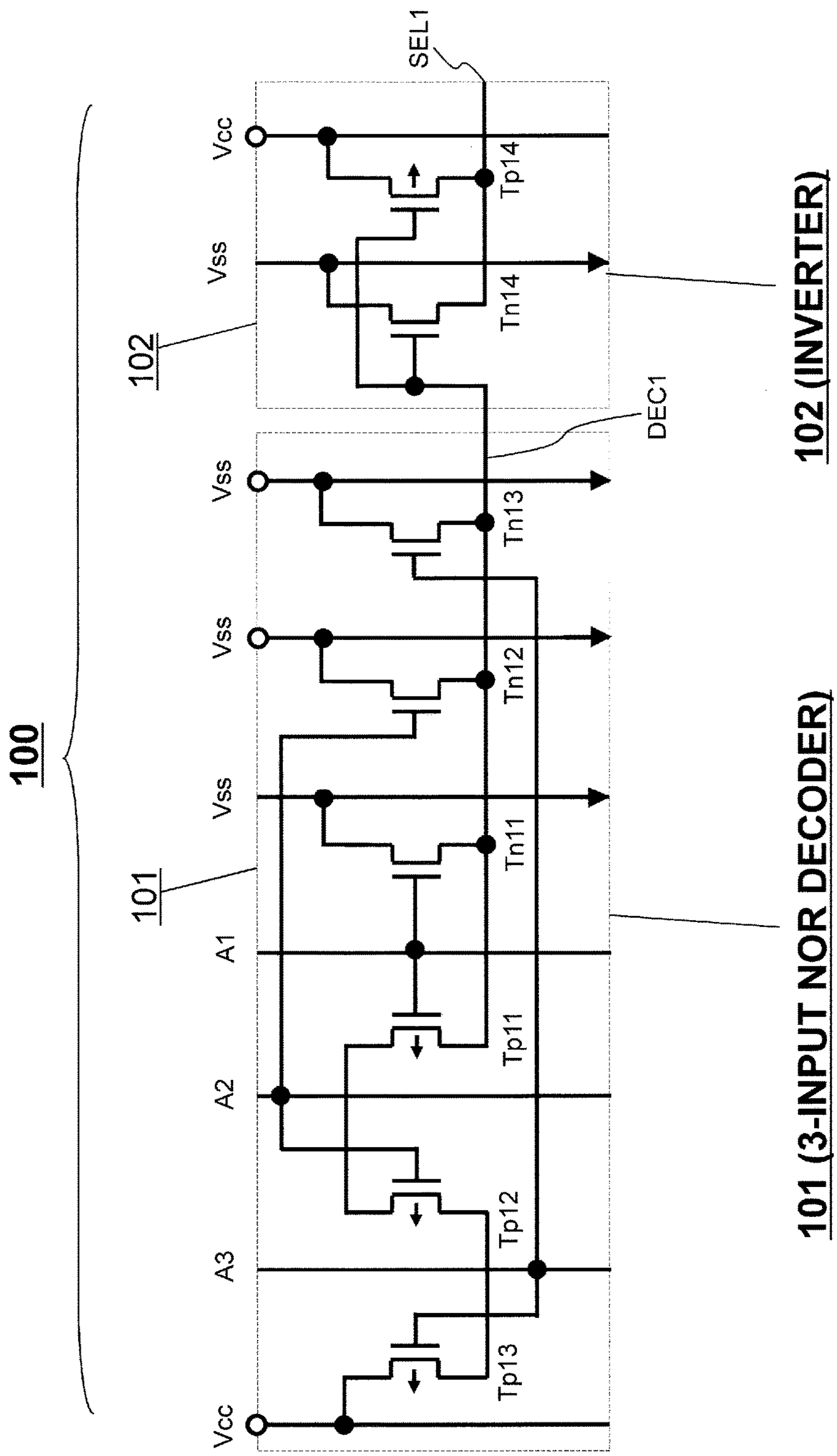
FIG. 4 is an equivalent circuit diagram illustrating a decoder according to a second exemplary embodiment of the present invention.

FIG. 4 illustrates a circuit diagram of a decoder arranged in accordance with an arrangement according to an exemplary embodiment. The decoder includes a 3-input NOR decoder and an inverter applicable to the present invention.

In FIG. 4, a 3-input NOR decoder 101 is the same or substantially the same as that illustrated in FIG. 1. An inverter 102 including an NMOS transistor Tn14 and a PMOS transistor Tp14 is added to the configuration illustrated in FIG. 1 to form a decoder 100. The gate of the NMOS transistor Tn14 and the gate of the PMOS transistor Tp14 are connected in common to the output terminal DEC1 of the 3-input NOR decoder 101. The drain of the NMOS transistor Tn14 and the drain of the PMOS transistor Tp14 are connected in common to serve as a decoder output SEL1. The source of the NMOS transistor Tn14 and the source of the PMOS transistor Tp14 are respectively connected to a reference power supply Vss and a power supply Vcc.

As described above, the addition of the inverter 102 to the NOR decoder 101 with a positive logic output results in the output SEL1 of the decoder 100 being a negative logic output (the output of a selected decoder is logic "0"). Here, the inverter 102 has both a logic inversion function and a buffer function (for amplifying the driving capability of the NOR decoder 101).

Figure 5:
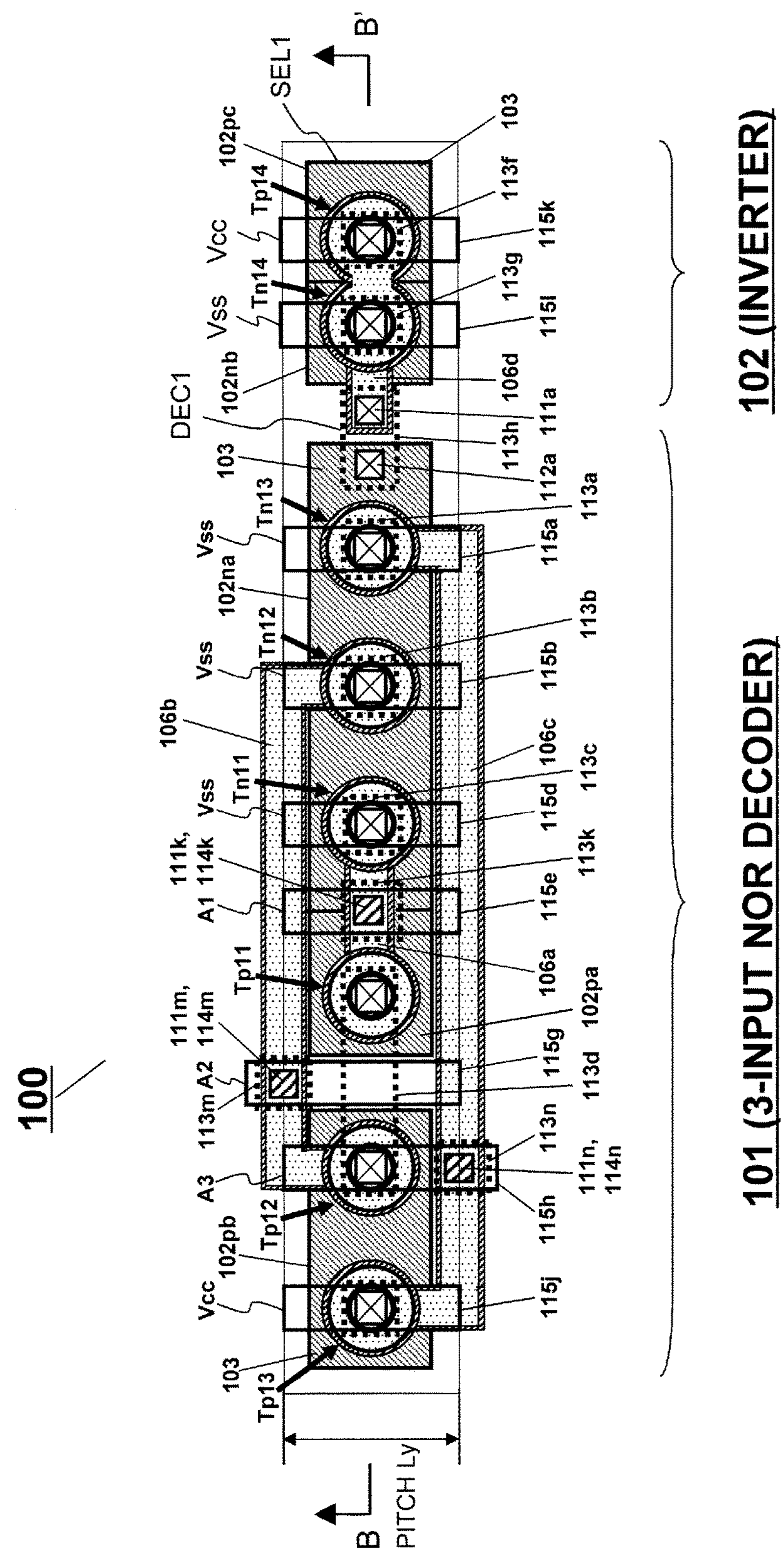
FIG. 5 is a plan view of the decoder according to the second exemplary embodiment of the present invention.
Figure 6:
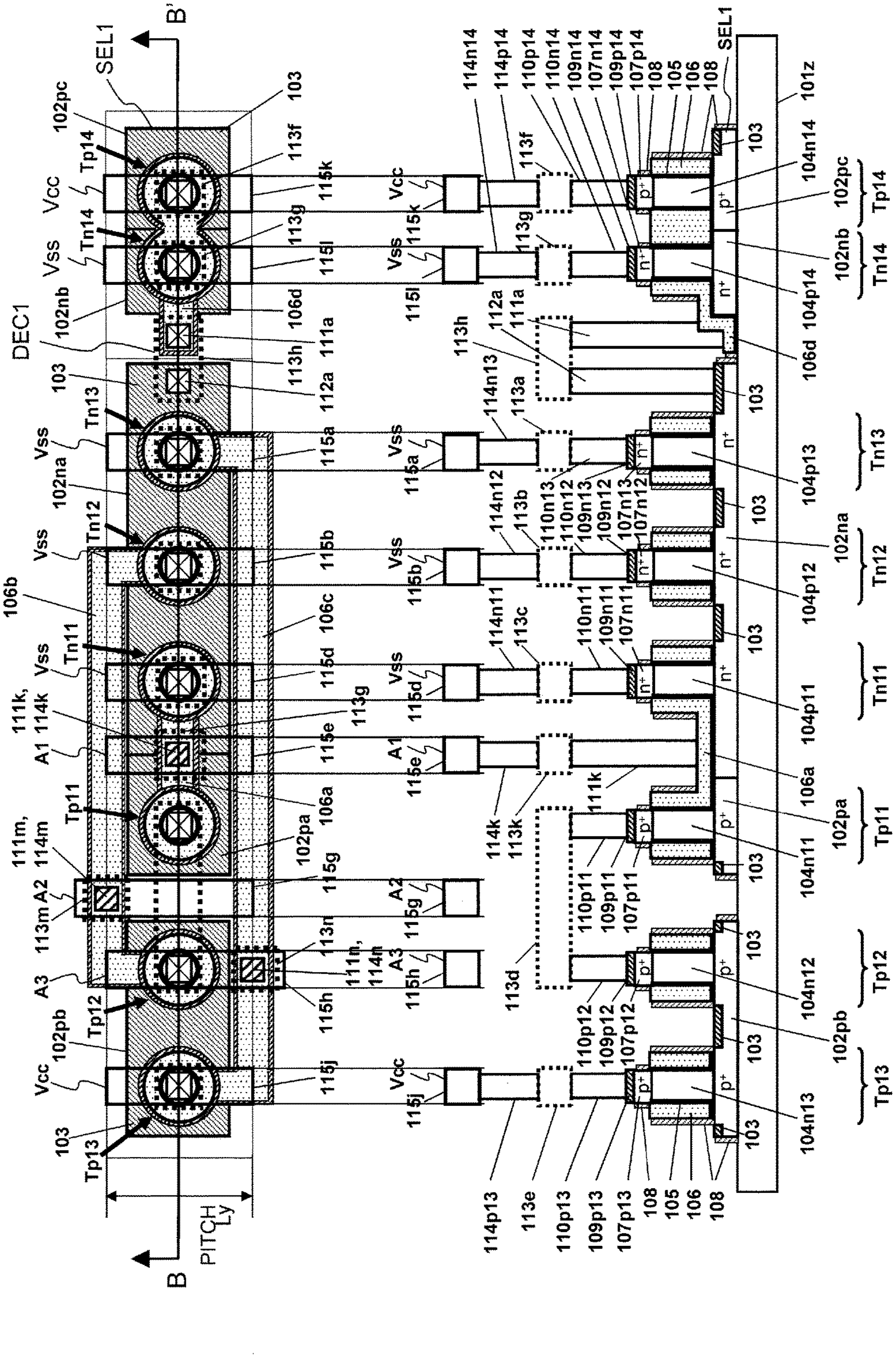
FIG. 6 is a cross-sectional view of the decoder according to the second exemplary embodiment of the present invention.

FIGS. 5 and 6 illustrate a second exemplary embodiment as an exemplary embodiment in which the equivalent circuit illustrated in FIG. 4 is applied to the present invention. FIG. 5 is a plan view of the layout (arrangement) of the 3-input NOR decoder 101 and the inverter 102 according to this exemplary embodiment. FIG. 6 is a cross-sectional view taken along the cut-line B-B' in FIG. 5 and corresponds to FIG. 3B.

In FIGS. 5 and 6, portions having the same or substantially the same structures as those illustrated in FIGS. 2A and 3B are denoted by equivalent reference numerals in the 100s.

In FIG. 5, the PMOS transistor Tp14 and the NMOS transistor Tn14, which constitute the inverter 102, and the six SGTs constituting the 3-input NOR decoder 101, namely, the NMOS transistors Tn13, Tn12, and Tn11 and the PMOS transistors Tp11, Tp12, and Tp13, are arranged in a line in a lateral direction (a first direction) from right to left in this figure.

The 3-input NOR decoder 101 illustrated in FIG. 5 is the same or substantially the same as that illustrated in FIG. 2A, and the inverter 102, which is not illustrated in FIG. 2A, will be described in detail.

Planar silicon layers 102$nb$ and 102$pc$ are formed on top of the insulating film such as the buried oxide (BOX) film layer 101$z$ disposed on the substrate. The planar silicon layers 102$nb$ and 102$pc$ are formed as an n+ diffusion layer and a p+ diffusion layer, respectively, through impurity implantation or the like. Reference numeral 103 denotes a silicide layer disposed on surfaces of the planar silicon layers (102*nb* and 102*pc*). The silicide layer 103 connects the planar silicon layers 102*nb* and 102*pc* to each other. Reference numeral 104*p*14 denotes a p-type silicon pillar, and reference numeral 104*n*14 denotes an n-type silicon pillar. Reference numeral 105 denotes a gate insulating film that surrounds the silicon pillars 104*p*14 and 104*n*14. Reference numeral 106 denotes a gate electrode, and reference numeral 106*d* denotes a gate line.

In top portion of the silicon pillar 104*p*14, an n+ diffusion layer 107*n*14 is formed through impurity implantation or the like. In top portion of the silicon pillar 104*n*14, a p+ diffusion layer 107*p*14 is formed through impurity implantation or the like. Reference numeral 108 denotes a silicon nitride film for protecting the gate insulating film 105, and reference numerals 109*n*14 and 109*p*14 denote silicide layers to be respectively connected to the n+ diffusion layer 107*n*14 and the p+ diffusion layer 107*p*14.

Reference numerals 110*n*14 and 110*p*14 denote contacts that respectively connect the silicide layers 109*n*14 and 109*p*14 to lines 113*g* and 113*f* of the first metal wiring layer. Reference numeral 111*a* denotes a contact that connects the gate line 106*d* to a line 113*h* of the first metal wiring layer. Reference numeral 112*a* denotes a contact that connects the silicide layer 103, which is the output DEC1 of the 3-input NOR decoder 101, to the line 113*h* of the first metal wiring layer. Reference numeral 114*n*14 denotes a contact that connects the line 113*g* of the first metal wiring layer to a line 115*l* of the second metal wiring layer, and reference numeral 114*p*14 denotes a contact that connects the line 113*f* of the first metal wiring layer to a line 115*k* of the second metal wiring layer.

The silicon pillar 104*p*14, the lower diffusion layer 102*nb*, the upper diffusion layer 107*n*14, the gate insulating film 105, and the gate electrode 106 constitute the NMOS transistor Tn14. The silicon pillar 104*n*14, the lower diffusion layer 102*pc*, the upper diffusion layer 107*p*14, the gate insulating film 105, and the gate electrode 106 constitute the PMOS transistor Tp14.

Further, the gate electrode 106 of the NMOS transistor Tn14 and the gate electrode 106 of the PMOS transistor Tp14 are connected in common, to which the gate line 106*d* is connected.

The lower diffusion layers 102*nb* and 102*pc* are connected to each other by using the silicide layer 103 to serve as a common drain of the NMOS transistor Tn14 and the PMOS transistor Tp14, and are connected to the output SELL The upper diffusion layer 107*n*14, which is a source region of the NMOS transistor Tn14, is connected to the line 113*g* of the first metal wiring layer via the silicide layer 109*n*14 and the contact 110*n*14. The line 113*g* of the first metal wiring layer is connected to the line 115*l* of the second metal wiring layer via the contact 114*n*14. The reference power supply Vss is supplied to the line 115*l* of the second metal wiring layer.

The upper diffusion layer 107*p*14, which is a source region of the PMOS transistor Tp14, is connected to the line 113*f* of the first metal wiring layer via the silicide layer 109*p*14 and the contact 110*p*14. The line 113*f* of the first metal wiring layer is connected to the line 115*k* of the second metal wiring layer via the contact 114*p*14. The power supply Vcc is supplied to the line 115*k* of the second metal wiring layer.

The line 115*e* of the second metal wiring layer is supplied with an address signal A1. The line 115*e* of the second metal wiring layer is connected to the gate line 106*a* via the contact 114*k*, the line 113*k* of the first metal wiring layer, and the contact 111*k*, and accordingly the address signal A1 is supplied to the gate electrode 106 of the NMOS transistor Tn11 and the gate electrode 106 of the PMOS transistor Tp11.

The line 115*g* of the second metal wiring layer is supplied with an address signal A2. The line 115*g* of the second metal wiring layer is connected to the gate line 106*b* via the contact 114*m*, the line 113*m* of the first metal wiring layer, and the contact 111*m*, and accordingly the address signal A2 is supplied to the gate electrode 106 of the NMOS transistor Tn12 and the gate electrode 106 of the PMOS transistor Tp12.

The line 115*h* of the second metal wiring layer is supplied with an address signal A3. The line 115*h* of the second metal wiring layer is connected to the gate line 106*c* via the contact 114*n*, the line 113*n* of the first metal wiring layer, and the contact 111*n*, and accordingly the address signal A3 is supplied to the gate electrode 106 of the NMOS transistor Tn13 and the gate electrode 106 of the PMOS transistor Tp13.

It is to be noted that, in FIG. 5, as in FIG. 2A, a size in the longitudinal direction (the second direction) is a minimum processing size determined by the size of an SGT, a margin between an SGT and a lower diffusion layer, and an interval between diffusion layers, and is defined as Ly. That is, a plurality of decoders 100, each of which is the decoder 100 (the 3-input NOR decoder 101 and the inverter 102) according to this exemplary embodiment, can be arranged vertically adjacent to one another at a minimum pitch (minimum interval) Ly.

According to this exemplary embodiment, six SGTs constituting a 3-input NOR decoder and two SGTs constituting an inverter are arranged in a line in a first direction and the reference power supply line Vss, the power supply line Vcc, and the address signal lines A1, A2, and A3 are arranged to extend in a second direction perpendicular to the first direction. This configuration provides a semiconductor device including a decoder (a 3-input NOR decoder and an inverter) with a reduced area without using any extra lines or contact regions.

Third Exemplary Embodiment

Equivalent Circuit Applicable to Exemplary Embodiment of Present Invention

Figure 7:
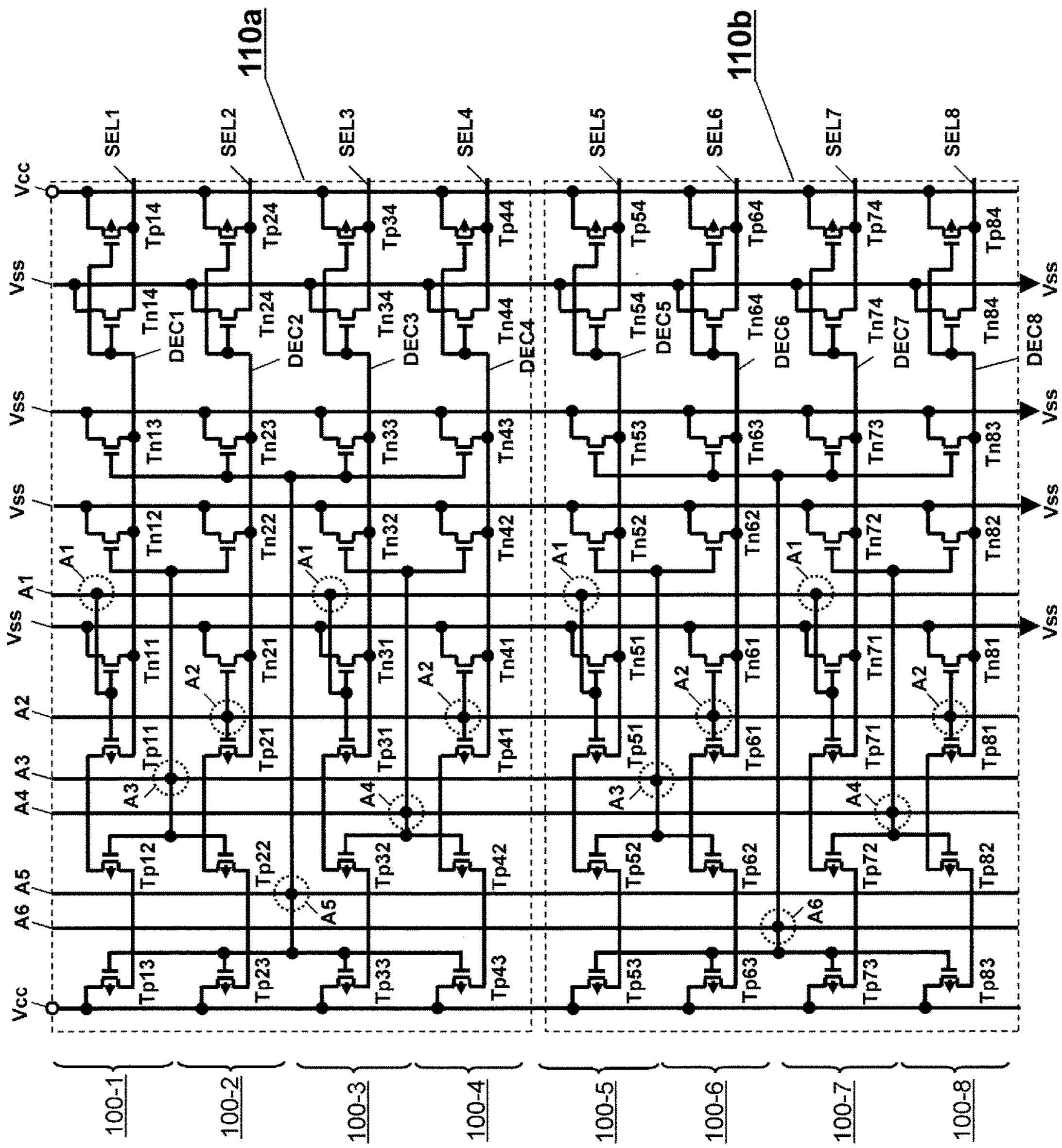
FIG. 7 is an equivalent circuit diagram illustrating a decoder according to a third exemplary embodiment of the present invention.

FIG. 7 illustrates an equivalent circuit diagram of decoders, each constructed by arranging a plurality of 3-input NOR decoders and a plurality of inverters applicable to the present invention.

Six address signal lines A1, A2, A3, A4, A5, and A6 are provided, in which the address signal lines A1 and A2 are selectively connected to the gate of an NMOS transistor Tnk1 (where k denotes a natural number) and the gate of a PMOS transistor Tpk1, the address signal lines A3 and A4 are selectively connected to the gate of an NMOS transistor Tnk2 and the gate of a PMOS transistor Tpk2, and the address signal lines A5 and A6 are selectively connected to the gate of an NMOS transistor Tnk3 and the gate of a PMOS transistor Tpk3. Eight decoders 100-1 to 100-8 are formed by using the six address signals A1 to A6. The address signal lines A1, A3, and A5 are connected to the decoder 100-1. The address signal lines A2, A3, and A5 are connected to the decoder 100-2. The address signal lines A1, A4, and A5 are connected to the decoder 100-3. The address signal lines A2, A4, and A5 are connected to the decoder 100-4. The address signal lines A1, A3, and A6 are connected to the decoder 100-5. The address signal lines A2, A3, and A6 are connected to the decoder 100-6. The address signal lines A1, A4, and A6 are connected to the decoder 100-7. The address signal lines A2, A4, and A6 are connected to the decoder 100-8.

Portions at which address signal lines are connected are indicated by the broken-line circles.

As described below, the address signal line A3 is connected in common to the decoders 100-1 and 100-2 and is also connected in common to the decoder 100-5 and the decoder 100-6. The address signal line A4 is connected in common to the decoders 100-3 and 100-4 and is also connected in common to the decoders 100-7 and 100-8. The address signal line A5 is connected in common to the decoders 100-1 to 100-4, and the address signal line A6 is connected in common to the decoders 100-5 to 100-8.

FIG. 8 illustrates an address map of the eight decoders illustrated in FIG. 7. An address signal line to be connected to each of the decoder outputs DEC1/SEL1 to DEC8/SEL8 is marked with a circle. Connections are made by using contacts, as described below.

Figure 9A:
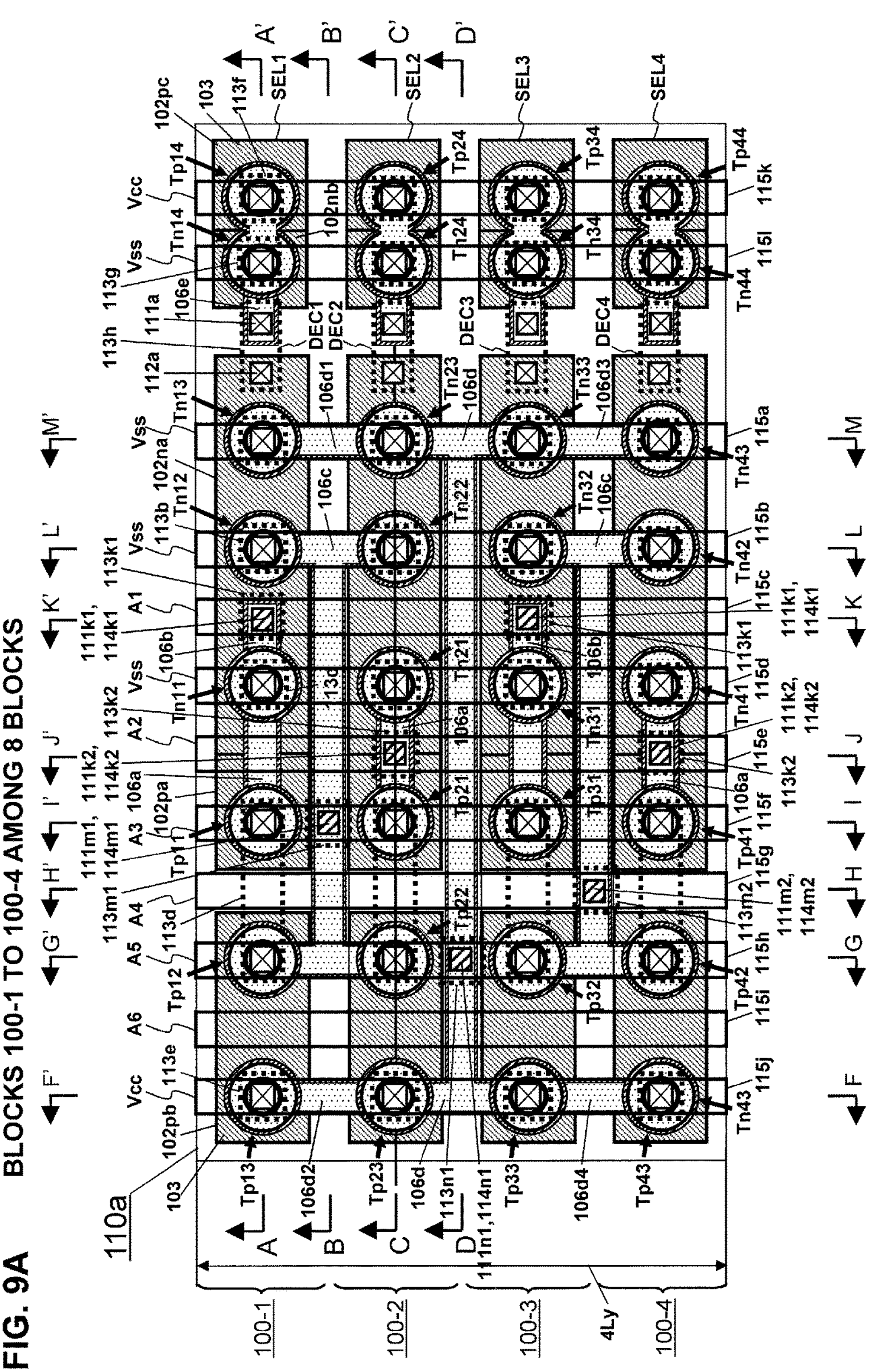
FIG. 9A is a plan view of the decoder according to the third exemplary embodiment of the present invention.
Figure 9C:
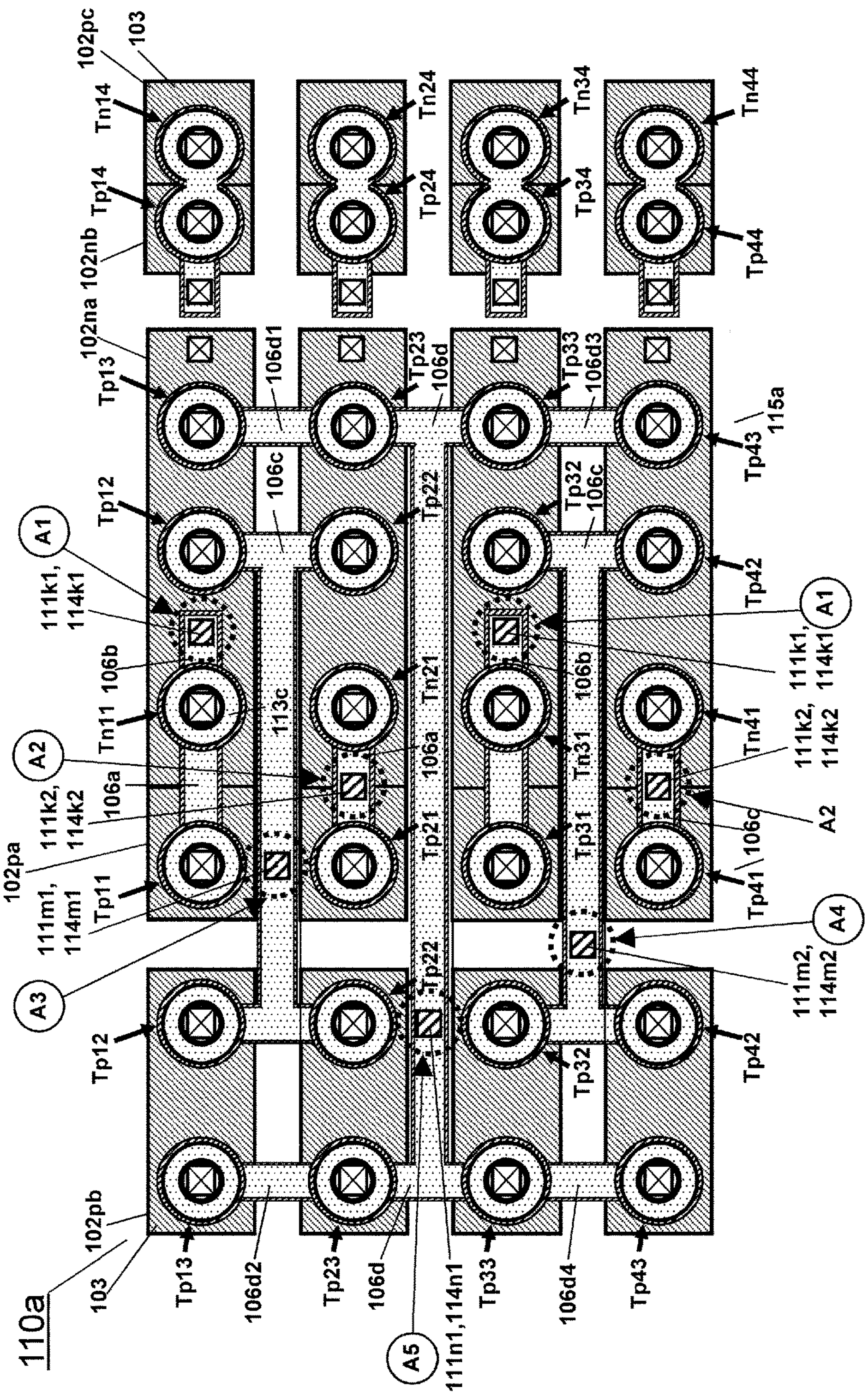
FIG. 9C is a plan view of the decoder according to the third exemplary embodiment of the present invention.
Figure 9D:
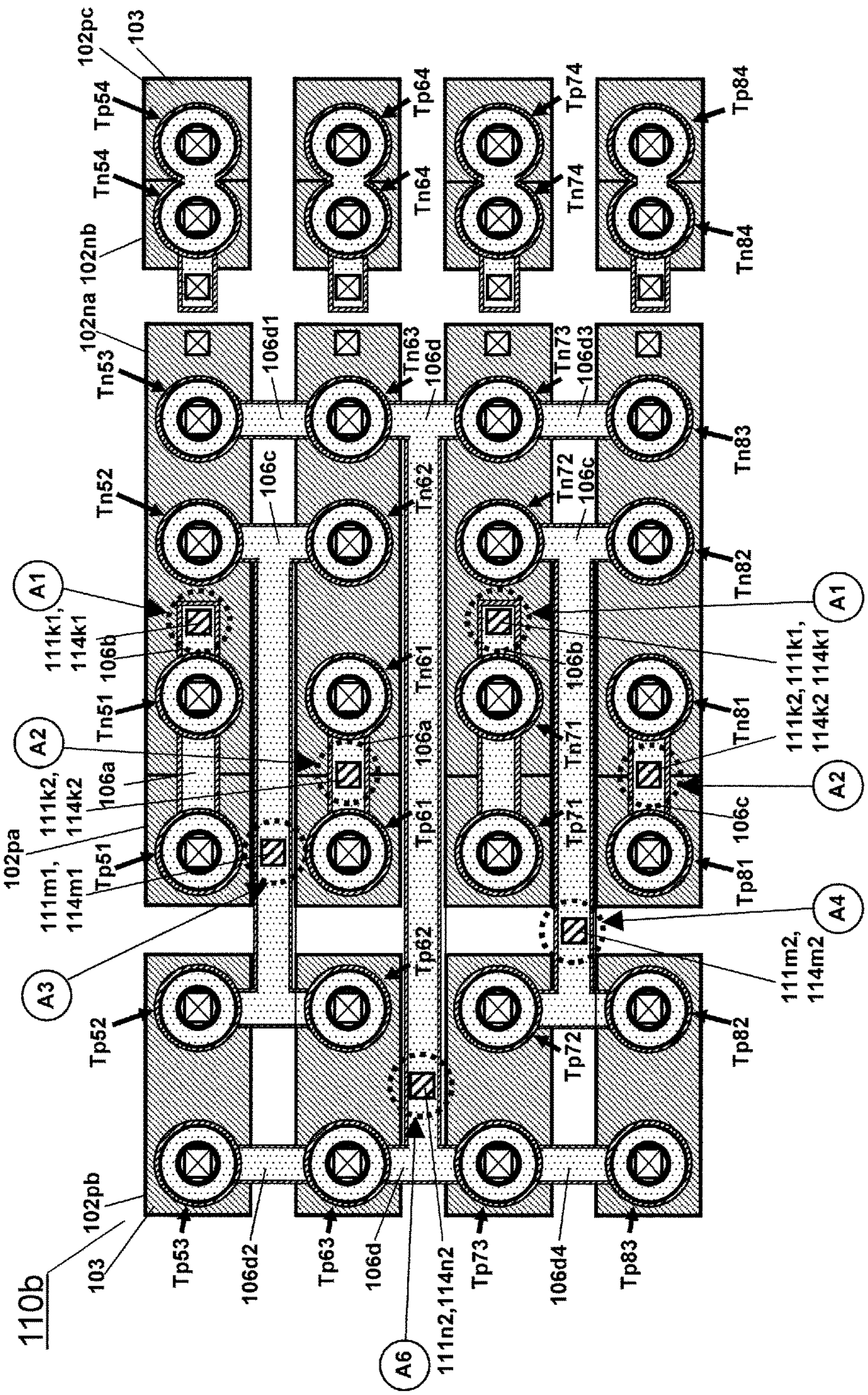
FIG. 9D is a plan view of the decoder according to the third exemplary embodiment of the present invention.

FIGS. 9A to 9D and FIGS. 10A to 10M illustrate a third exemplary embodiment. This exemplary embodiment illustrates an implementation of the equivalent circuit illustrated in FIG. 7, in which the eight decoders 100-1 to 100-8, each of which is the decoder 100 illustrated in FIG. 5, are arranged vertically (in the second direction) in the figures adjacent to one another at a minimum pitch Ly. In the arrangement, the decoders 100-1, 100-3, 100-5, and 100-7 are each constructed by arranging the decoder 100 illustrated in FIG. 5 in a vertically inverted configuration, and the decoders 100-2, 100-4, 100-6, and 100-8 are each constructed by arranging the decoder 100 illustrated in FIG. 5 in a non-inverted configuration. This configuration allows each decoder to share the gate line 106*c* or the gate line 106*d* of an adjacent decoder and can result in the pitch in the longitudinal direction being minimized. FIGS. 9A and 9B are plan views of the layout (arrangement) of the 3-input NOR decoders and the inverters according to the third exemplary embodiment of the present invention, and FIGS. 9C and 9D illustrate only the lower diffusion layers, the transistors, and the gate lines depicted in the plan views of FIGS. 9A and 9B to facilitate the understanding of the connections between the address signal lines and the gate lines.

Figure 10A:
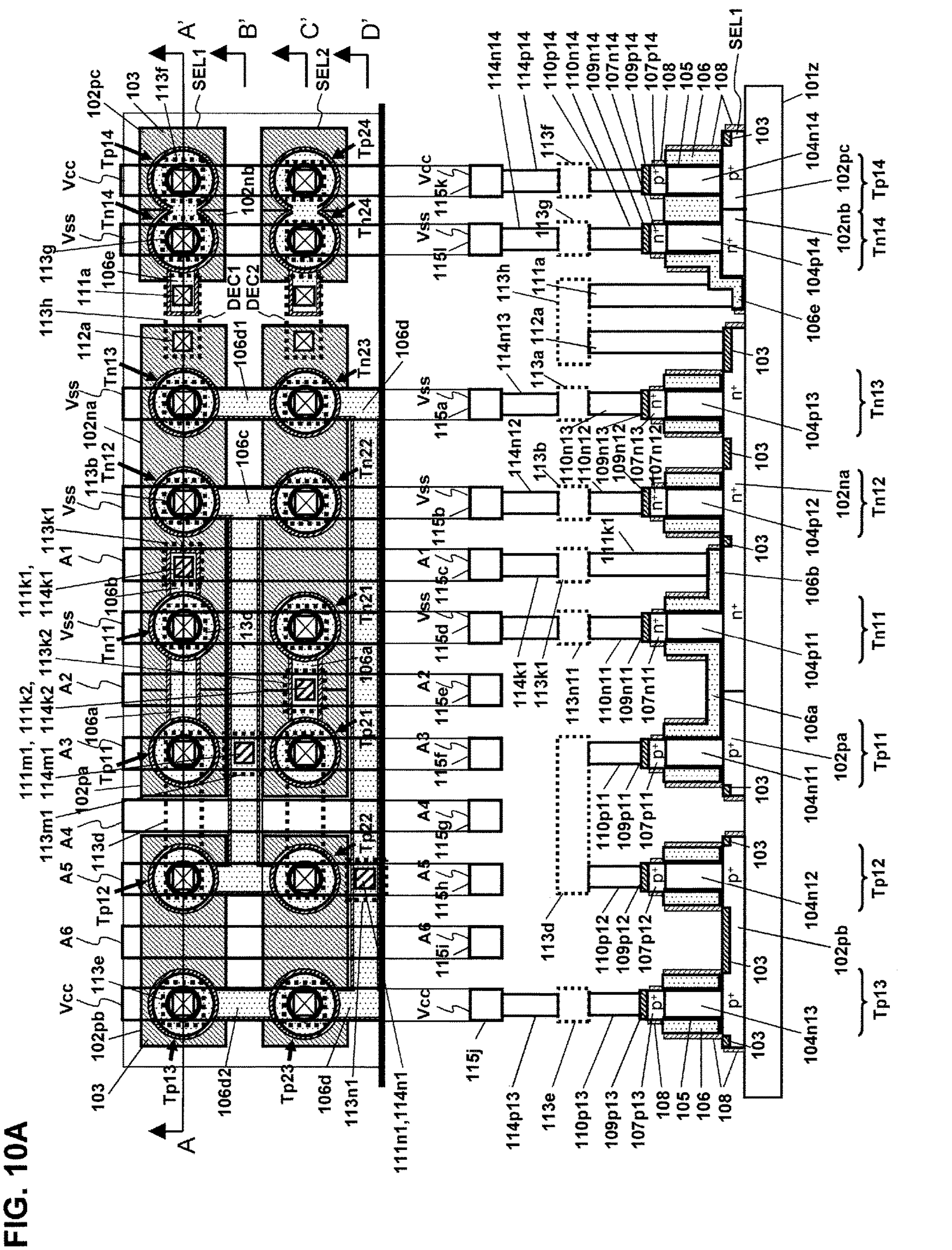
FIG. 10A is a cross-sectional view of the decoder according to the third exemplary embodiment of the present invention.
Figure 10B:
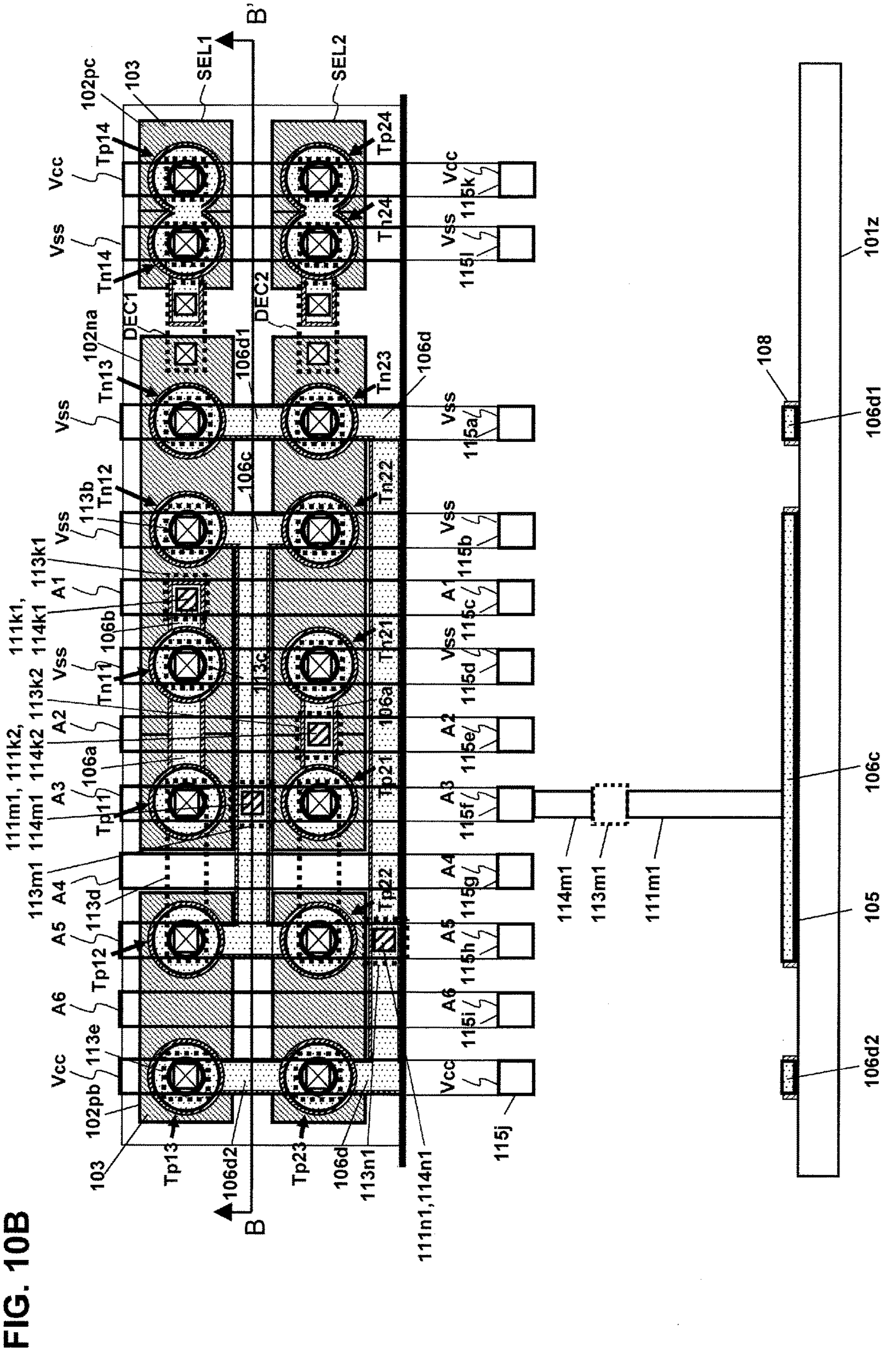
FIG. 10B is a cross-sectional view of the decoder according to the third exemplary embodiment of the present invention.
Figure 10C:
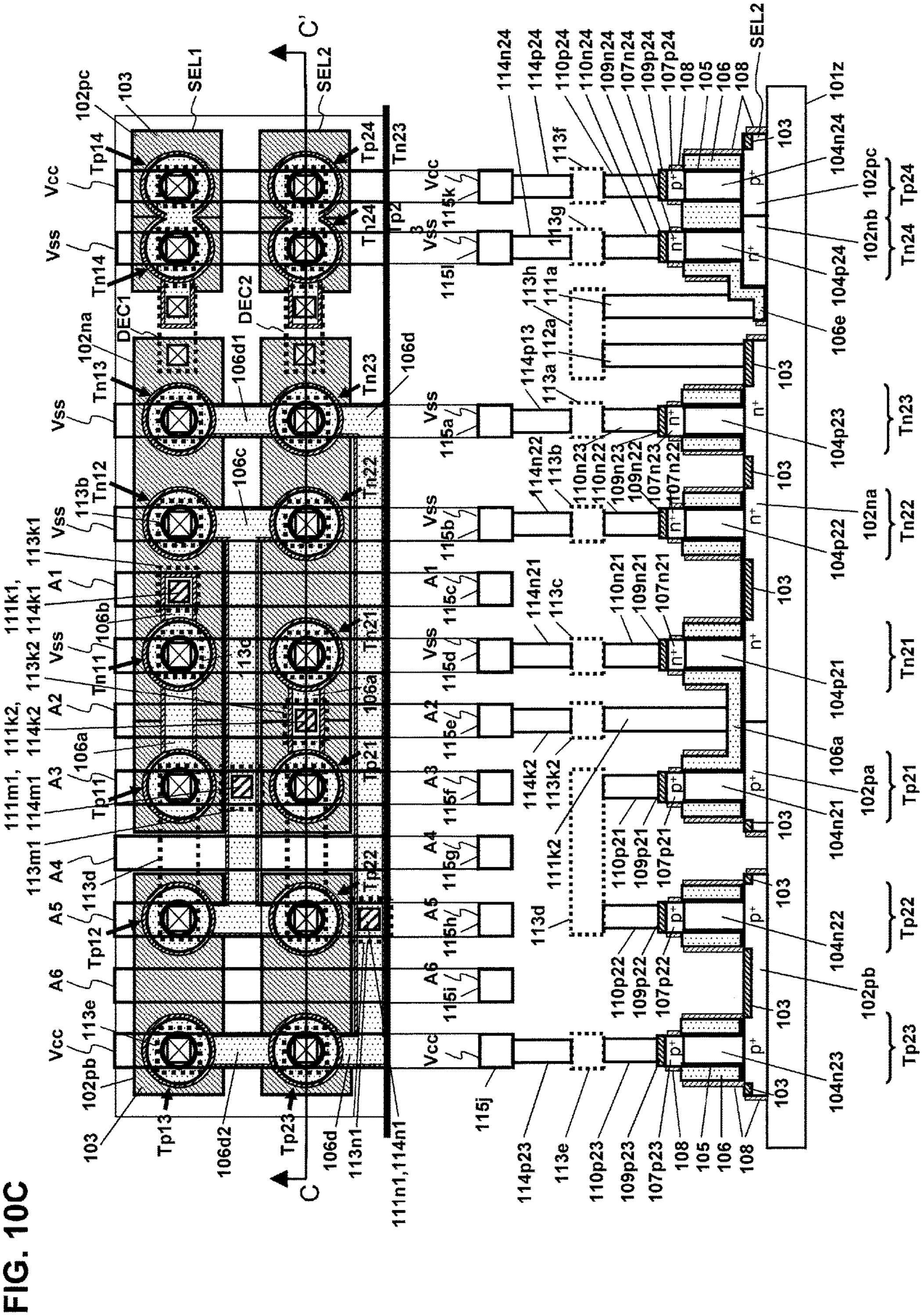
FIG. 10C is a cross-sectional view of the decoder according to the third exemplary embodiment of the present invention.
Figure 10D:
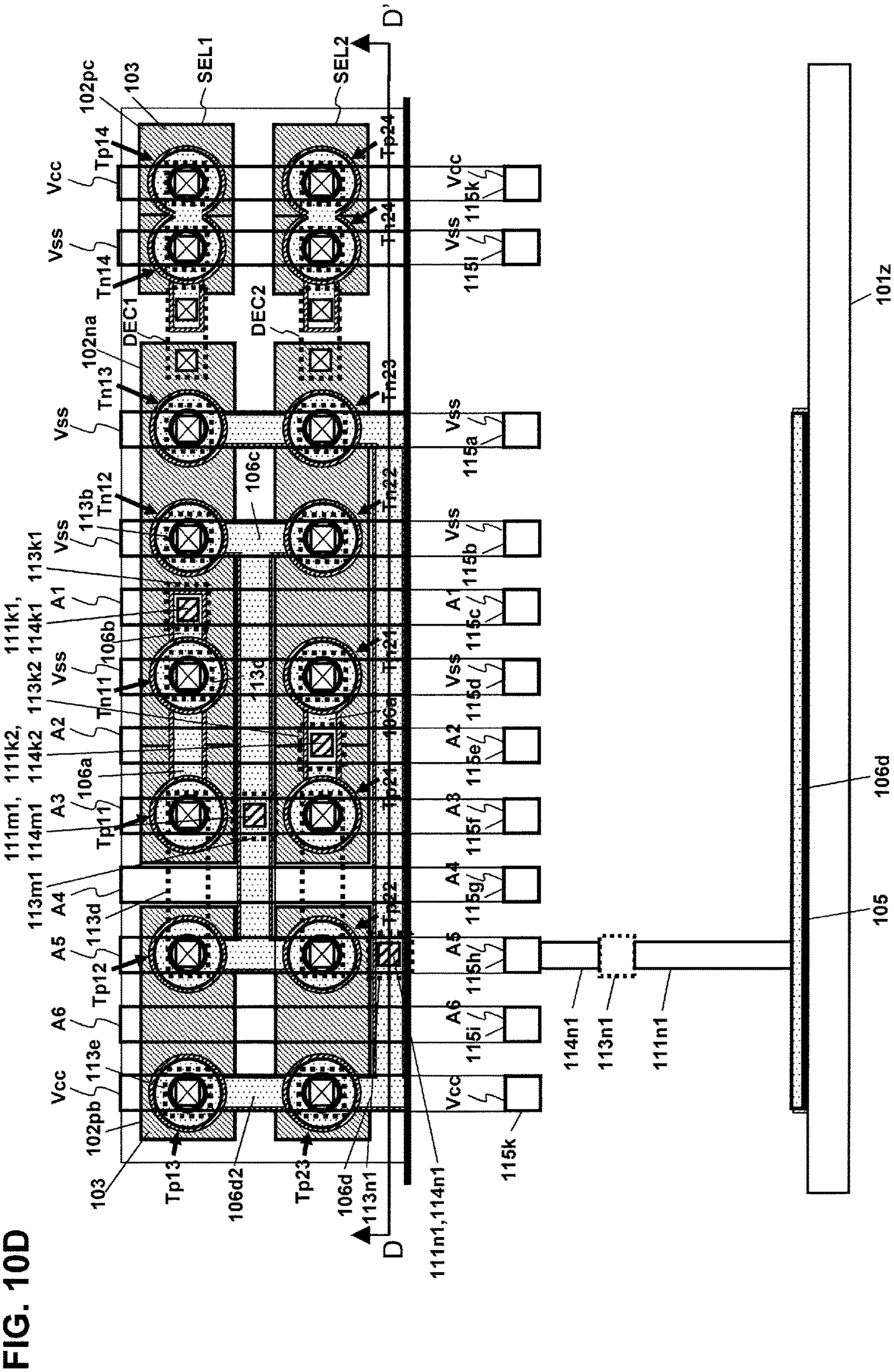
FIG. 10D is a cross-sectional view of the decoder according to the third exemplary embodiment of the present invention.
Figure 10E:
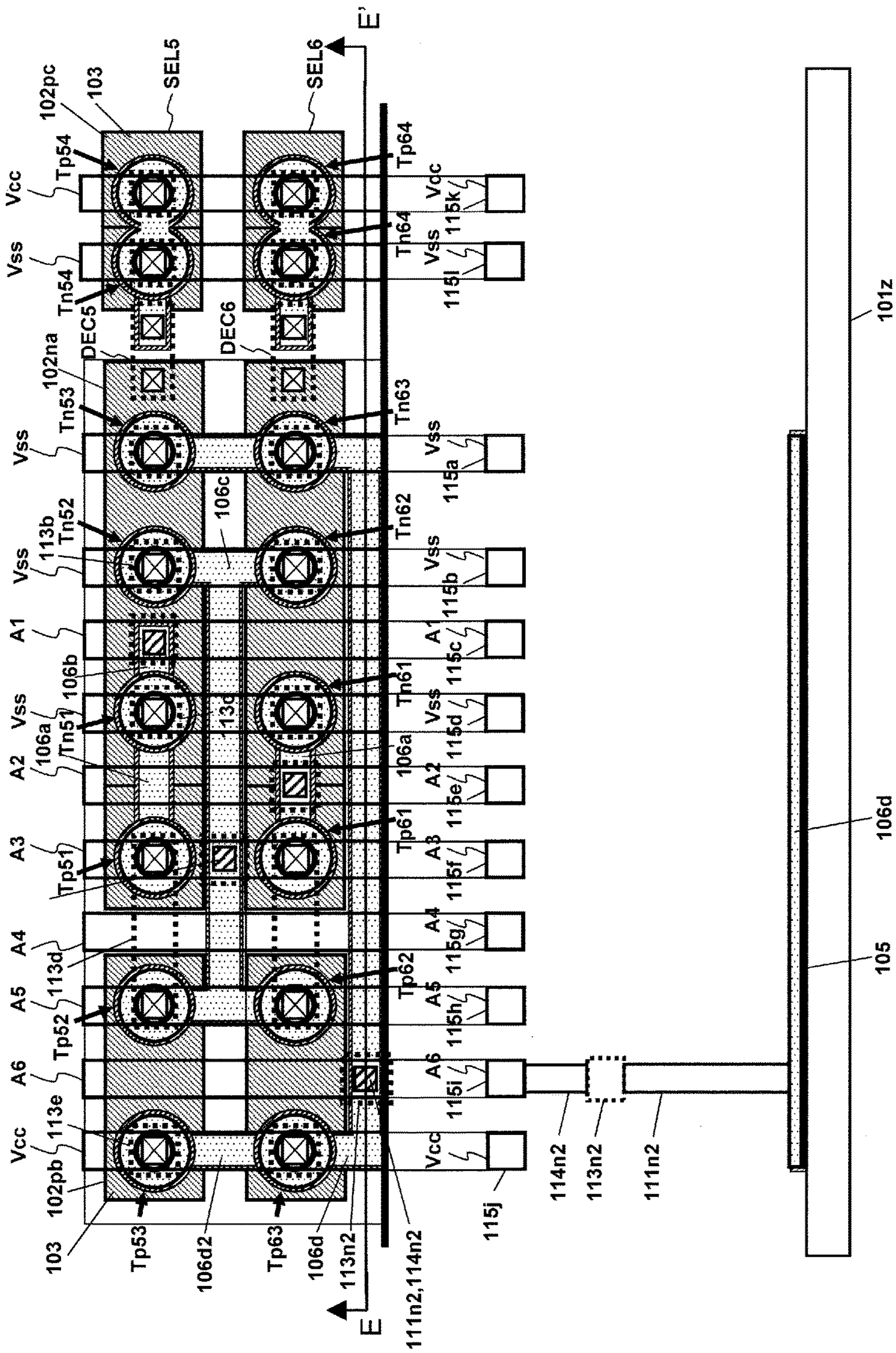
FIG. 10E is a cross-sectional view of the decoder according to the third exemplary embodiment of the present invention.
Figure 10F:
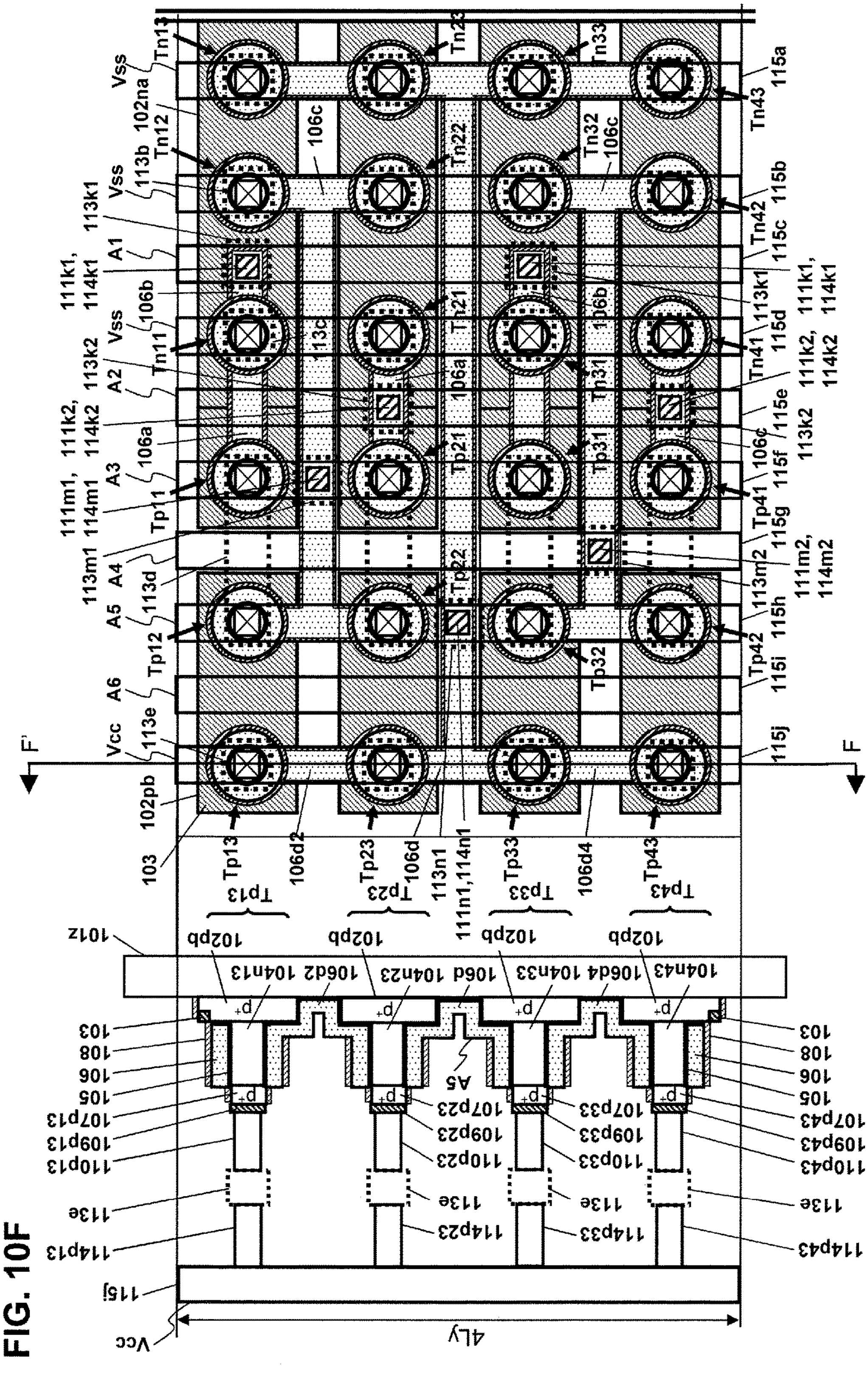
FIG. 10F is a cross-sectional view of the decoder according to the third exemplary embodiment of the present invention.
Figure 10G:
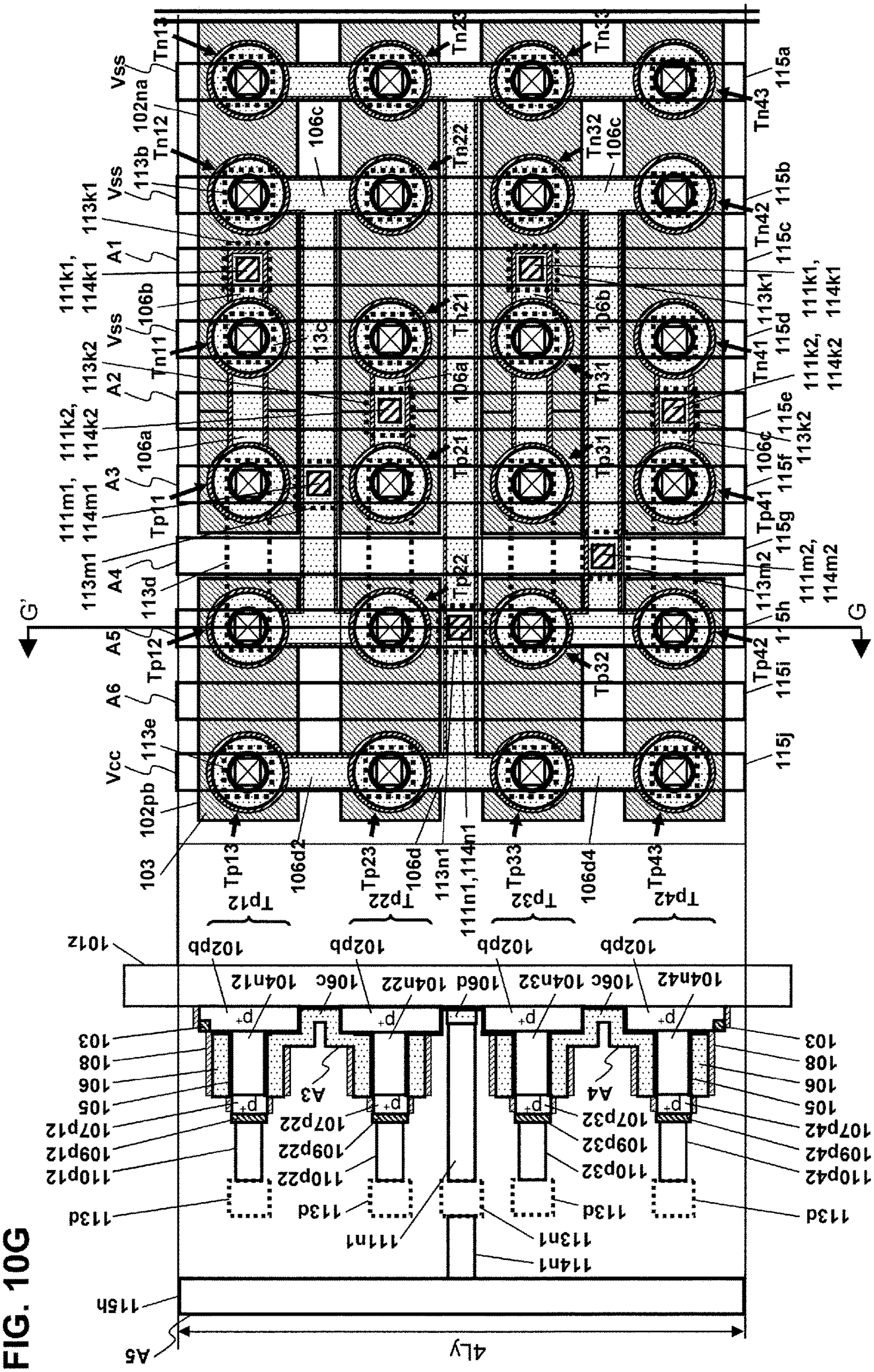
FIG. 10G is a cross-sectional view of the decoder according to the third exemplary embodiment of the present invention.
Figure 10H:
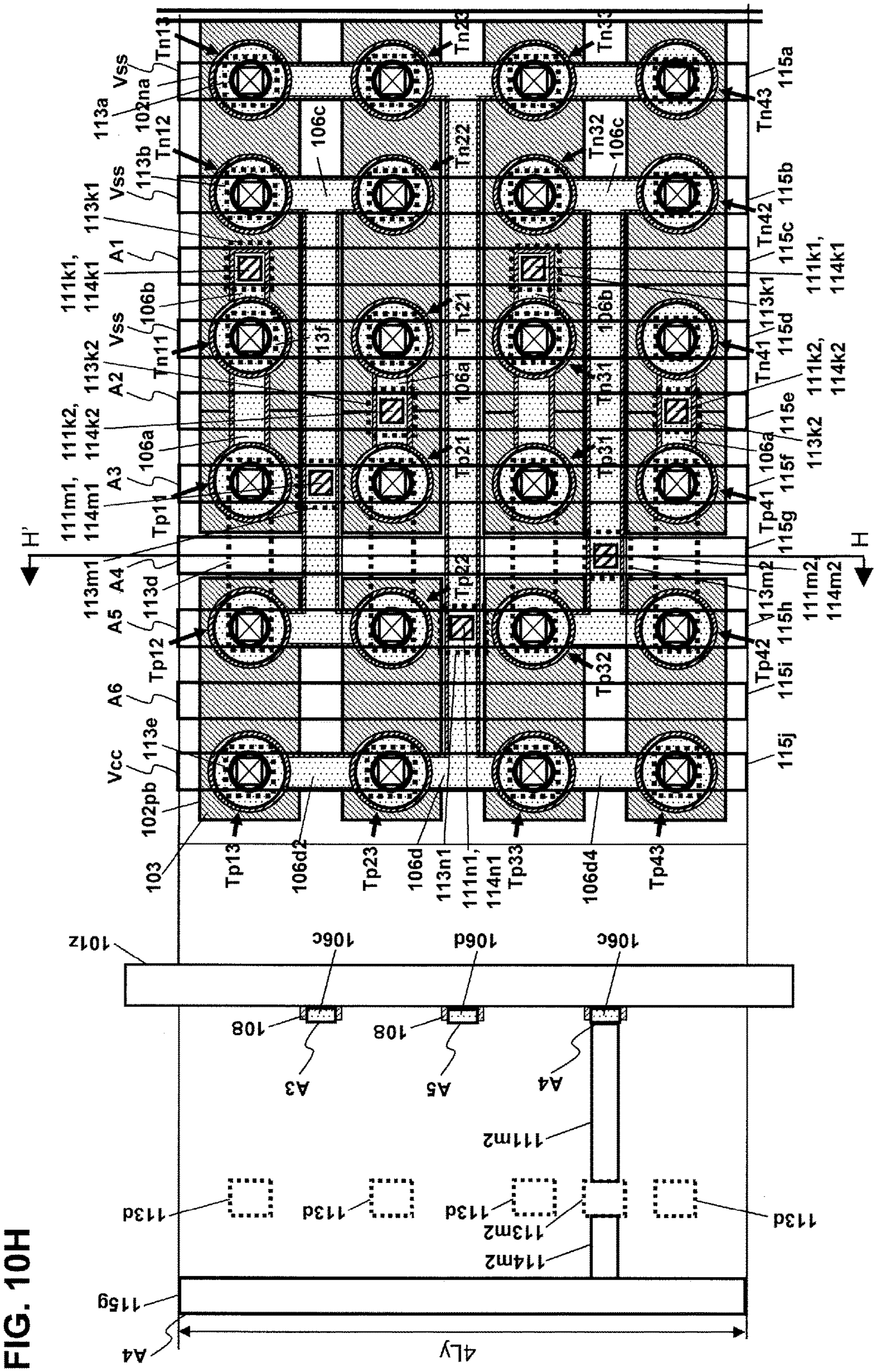
FIG. 10H is a cross-sectional view of the decoder according to the third exemplary embodiment of the present invention.
Figure 10I:
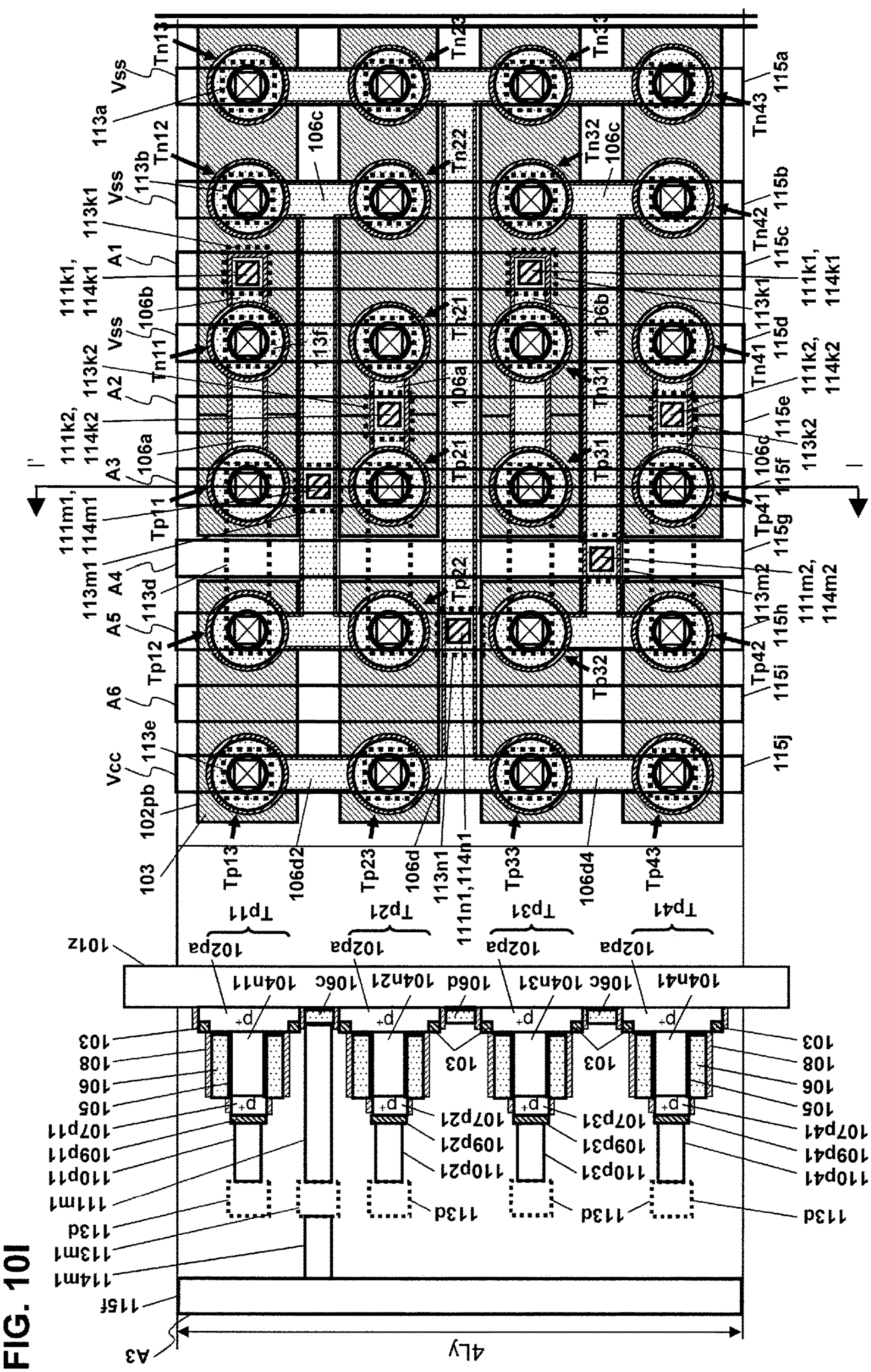
FIG. 10I is a cross-sectional view of the decoder according to the third exemplary embodiment of the present invention.
Figure 10J:
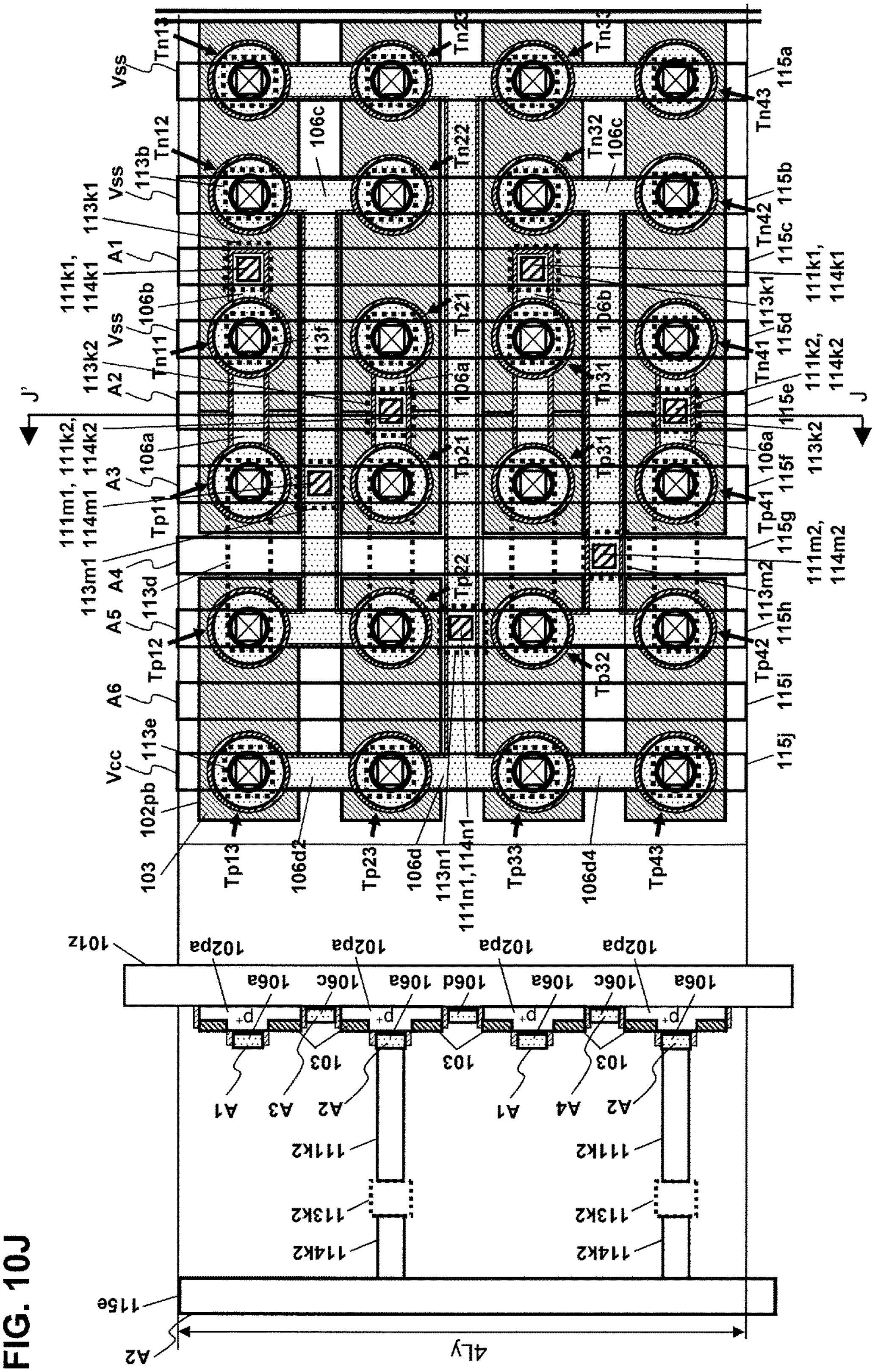
FIG. 10J is a cross-sectional view of the decoder according to the third exemplary embodiment of the present invention.
Figure 10K:
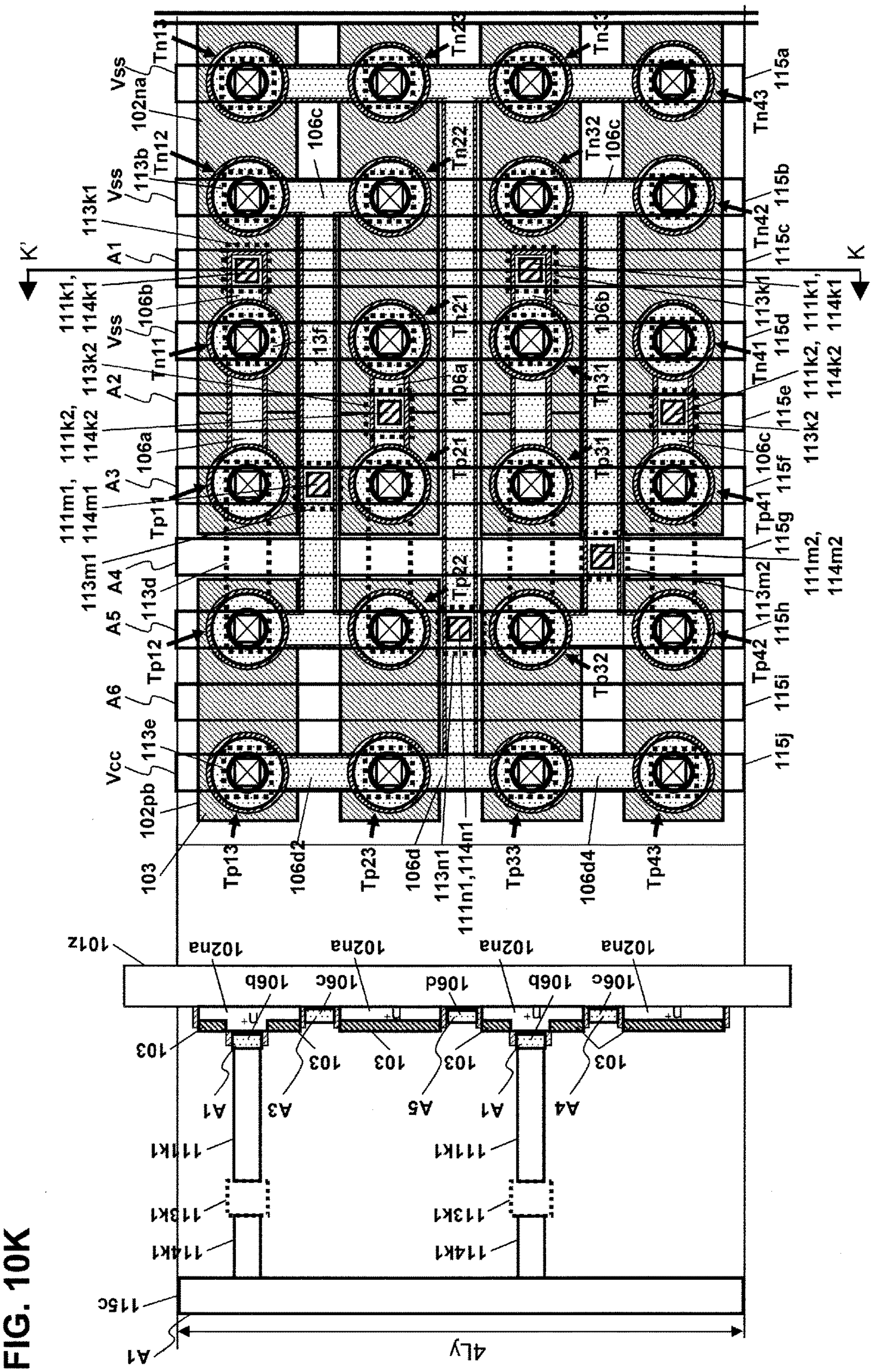
FIG. 10K is a cross-sectional view of the decoder according to the third exemplary embodiment of the present invention.
Figure 10L:
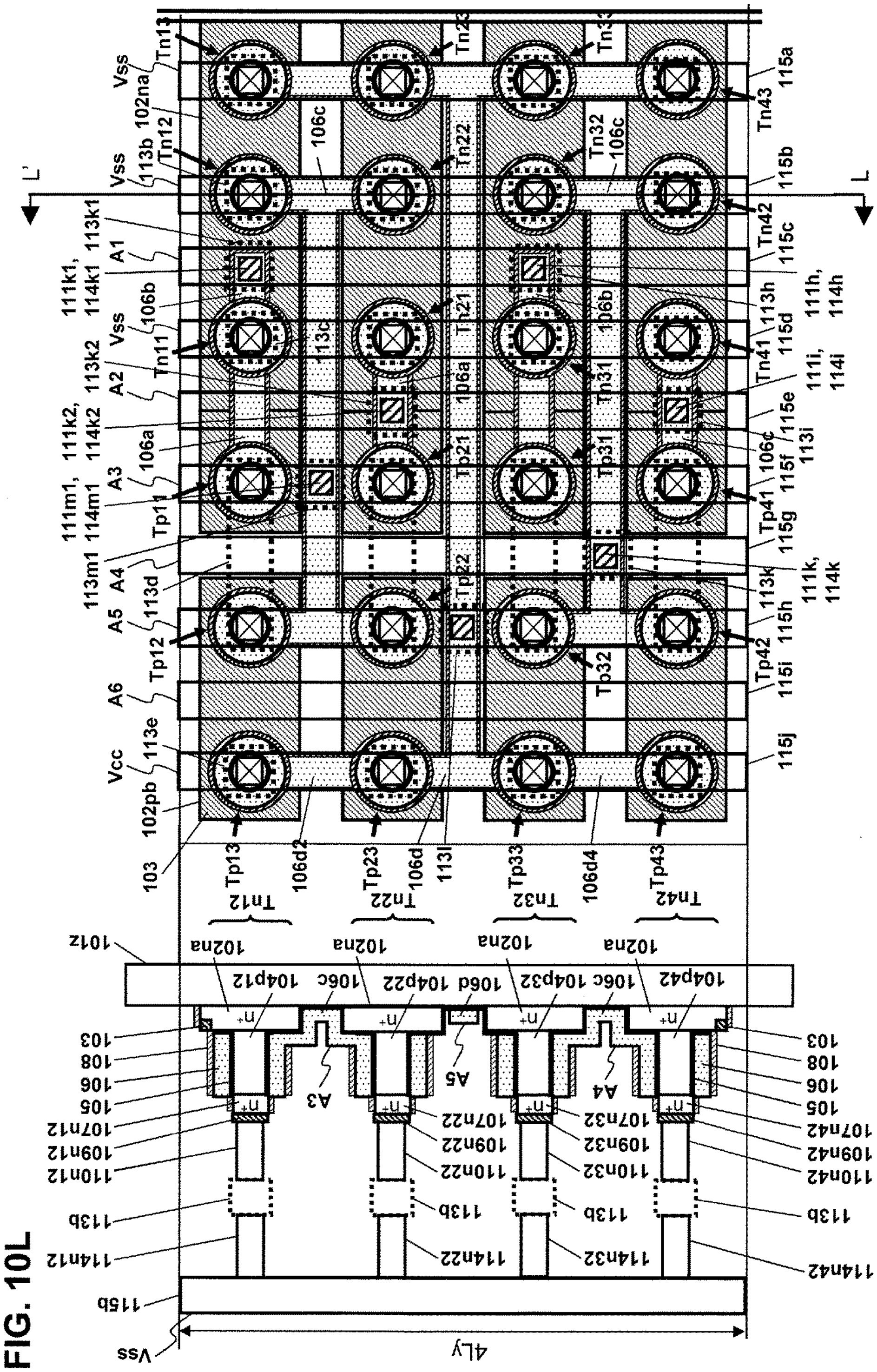
FIG. 10L is a cross-sectional view of the decoder according to the third exemplary embodiment of the present invention.
Figure 10M:
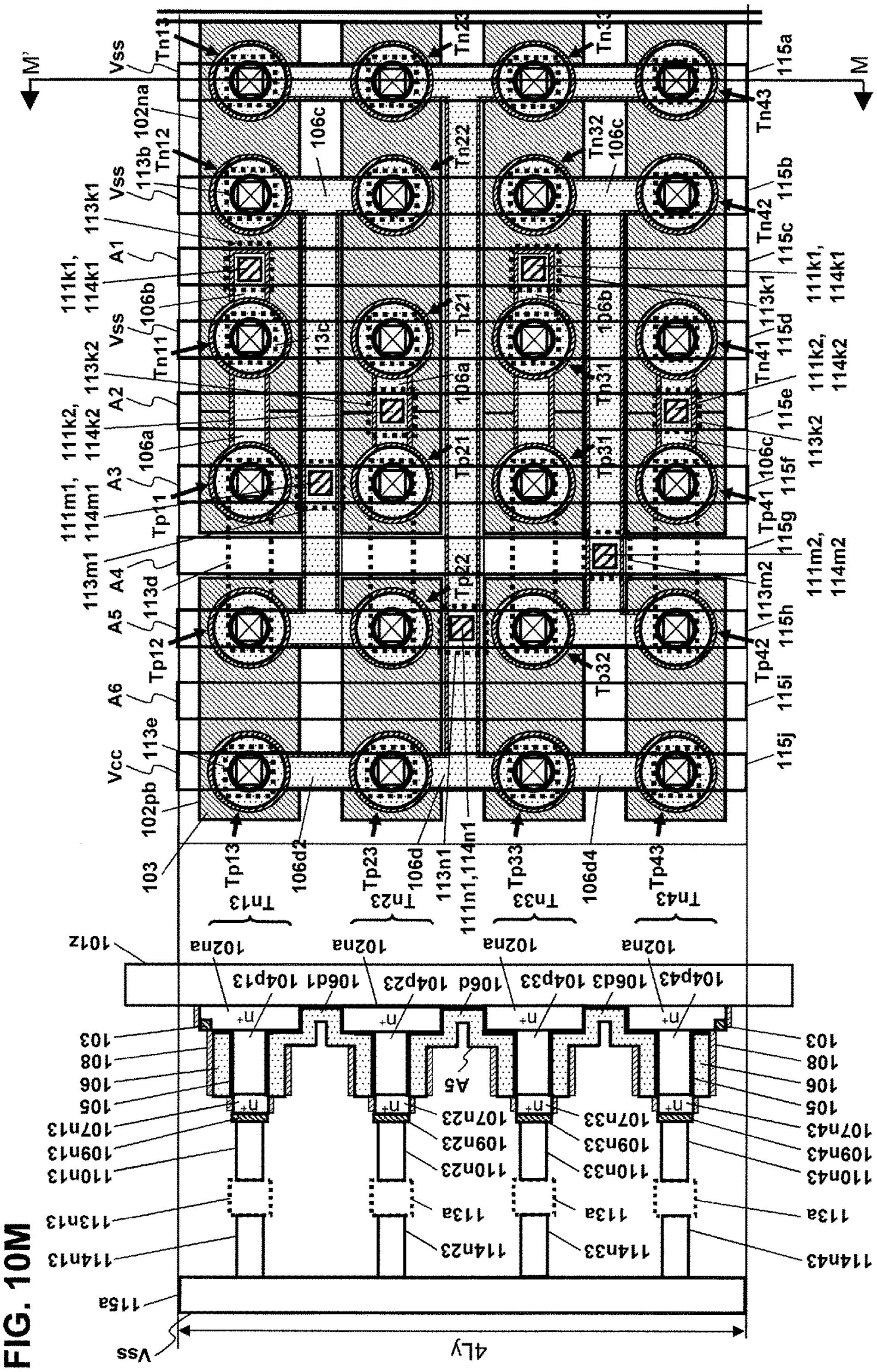
FIG. 10M is a cross-sectional view of the decoder according to the third exemplary embodiment of the present invention.

FIG. 10A is a cross-sectional view taken along the cut-line A-A' in FIG. 9A, FIG. 10B is a cross-sectional view taken along the cut-line B-B' in FIG. 9A, FIG. 10C is a cross-sectional view taken along the cut-line C-C' in FIG. 9A, FIG. 10D is a cross-sectional view taken along the cut-line D-D' in FIG. 9A, FIG. 10E is a cross-sectional view taken along the cut-line E-E' in FIG. 9B, FIG. 10F is a cross-sectional view taken along the cut-line F-F' in FIG. 9A, FIG. 10G is a cross-sectional view taken along the cut-line G-G' in FIG. 9A, FIG. 10H is a cross-sectional view taken along the cut-line H-H' in FIG. 9A, FIG. 10I is a cross-sectional view taken along the cut-line I-I' in FIG. 9A, FIG. 10J is a cross-sectional view taken along the cut-line J-J' in FIG. 9A, FIG. 10K is a cross-sectional view taken along the cut-line K-K' in FIG. 9A, FIG. 10L is a cross-sectional view taken along the cut-line L-L' in FIG. 9A, and FIG. 10M is a cross-sectional view taken along the cut-line M-M' in FIG. 9A.

FIG. 9A illustrates a decoder block 110*a* illustrated in FIG. 7, and FIG. 9B illustrates a decoder block 110*b* illustrated in FIG. 7. Although FIGS. 9A and 9B are consecutive views, separate views are presented in FIGS. 9A and 9B in enlarged scale, for convenience.

In FIG. 9A, the transistors constituting the decoder 100-1 illustrated in FIG. 7, namely, the PMOS transistor Tp14, the NMOS transistors Tn14, Tn13, Tn12, and Tn11, and the PMOS transistors Tp11, Tp12, and Tp13, are arranged in the top row of FIG. 9A in a line in the lateral direction (the first direction) from right to left in this figure.

The transistors constituting the decoder 100-2, namely, the PMOS transistor Tp24, the NMOS transistors Tn24, Tn23, Tn22, and Tn21, and the PMOS transistors Tp21, Tp22, and Tp23, are arranged in the second row from the top in FIG. 9A in a line in the lateral direction (the first direction) from right to left in this figure. Likewise, the decoder 100-3 and the decoder 100-4 are arranged in sequence from top to bottom in FIG. 9A.

The gate electrodes 106 of the NMOS transistors Tn12 and Tn22 and the PMOS transistors Tp12 and Tp22 are connected in common by using a gate line 106*c*. Since the gate line 106*c* is formed in the space (dead space) between the lower diffusion layers of the decoder 100-1 and the decoder 100-2, the size in the longitudinal direction (the second direction) can be minimized. In addition, the use of a common gate line can reduce the parasitic capacitance of lines. High-speed operation can be achieved.

Likewise, the gate electrodes 106 of the NMOS transistors Tn32 and Tn42 and the PMOS transistors Tp32 and Tp42 are connected in common by using a gate line 106*c*. The gate line 106*c* is formed in the space (dead space) between the lower diffusion layers of the decoder 100-3 and the decoder 100-4.

Further, the gate electrodes 106 of the NMOS transistors Tn13, Tn23, Tn33, and Tn43, the PMOS transistors Tp13, Tp23, Tp33, and Tp34 are connected in common by using gate lines 106*d*, 106*d*1, 106*d*2, 106*d*3, and 106*d*4. Since the gate line 106*d* is formed in the space (dead space) between the lower diffusion layers of the decoder 100-2 and the decoder 100-3, the size in the longitudinal direction (the second direction) can be minimized. In addition, the use of a common gate line can reduce the parasitic capacitance of lines. High-speed operation can be achieved.

Also in FIG. 9B, the transistors constituting the decoder 100-5 illustrated in FIG. 7, namely, the PMOS transistor Tp54, the NMOS transistors Tn54, Tn53, Tn52, and Tn51 and the PMOS transistors Tp51, Tp52, and Tp53, are arranged in the top row of FIG. 9B in a line in the lateral direction (the first direction) from right to left in this figure.

The transistors constituting the decoder 100-6, namely, the PMOS transistor Tp64, the NMOS transistors Tn64, Tn63, Tn62, and Tn61 and the PMOS transistors Tp61, Tp62, and Tp63, are arranged in the second row from the top in FIG. 9B in a line in the lateral direction (the first direction) from right to left in this figure. Likewise, the decoder 100-7 and the decoder 100-8 are arranged in sequence from top to bottom in FIG. 9B.

The gate electrodes 106 of the NMOS transistors Tn52 and Tn62 and the PMOS transistors Tp52 and Tp62 are connected in common by using a gate line 106*c*. Since the gate line 106*c* is formed in the space (dead space) between the lower diffusion layers of the decoder 100-5 and the decoder 100-6, the size in the longitudinal direction (the second direction) can be minimized. In addition, the use of a common gate line can reduce the parasitic capacitance of lines. High-speed operation can be achieved.

Likewise, the gate electrodes 106 of the NMOS transistors Tn72 and Tn82 and the PMOS transistors Tp72 and Tp82 are connected in common by using a gate line 106*c*. The gate line 106*c* is formed in the space (dead space) between the lower diffusion layers of the decoder 100-7 and the decoder 100-8.

Further, the gate electrodes 106 of the NMOS transistors Tn53, Tn63, Tn73, and Tn83 and the PMOS transistors Tp53, Tp63, Tp73, and Tp83 are connected in common by using gate lines 106*d*, 106*d*1, 106*d*2, 106*d*3, and 106*d*4. Since the gate line 106*d* is formed in the space (dead space) between the lower diffusion layers of the decoder 100-6 and the decoder 100-7, the size in the longitudinal direction (the second direction) can be minimized. In addition, the use of a common gate line can reduce the parasitic capacitance of lines. High-speed operation can be achieved.

In FIGS. 9A and 9B, lines 115*k*, 115*l*, 115*a*, 115*b*, 115*c*, 115*d*, 115*e*, 115*f*, 115*g*, 115*h*, 115*i*, and 115*j* of a second metal wiring layer are arranged to extend in the longitudinal direction (the second direction) from right to left, and respectively form a power supply line Vcc, a reference power supply line Vss, a reference power supply line Vss, a reference power supply line Vss, the address signal line A1, a reference power supply line Vss, the address signal lines A2, A3, A4, A5, and A6, and a power supply line Vcc. Since the lines 115*a* to 115*l* of the second metal wiring layer are arranged at a minimum pitch (a minimum wiring width and a minimum wiring interval) for the second metal wiring layer, the size in the lateral direction can be minimized in the arrangement.

In FIGS. 9A to 9D and FIGS. 10A to 10M, portions having the same or substantially the same structures as those illustrated in FIGS. 2A and 2B and FIGS. 3A to 3H are denoted by equivalent reference numerals in the 100s.

The arrangement of the eight SGTs constituting the decoder 100-1, namely, the PMOS transistor Tp14, the NMOS transistors Tn14, Tn13, Tn12, and Tn11, and the PMOS transistors Tp11, Tp12, and Tp13, up to the eight SGTs constituting the decoder 100-8, namely, the PMOS transistor Tp84, the NMOS transistors Tn84, Tn83, Tn82, and Tn81, and the PMOS transistors Tp81, Tp82, and Tp83, is identical to the arrangement of the eight SGTs illustrated in FIG. 5, namely, the PMOS transistor Tp14, the NMOS transistors Tn14, Tn13, Tn12, and Tn11, and the PMOS transistors Tp11, Tp12, and Tp13. Note that FIGS. 9A and 9B are different from FIG. 5 in that since the number of address signal lines is increased from three (A1 to A3) to six (A1 to A6), the arrangement positions and connection portions of the lines of the second metal wiring layer along which address signals are supplied are changed.

In FIGS. 9A and 9B, the following connections are provided.

The line 115*k* of the second metal wiring layer along which the power supply Vcc is supplied is arranged to extend in the second direction, and is connected to the sources of the PMOS transistors Tp14 and Tp24 to Tp84.

The line 115*l* of the second metal wiring layer along which the reference power supply Vss is supplied is arranged to extend in the second direction, and is connected to the sources of the NMOS transistors Tn14 and Tn24 to Tn84.

The line 115*a* of the second metal wiring layer along which the reference power supply Vss is supplied is arranged to extend in the second direction, and is connected to the sources of the NMOS transistors Tn13 and Tn23 to Tn83.

The line 115*b* of the second metal wiring layer along which the reference power supply Vss is supplied is arranged to extend in the second direction, and is connected to the sources of the NMOS transistors Tn12 and Tn22 to Tn82.

The line 115*c* of the second metal wiring layer along which an address signal A1 is supplied is arranged to extend in the second direction, and is connected to the gate lines 106*b* via contacts 114*k*1, lines 113*k*1 of the first metal wiring layer, and contacts 111*k*1. The line 115*c* of the second metal wiring layer is then connected to the gate electrodes 106 of the NMOS transistors Tn11, Tn31, Tn51, and Tn71, and is also connected to the gate electrodes 106 of the PMOS transistors Tp11, Tp31, Tp51, and Tp71 via the gate lines 106*a*.

The line 115*d* of the second metal wiring layer along which the reference power supply Vss is supplied is arranged to extend in the second direction, and is connected to the sources of the NMOS transistors Tn11, Tn21, Tn31, Tn41, Tn51, Tn61, Tn71, and Tn81.

The line 115*e* of the second metal wiring layer along which an address signal A2 is supplied is arranged to extend in the second direction, and is connected to the gate lines 106*a* via contacts 114*k*2, lines 113*k*2 of the first metal wiring layer, and contacts 111*k*2. The line 115*e* of the second metal wiring layer is then connected to the gate electrodes 106 of the NMOS transistor Tn21 and the PMOS transistor Tp21, the gate electrodes 106 of the NMOS transistor Tn41 and the PMOS transistor Tp41, the gate electrodes 106 of the NMOS transistor Tn61 and the PMOS transistor Tp61, and the gate electrodes 106 of the NMOS transistor Tn81 and the PMOS transistor Tp81.

The line 115*f* of the second metal wiring layer along which an address signal A3 is supplied is arranged to extend in the second direction, and is connected to the gate line 106*c* via a contact 114*m*1, a line 113*m*1 of the first metal wiring layer, and a contact 111*m*1. The line 115*f* of the second metal wiring layer is then connected to the gate electrodes 106 of the NMOS transistors Tn12 and Tn22 and the PMOS transistors Tp12 and Tp22. In addition, the line 115*f* of the second metal wiring layer is also connected to the gate line 106*c* via a contact 114*m*1, a line 113*m*1 of the first metal wiring layer, and a contact 111*m*1, and is then connected to the gate electrodes 106 of the NMOS transistors Tn52 and Tn62 and the PMOS transistors Tp52 and Tp62.

The line 115*g* of the second metal wiring layer along which an address signal A4 is supplied is arranged to extend in the second direction, and is connected to the gate line 106*c* via a contact 114*m*2, a line 113*m*2 of the first metal wiring layer, and a contact 111*m*2. The line 115*g* of the second metal wiring layer is then connected to the gate electrodes 106 of the NMOS transistors Tn32 and Tn42 and the PMOS transistors Tp32 and Tp42. In addition, the line 115*g* of the second metal wiring layer is also connected to the gate line 106*c* via a contact 114*m*2, a line 113*m*2 of the first metal wiring layer, and a contact 111*m*2, and is then connected to the gate electrodes 106 of the NMOS transistors Tn72 and Tn82 and the PMOS transistors Tp72 and Tp82.

The line 115*h* of the second metal wiring layer along which an address signal A5 is supplied is arranged to extend in the second direction, and is connected to the gate line 106*d* via a contact 114*n*1, a line 113*n*1 of the first metal wiring layer, and a contact 111*n*1. The line 115*h* of the second metal wiring layer is then connected to the gate electrodes 106 of the NMOS transistors Tn23 and Tn33 and the PMOS transistors Tp23 and Tp33. In addition, the line 115*h* of the second metal wiring layer is further connected to the gate electrodes 106 of the NMOS transistors Tn13 and Tn43 and the PMOS transistors Tp13 and Tp43 via the gate lines 106*d*1, 106*d*3, 106*d*2, and 106*d*4, respectively.

The line 115*i* of the second metal wiring layer along which an address signal A6 is supplied is arranged to extend in the second direction, and is connected to the gate line 106*d* via a contact 114*n*2, a line 113*n*2 of the first metal wiring layer, and a contact 111*n*2. The line 115*i* of the second metal wiring layer is then connected to the gate electrodes 106 of the NMOS transistors Tn63 and Tn73 and the PMOS transistors Tp63 and Tp73. In addition, the line 115*i* of the second metal wiring layer is further connected to the gate electrodes 106 of the NMOS transistors Tn53 and Tn83 and the PMOS transistors Tp53 and Tp83 via the gate lines 106*d*1, 106*d*3, 106*d*2, and 106*d*4, respectively.

The line 115*j* of the second metal wiring layer along which the power supply Vcc is supplied is arranged to extend in the second direction, and is connected to the sources of the PMOS transistors Tp13 and Tp23 to Tp83.

The arrangement and connections described above can provide eight decoders with a minimum area at a minimum pitch in both the lateral direction and the longitudinal direction.

In this exemplary embodiment, the address signal lines A1 to A6 are set to provide eight decoders. The use of an increased number of address signal lines to increase the number of decoders also falls within the scope of the present invention.

According to this exemplary embodiment, a plurality of decoders, each including eight SGTs that constitute a 3-input NOR decoder and an inverter and that are arranged in a line in a first direction, are arranged adjacent to each other, and the reference power supply line Vss, the power supply line Vcc, and the address signal lines (A1 to A6) are arranged to extend in a second direction perpendicular to the first direction. This configuration provides a semiconductor device including 3-input NOR decoders and inverters with a minimum area, in such a manner that the 3-input NOR decoders and the inverters can be arranged at a minimum pitch in both the first direction and the second direction, without using any extra lines or contact regions.

Fourth Exemplary Embodiment

Equivalent Circuit Applicable to Exemplary Embodiment of Present Invention

Figure 11:
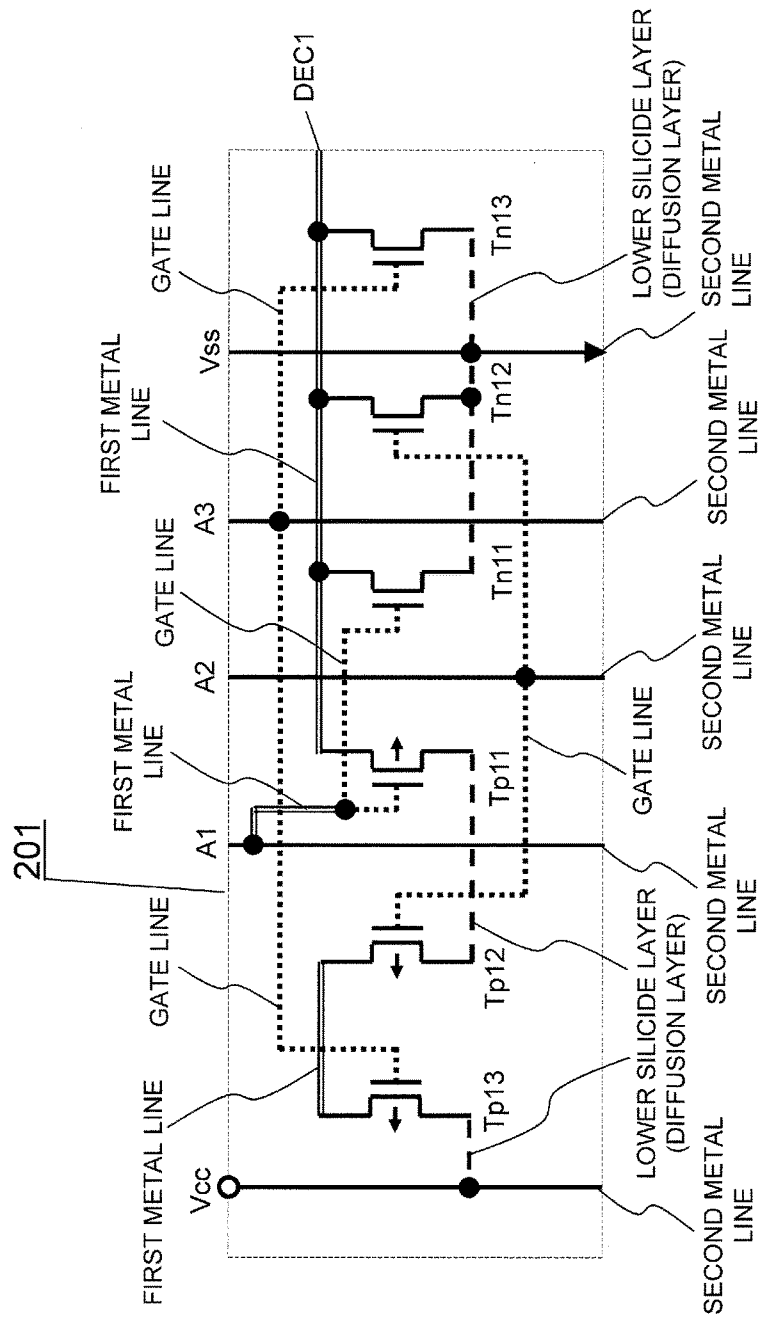
FIG. 11 is an equivalent circuit diagram illustrating a decoder according to a fourth exemplary embodiment of the present invention.

FIG. 11 illustrates an equivalent circuit diagram of a 3-input NOR decoder 201 applicable to the present invention. FIG. 11 illustrates the arrangement of transistors and a method for connecting circuits corresponding to an exemplary embodiment described below. This exemplary embodiment is different from the first exemplary embodiment described above in that the NMOS transistors Tn11, Tn12, and Tn13 and the PMOS transistors Tp11, Tp12, and Tp13 are arranged so that their sources and drains are oriented upside-down. Accordingly, the lines connecting the drains, sources, and gates of the transistors differ. In FIG. 11, the types of the lines are indicated to clearly identify how the lines are provided.

In FIG. 11, reference numerals Tn11, Tn12, and Tn13 denote NMOS transistors formed of SGTs, and reference numerals Tp11, Tp12, and Tp13 denote PMOS transistors formed of SGTs. The sources of the NMOS transistors Tn11, Tn12, and Tn13 serve as a lower diffusion layer, and are connected to lines of a first metal wiring layer via lines of a silicide layer. The sources are further connected to lines of a second metal wiring layer, and a reference power supply Vss is supplied to the lines of the second metal wiring layer. The drains of the NMOS transistors Tn11, Tn12, and Tn13 and the drain of the PMOS transistor Tp11 are connected in common to an output line DEC1 formed of a line of the first metal wiring layer. The source of the PMOS transistor Tp11 is connected to the drain of the PMOS transistor Tp12 via a lower diffusion layer and a silicide layer. The source of the PMOS transistor Tp12 is connected to the drain of the PMOS transistor Tp13 via a line of the first metal wiring layer. The source of the PMOS transistor Tp13 is connected to a line of the second metal wiring layer via a lower silicide layer, and a power supply Vcc is supplied to the line of the second metal wiring layer.

Further, an address signal line A1 is connected to the gate of the NMOS transistor Tn11 and the gate of the PMOS transistor Tp11 via a line of the second metal wiring layer, a line of the first metal wiring layer, and a gate line. An address signal line A2 is connected to the gate of the NMOS transistor Tn12 and the gate of the PMOS transistor Tp12 via a line of the second metal wiring layer, a line of the first metal wiring layer, and a gate line. An address signal line A3 is connected to the gate of the NMOS transistor Tn13 and the gate of the PMOS transistor Tp13 via a line of the second metal wiring layer, a line of the first metal wiring layer, and a gate line.

Figure 12A:
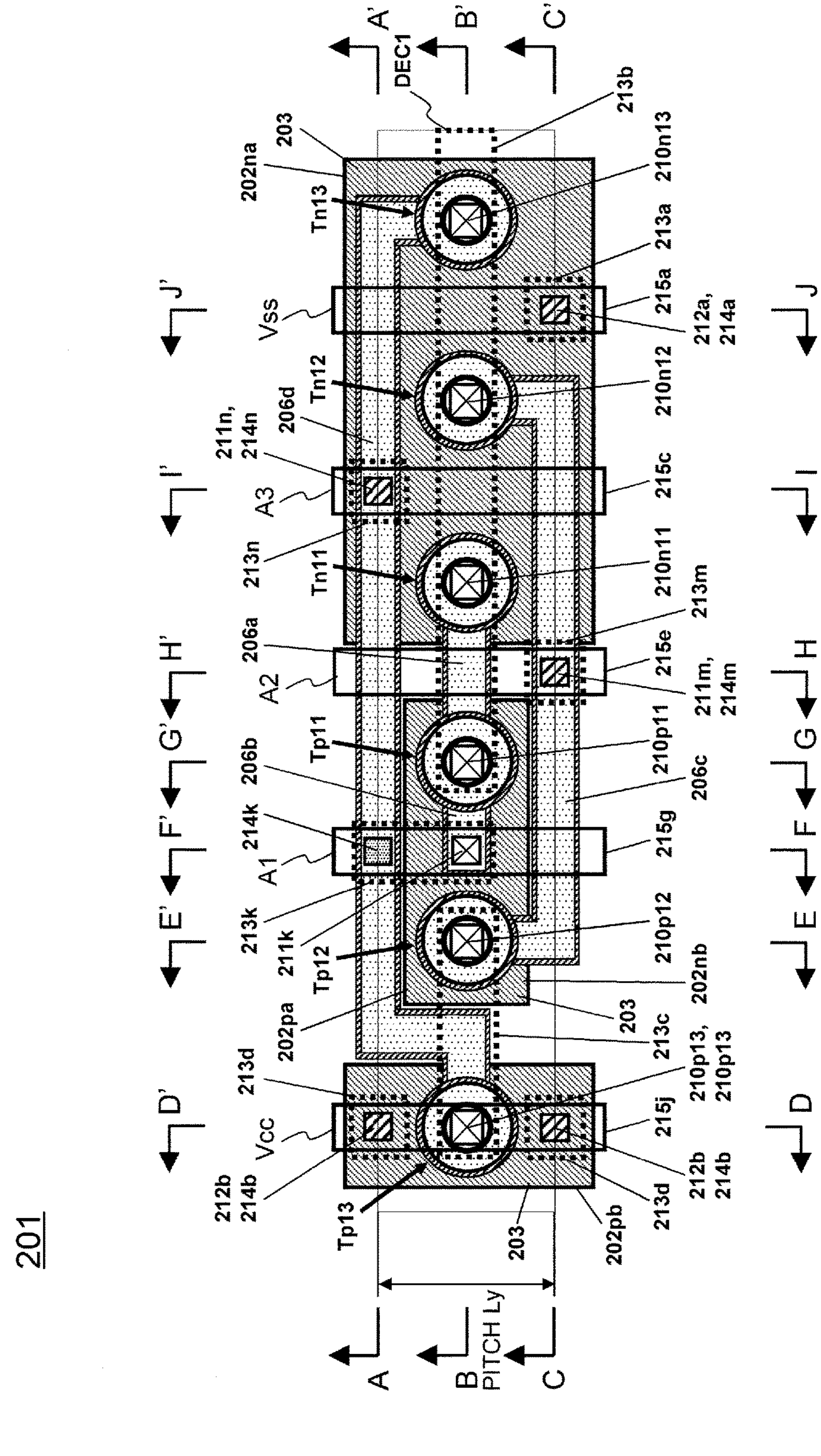
FIG. 12A is a plan view of the decoder according to the fourth exemplary embodiment of the present invention.
Figure 12B:
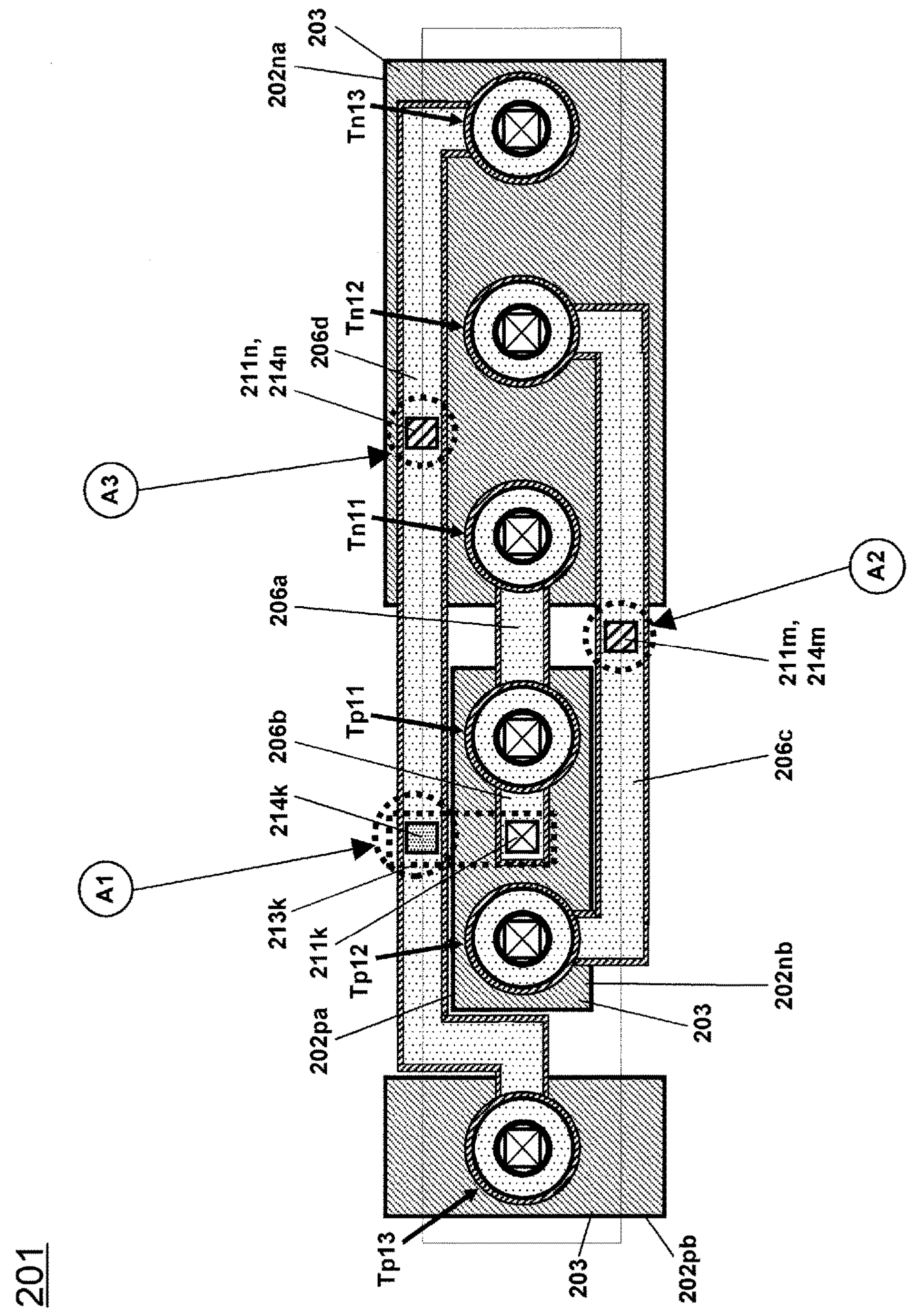
FIG. 12B is a plan view of the decoder according to the fourth exemplary embodiment of the present invention.

FIGS. 12A and 12B and FIGS. 13A to 13J illustrate a fourth exemplary embodiment as an exemplary embodiment in which the equivalent circuit illustrated in FIG. 11 is applied to the present invention. FIG. 12A is a plan view of the layout (arrangement) of a 3-input NOR decoder according to this exemplary embodiment. FIG. 12B illustrates lower diffusion layers, transistors, and gate lines depicted in the plan view of FIG. 12A to facilitate the understanding of the connections between the address signal lines and the gate lines.

Figure 13A:
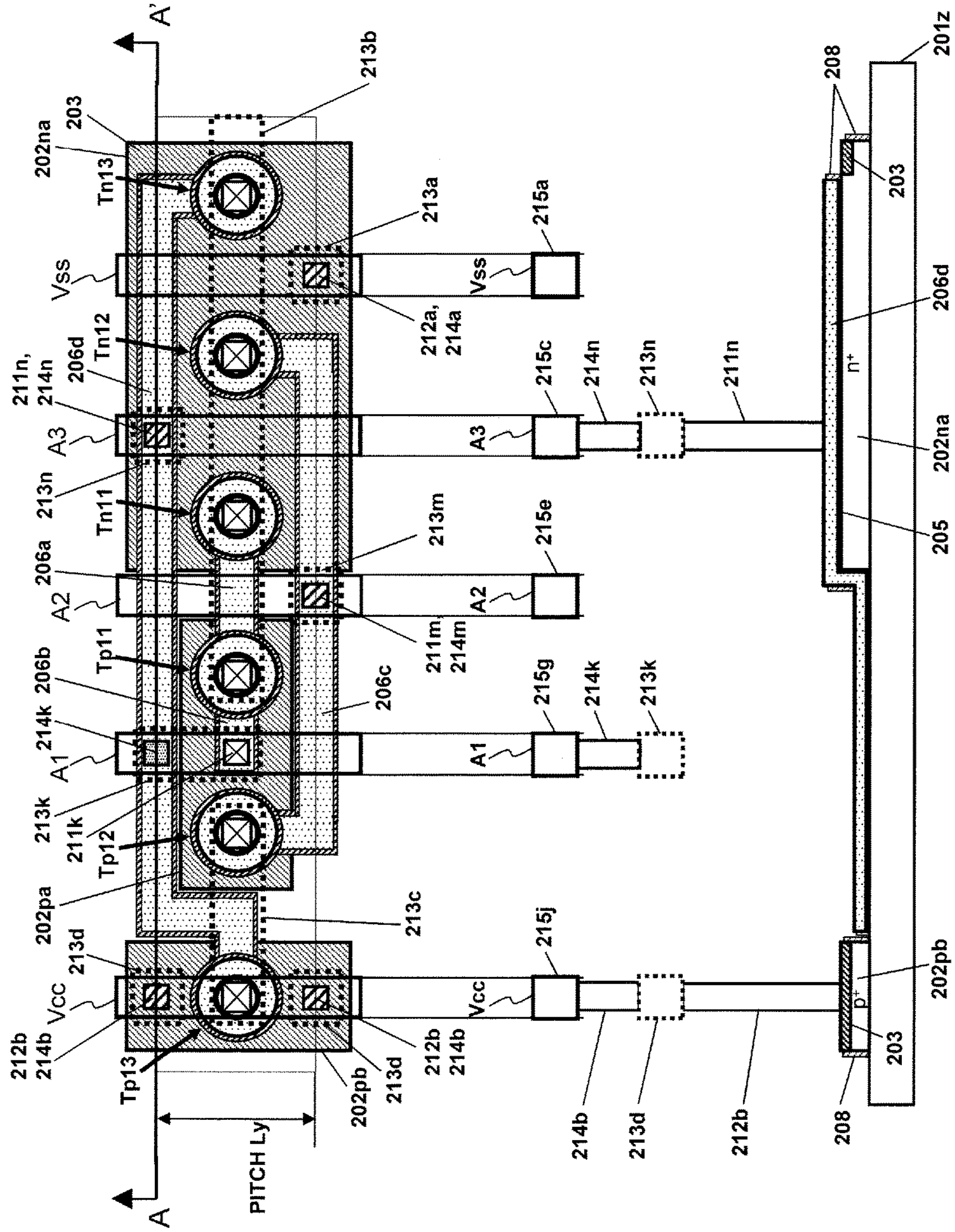
FIG. 13A is a cross-sectional view of the decoder according to the fourth exemplary embodiment of the present invention.
Figure 13B:
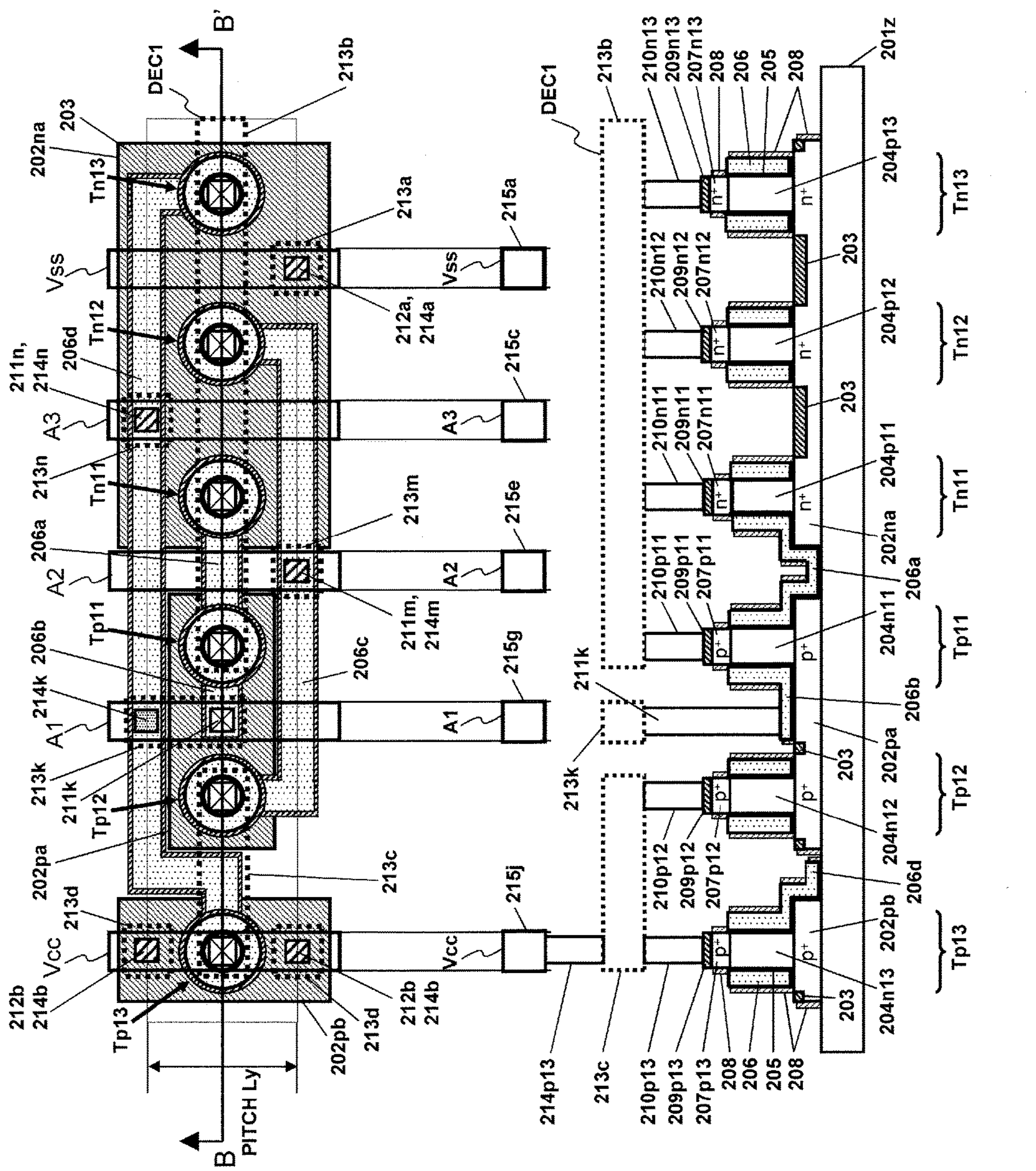
FIG. 13B is a cross-sectional view of the decoder according to the fourth exemplary embodiment of the present invention.
Figure 13C:
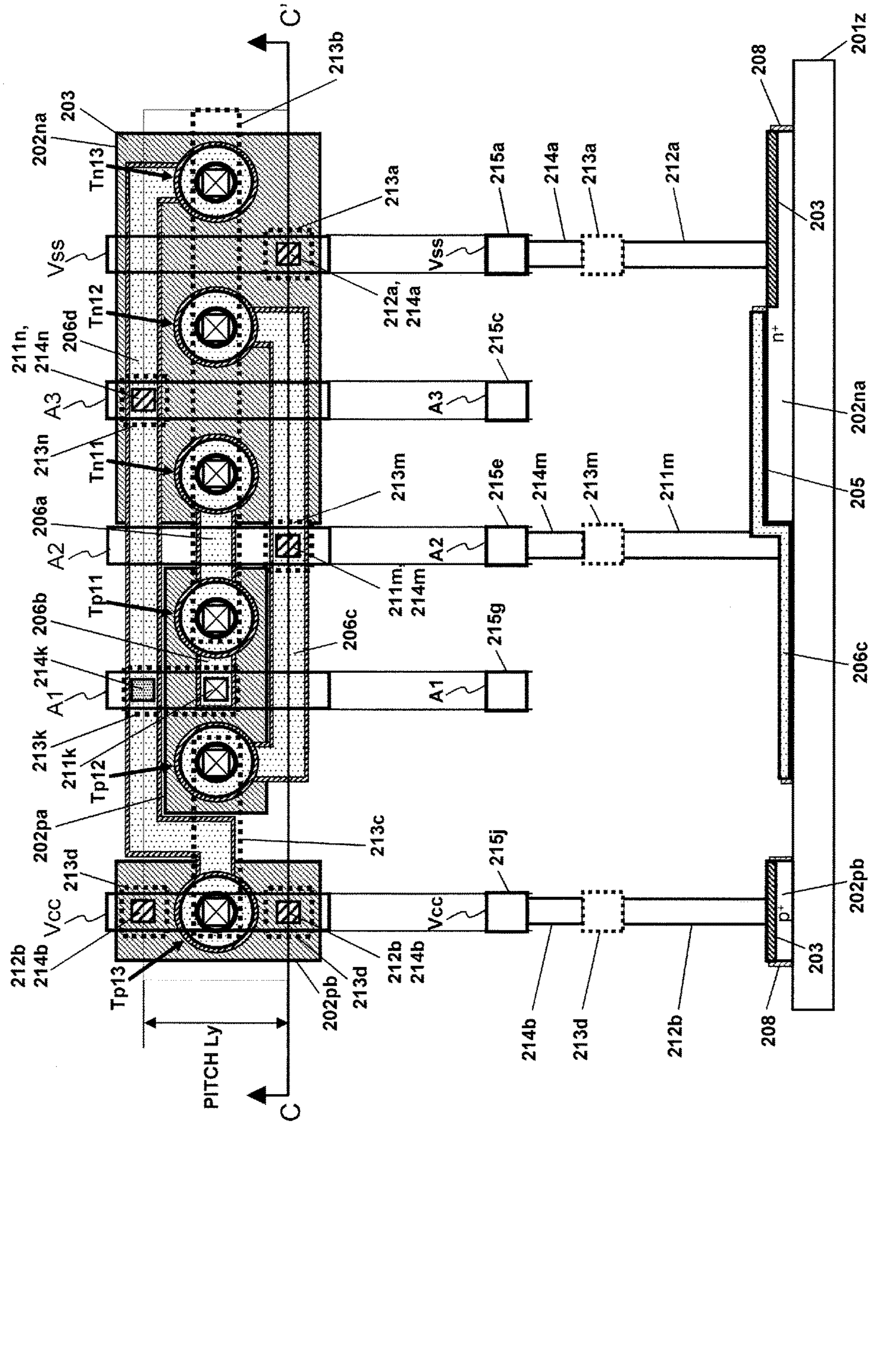
FIG. 13C is a cross-sectional view of the decoder according to the fourth exemplary embodiment of the present invention.
Figure 13D:
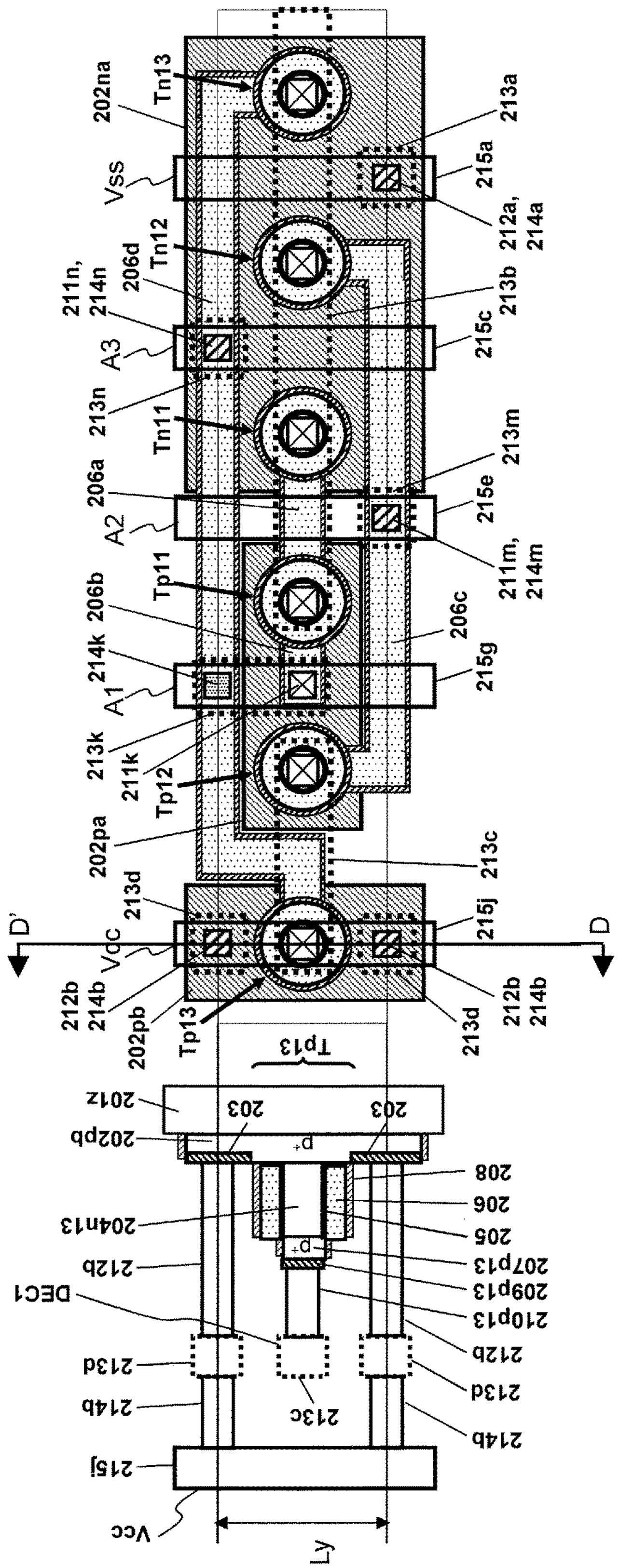
FIG. 13D is a cross-sectional view of the decoder according to the fourth exemplary embodiment of the present invention.
Figure 13E:
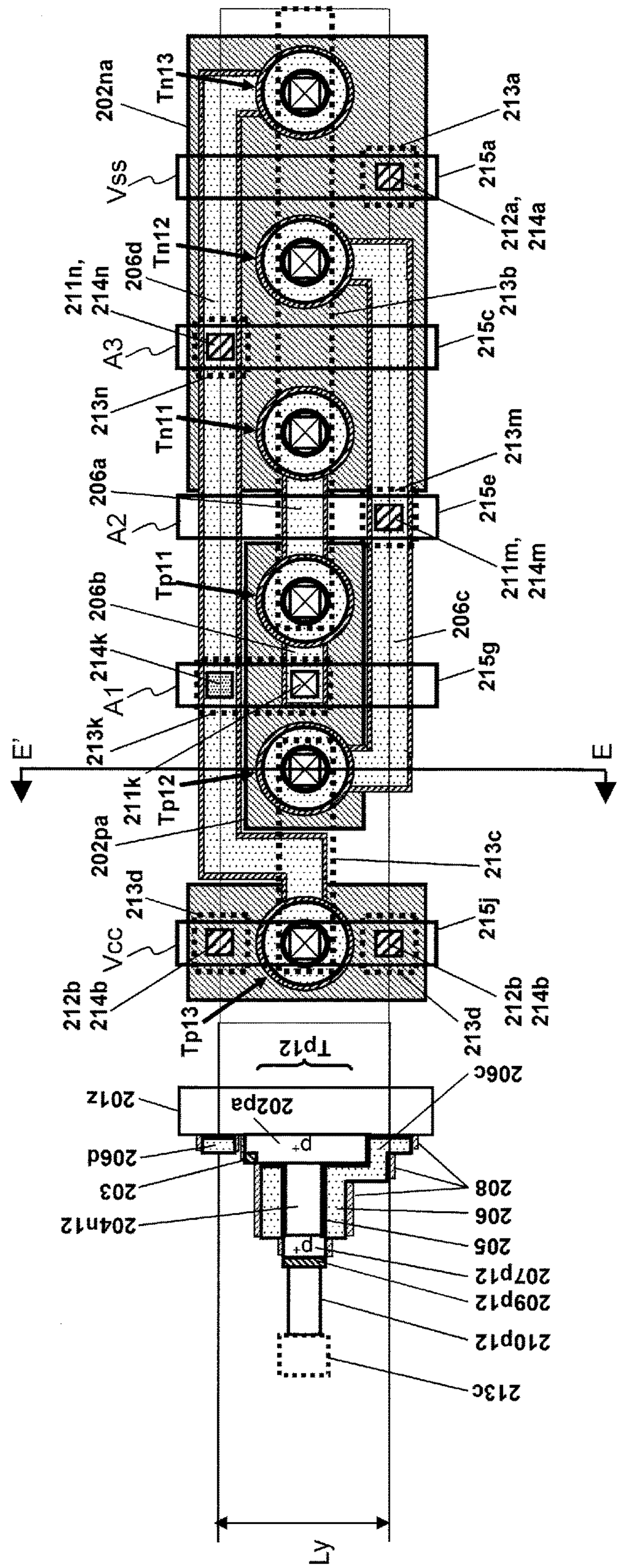
FIG. 13E is a cross-sectional view of the decoder according to the fourth exemplary embodiment of the present invention.
Figure 13F:
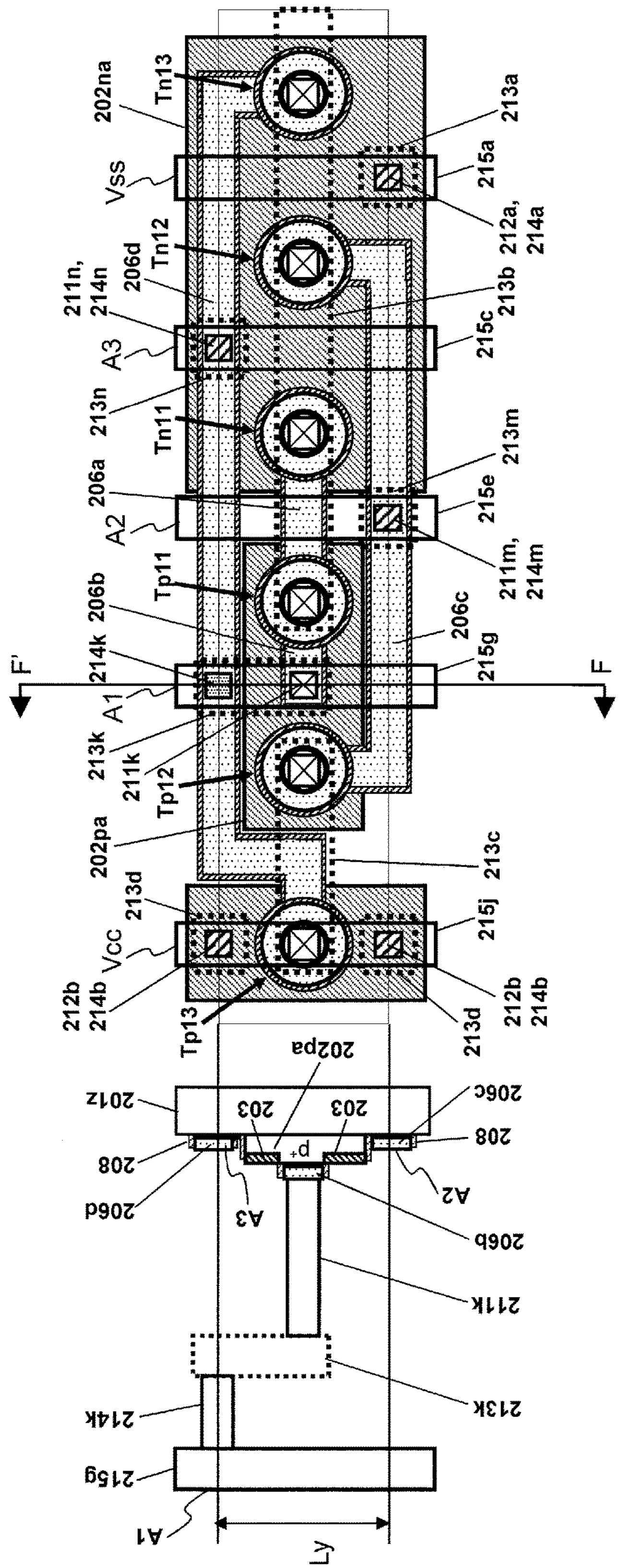
FIG. 13F is a cross-sectional view of the decoder according to the fourth exemplary embodiment of the present invention.
Figure 13G:
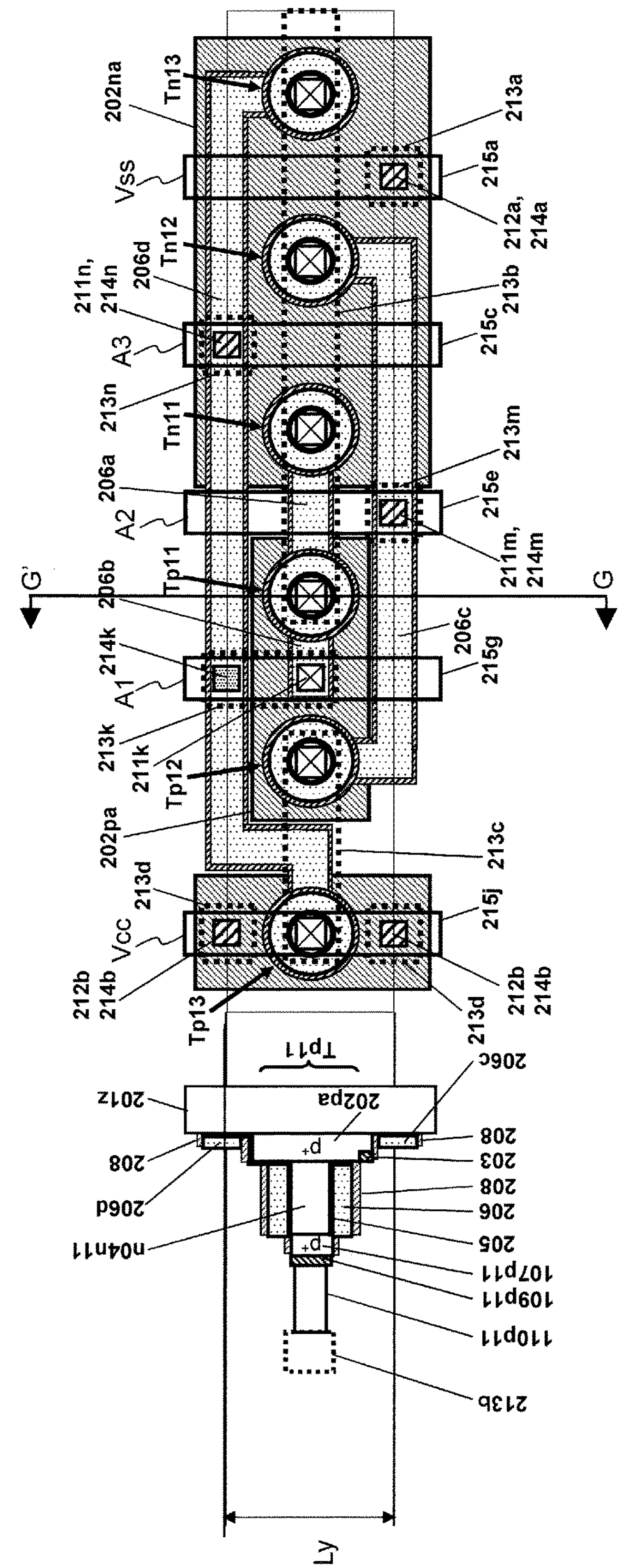
FIG. 13G is a cross-sectional view of the decoder according to the fourth exemplary embodiment of the present invention.
Figure 13H:
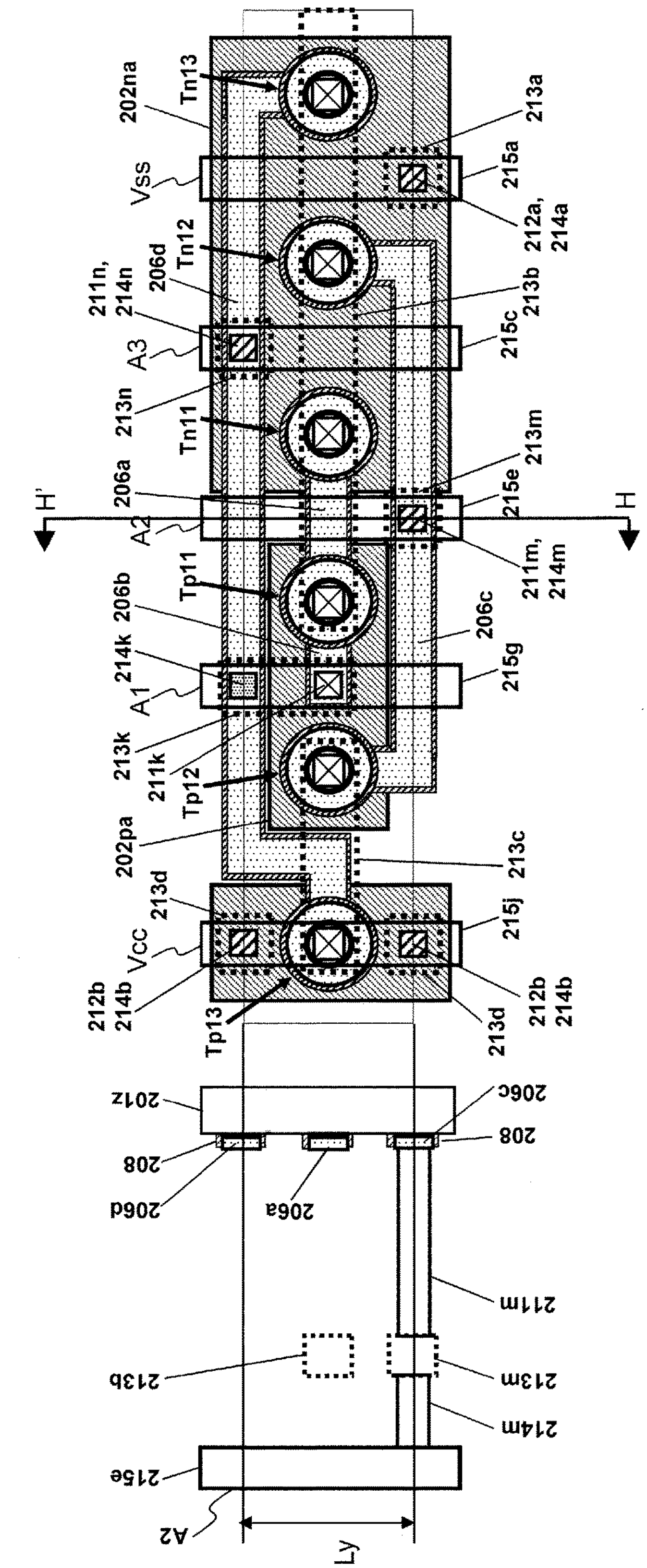
FIG. 13H is a cross-sectional view of the decoder according to the fourth exemplary embodiment of the present invention.
Figure 13I:
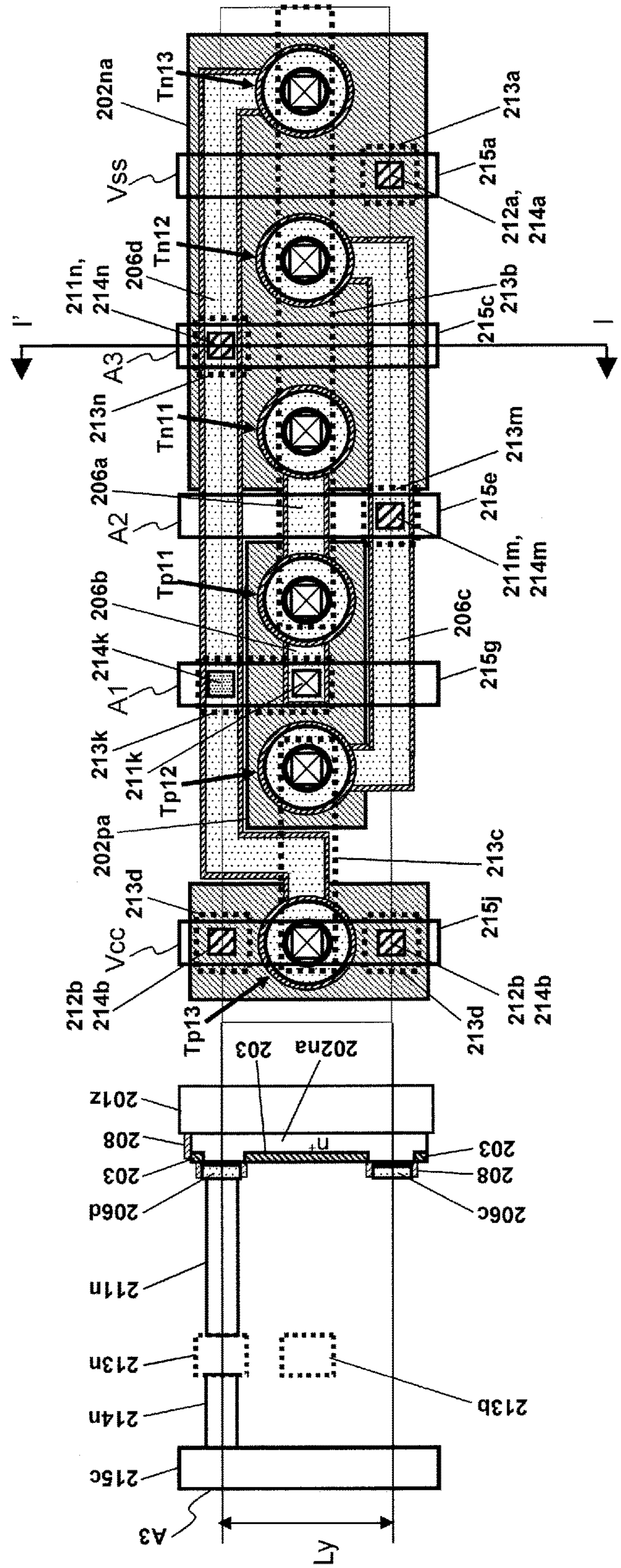
FIG. 13I is a cross-sectional view of the decoder according to the fourth exemplary embodiment of the present invention.
Figure 13J:
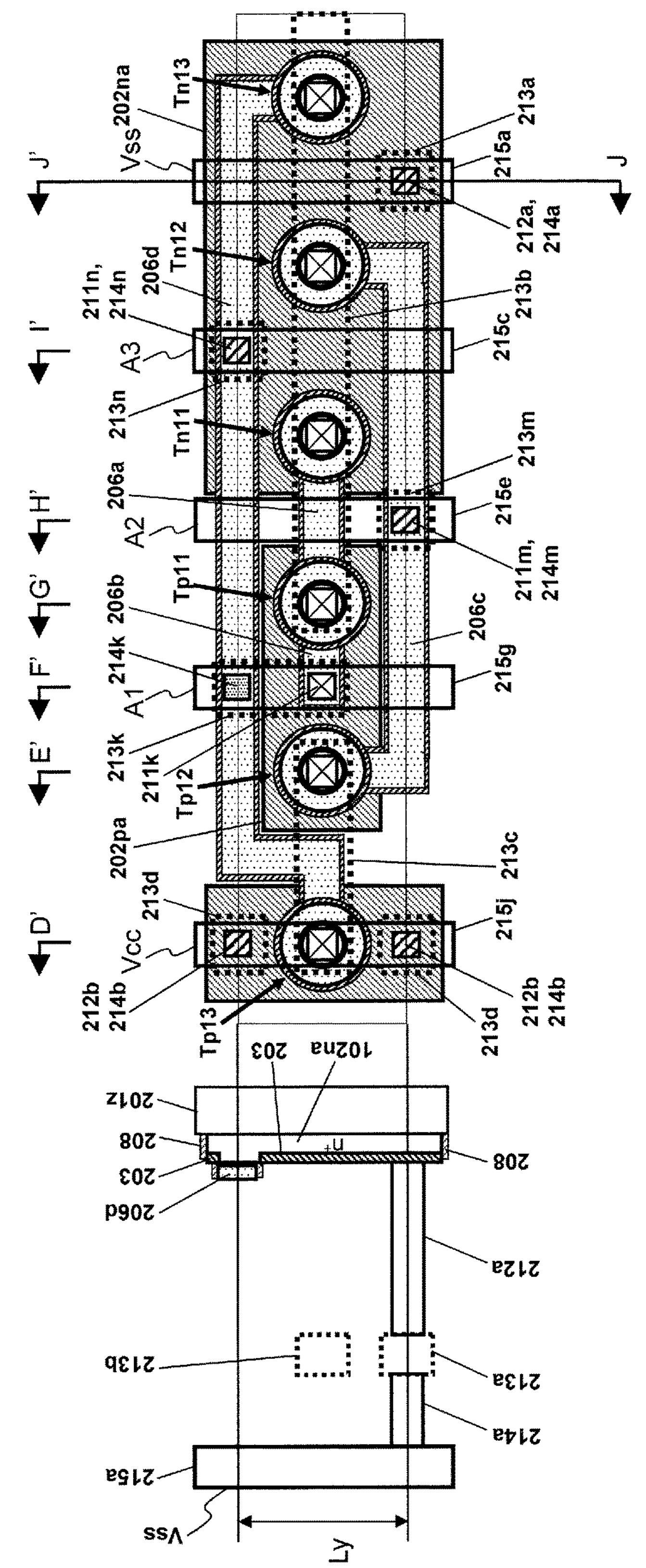
FIG. 13J is a cross-sectional view of the decoder according to the fourth exemplary embodiment of the present invention.

FIG. 13A is a cross-sectional view taken along the cut-line A-A' in FIG. 12A, FIG. 13B is a cross-sectional view taken along the cut-line B-B' in FIG. 12A, FIG. 13C is a cross-sectional view taken along the cut-line C-C' in FIG. 12A, FIG. 3D is a cross-sectional view taken along the cut-line D-D' in FIG. 12A, FIG. 13E is a cross-sectional view taken along the cut-line E-E' in FIG. 12A, FIG. 13F is a cross-sectional view taken along the cut-line F-F' in FIG. 12A, FIG. 13G is a cross-sectional view taken along the cut-line G-G' in FIG. 12A, FIG. 13H is a cross-sectional view taken along the cut-line H-H' in FIG. 12A, FIG. 13I is a cross-sectional view taken along the cut-line I-I' in FIG. 12A, and FIG. 13J is a cross-sectional view taken along the cut-line J-J' in FIG. 12A.

In FIGS. 12A and 12B and FIGS. 13A to 13J, portions having the same or substantially the same structures as those illustrated in FIGS. 2A and 2B and FIGS. 3A to 3H are denoted by equivalent reference numerals in the 200s.

In FIG. 12A, the transistors constituting the NOR decoder 201 illustrated in FIG. 11, namely, the NMOS transistors Tn13, Tn12, and Tn11 and the PMOS transistors Tp11, Tp12, and Tp13, are arranged in a line in a lateral direction (a first direction) from right to left in this figure.

Further, lines 215*a*, 215*c*, 215*e*, 215*g*, and 215*j* of the second metal wiring layer, described below, are arranged to extend in a longitudinal direction in the figure (a second direction perpendicular to the first direction) and respectively form a reference power supply line Vss, address signal lines A3, A2, and A1, and a power supply line Vcc.

A feature of this exemplary embodiment is that the address signal line A1 connected to the line 215*g* of the second metal wiring layer is temporarily replaced by a line

213*k* of the first metal wiring layer via a contact 214*k* and the line 213*k* of the first metal wiring layer is made to extend for wiring and is connected to a gate line 206*b* via a contact 211*k*. This feature is available for the arrangement of a plurality of NOR decoders 201 according to this exemplary embodiment in order to readily arrange a plurality of address signal lines without increasing the area thereof, as illustrated in other exemplary embodiments described below.

Planar silicon layers 202*na*, 202*pa*, and 202*pb* are formed on top of an insulating film such as a buried oxide (BOX) film layer 201*z* disposed on a substrate. The planar silicon layers 202*na*, 202*pa*, and 202*pb* are formed as an n+ diffusion layer, a p+ diffusion layer, and a p+ diffusion layer, respectively, through impurity implantation or the like. Reference numeral 203 denotes a silicide layer disposed on surfaces of the planar silicon layers (202*na*, 202*pa*, and 202*pb*). Reference numerals 204*p*11, 204*p*12, and 204*p*13 denote p-type silicon pillars, and reference numerals 204*n*11, 204*n*12, and 204*n*13 denote n-type silicon pillars. Reference numeral 205 denotes a gate insulating film that surrounds the silicon pillars 204*p*11, 204*p*12, 204*p*13, 204*n*11, 204*n*12, and 204*n*13. Reference numeral 206 denotes a gate electrode, and reference numerals 206*a*, 206*b*, 206*c*, and 206*d* denote gate lines. The gate insulating film 205 is also formed to underlie the gate electrode 206 and the gate lines 206*a*, 206*b*, 206*c*, and 206*d*.

In top portions of the silicon pillars 204*p*11, 204*p*12, and 204*p*13, n+ diffusion layers 207*n*11, 207*n*12, and 207*n*13 are respectively formed through impurity implantation or the like. In top portions of the silicon pillars 204*n*11, 204*n*12, and 204*n*13, p+ diffusion layers 207*p*11, 207*p*12, and 207*p*13 are respectively formed through impurity implantation or the like. Reference numeral 208 denotes a silicon nitride film for protecting the gate insulating film 205, and reference numerals 209*n*11, 209*n*12, 209*n*13, 209*p*11, 209*p*12, and 209*p*13 denote silicide layers to be respectively connected to the n+ diffusion layers 207*n*11, 207*n*12, and 207*n*13 and the p+ diffusion layers 207*p*11, 207*p*12, and 207*p*13.

Reference numerals 210*n*11, 210*n*12, 210*n*13, 210*p*11, 210*p*12, and 210*p*13 denote contacts that respectively connect the silicide layers 209*n*11, 209*n*12, 209*n*13, 209*p*11, 209*p*12, and 209*p*13 to lines 213*b*, 213*b*, 213*b*, 213*b*, 213*c*, and 213*c* of the first metal wiring layer. Reference numeral 211*k* denotes a contact that connects the gate line 206*b* to the line 213*k* of the first metal wiring layer, reference numeral 211*m* denotes a contact that connects the gate line 206*c* to a line 213*m* of the first metal wiring layer, and reference numeral 211*n* denotes a contact that connects the gate line 206*d* to a line 213*n* of the first metal wiring layer. Reference numeral 212*a* denotes a contact that connects the silicide layer 203 connected to the n+ diffusion layer 202*na* to a line 213*a* of the first metal wiring layer, and reference numeral 212*b* denotes a contact (in FIG. 13A, an arrangement of two contacts is illustrated) that connects the silicide layer 203 connected to the p+ diffusion layer 202*pb* to a line 213*d* of the first metal wiring layer.

Reference numeral 214*a* denotes a contact that connects the line 213*a* of the first metal wiring layer to the line 215*a* of the second metal wiring layer, reference numeral 214*b* denotes a contact that connects the line 213*d* of the first metal wiring layer to the line 215*j* of the second metal wiring layer, reference numeral 214*k* denotes a contact that connects the line 213*k* of the first metal wiring layer to the line 215*g* of the second metal wiring layer, reference numeral 214*m* denotes a contact that connects the line 213*m* of the first metal wiring layer to the line 215*e* of the second metal wiring layer, and reference numeral 214*n* denotes a contact that connects the line 213*n* of the first metal wiring layer to the line 215*c* of the second metal wiring layer.

The silicon pillar 204*p*11, the lower diffusion layer 202*na*, the upper diffusion layer 207*n*11, the gate insulating film 205, and the gate electrode 206 constitute the NMOS transistor Tn11. The silicon pillar 204*p*12, the lower diffusion layer 202*na*, the upper diffusion layer 207*n*12, the gate insulating film 205, and the gate electrode 206 constitute the NMOS transistor Tn12. The silicon pillar 204*p*13, the lower diffusion layer 202*na*, the upper diffusion layer 207*n*13, the gate insulating film 205, and the gate electrode 206 constitute the NMOS transistor Tn13. The silicon pillar 204*n*11, the lower diffusion layer 202*pa*, the upper diffusion layer 207*p*11, the gate insulating film 205, and the gate electrode 206 constitute the PMOS transistor Tp11. The silicon pillar 204*n*12, the lower diffusion layer 202*pa*, the upper diffusion layer 207*p*12, the gate insulating film 205, and the gate electrode 206 constitute the PMOS transistor Tp12. The silicon pillar 204*n*13, the lower diffusion layer 202*pb*, the upper diffusion layer 207*p*13, the gate insulating film 205, and the gate electrode 206 constitute the PMOS transistor Tp13.

Further, the gate line 206*a* is connected to the gate electrode 206 of the NMOS transistor Tn11 and the gate electrode 206 of the PMOS transistor Tp11, and the gate line 206*b* is connected to the gate electrode 206 of the PMOS transistor Tp11. The gate line 206*c* is connected to the gate electrode 206 of the NMOS transistor Tn12 and the gate electrode 206 of the PMOS transistor Tp12, and the gate line 206*d* is connected in common to the gate electrode 206 of the NMOS transistor Tn13 and the gate electrode 206 of the PMOS transistor Tp13.

The n+ diffusion layer 207*n*11, which is the drain of the NMOS transistor Tn11, the n+ diffusion layer 207*n*12, which is the drain of the NMOS transistor Tn12, the n+ diffusion layer 207*n*13, which is the drain of the NMOS transistor Tn13, and the p+ diffusion layer 207*p*11, which is the drain of the PMOS transistor Tp11, are connected in common via the line 213*b* of the first metal wiring layer to serve as an output line DEC1. The lower diffusion layer 202*na*, which is the sources of the NMOS transistor Tn11, the NMOS transistor Tn12, and the NMOS transistor Tn13, is connected in common by using the silicide layer 203. The silicide layer 203 is connected to the line 215*a* of the second metal wiring layer via the contact 212*a*, the line 213*a* of the first metal wiring layer, and the contact 214*a*, and the reference power supply Vss is supplied to the line 215*a* of the second metal wiring layer. The lower diffusion layer 202*pa*, which is a source region of the PMOS transistor Tp11, is connected to a drain region of the PMOS transistor Tp12 via the silicide layer 203, and the upper diffusion layer 207*p*12, which is a source region of the PMOS transistor Tp12, is connected to the line 213*c* of the first metal wiring layer via the silicide layer 209*p*12 and the contact 210*p*12. Further, a drain region of the PMOS transistor Tp13 is connected to the line 213*c* of the first metal wiring layer via the upper diffusion layer 207*p*13, the silicide layer 209*p*13, and the contact 210*p*13. Here, the source of the PMOS transistor Tp12 and the drain of the PMOS transistor Tp13 are connected to each other via the line 213*c* of the first metal wiring layer. Further, the lower diffusion layer 202*pb*, which is a source region of the PMOS transistor Tp13, is connected to the line 215*j* of the second metal wiring layer via the silicide layer 203, the contact 212*b*, the line 213*d* of the first metal wiring layer, and the contact 214*b*, and the power supply Vcc is supplied to the line 215*j* of the second metal wiring layer. In FIG. 12A and FIGS. 13A to 13J, the contact 212*b*, the line 213*d* of the first metal wiring layer, and the contact 214*b* are placed in each of two, upper and lower portions.

The line 215*g* of the second metal wiring layer is supplied with an address signal A1. The line 215*g* is connected to the line 213*k* of the first metal wiring layer, which is arranged to extend, via the contact 214*k*. The line 215*g* is further connected to the gate line 206*b* via the contact 211*k*, and accordingly the address signal A1 is supplied to the gate electrode 206 of the PMOS transistor Tp11. The address signal A1 is also supplied to the gate electrode 206 of the NMOS transistor Tn11 via the gate line 206*a*.

The line 215*e* of the second metal wiring layer is supplied with an address signal A2. The line 215*e* of the second metal wiring layer is connected to the gate line 206*c* via the contact 214*m*, the line 213*m* of the first metal wiring layer, and the contact 211*m*, and accordingly the address signal A2 is supplied to the gate electrode 206 of the NMOS transistor Tn12 and the gate electrode 206 of the PMOS transistor Tp12.

The line 215*c* of the second metal wiring layer is supplied with an address signal A3. The line 215*c* of the second metal wiring layer is connected to the gate line 206*d* via the contact 214*n*, the line 213*n* of the first metal wiring layer, and the contact 211*n*, and accordingly the address signal A3 is supplied to the gate electrode 206 of the NMOS transistor Tn13 and the gate electrode 206 of the PMOS transistor Tp13.

It is to be noted that, in FIG. 13A, a size in the longitudinal direction (the second direction) is a minimum processing size determined by the size of an SGT, a margin between an SGT and a lower diffusion layer, and an interval between diffusion layers, and is defined as Ly. That is, in this exemplary embodiment, 3-input NOR decoders 201 are arranged vertically in an inverted configuration, thus allowing the gate line 206*c* or 206*d* of each of the 3-input NOR decoders 201 to be shared with an adjacent 3-input NOR decoder 201. Accordingly, a plurality of 3-input NOR decoders can be arranged adjacent to one another at a minimum pitch (minimum interval) Ly.

For the address signal A1, the line 213*k* of the first metal wiring layer, which replaces the line 215*g* of the second metal wiring layer, is connected to the gate line 206*b*. This configuration allows the arrangement position of the line 215*g* of the second metal wiring layer to be moved to any appropriate position between the line 215*e* of the second metal wiring layer and the line 215*j* of the second metal wiring layer in FIG. 12A. The movement of the arrangement position of the line 215*g* of the second metal wiring layer can be achieved by making the line 213*k* of the first metal wiring layer extend in the lateral direction (the first direction).

In this exemplary embodiment, the line 213*k* of the first metal wiring layer is arranged to extend for the supply of the address signal A1. Alternatively, this technique may be applied to the supply of the address signal A2 or A3.

According to this exemplary embodiment, six SGTs constituting a 3-input NOR decoder are arranged in a line in a first direction, the source regions of the NMOS transistors Tn11, Tn12, and Tn13 are connected in common by using the lower diffusion layer (202*na*) and the silicide layer 203, and the reference power supply line Vss, the power supply line Vcc, and the address signal lines A1, A2, and A3 are arranged to extend in a second direction perpendicular to the first direction. This configuration provides a semiconductor device including a 3-input NOR decoder with a minimum area without using any extra lines or contact regions. In addition, a line of the second metal wiring layer to which an address signal is supplied is replaced with a line of the first metal wiring layer that is arranged to extend, and the line of the first metal wiring layer is connected to a gate line, thereby increasing flexibility in how the address signal is supplied.

Fifth Exemplary Embodiment

Equivalent Circuit Applicable to Exemplary Embodiment of Present Invention

Figure 14:
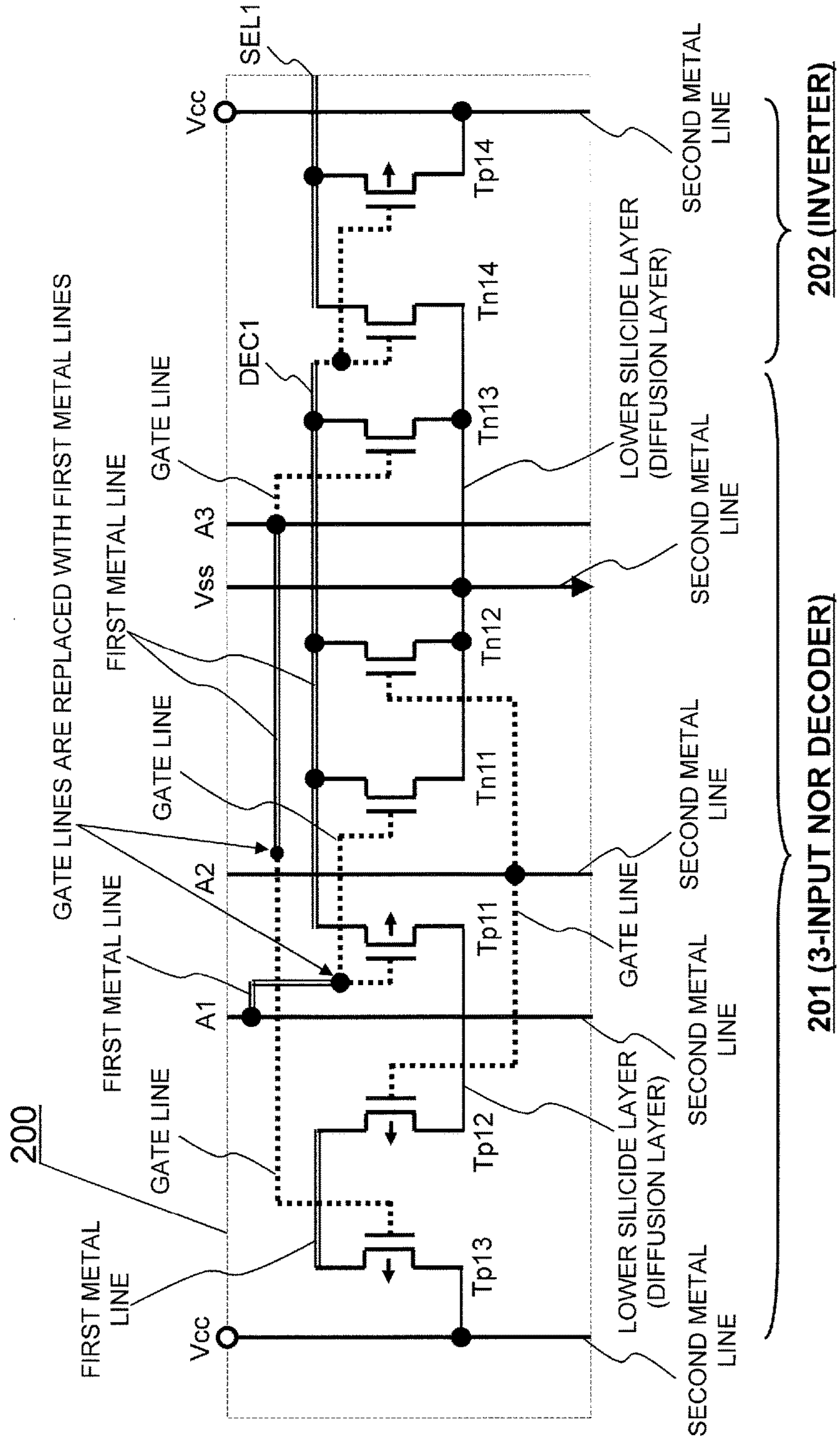
FIG. 14 is an equivalent circuit diagram illustrating a decoder according to a fifth exemplary embodiment of the present invention.

FIG. 14 illustrates a circuit diagram of a decoder arranged in accordance with an arrangement according to an exemplary embodiment. The decoder includes a 3-input NOR decoder and an inverter applicable to the present invention.

In FIG. 14, a 3-input NOR decoder 201 is the same or substantially the same as that illustrated in FIG. 11. An inverter 202 including an NMOS transistor Tn14 and a PMOS transistor Tp14 is added to the configuration illustrated in FIG. 11 to form a decoder 200. The gate of the NMOS transistor Tn14 and the gate of the PMOS transistor Tp14 are connected in common to the output line DEC1 of the 3-input NOR decoder 201. The drain of the NMOS transistor Tn14 and the drain of the PMOS transistor Tp14 are connected in common to serve as a decoder output SELL. The source of the NMOS transistor Tn14 and the source of the PMOS transistor Tp14 are respectively connected to a reference power supply Vss and a power supply Vcc.

The source of the NMOS transistor Tn14 is arranged and connected in common to those of the NMOS transistors Tn11, Tn12, and Tn13 via a lower silicide layer.

As described above, the addition of the inverter 202 to the NOR decoder 201 with a positive logic output results in the output SEL1 of the decoder 200 being a negative logic output (the output of a selected decoder is logic "0"). Here, the inverter 202 has both a logic inversion function and a buffer function (for amplifying the driving capability of the NOR decoder 201).

Figure 15A:
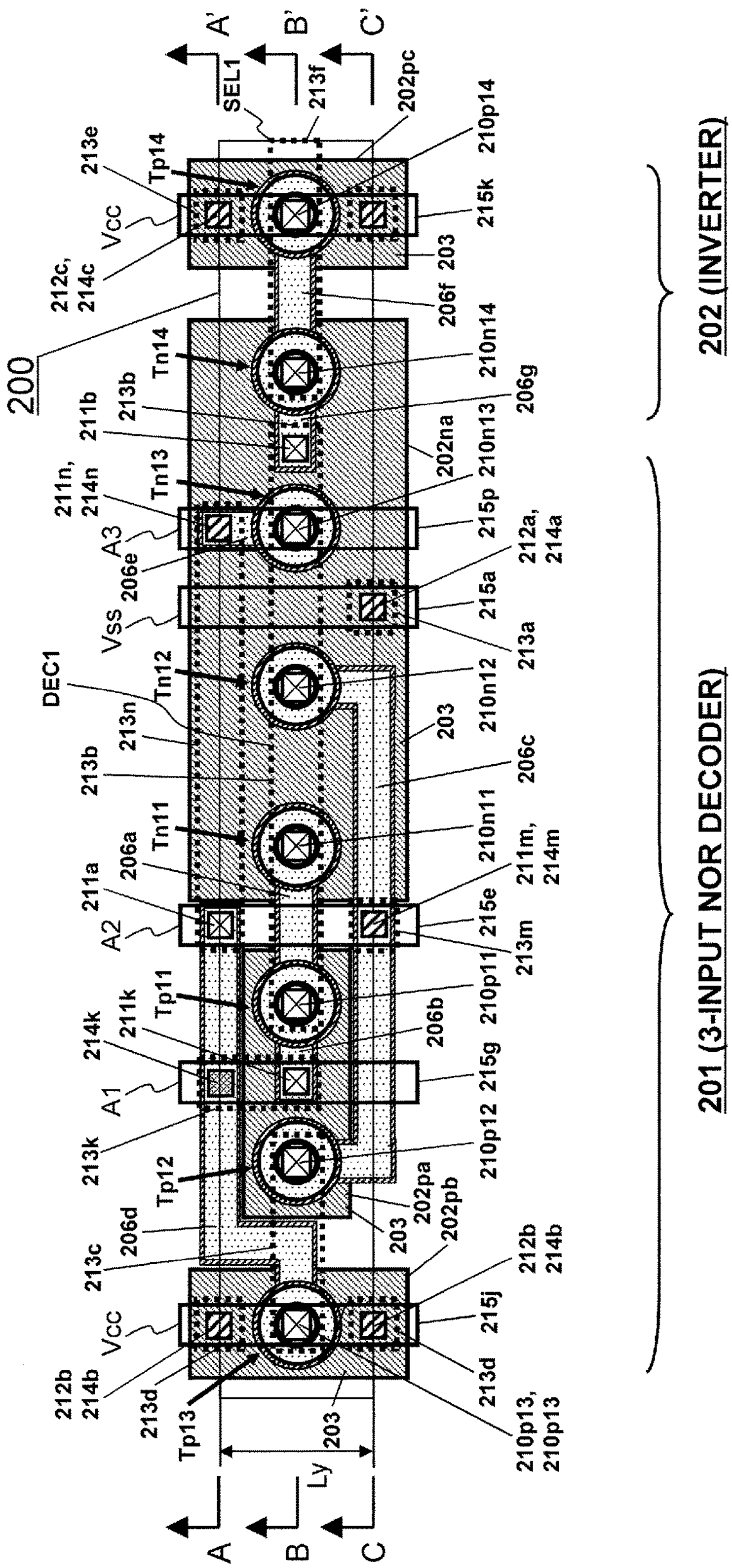
FIG. 15A is a plan view of the decoder according to the fifth exemplary embodiment of the present invention.

FIGS. 15A and 15B and FIGS. 16A, 16B, and 16C illustrate a fifth exemplary embodiment as an exemplary embodiment in which the equivalent circuit illustrated in FIG. 14 is applied to the present invention. FIG. 15A is a plan view of the layout (arrangement) of the 3-input NOR decoder 201 and the inverter 202 according to this exemplary embodiment.

Figure 15B:
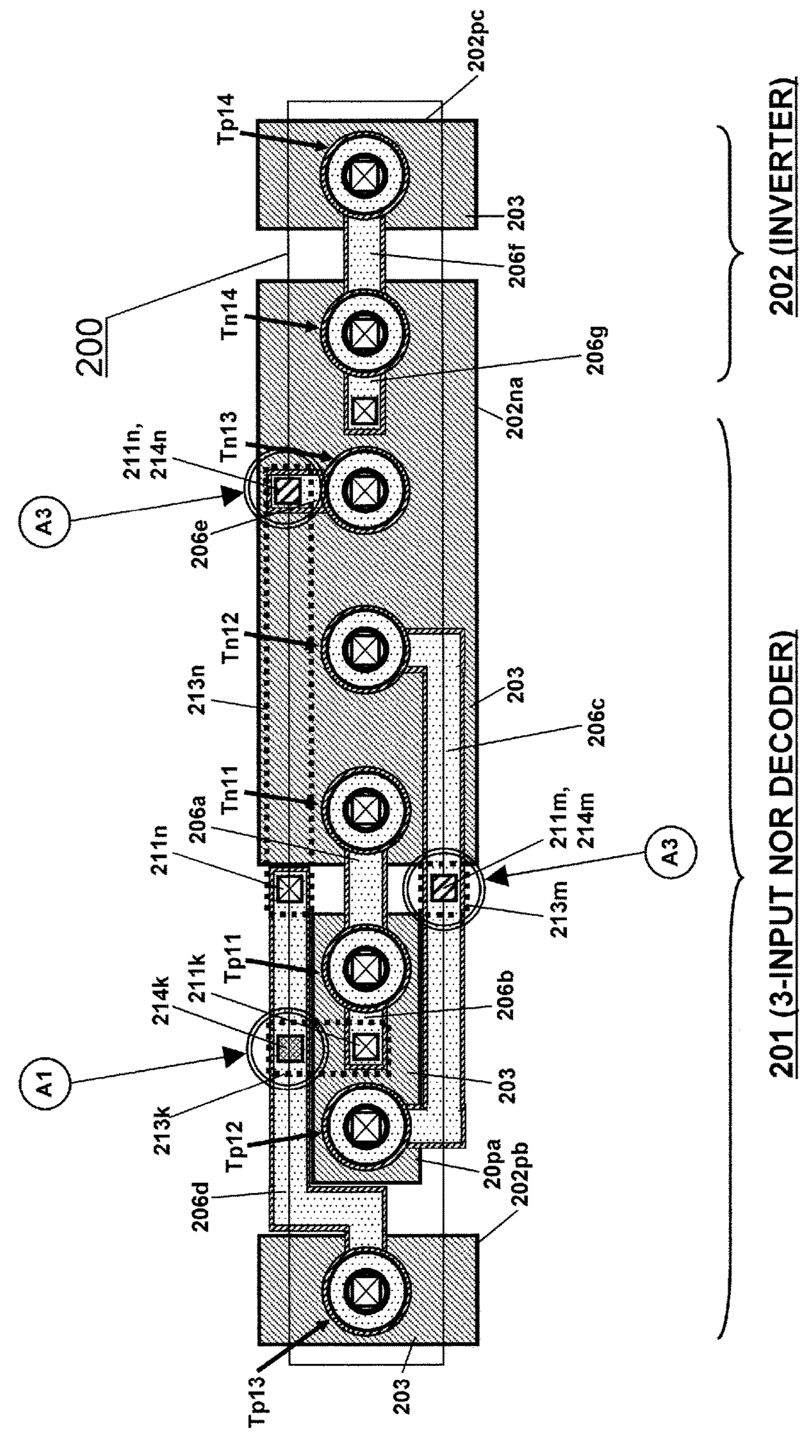
FIG. 15B is a plan view of the decoder according to the fifth exemplary embodiment of the present invention.

FIG. 15B illustrates lower diffusion layers, transistors, and gate lines depicted in the plan view of FIG. 15A to facilitate the understanding of the connections between the address signal lines and the gate lines.

Figure 16A:
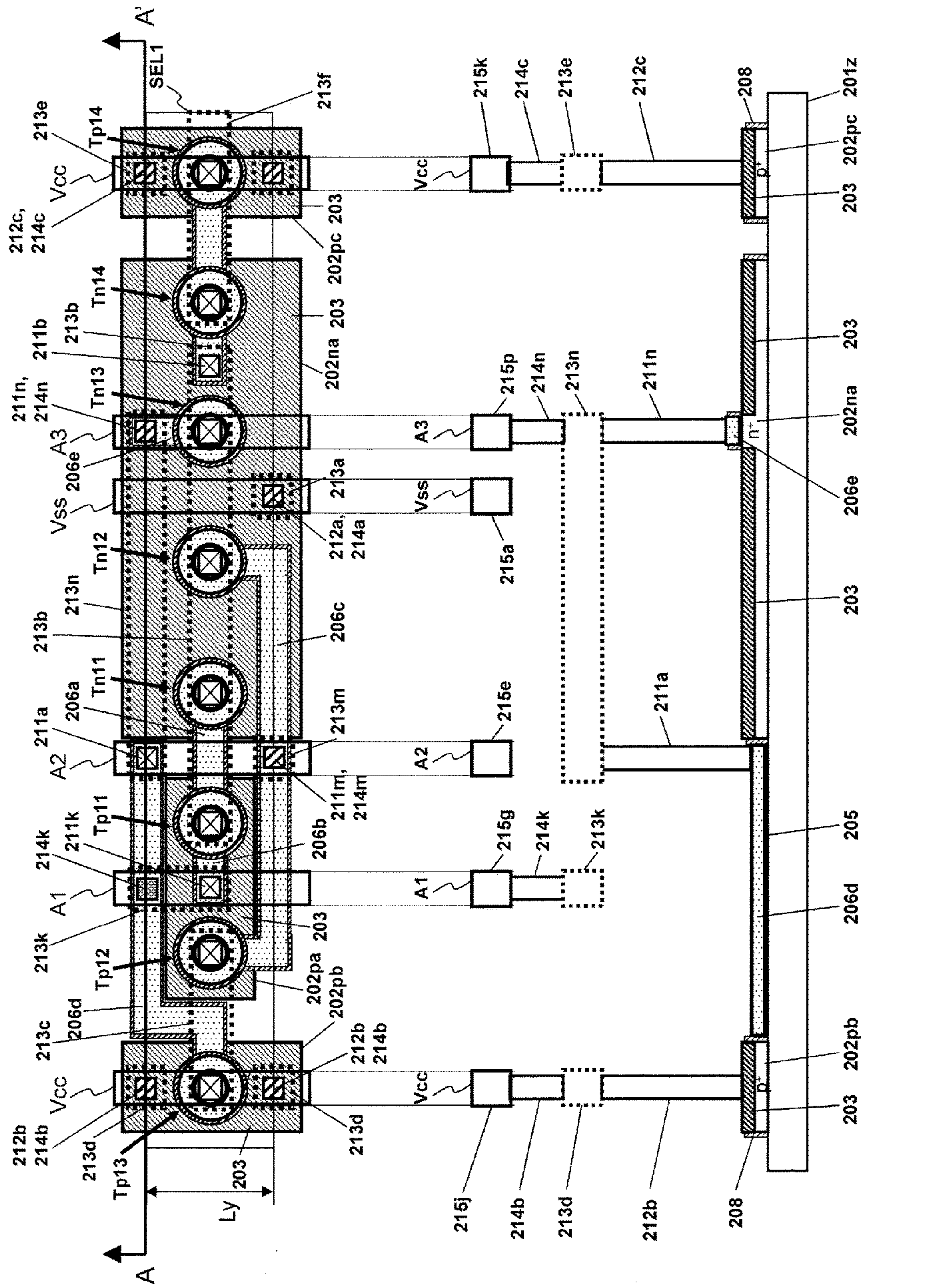
FIG. 16A is a cross-sectional view of the decoder according to the fifth exemplary embodiment of the present invention.
Figure 16B:
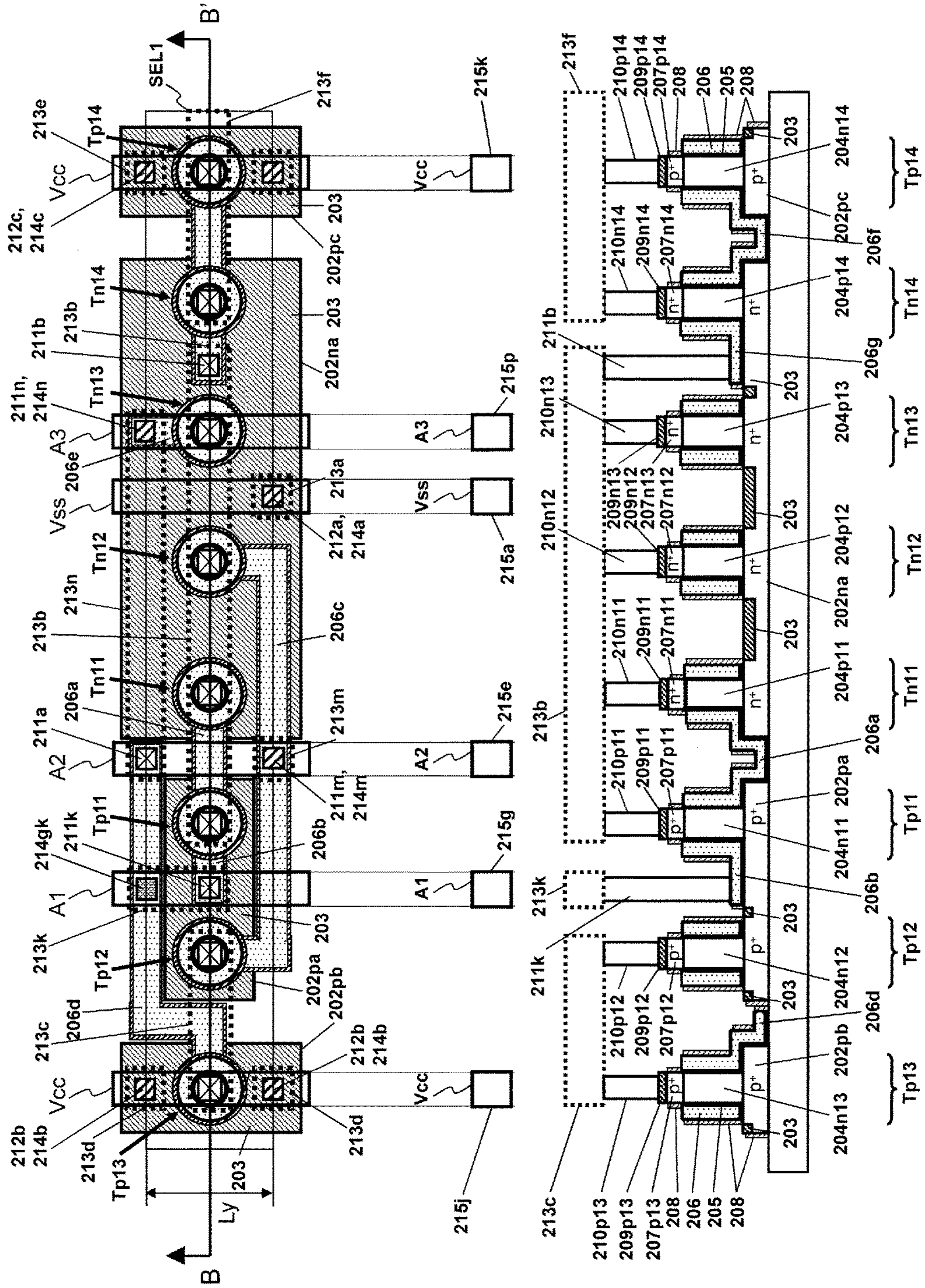
FIG. 16B is a cross-sectional view of the decoder according to the fifth exemplary embodiment of the present invention.
Figure 16C:
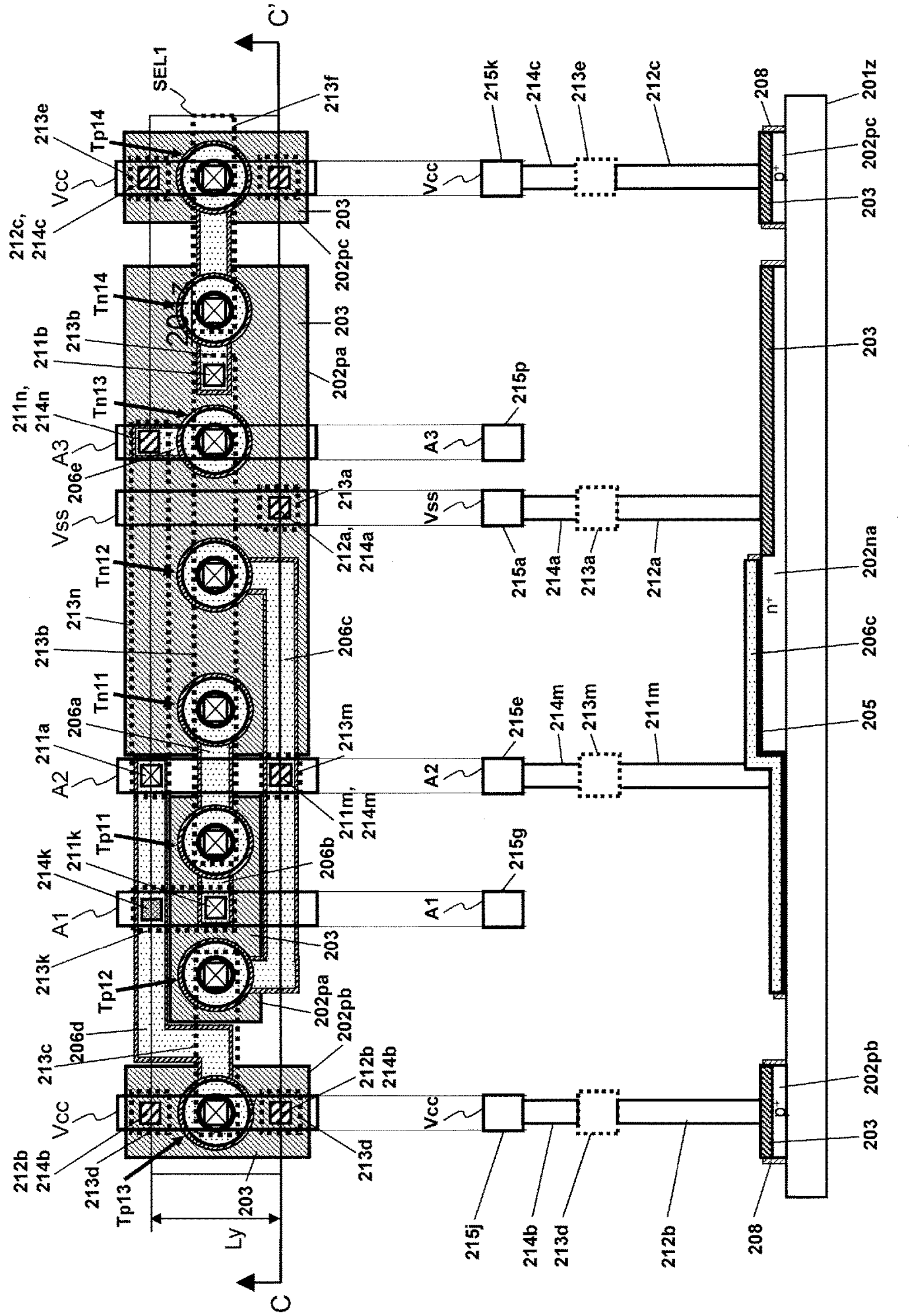
FIG. 16C is a cross-sectional view of the decoder according to the fifth exemplary embodiment of the present invention.

FIG. 16A is a cross-sectional view taken along the cut-line A-A' in FIG. 15A, FIG. 16B is a cross-sectional view taken along the cut-line B-B' in FIG. 15A, and FIG. 16C is a cross-sectional view taken along the cut-line C-C' in FIG. 15A.

FIG. 15A illustrates a configuration in which the inverter 202 including the NMOS transistor Tn14 and the PMOS transistor Tp14 is added to the configuration illustrated in FIG. 12A, and is different from FIG. 12A in the method of connecting the gate electrodes of the NMOS transistor Tn13 and the PMOS transistor Tp13. Specifically, in FIG. 12A (the fourth exemplary embodiment), the gate electrode 206 of the NMOS transistor Tn13 and the gate electrode 206 of the PMOS transistor Tp13 are connected directly to each other by using the gate line 206*d*, while, in FIG. 15A (the fifth exemplary embodiment), separate gate lines 206*d* and 206*e* are connected to each other by using a line 213*n* of the first metal wiring layer. In FIG. 15A, the line 213*n* of the first metal wiring layer is made to extend in a lateral direction (first direction). This arrangement increases the flexibility of arrangement of a line 215*p* of the second metal wiring layer along which an address signal A3 is supplied, as described below.

In FIGS. 15A and 15B and FIGS. 16A, 16B, and 16C, portions having the same or substantially the same structures as those illustrated in FIG. 12A and FIG. 13A to FIG. 13J are denoted by equivalent reference numerals in the 200s.

In FIG. 15A, the transistors constituting the NOR decoder 201 and the inverter 202 illustrated in FIG. 14, namely, the PMOS transistor Tp14, the NMOS transistor Tn14, the NMOS transistors Tn13, Tn12, and Tn11, and the PMOS transistors Tp11, Tp12, and Tp13, are arranged in a line in a lateral direction (a first direction) from right to left in this figure.

Further, lines 215*k*, 215*p*, 215*a*, 215*e*, 215*g*, and 215*j* of the second metal wiring layer are arranged to extend in a longitudinal direction (a second direction perpendicular to the first direction) and respectively form a power supply line Vcc, an address signal line A3, a reference power supply Vss, address signal lines A2 and A1, and a power supply line Vcc.

A feature of this exemplary embodiment is that, as in FIG. 12A, the address signal line A1 connected to the line 215*g* of the second metal wiring layer is temporarily replaced by a line 213*k* of the first metal wiring layer via a contact 214*k* and the line 213*k* of the first metal wiring layer is made to extend for wiring and is connected to the gate line 206*b* via a contact 211*k*. Another feature of this exemplary embodiment is that the address signal line A3 connected to the line 215*p* of the second metal wiring layer is temporarily replaced by the line 213*n* of the first metal wiring layer via a contact 214*n* and the line 213*n* of the first metal wiring layer is made to extend for wiring and is connected to the gate line 206*d* via a contact 211*a*. This feature is available for the arrangement of a plurality of decoders 200 according to this exemplary embodiment in order to readily arrange a plurality of address signal lines without increasing the area thereof, as illustrated in another exemplary embodiment described below. Still another feature of this exemplary embodiment is that a lower diffusion layer (202*na*) that is a source region of the NMOS transistor Tn14 constituting the inverter 202 is made common to the lower diffusion layer (202*na*), which is the source regions of the NMOS transistors Tn11, Tn12, and Tn13 of the 3-input NOR decoder 201, thereby allowing the line (215*a*) of the second metal wiring layer along which the reference power supply Vss is supplied to be rendered common, which results in a reduction in the number of lines of the second metal wiring layer.

This configuration will be described in detail hereinafter.

Planar silicon layers 202*na*, 202*pa*, 202*pb*, and 202*pc* are formed on top of an insulating film such as a buried oxide (BOX) film layer 201*z* disposed on a substrate. The planar silicon layers 202*na*, 202*pa*, 202*pb*, and 202*pc* are formed as an n+ diffusion layer, a p+ diffusion layer, a p+ diffusion layer, and a p+ diffusion layer, respectively, through impurity implantation or the like. Reference numeral 203 denotes a silicide layer disposed on surfaces of the planar silicon layers (202*na*, 202*pa*, 202*pb*, and 202*pc*). Reference numerals 204*p*11, 204*p*12, 204*p*13, and 204*p*14 denote p-type silicon pillars, and reference numerals 204*n*11, 204*n*12, 204*n*13, and 204*n*14 denote n-type silicon pillars. Reference numeral 205 denotes a gate insulating film that surrounds the silicon pillars 204*p*11, 204*p*12, 204*p*13, 204*p*14, 204*n*11, 204*n*12, 204*n*13, and 204*n*14. Reference numeral 206 denotes a gate electrode, and reference numerals 206*a*, 206*b*, 206*c*, 206*d*, 206*e*, 206*f*, and 206*g* denote gate lines. The gate insulating film 205 is also formed to underlie the gate electrode 206 and the gate lines 206*a*, 206*b*, 206*c*, 206*d*, 206*e*, 206*f*, and 206*g*.

In top portions of the silicon pillars 204*p*11, 204*p*12, 204*p*13, and 204*p*14, n+ diffusion layers 207*n*11, 207*n*12, 207*n*13, and 207*n*14 are respectively formed through impurity implantation or the like. In top portions of the silicon pillars 204*n*11, 204*n*12, 204*n*13, and 204*n*14, p+ diffusion layers 207*p*11, 207*p*12, 207*p*13, and 207*p*14 are respectively formed through impurity implantation or the like. Reference numeral 208 denotes a silicon nitride film for protecting the gate insulating film 205, and reference numerals 209*n*11, 209*n*12, 209*n*13, 209*n*14, 209*p*11, 209*p*12, 209*p*13, and 209*p*14 denote silicide layers to be respectively connected to the n+ diffusion layers 207*n*11, 207*n*12, 207*n*13, and 207*n*14 and the p+ diffusion layers 207*p*11, 207*p*12, 207*p*13, and 207*p*14.

Reference numerals 210*n*11, 210*n*12, 210*n*13, 210*n*14, 210*p*11, 210*p*12, 210*p*13, and 210*p*14 denote contacts that respectively connect the silicide layers 209*n*11, 209*n*12, 209*n*13, 209*n*14, 209*p*11, 209*p*12, 209*p*13, and 209*p*14 to lines 213*b*, 213*b*, 213*b*, 213*f*, 213*b*, 213*c*, 213*c*, and 213*f* of the first metal wiring layer. Reference numeral 211*k* denotes a contact that connects the gate line 206*b* to the line 213*k* of the first metal wiring layer, reference numeral 211*m* denotes a contact that connects the gate line 206*c* to the line 213*m* of the first metal wiring layer, and reference numeral 211*n* denotes a contact that connects the gate line 206*e* to the line 213*n* of the first metal wiring layer. Reference numeral 211*a* denotes a contact that connects the gate line 206*d* to the line 213*n* of the first metal wiring layer, and reference numeral 211*b* denotes a contact that connects the gate line 206*g* to the line 213*b* of the first metal wiring layer. Reference numeral 212*a* denotes a contact that connects the silicide layer 203 connected to the n+ diffusion layer 202*na* to a line 213*a* of the first metal wiring layer, reference numeral 212*b* denotes a contact (in FIG. 15A, a vertical arrangement of two contacts is illustrated) that connects the silicide layer 203 connected to the p+ diffusion layer 202*pb* to a line 213*d* of the first metal wiring layer, and reference numeral 212*c* denotes a contact (in FIG. 15A, a vertical arrangement of two contacts is illustrated) that connects the silicide layer 203 connected to the p+ diffusion layer 202*pc* to a line 213*e* of the first metal wiring layer.

Reference numeral 214*a* denotes a contact that connects the line 213*a* of the first metal wiring layer to the line 215*a* of the second metal wiring layer, reference numeral 214*b* denotes a contact that connects the line 213*d* of the first metal wiring layer to the line 215*j* of the second metal wiring layer, and reference numeral 214*c* denotes a contact that connects the line 213*e* of the first metal wiring layer to the line 215*k* of the second metal wiring layer. Reference numeral 214*k* denotes a contact that connects the line 213*k* of the first metal wiring layer to the line 215*g* of the second metal wiring layer, reference numeral 214*m* denotes a contact that connects the line 213*m* of the first metal wiring layer to the line 215*e* of the second metal wiring layer, and reference numeral 214*n* denotes a contact that connects the line 213*n* of the first metal wiring layer to the line 215*p* of the second metal wiring layer.

The silicon pillar 204*p*11, the lower diffusion layer 202*na*, the upper diffusion layer 207*n*11, the gate insulating film 205, and the gate electrode 206 constitute the NMOS transistor Tn11. The silicon pillar 204*p*12, the lower diffusion layer 202*na*, the upper diffusion layer 207*n*12, the gate insulating film 205, and the gate electrode 206 constitute the NMOS transistor Tn12. The silicon pillar 204*p*13, the lower diffusion layer 202*na*, the upper diffusion layer 207*n*13, the gate insulating film 205, and the gate electrode 206 constitute the NMOS transistor Tn13. The silicon pillar 204*p*14, the lower diffusion layer 202*na*, the upper diffusion layer 207*n*14, the gate insulating film 205, and the gate electrode 206 constitute the NMOS transistor Tn14. The silicon pillar 204*n*11, the lower diffusion layer 202*pa*, the upper diffusion layer 207*p*11, the gate insulating film 205, and the gate electrode 206 constitute the PMOS transistor Tp11. The silicon pillar 204*n*12, the lower diffusion layer 202*pa*, the upper diffusion layer 207*p*12, the gate insulating film 205, and the gate electrode 206 constitute the PMOS transistor Tp12. The silicon pillar 204*n*13, the lower diffusion layer 202*pb*, the upper diffusion layer 207*p*13, the gate insulating film 205, and the gate electrode 206 constitute the PMOS transistor Tp13. The silicon pillar 204*n*14, the lower diffusion layer 202*pc*, the upper diffusion layer 207*p*14, the gate insulating film 205, and the gate electrode 206 constitute the PMOS transistor Tp14.

Further, the gate line 206*a* is connected to the gate electrode 206 of the NMOS transistor Tn11 and the gate electrode 206 of the PMOS transistor Tp11, and the gate line 206*b* is further connected to the gate electrode 206 of the PMOS transistor Tp11. The gate line 206*c* is connected to the gate electrode 206 of the NMOS transistor Tn12 and the gate electrode 206 of the PMOS transistor Tp12. The gate line 206*e* is connected to the gate electrode 206 of the NMOS transistor Tn13, and the gate line 206*d* is connected to the gate electrode 206 of the PMOS transistor Tp13. The gate line 206*f* is connected to the gate electrode 206 of the NMOS transistor Tn14 and the gate electrode 206 of the PMOS transistor Tp14, and the gate line 206*g* is further connected to the gate electrode 206 of the NMOS transistor Tn14.

The n+ diffusion layer 207*n*11, which is the drain of the NMOS transistor Tn11, the n+ diffusion layer 207*n*12, which is the drain of the NMOS transistor Tn12, the n+ diffusion layer 207*n*13, which is the drain of the NMOS transistor Tn13, and the p+ diffusion layer 207*p*11, which is the drain of the PMOS transistor Tp11, are connected in common via the line 213*b* of the first metal wiring layer to serve as an output line DEC1. The lower diffusion layer 202*na*, which is the sources of the NMOS transistor Tn11, the NMOS transistor Tn12, the NMOS transistor Tn13, and the NMOS transistor Tn14, is connected in common by using the silicide layer 203. The silicide layer 203 is connected to the line 215*a* of the second metal wiring layer via the contact 212*a*, the line 213*a* of the first metal wiring layer, and the contact 214*a*, and the reference power supply Vss is supplied to the line 215*a* of the second metal wiring layer. The lower diffusion layer 202*pa*, which is a source region of the PMOS transistor Tp11, is connected to a drain region of the PMOS transistor Tp12 via the silicide layer 203, and the upper diffusion layer 207*p*12, which is a source region of the PMOS transistor Tp12, is connected to the line 213*c* of the first metal wiring layer via the silicide layer 209*p*12 and the contact 210*p*12. Further, a drain region of the PMOS transistor Tp13 is connected to the line 213*c* of the first metal wiring layer via the upper diffusion layer 207*p*13, the silicide layer 209*p*13, and the contact 210*p*13. Here, the source of the PMOS transistor Tp12 and the drain of the PMOS transistor Tp13 are connected to each other via the line 213*c* of the first metal wiring layer. Further, the lower diffusion layer 202*pb*, which is a source region of the PMOS transistor Tp13, is connected to the line 215*j* of the second metal wiring layer via the silicide layer 203, the contact 212*b*, the line 213*d* of the first metal wiring layer, and the contact 214*b*, and the power supply Vcc is supplied to the line 215*j* of the second metal wiring layer. In FIG. 15A, the contact 212*b*, the line 213*d* of the first metal wiring layer, and the contact 214*b* are placed in each of two, upper and lower portions. The lower diffusion layer 202*pc*, which is a source region of the PMOS transistor Tp14, is connected to the line 215*k* of the second metal wiring layer via the silicide layer 203, the contact 212*c*, the line 213*e* of the first metal wiring layer, and the contact 214*c*, and the power supply Vcc is supplied to the line 215*k* of the second metal wiring layer. In FIG. 15A, the contact 212*c*, the line 213*e* of the first metal wiring layer, and the contact 214*c* are placed in each of two, upper and lower portions. The drain of the NMOS transistor Tn14 and the drain of the PMOS transistor Tp14 are connected in common to the line 213*f* of the first metal wiring layer via the upper diffusion layer 207*n*14, the silicide layer 209*n*14, and the contact 210*n*14 and via the upper diffusion layer 207*p*14, the silicide layer 209*p*14, and the contact 210*p*14, respectively, to serve as an output SEL1 of the decoder 200.

The line 215*g* of the second metal wiring layer is supplied with an address signal A1. The line 215*g* is connected to the line 213*k* of the first metal wiring layer, which is arranged to extend, via the contact 214*k*. The line 215*g* is further connected to the gate line 206*b* via the contact 211*k*, and accordingly the address signal A1 is supplied to the gate electrode 206 of the PMOS transistor Tp11. The address signal A1 is also supplied to the gate electrode 206 of the NMOS transistor Tn11 via the gate line 206*a*.

The line 215*e* of the second metal wiring layer is supplied with an address signal A2. The line 215*e* of the second metal wiring layer is connected to the gate line 206*c* via the contact 214*m*, the line 213*m* of the first metal wiring layer, and the contact 211*m*, and accordingly the address signal A2 is supplied to the gate electrode 206 of the NMOS transistor Tn12 and the gate electrode 206 of the PMOS transistor Tp12.

The line 215*p* of the second metal wiring layer is supplied with an address signal A3. The line 215*p* of the second metal wiring layer is connected to the gate line 206*e* via the contact 214*n*, the line 213*n* of the first metal wiring layer, and the contact 211*n*, and is then connected to the gate electrode 206 of the NMOS transistor Tn13. The line 213*n* of the first metal wiring layer is arranged to extend leftward and is connected to the gate line 206*d* via the contact 211*a*. The gate line 206*d* is connected to the gate electrode 206 of the PMOS transistor Tp13.

It is to be noted that, in FIG. 15A, a size in the longitudinal direction (the second direction) is a minimum processing size determined by the size of an SGT, a margin between an SGT and a lower diffusion layer, and an interval between diffusion layers, and is defined as Ly. That is, in this exemplary embodiment, decoders 200, each including the 3-input NOR decoder 201 and the inverter 202, are arranged vertically in an inverted configuration, thus allowing the gate lines 206*c*, 206*d*, and 206*e* to be shared with adjacent decoders 200. Accordingly, a plurality of decoders can be arranged adjacent to one another at a minimum pitch (minimum interval) Ly.

For the address signal A1, the line 213*k* of the first metal wiring layer, which replaces the line 215*g* of the second metal wiring layer, is connected to the gate line 206*b*. This configuration allows the arrangement position of the line

215*g* of the second metal wiring layer to be moved to any appropriate position between the line 215*e* of the second metal wiring layer and the line 215*j* of the second metal wiring layer in FIG. 15A. The movement of the arrangement position of the line 215*g* of the second metal wiring layer can be achieved by making the line 213*k* of the first metal wiring layer extend in the lateral direction (the first direction).

For the address signal A3, furthermore, the line 213*n* of the first metal wiring layer, which replaces the line 215*p* of the second metal wiring layer, is connected to the gate line 206*e* or the gate line 206*d*. This configuration allows the arrangement position of the line 215*p* of the second metal wiring layer to be moved to any appropriate position between the line 215*k* of the second metal wiring layer and the line 215*a* of the second metal wiring layer in FIG. 15A.

In this exemplary embodiment, for the address signal A2, the line 213*m* of the first metal wiring layer is not arranged to extend. The line 213*m* of the first metal wiring layer may be arranged to extend in a manner similar to that for the address signal A1 or A3.

According to this exemplary embodiment, six SGTs constituting a 3-input NOR decoder (201) and two SGTs constituting an inverter (202) are arranged in a line in a first direction, the source regions of the NMOS transistors Tn11, Tn12, Tn13, and Tn14 are connected in common via the lower diffusion layer (202*na*) and the silicide layer 203, and the reference power supply line Vss, the power supply line Vcc, and the address signal lines A1, A2, and A3 are arranged to extend in a second direction perpendicular to the first direction. This configuration provides a semiconductor device including a decoder (200) formed of the 3-input NOR decoder and the inverter with a minimum area without using any extra lines or contact regions. In addition, a line of the second metal wiring layer to which an address signal is supplied is replaced with a line of the first metal wiring layer that is arranged to extend, and the line of the first metal wiring layer is connected to a gate line, thereby increasing flexibility in how the address signal is supplied.

Sixth Exemplary Embodiment

Equivalent Circuit Applicable to Exemplary Embodiment of Present Invention

Figure 17A:
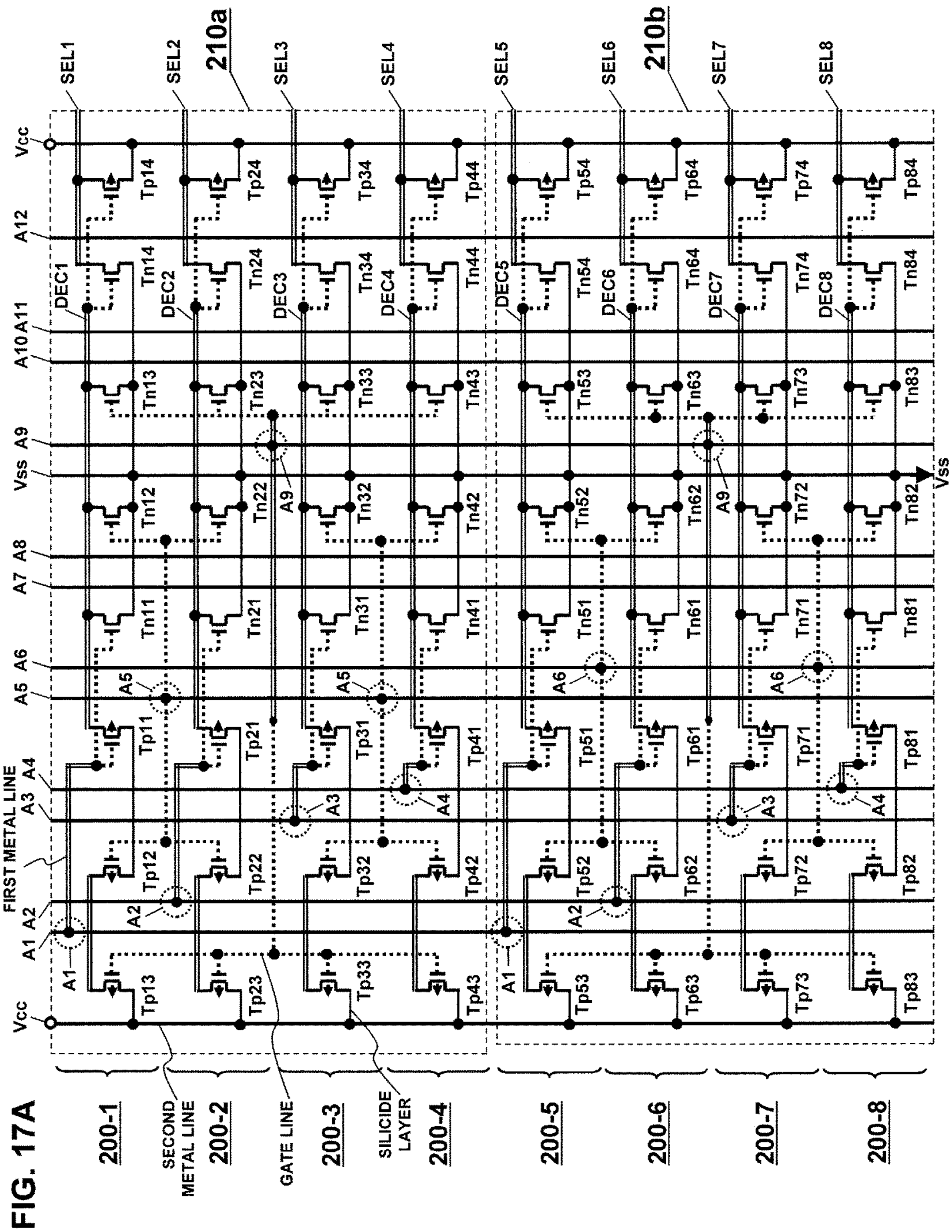
FIG. 17A is an equivalent circuit diagram illustrating a decoder according to a sixth exemplary embodiment of the present invention.
Figure 17B:
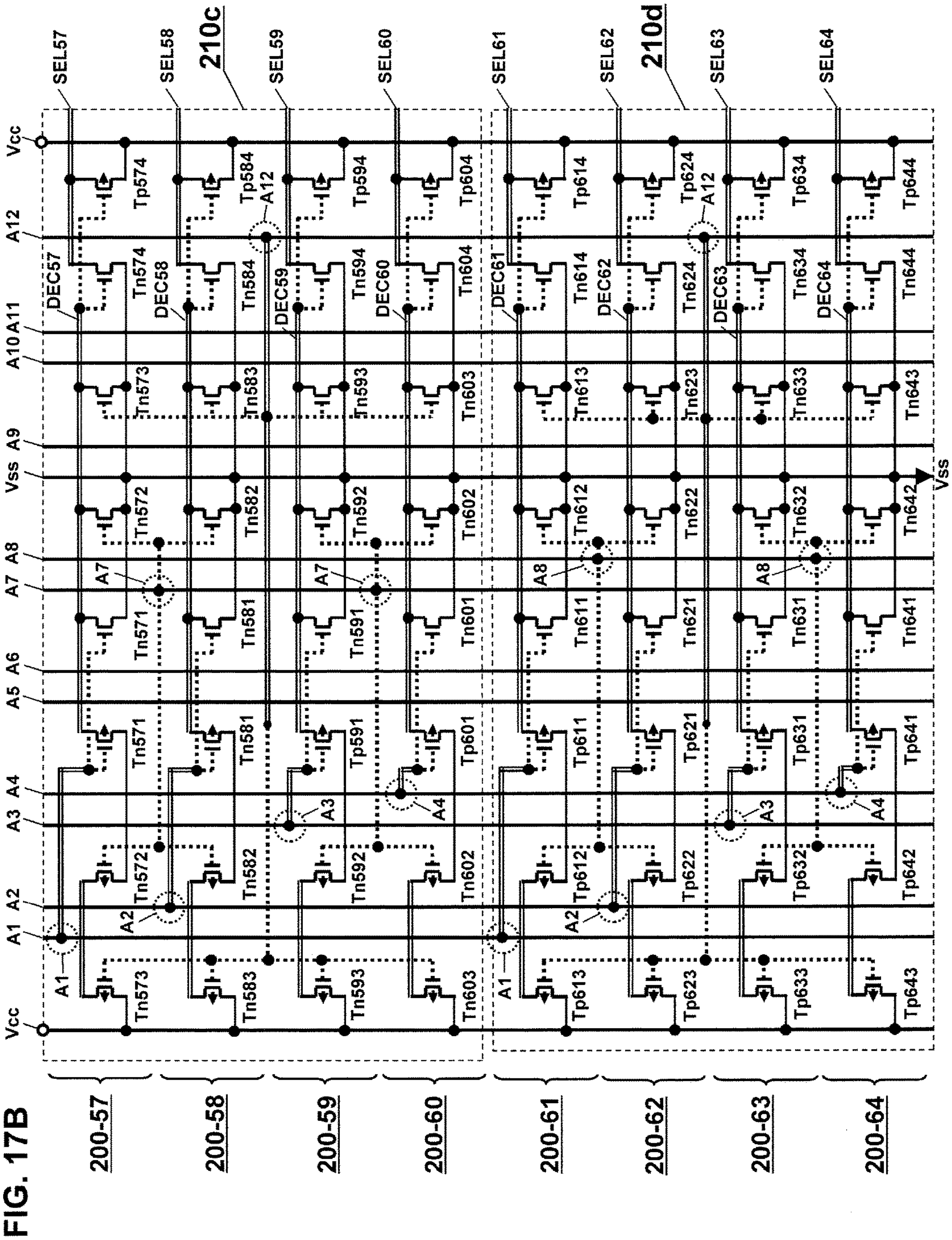
FIG. 17B is an equivalent circuit diagram illustrating the decoder according to the sixth exemplary embodiment of the present invention.

FIGS. 17A and 17B illustrate an equivalent circuit diagram of decoders, each constructed by arranging a plurality of 3-input NOR decoders and a plurality of inverters applicable to the present invention. The illustration is based on an arrangement and connection method according to an exemplary embodiment. As in FIG. 14, lines in silicide layers, gate lines, lines in the first metal wiring layer, and lines in the second metal wiring layer are distinguishably illustrated.

Twelve address signal lines A1, A2, A3, A4, A5, A6, A7, A8, A9, A10, A11, and A12 are provided, in which the address signal lines A1 to A4 are selectively connected to the gate of an NMOS transistor Tnk1 (where k denotes a natural number) and the gate of a PMOS transistor Tpk1, the address signal lines A5 to A8 are selectively connected to the gate of an NMOS transistor Tnk2 and the gate of a PMOS transistor Tpk2, and the address signal lines A9 to A12 are selectively connected to the gate of an NMOS transistor Tnk3 and the gate of a PMOS transistor Tpk3. Sixty-four decoders 200-1 to 200-64 are formed by using the twelve address signal lines A1 to A12.

Note that, as representatives, the eight decoders 200-1 to 200-8 are illustrated in FIG. 17A and the eight decoders 200-57 to 200-64 are illustrated in FIG. 17B since all the sixty-four decoders are difficult to depict in the drawings.

In FIG. 17A, the following connections are provided. The address signal lines A1, A5, and A9 are connected to the decoder 200-1. The address signal lines A2, A5, and A9 are connected to the decoder 200-2. The address signal lines A3, A5, and A9 are connected to the decoder 200-3. The address signal lines A4, A5, and A9 are connected to the decoder 200-4. The address signal lines A1, A6, and A9 are connected to the decoder 200-5. The address signal lines A2, A6, and A9 are connected to the decoder 200-6. The address signal lines A3, A6, and A9 are connected to the decoder 200-7. The address signal lines A4, A6, and A9 are connected to the decoder 200-8.

Further, in FIG. 17B, the following connections are provided. The address signal lines A1, A7, and A12 are connected to the decoder 200-57. The address signal lines A2, A7, and A12 are connected to the decoder 200-58. The address signal lines A3, A7, and A12 are connected to the decoder 200-59. The address signal lines A4, A7, and A12 are connected to the decoder 200-60. The address signal lines A1, A8, and A12 are connected to the decoder 200-61. The address signal lines A2, A8, and A12 are connected to the decoder 200-62. The address signal lines A3, A8, and A12 are connected to the decoder 200-63. The address signal lines A4, A8, and A12 are connected to the decoder 200-64.

Portions at which address signal lines are connected are indicated by the broken-line circles.

As described below, in FIG. 17A, the address signal line A5 is connected in common to the decoders 200-1 and 200-2 and is also connected in common to the decoders 200-3 and 200-4. The address signal line A6 is connected in common to the decoders 200-5 and 200-6 and is also connected in common to the decoders 200-7 and 200-8. Further, in FIG. 17B, the address signal line A7 is connected in common to the decoders 200-57 and 200-58 and is also connected in common to the decoders 200-59 and 200-60. The address signal line A8 is connected in common to the decoders 200-61 and 200-62 and is also connected in common to the decoders 200-63 and 200-64.

In FIGS. 17A and 17B, as described in detail below, the address signal lines A1 to A4 are temporarily connected to lines of a first metal wiring layer through lines of a second metal wiring layer arranged to extend in the longitudinal direction (the second direction), and are then connected to gate lines. Further, in FIG. 17B, the address signal line Alt is also temporarily connected to a line of the first metal wiring layer from a line of the second metal wiring layer arranged to extend in the longitudinal direction (the second direction), and is then connected to a gate line.

FIGS. 18A and 18B illustrate an address map of the sixty-four decoders according to this exemplary embodiment. An address signal line to be connected to each of the decoder outputs DEC1/SEL1 to DEC64/SEL64 is marked with a circle. Connections are made by using contacts, as described below.

Figure 19A:
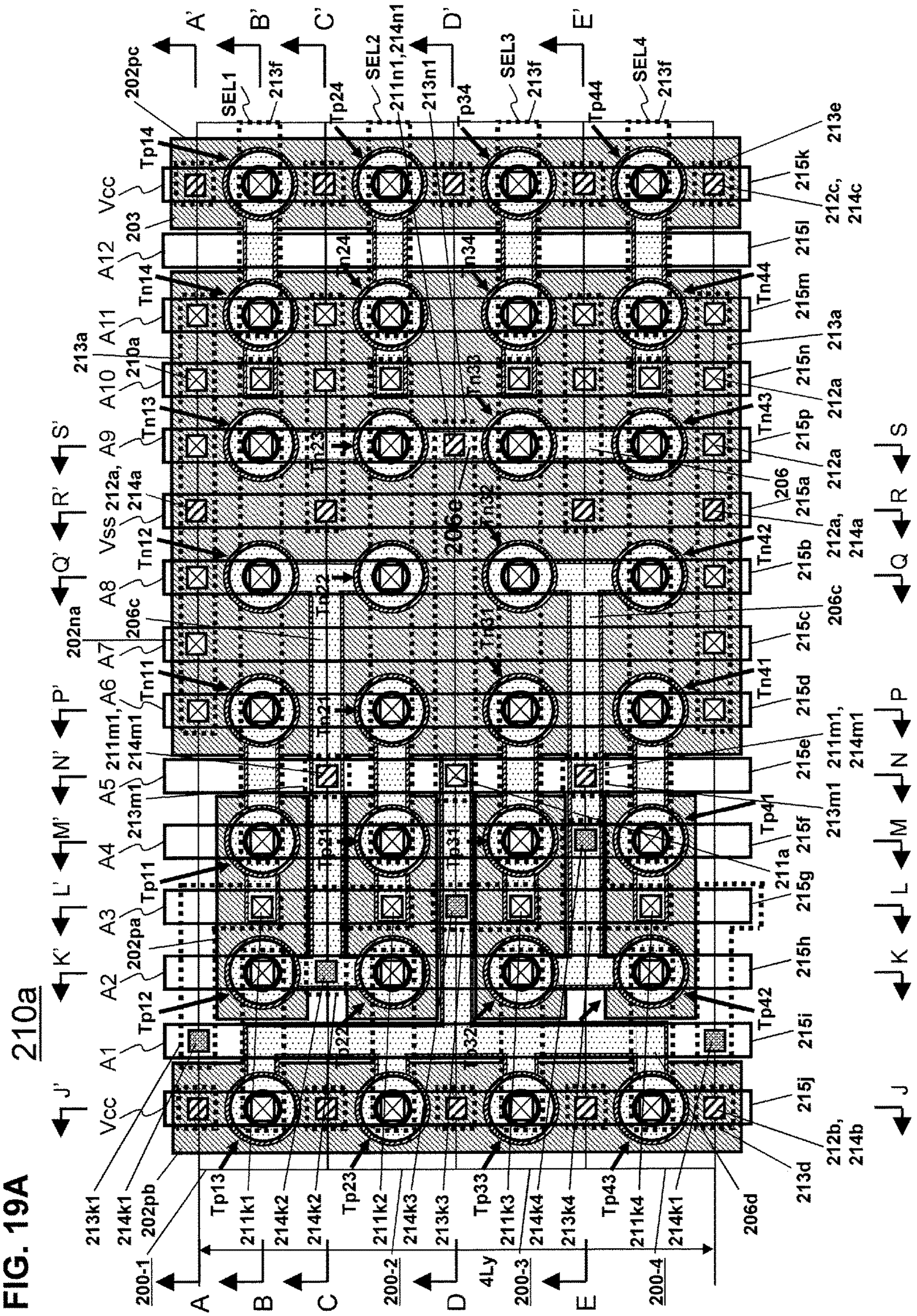
FIG. 19A is a plan view of the decoder according to the sixth exemplary embodiment of the present invention.
Figure 19B:
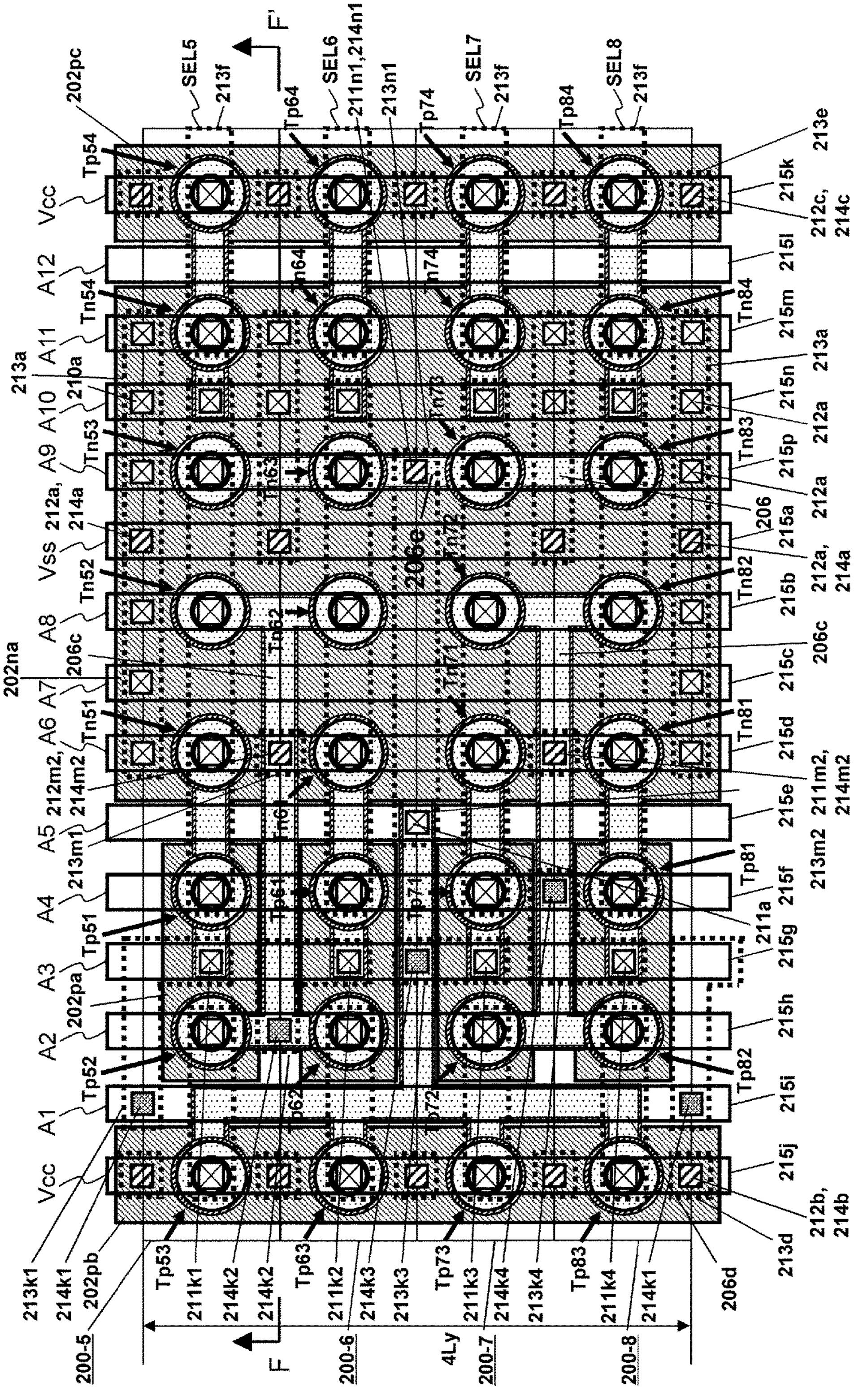
FIG. 19B is a plan view of the decoder according to the sixth exemplary embodiment of the present invention.
Figure 19C:
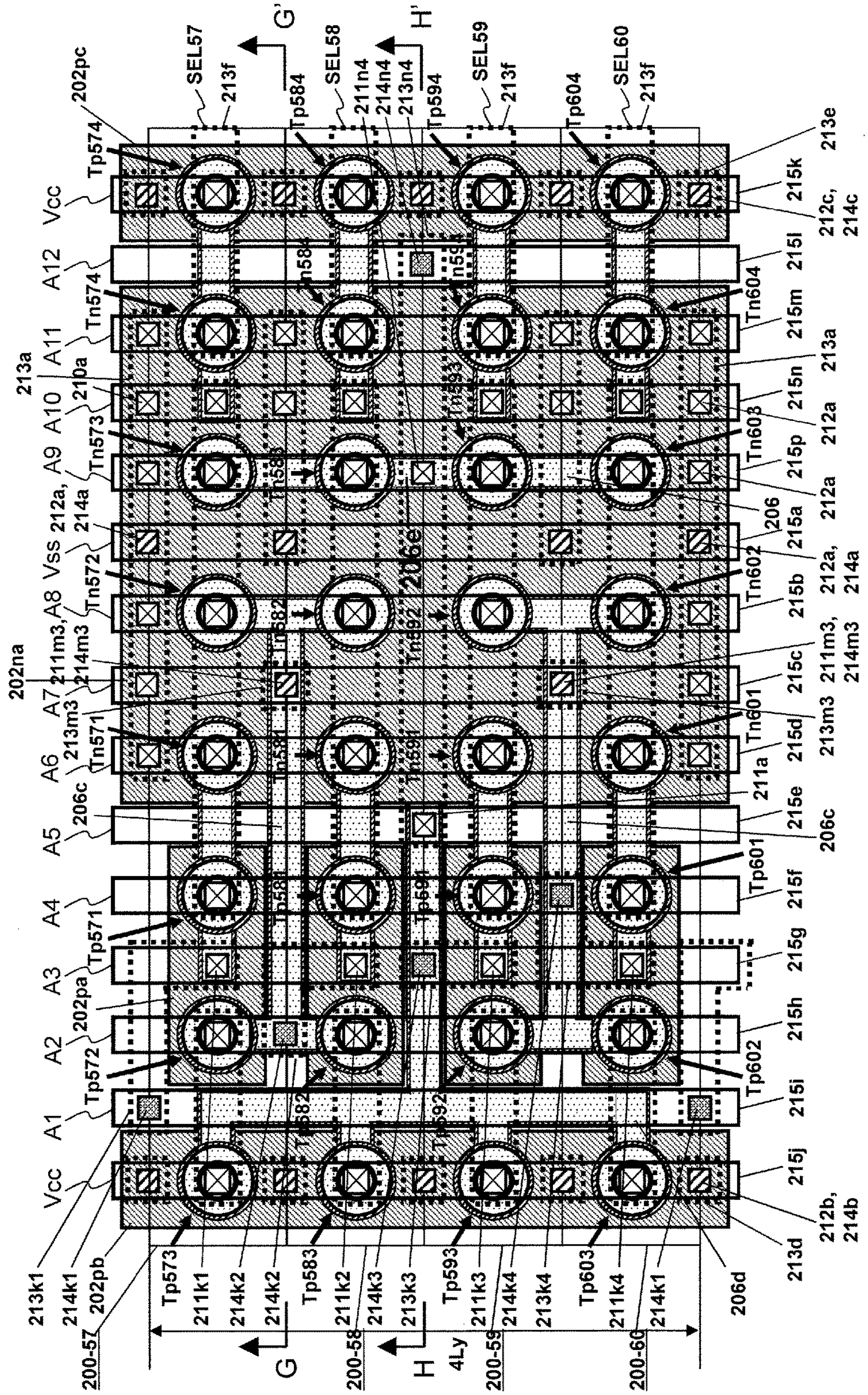
FIG. 19C is a plan view of the decoder according to the sixth exemplary embodiment of the present invention.
Figure 19D:
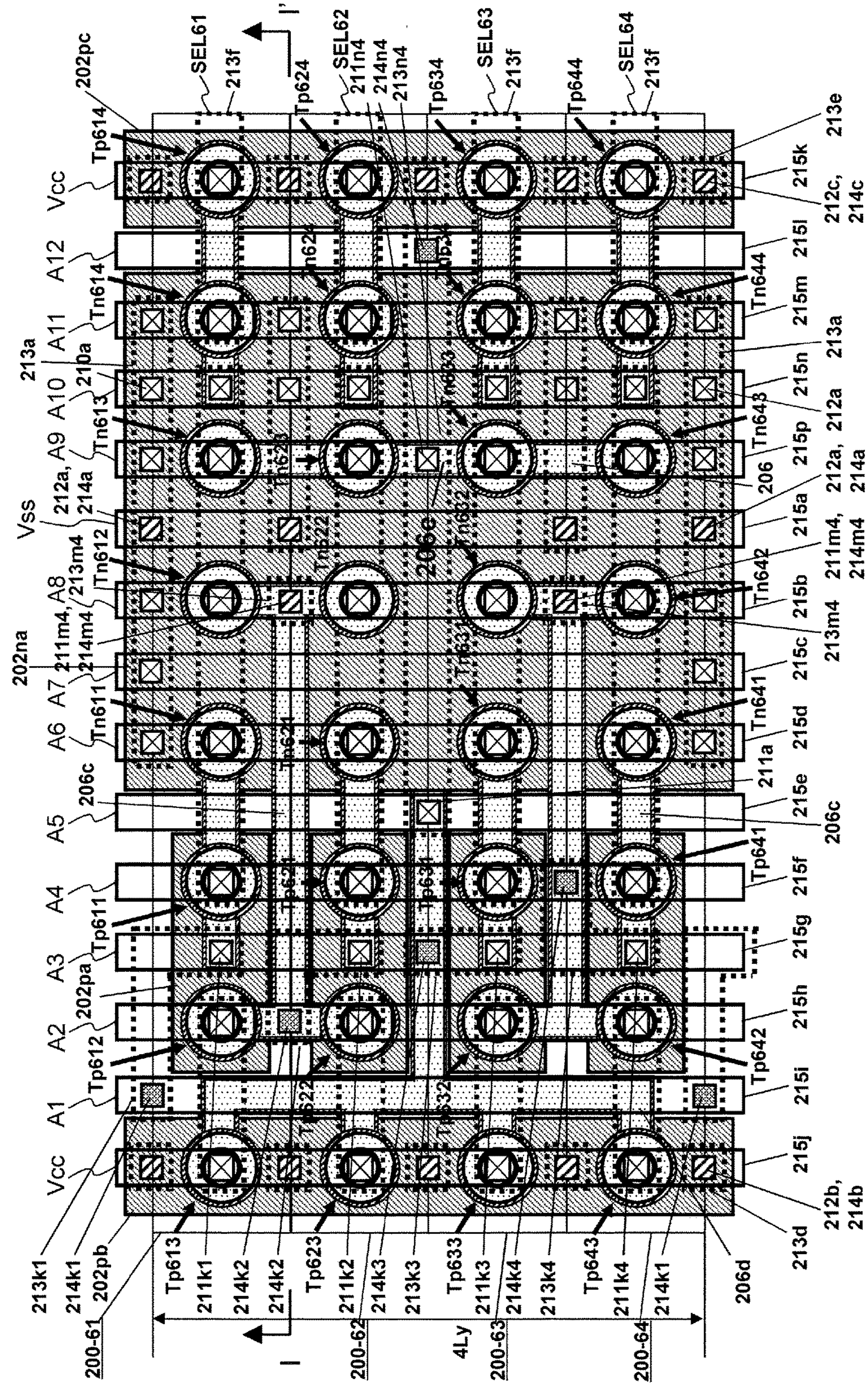
FIG. 19D is a plan view of the decoder according to the sixth exemplary embodiment of the present invention.
Figure 19E:
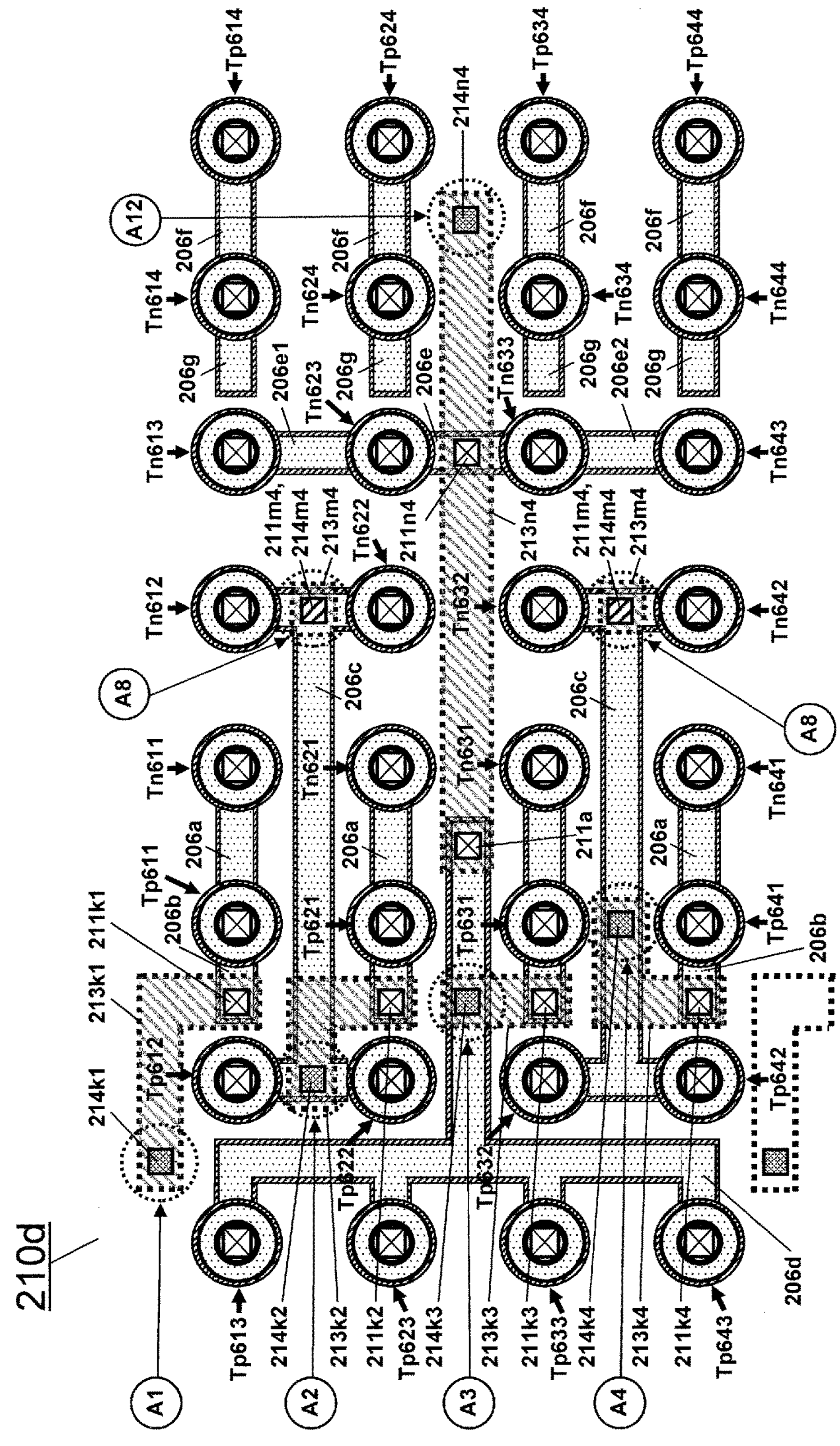
FIG. 19E is a plan view of the decoder according to the sixth exemplary embodiment of the present invention.
Figure 20A:
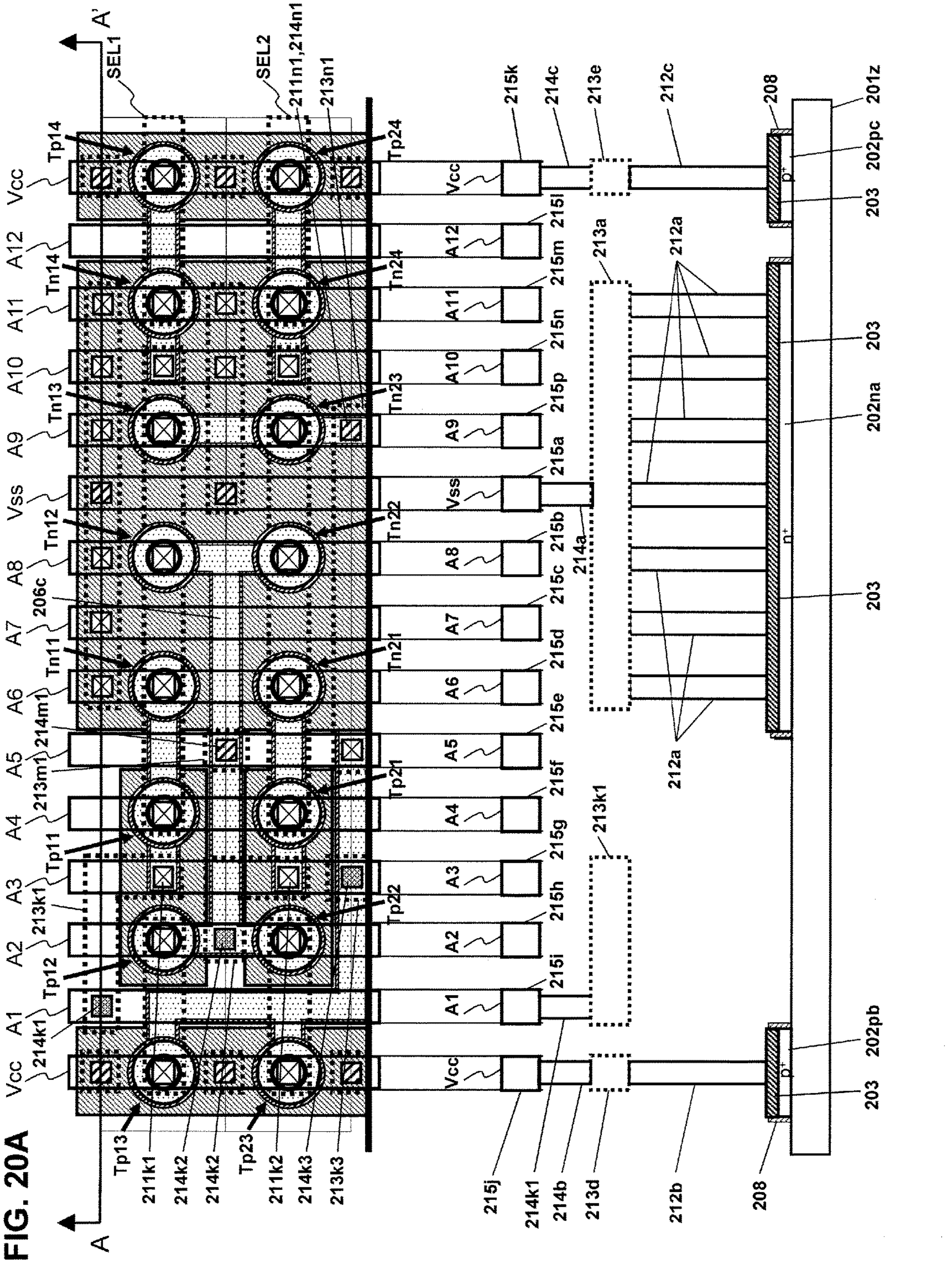
FIG. 20A is a cross-sectional view of the decoder according to the sixth exemplary embodiment of the present invention.
Figure 20B:
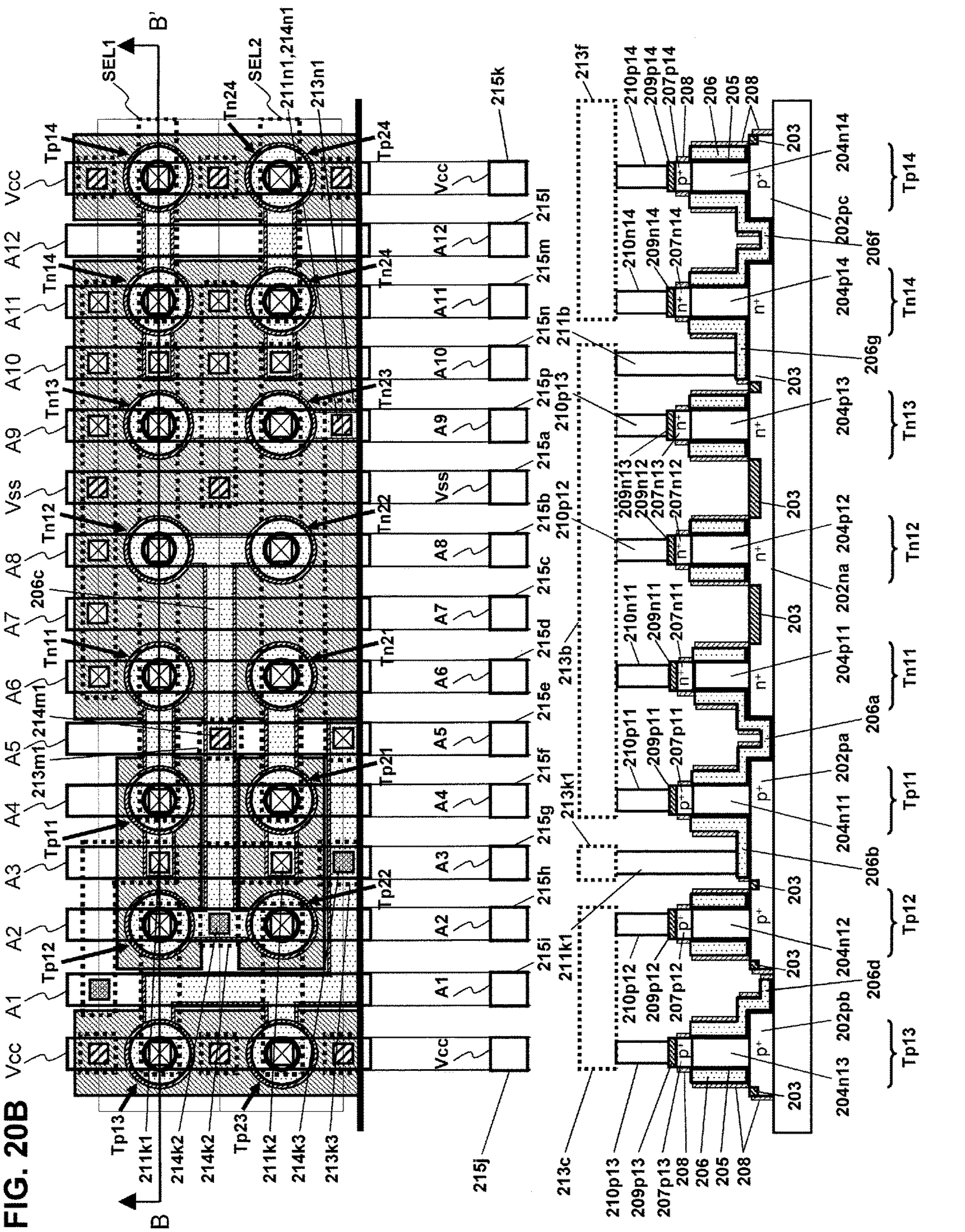
FIG. 20B is a cross-sectional view of the decoder according to the sixth exemplary embodiment of the present invention.
Figure 20C:
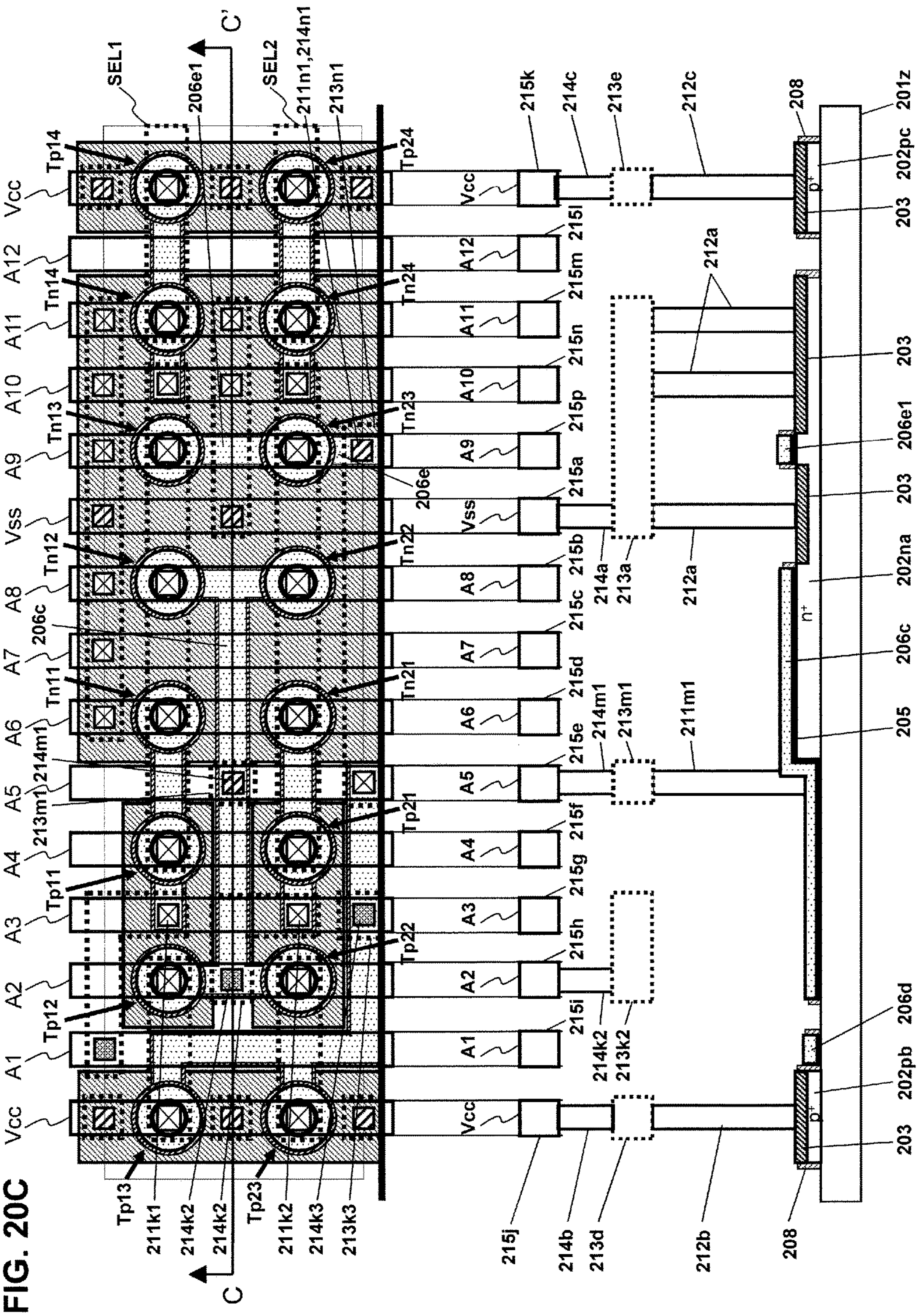
FIG. 20C is a cross-sectional view of the decoder according to the sixth exemplary embodiment of the present invention.
Figure 20D:
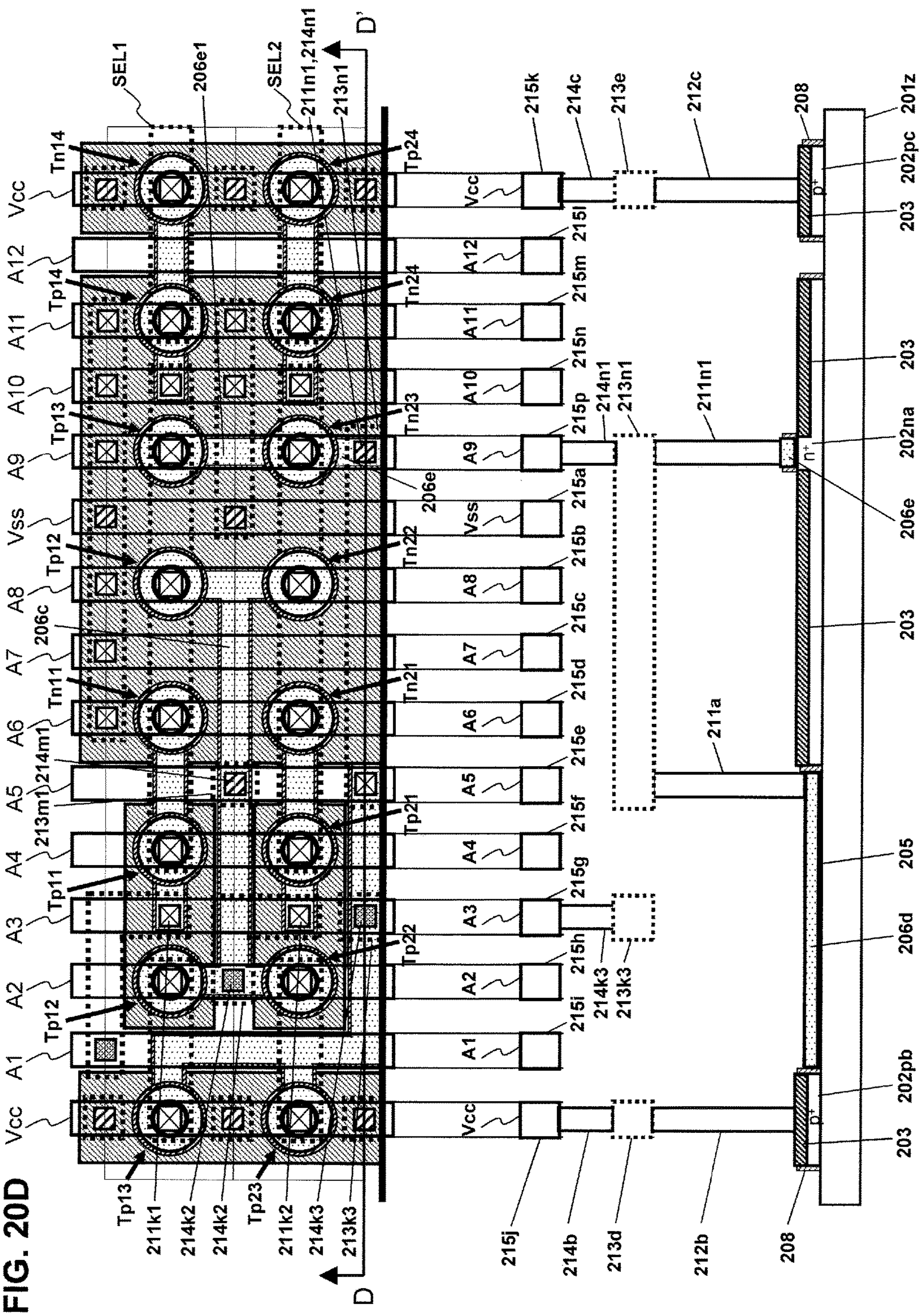
FIG. 20D is a cross-sectional view of the decoder according to the sixth exemplary embodiment of the present invention.
Figure 20E:
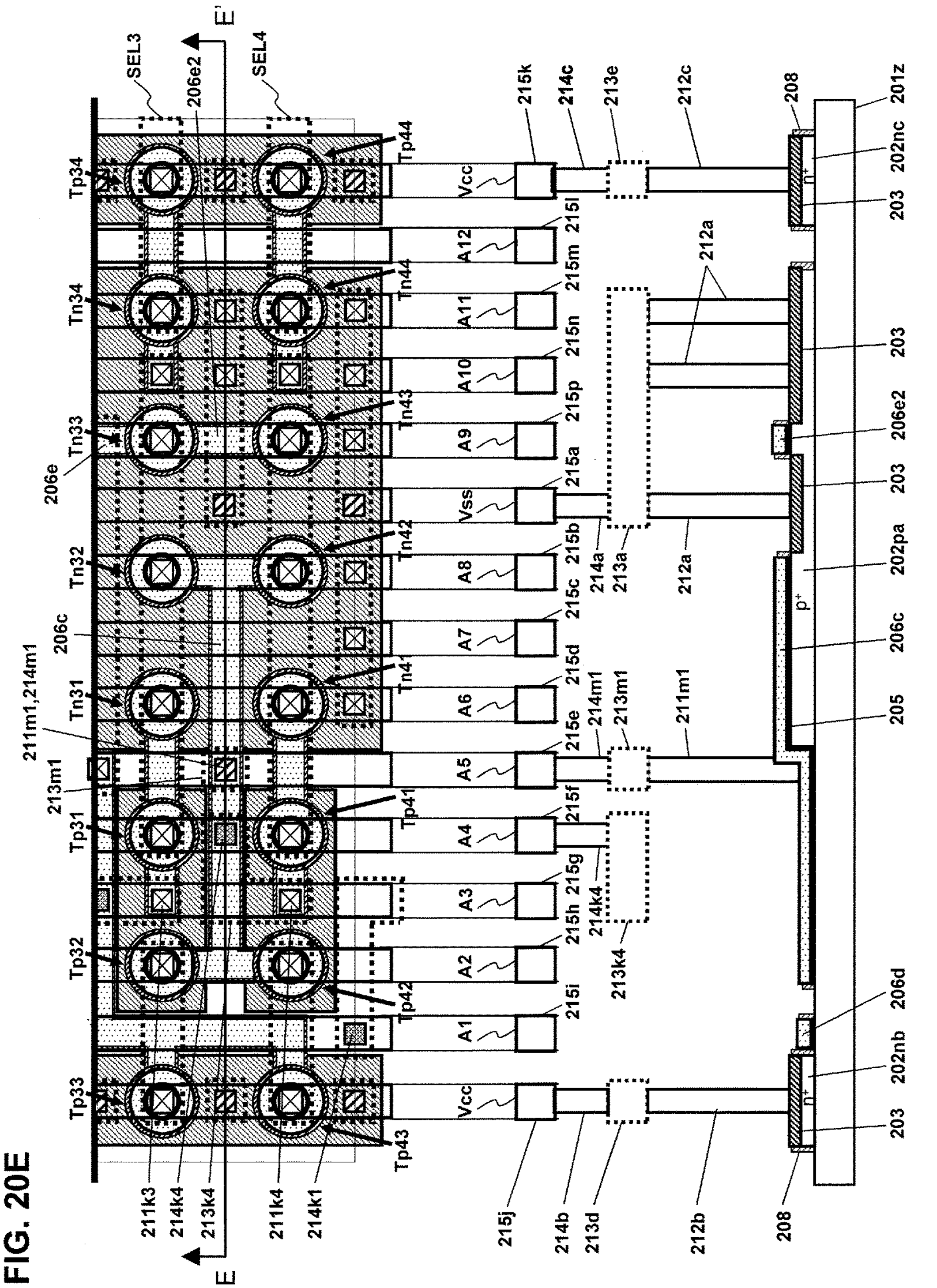
FIG. 20E is a cross-sectional view of the decoder according to the sixth exemplary embodiment of the present invention.
Figure 20F:
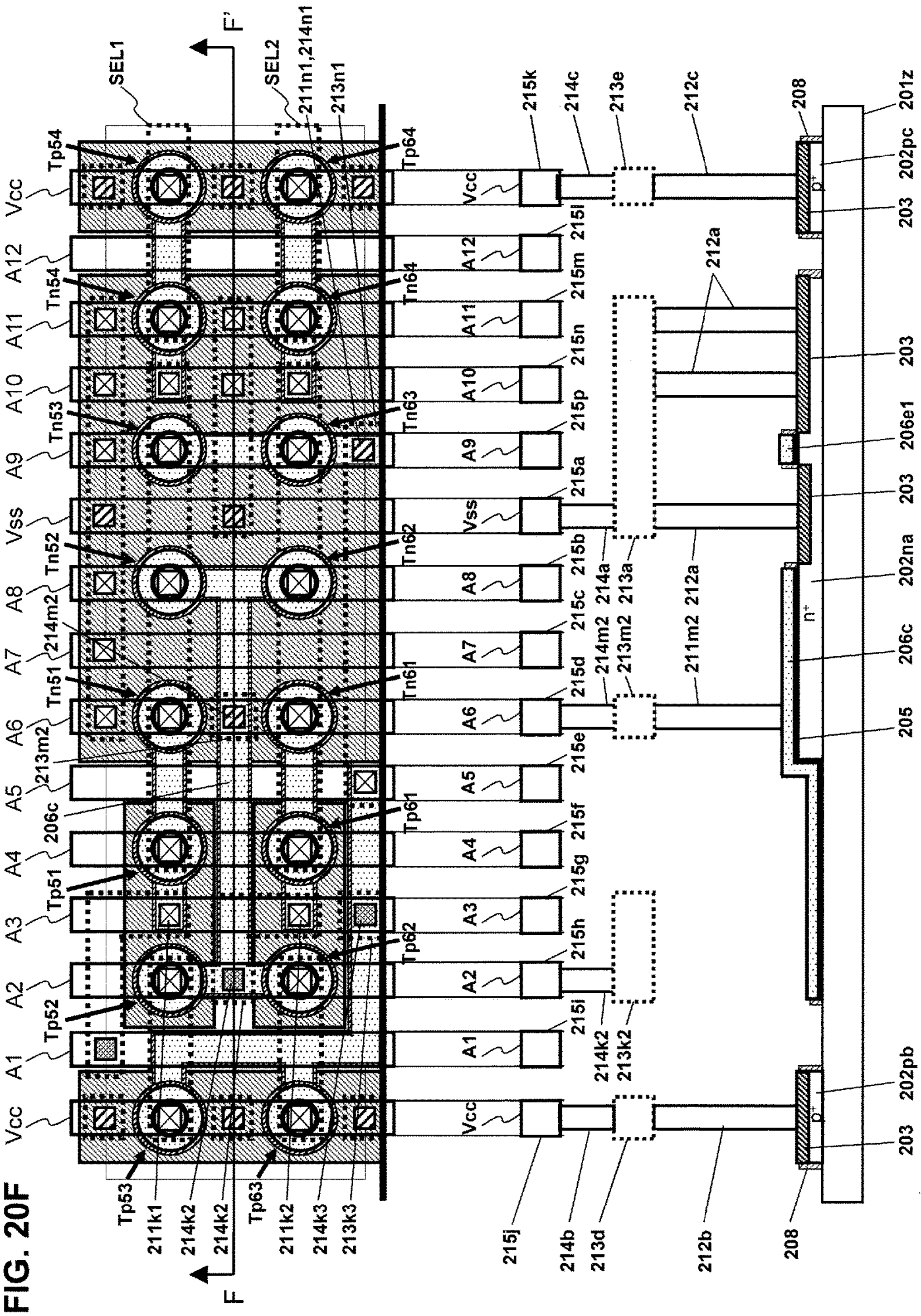
FIG. 20F is a cross-sectional view of the decoder according to the sixth exemplary embodiment of the present invention.
Figure 20G:
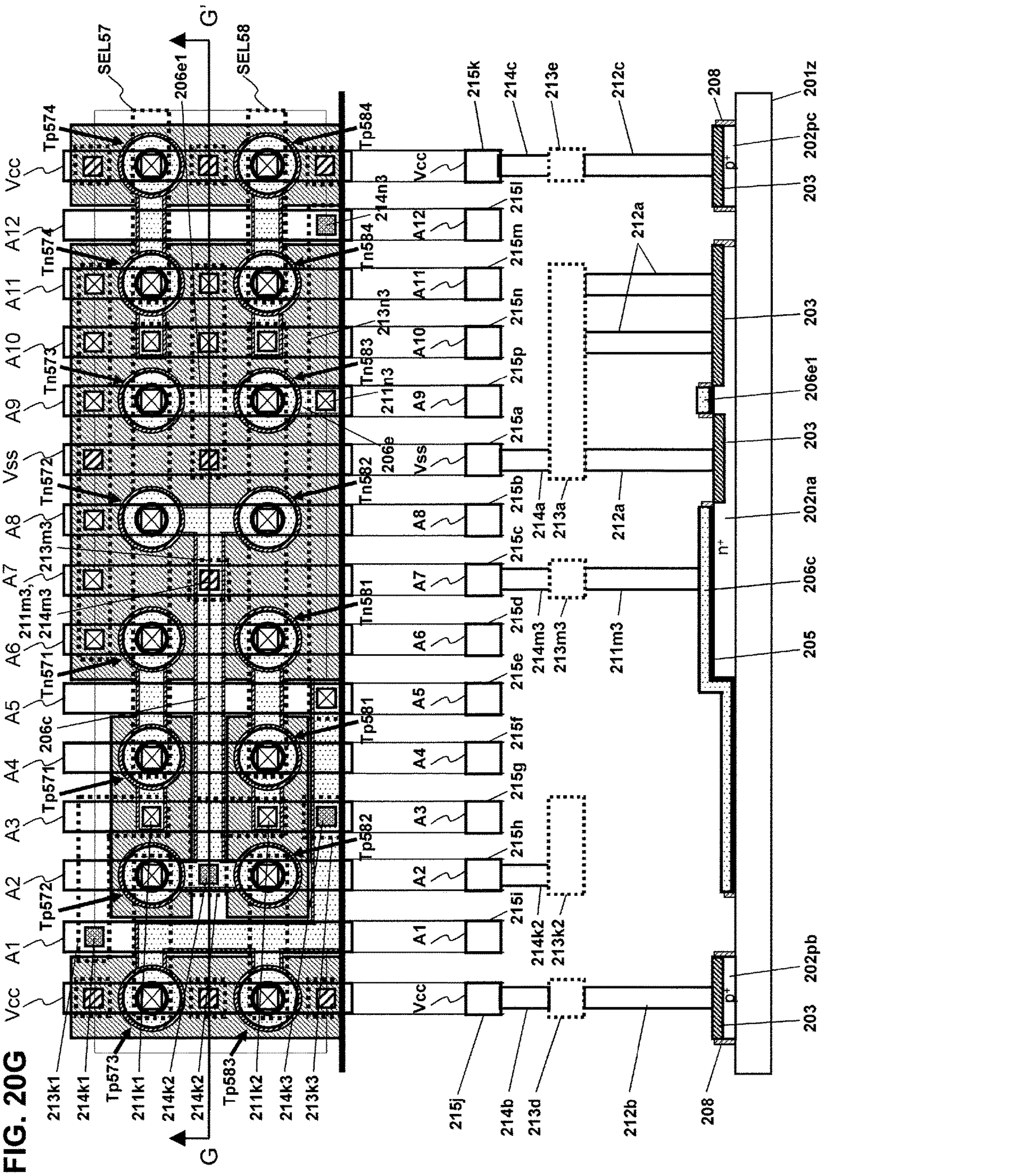
FIG. 20G is a cross-sectional view of the decoder according to the sixth exemplary embodiment of the present invention.
Figure 20H:
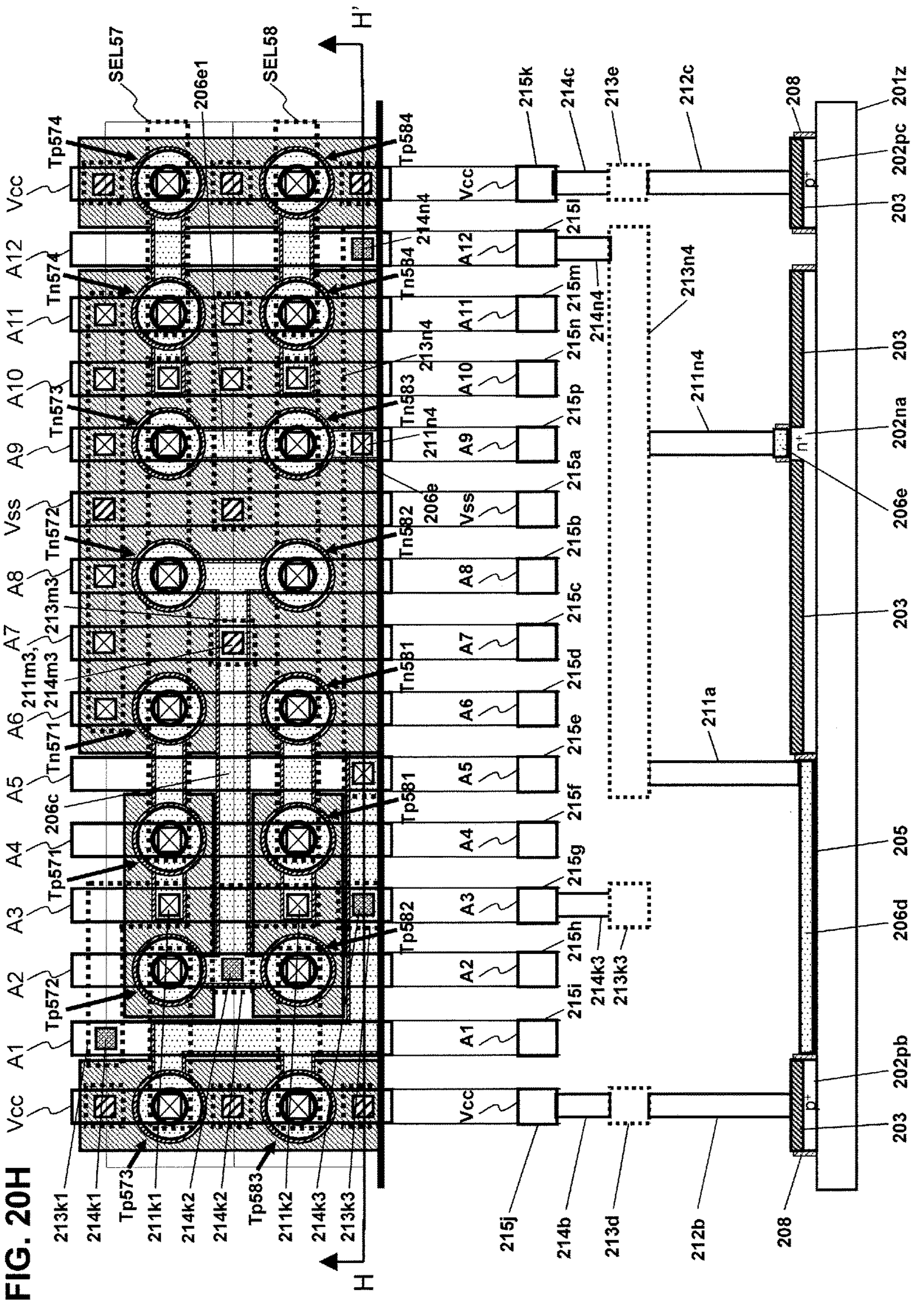
FIG. 20H is a cross-sectional view of the decoder according to the sixth exemplary embodiment of the present invention.
Figure 20I:
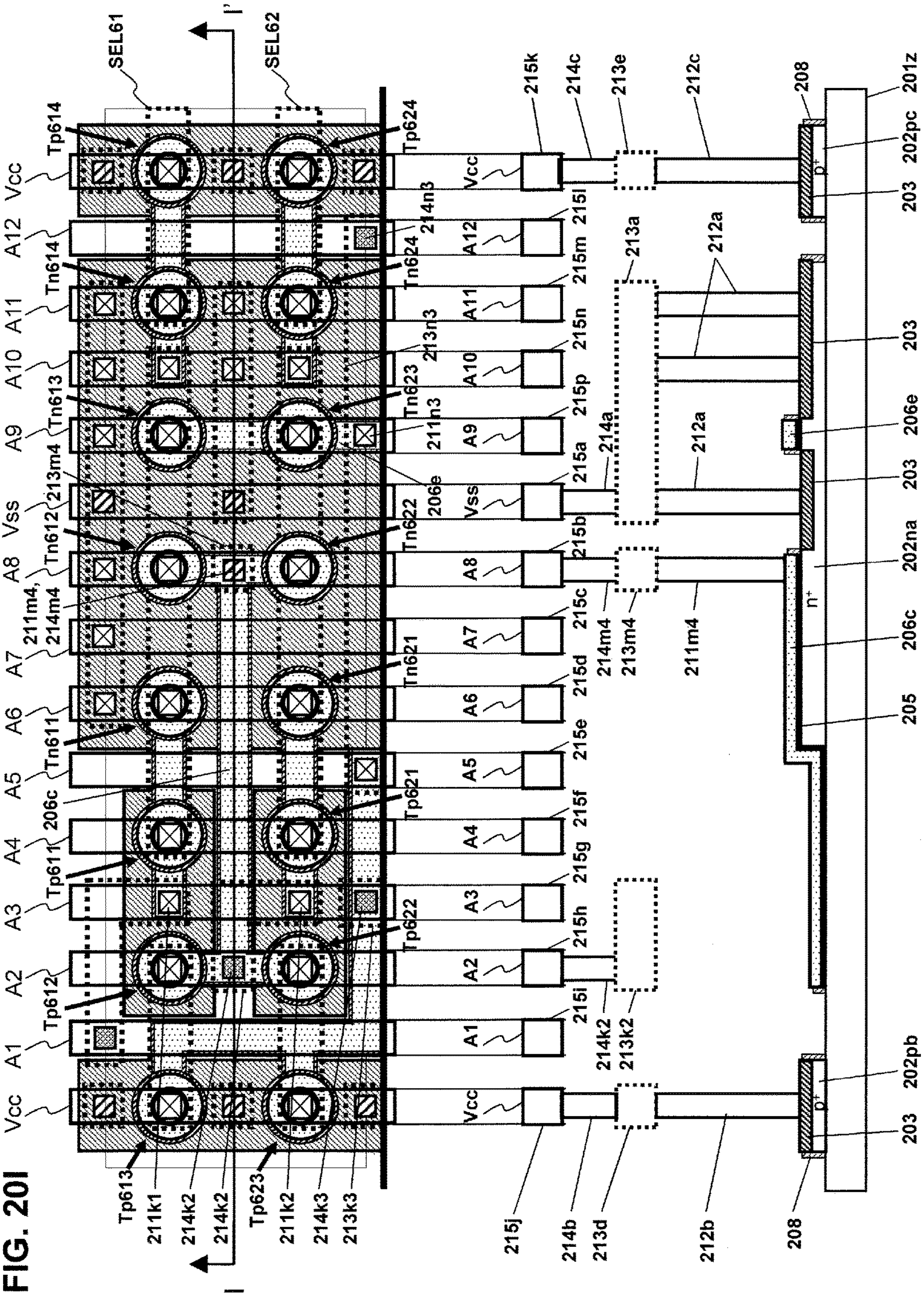
FIG. 20I is a cross-sectional view of the decoder according to the sixth exemplary embodiment of the present invention.
Figure 20J:
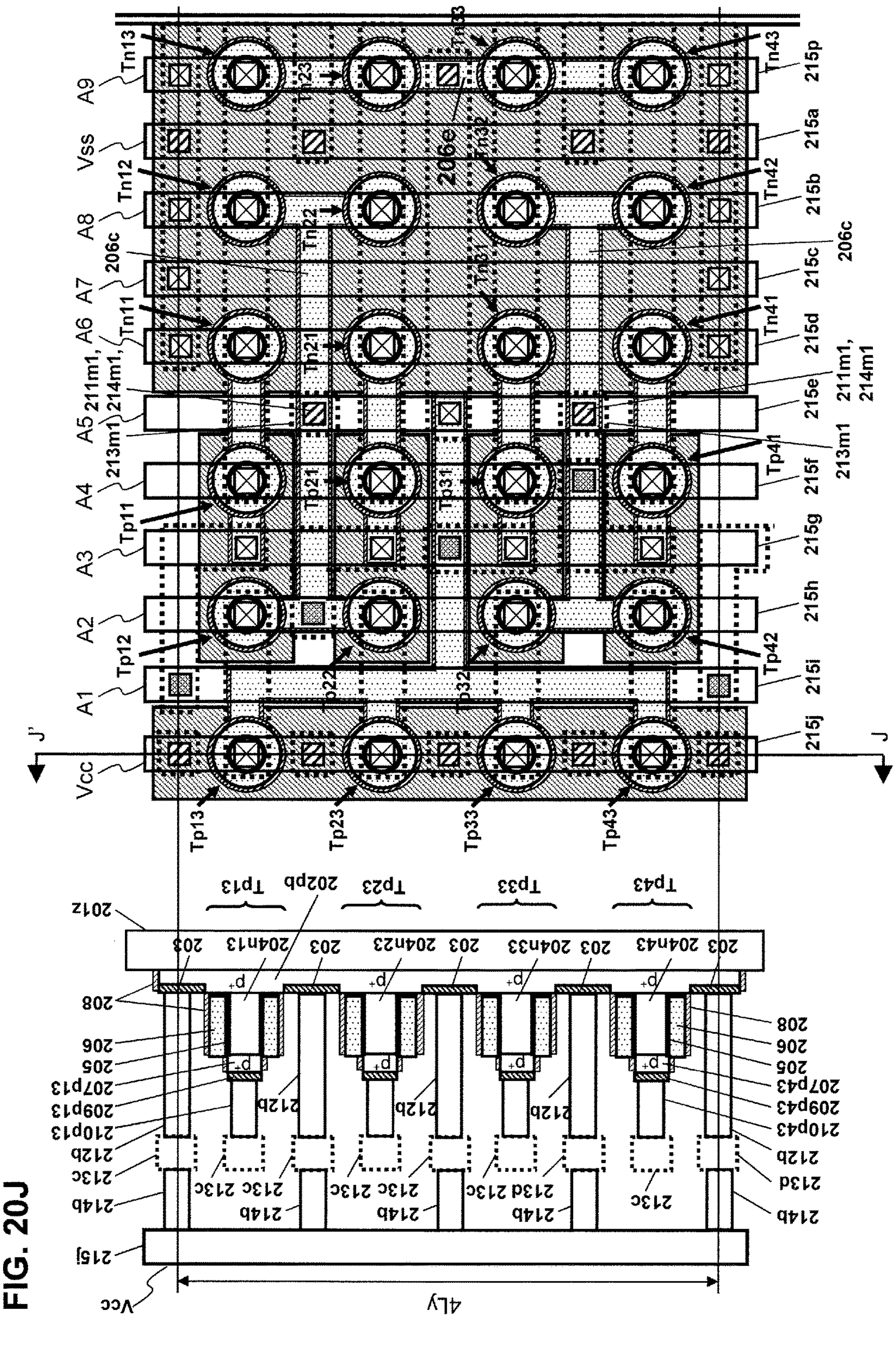
FIG. 20J is a cross-sectional view of the decoder according to the sixth exemplary embodiment of the present invention.
Figure 20K:
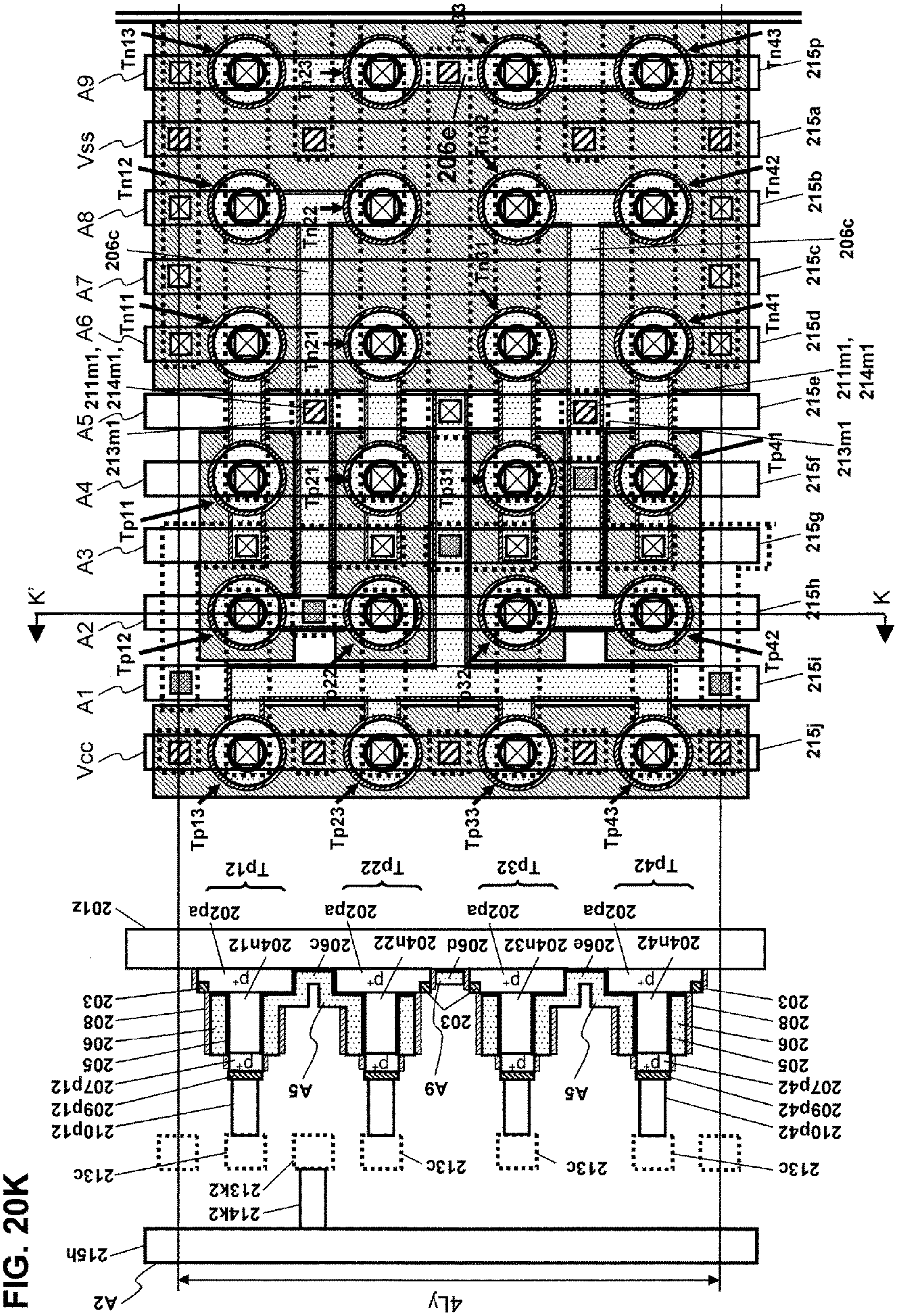
FIG. 20K is a cross-sectional view of the decoder according to the sixth exemplary embodiment of the present invention.
Figure 20L:
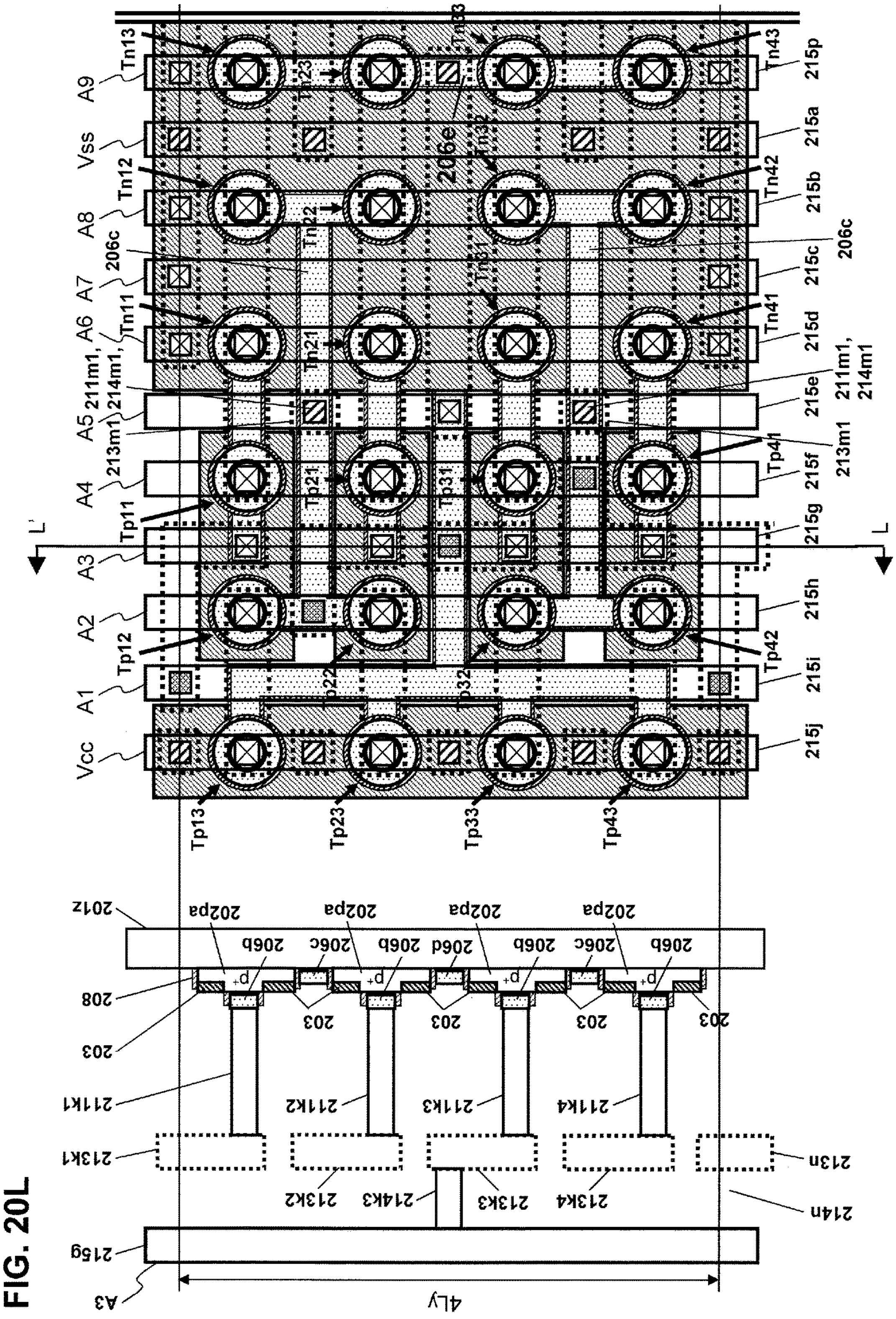
FIG. 20L is a cross-sectional view of the decoder according to the sixth exemplary embodiment of the present invention.
Figure 20M:
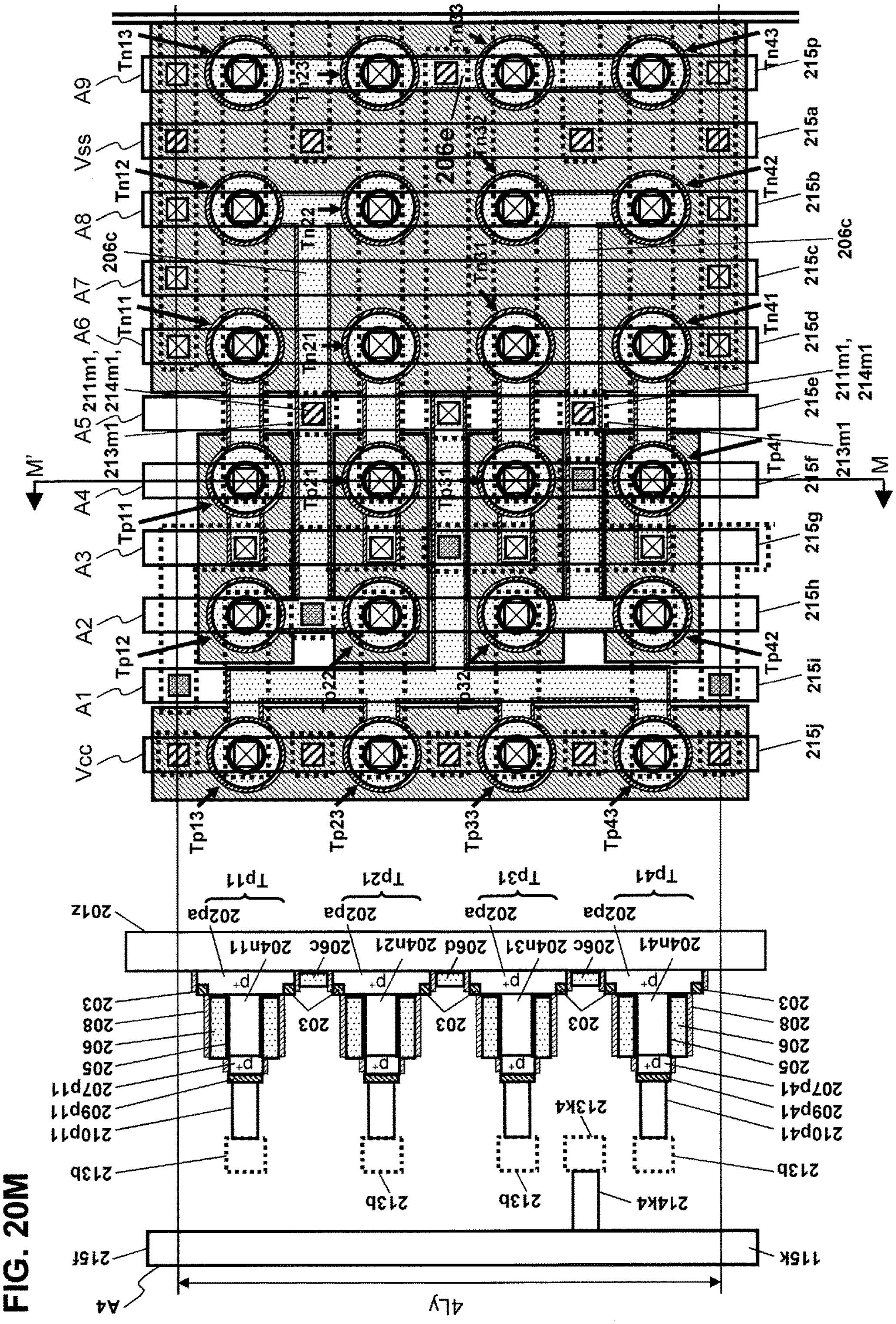
FIG. 20M is a cross-sectional view of the decoder according to the sixth exemplary embodiment of the present invention.
Figure 20N:
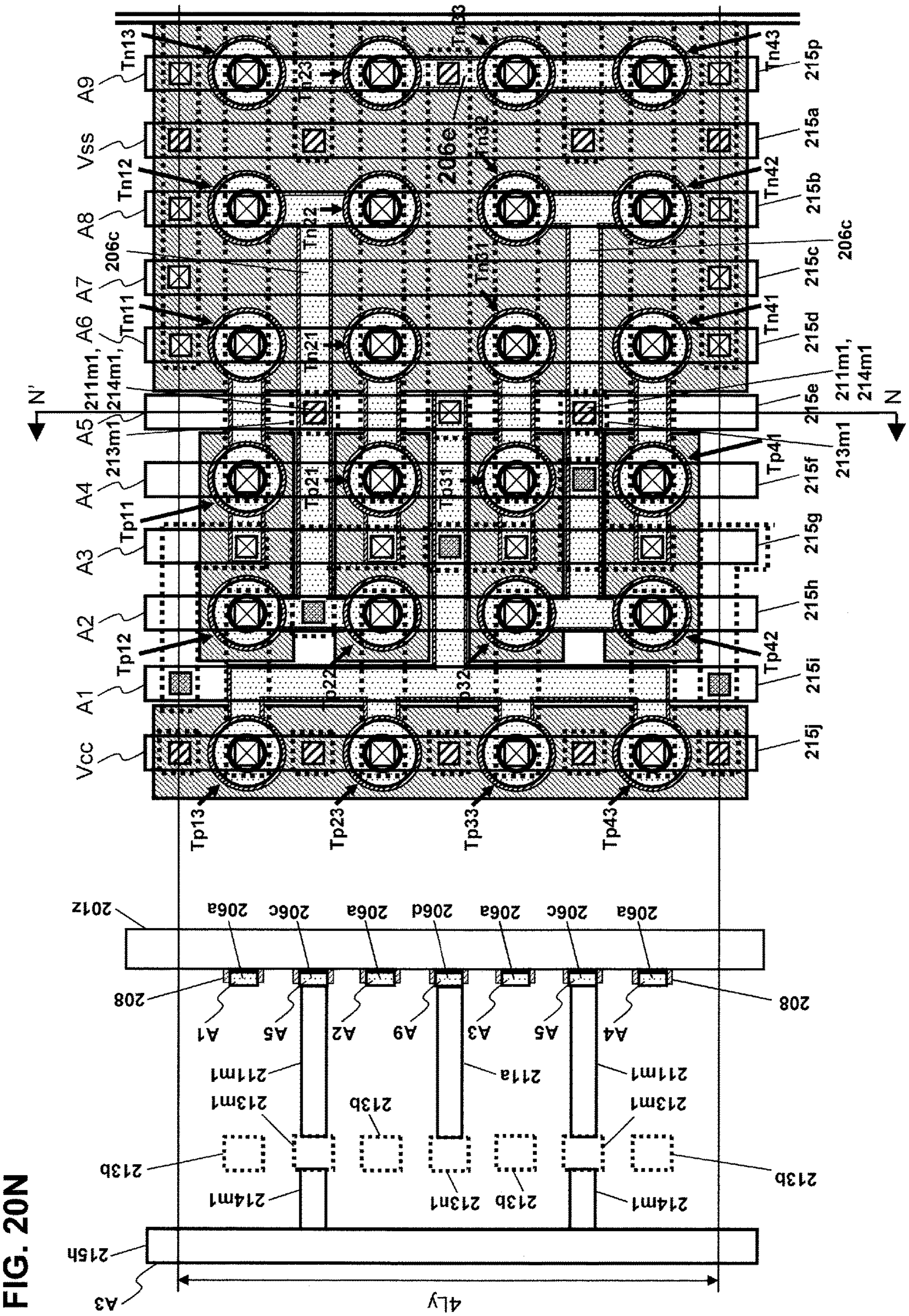
FIG. 20N is a cross-sectional view of the decoder according to the sixth exemplary embodiment of the present invention.
Figure 20P:
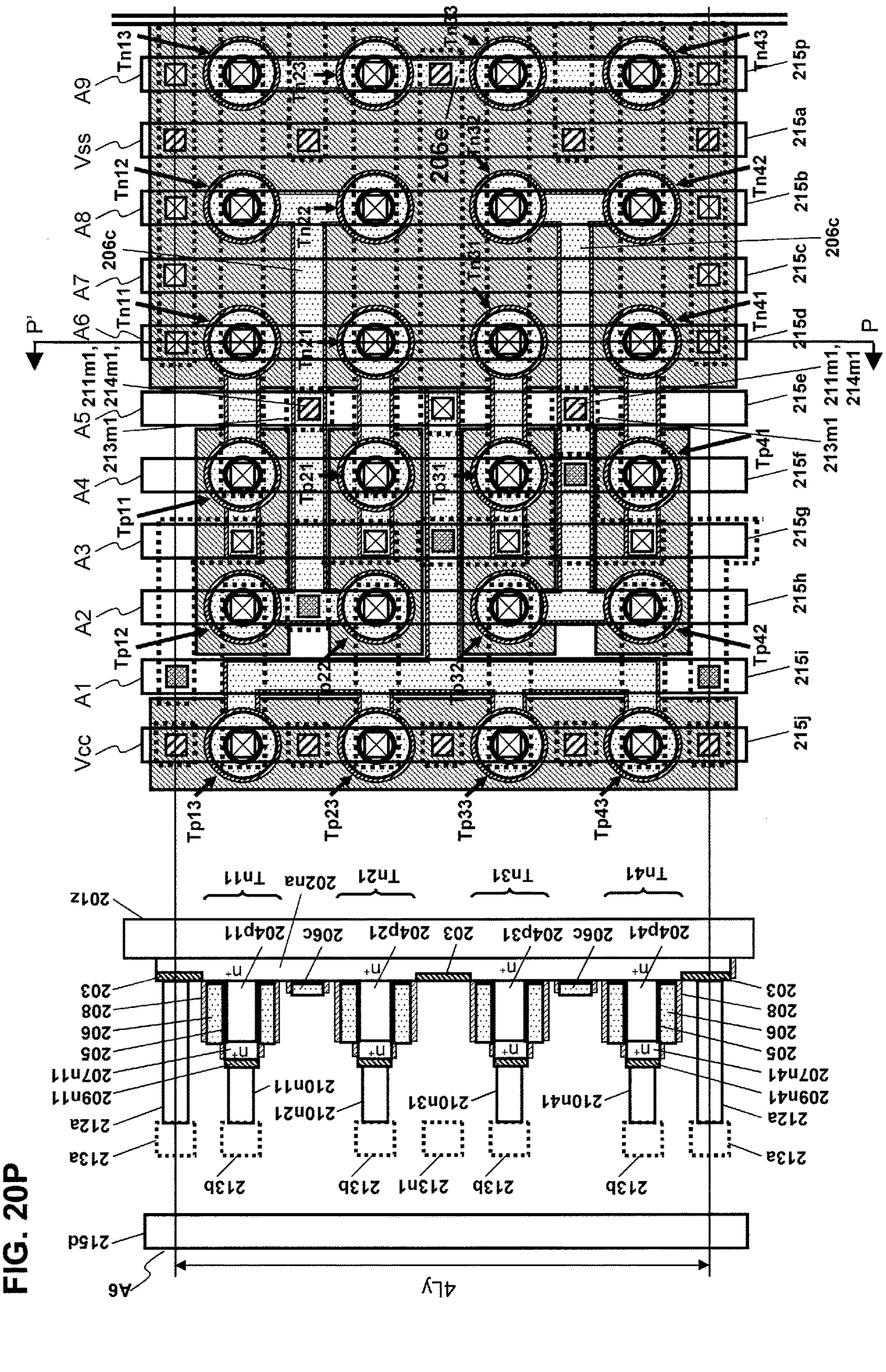
FIG. 20P is a cross-sectional view of the decoder according to the sixth exemplary embodiment of the present invention.
Figure 20Q:
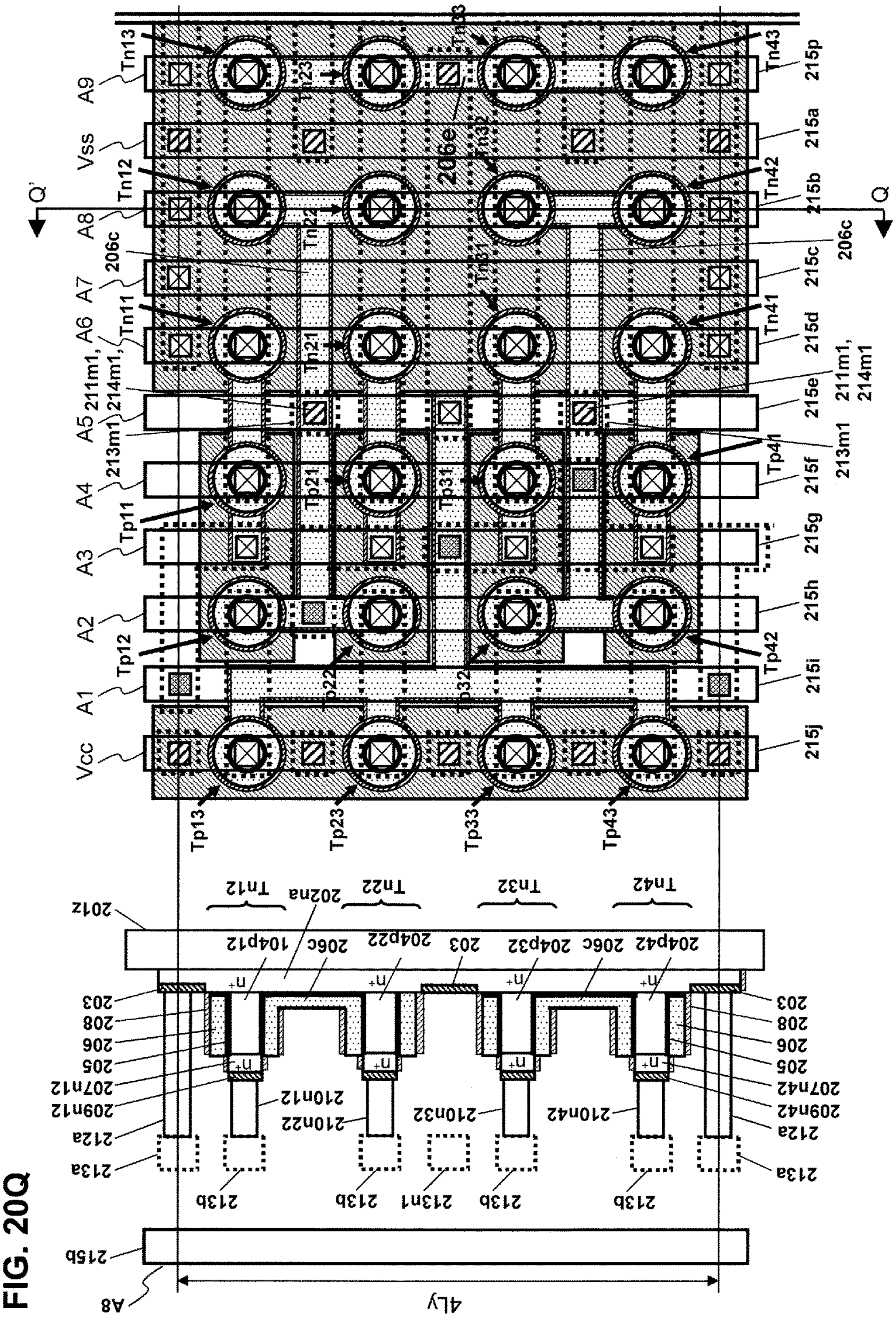
FIG. 20Q is a cross-sectional view of the decoder according to the sixth exemplary embodiment of the present invention.
Figure 20R:
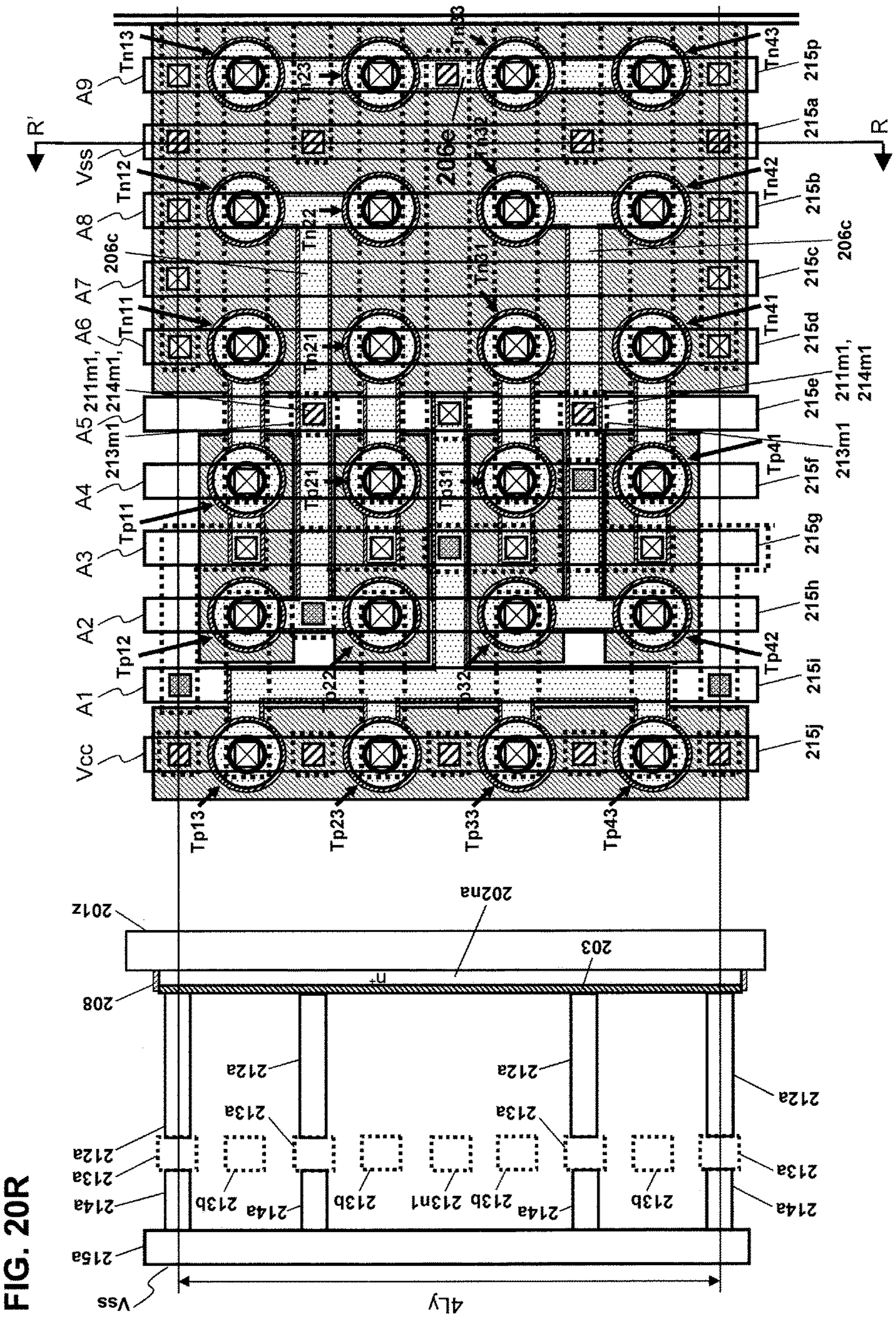
FIG. 20R is a cross-sectional view of the decoder according to the sixth exemplary embodiment of the present invention.
Figure 20S:
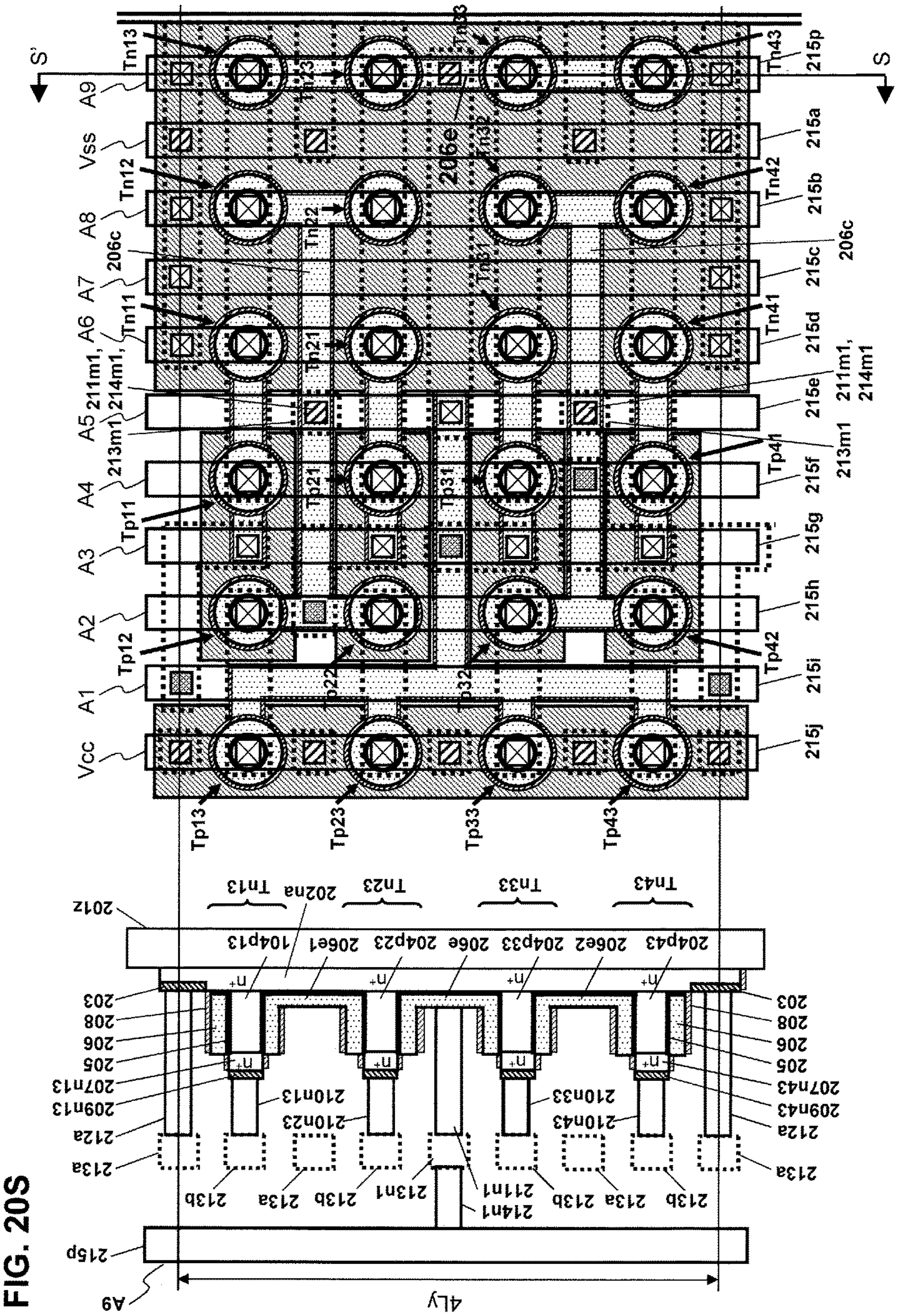
FIG. 20S is a cross-sectional view of the decoder according to the sixth exemplary embodiment of the present invention.

FIGS. 19A to 19E and FIGS. 20A to 20S illustrate a sixth exemplary embodiment. This exemplary embodiment illustrates an implementation of the equivalent circuit illustrated in FIGS. 17A and 17B, in which the sixteen decoders (200-1 to 200-8 and 200-57 to 200-64), each of which is based on the decoder according to the fifth exemplary embodiment (FIG. 15A), are arranged adjacent to one another at a minimum pitch Ly in accordance with FIGS. 17A and 17B. FIGS. 19A to 19D are plan views of the layout (arrangement) of 3-input NOR decoders 201 and inverters 202 according to the sixth exemplary embodiment of the present invention, and FIG. 19E is a plan view illustrating only the lines of the first metal wiring layer to which the SGTs, the gate lines, and the address signals A1, A2, A3, A4, A8, and A12 illustrated in FIG. 19D are connected. FIG. 20A is a cross-sectional view taken along the cut-line A-A' in FIG. 19A, FIG. 20B is a cross-sectional view taken along the cut-line B-B' in FIG. 19A, FIG. 20C is a cross-sectional view taken along the cut-line C-C' in FIG. 19A, FIG. 20D is a cross-sectional view taken along the cut-line D-D' in FIG. 19A, FIG. 20E is a cross-sectional view taken along the cut-line E-E' in FIG. 19A, FIG. 20F is a cross-sectional view taken along the cut-line F-F' in FIG. 19B, FIG. 20G is a cross-sectional view taken along the cut-line G-G' in FIG. 19C, FIG. 20H is a cross-sectional view taken along the cut-line H-H' in FIG. 19C, FIG. 20I is a cross-sectional view taken along the cut-line I-I' in FIG. 19D, FIG. 20J is a cross-sectional view taken along the cut-line J-J' in FIG. 19A, FIG. 20K is a cross-sectional view taken along the cut-line K-K' in FIG. 19A, FIG. 20L is a cross-sectional view taken along the cut-line L-L' in FIG. 19A, FIG. 20M is a cross-sectional view taken along the cut-line M-M' in FIG. 19A, FIG. 20N is a cross-sectional view taken along the cut-line N-N' in FIG. 19A, FIG. 20P is a cross-sectional view taken along the cut-line P-P' in FIG. 19A, FIG. 20Q is a cross-sectional view taken along the cut-line Q-Q' in FIG. 19A, FIG. 20R is a cross-sectional view taken along the cut-line R-R' in FIG. 19A, and FIG. 20S is a cross-sectional view taken along the cut-line S-S' in FIG. 19A.

FIG. 19A illustrates a decoder block 210*a* illustrated in FIG. 17A, FIG. 19B illustrates a decoder block 210*b* illustrated in FIG. 17A, FIG. 19C illustrates a decoder block 210*c* illustrated in FIG. 17B, and FIG. 19D illustrates a decoder block 210*d* illustrated in FIG. 17B. Although FIGS. 19A and 19B are consecutive views and FIGS. 19C and 19D are consecutive views, separate views are presented in FIGS. 19A to 19D in enlarged scale, for convenience.

In FIG. 19A, the transistors constituting the decoder 200-1 illustrated in FIG. 17A, namely, the PMOS transistor Tp14, the NMOS transistors Tn14, Tn13, Tn12, and Tn11, and the PMOS transistors Tp11, Tp12, and Tp13, are arranged in the top row of FIG. 19A in a line in the lateral direction (the first direction) from right to left in this figure.

The transistors constituting the decoder 200-2, namely, the PMOS transistor Tp24, the NMOS transistors Tn24, Tn23, Tn22, and Tn21, and the PMOS transistors Tp21, Tp22, and Tp23, are arranged in the second row from the top in FIG. 19A in a line in the lateral direction. Likewise, the decoder 200-3 and the decoder 200-4 are arranged in sequence from top to bottom in FIG. 19A.

The decoders 200-1 and 200-3 are each arranged in a non-inverted configuration based on the decoder illustrated in FIG. 15A. The decoders 200-2 and 200-4 are each arranged in a vertically inverted configuration.

Accordingly, a common gate line 206*c* is provided to respectively connect the NMOS transistors Tn12 and Tn22 and the PMOS transistors Tp12 and Tp22 to each other, and is formed in the space (dead space) between the lower diffusion layers of the decoder 200-1 and the decoder 200-2. This configuration can minimize the size in the longitudinal direction (the second direction). In addition, the use of a common gate line can reduce the parasitic capacitance of lines. High-speed operation can be achieved. Likewise, a common gate line 206*c* is provided to respectively connect the NMOS transistors Tn32 and Tn42 and the PMOS transistors Tp32 and Tp42 to each other.

Further, the gate electrodes 206 of the NMOS transistors Tn13, Tn23, Tn33, and Tn43 are connected to each other by using gate lines 206*e*1, 206*e*, and 206*e*2. Further, the gate electrodes 206 of the PMOS transistors Tp13, Tp23, Tp33, and Tp43 are connected in common by using a gate line 206*d*, and the gate line 206*d* is arranged in the lateral direction so as to extend in the space between the lower diffusion layers of the decoders 200-2 and 200-3. The gate line 206*d* and the gate line 206*e* are connected in common by using a line 213*n*1 of the first metal wiring layer via a contact 211*a* and a contact 211*n*1. Specifically, in FIG. 19A, the line 215*p* of the second metal wiring layer to which an address signal A9 is supplied is connected to the gate line 206*e* and the gate line 206*d* from a single point, that is, from a contact 214*n*1, via the line 213*n*1 of the first metal wiring layer and the contact 211*n*1 and via the line 213*n*1 of the first metal wiring layer and the contact 211*a*, respectively, and is then connected to the gate electrodes 206 of the NMOS transistors Tn13, Tn23, Tn33, and Tn43 and the PMOS transistors Tp13, Tp23, Tp33, and Tp43. This arrangement can reduce the area of the wiring region and can reduce the parasitic capacitance of lines. High-speed operation can be achieved.

It is to be noted here that while the decoders 200-2 and 200-4 are arranged in an inverted configuration, contacts 211*k*1 to 211*k*4, lines 213*k*1 to 213*k*4 of the first metal wiring layer, and contacts 214*k*1 to 214*k*4 via which address signals A1 to A4 are supplied are not arranged in an inverted configuration but are arranged in a non-inverted configuration. Accordingly, the address signals A1 to A4 can be separately supplied to the gate lines 206*b* for the decoders 200-1, 200-2, 200-3, and 200-4.

Also in FIGS. 19B, 19C, and 19D, the decoders 200-5 to 200-8, 200-57 to 200-60, and 200-61 to 200-64 are arranged in similar ways, respectively.

In FIGS. 19A to 19D, lines 215*k*, 215*l*, 215*m*, 215*n*, 215*p*, 215*a*, 215*b*, 215*c*, 215*d*, 215*e*, 215*f*, 215*g*, 215*h*, 215*i*, and 215*j* of the second metal wiring layer are arranged to extend in the longitudinal direction (the second direction), and are respectively supplied with a power supply Vcc, address signals A12, A11, A10, and A9, a reference power supply Vss, address signals A8, A7, A6, A5, A4, A3, A2, and A1, and the power supply Vcc. The lines 215*a* to 215*p* of the second metal wiring layer described above are arranged at a minimum pitch (a minimum wiring width and a minimum wiring interval) in the second metal wiring layer, resulting in the size in the lateral direction being minimized in the arrangement.

In FIGS. 19A to 19E and FIGS. 20A to 20S, portions having the same or substantially the same structures as those illustrated in FIGS. 15A and 15B and FIGS. 16A to 16C are denoted by equivalent reference numerals in the 200s.

In FIGS. 19A to 19D and FIGS. 20A to 20S, the line 215*k* of the second metal wiring layer to which the power supply Vcc is supplied is arranged to extend in the second direction, and is connected to the silicide layer 203, which is shared to connect the lower diffusion layers 202*pc*, which are the source regions of the PMOS transistors Tp14 to Tp84 and Tp574 to Tp644, via contacts 214*c*, lines 213*e* of the first metal wiring layer, and contacts 212*c*. Note that each of the connection portions (214*c*, 213*e*, and 212*c*) is provided at a plurality of locations. In addition, the lower diffusion layer 202*pc* and the silicide layer 203, which cover the lower diffusion layer 202*pc*, are shared by upper and lower adjacent decoders and are connected.

The line 215*l* of the second metal wiring layer to which the address signal A12 is supplied is arranged to extend in the longitudinal direction (the second direction). As illustrated in FIG. 19C and FIG. 20H, the line 215*l* of the second metal wiring layer is connected to the gate line 206*e* via a contact 214*n*4, a line 213*n*4 of the first metal wiring layer arranged to extend in the lateral direction (the first direction), and a contact 211*n*4, and is then connected to the gate electrodes 206 of the NMOS transistors Tn573, Tn583, Tn593, and Tn603. In addition, the line 215*l* of the second metal wiring layer is also connected to the gate line 206*d* via the contact 211*a*, and is then connected to the gate electrodes 206 of the PMOS transistors Tp573, Tp583, Tp593, and Tp603.

In addition, in FIG. 19D, the line 215*l* of the second metal wiring layer is connected to the gate line 206*e* via the contact 214*n*4, the line 213*n*4 of the first metal wiring layer arranged to extend in the lateral direction (the first direction), and the contact 211*n*4, and is then connected to the gate electrodes 206 of the NMOS transistors Tn613, Tn623, Tn633, and Tn643. In addition, the line 215*l* of the second metal wiring layer is also connected to the gate line 206*d* via the contact 211*a*, and is then connected to the gate electrodes 206 of the PMOS transistors Tp613, Tp623, Tp633, and Tp643.

Although not illustrated in the drawings, the address map illustrated in FIG. 18B shows that the address signal A12 is also supplied to the sixteen decoders 200-49 to 200-64 via the contacts 214*n*4, the lines 213*n*4 of the first metal wiring layer, and the contacts 211*n*4 in a way similar to that described above.

The line 215*m* of the second metal wiring layer to which the address signal A11 is supplied is arranged to extend in the longitudinal direction (the second direction). Although not illustrated in the drawings, in a way similar to that for the address signal A12, the line 215*m* of the second metal wiring layer is connected to the gate line 206*e* and the gate line 206*d* via contacts 214*n*3, lines 213*n*3 of the first metal wiring layer arranged to extend in the lateral direction (the first direction), and contacts 211*n*3, which are not illustrated in the drawings. Thus, according to the address map illustrated in FIG. 18B, the address signal A11 is supplied to the sixteen decoders 200-33 to 200-48.

The line 215*n* of the second metal wiring layer to which the address signal A10 is supplied is arranged to extend in the longitudinal direction (the second direction). Although not illustrated in the drawings, in a way similar to that for the address signal A12, the line 215*n* of the second metal wiring layer is connected to the gate line 206*e* and the gate line 206*d* via contacts 214*n*2, lines 213*n*2 of the first metal wiring layer arranged to extend in the lateral direction (the first direction), and contacts 211*n*2, which are not illustrated in the drawings. Thus, according to the address map illustrated in FIG. 18A, the address signal A10 is supplied to the sixteen decoders 200-17 to 200-32.

The line 215*p* of the second metal wiring layer to which the address signal A9 is supplied is arranged to extend in the longitudinal direction (the second direction). As illustrated in FIG. 19A and FIG. 20D, the line 215*p* of the second metal wiring layer is connected to the gate line 206*e* via the contact 214*n*1, the line 213*n*1 of the first metal wiring layer arranged to extend in the lateral direction (the first direction), and the contact 211*n*1, and is then connected to the gate electrodes 206 of the NMOS transistors Tn13, Tn23, Tn33, and Tn43. In addition, the line 215*p* of the second metal wiring layer is also connected to the gate line 206*d* via the contact 211*a*, and is then connected to the gate electrodes 206 of the PMOS transistors Tp13, Tp23, Tp33, and Tp43.

In addition, in FIG. 19B, the line 215*p* of the second metal wiring layer is connected to the gate line 206*e* via the contact 214*n*1, the line 213*n*1 of the first metal wiring layer arranged to extend in the lateral direction (the first direction), and the contact 211*n*1, and is then connected to the gate electrodes 206 of the NMOS transistors Tn53, Tn63, Tn73, and Tn83. In addition, the line 215*p* of the second metal wiring layer is also connected to the gate line 206*d* via the contact 211*a*, and is then connected to the gate electrodes 206 of the PMOS transistors Tp53, Tp63, Tp73, and Tp83.

The line 215*a* of the second metal wiring layer to which the reference power supply Vss is supplied is arranged to extend in the second direction, and is connected to the silicide layer 203, which is shared to connect the lower diffusion layers 202*na*, which are the source regions of the NMOS transistors Tn11, Tn12, Tn13, Tn14 to Tn641, Tn642, Tn643, and Tn644 of all the decoders, via contacts 214*a*, lines 213*a* of the first metal wiring layer, and contacts 212*a*. Note that each of the connection portions (214*a*, 213*a*, and 212*a*) is provided at a plurality of locations. In addition, each of the lines 213*a* of the first metal wiring layer is arranged to extend in the lateral direction (the first direction) and is provided with a plurality of contacts 212*a* to reduce the resistance of the silicide layer 203, resulting in efficient supply of the reference power supply Vss to the sources of the individual NMOS transistors.

The line 215*b* of the second metal wiring layer to which the address signal A8 is supplied is arranged to extend in the longitudinal direction (the second direction). As illustrated in FIG. 19D and FIG. 20I, the line 215*b* of the second metal wiring layer is connected to the gate line 206*c* via a contact 214*m*4, a line 213*m*4 of the first metal wiring layer, and a contact 211*m*4, and is then connected to the gate electrodes of the PMOS transistors Tp612 and Tp622 and the gate electrodes of the NMOS transistors Tn612 and Tn622. Also, the line 215*b* of the second metal wiring layer is connected to the gate line 206*c* via the contact 214*m*4, the line 213*m*4 of the first metal wiring layer, and the contact 211*m*4, and is then connected to the gate electrodes of the NMOS transistors Tn632 and Tn642 and the gate electrodes of the PMOS transistors Tp632 and Tp642.

The line 215*c* of the second metal wiring layer to which the address signal A7 is supplied is arranged to extend in the longitudinal direction (the second direction). As illustrated in FIG. 19C and FIG. 20G, the line 215*c* of the second metal wiring layer is connected to the gate line 206*c* via a contact 214*m*3, a line 213*m*3 of the first metal wiring layer, and a contact 211*m*3, and is then connected to the gate electrodes of the NMOS transistors Tn572 and Tn582 and the gate electrodes of the PMOS transistors Tp572 and Tp582. Also, the line 215*c* of the second metal wiring layer is connected to the gate line 206*c* via the contact 214*m*3, the line 213*m*3 of the first metal wiring layer, and the contact 211*m*3, and is then connected to the gate electrodes of the NMOS transistors Tn592 and Tn602 and the gate electrodes of the PMOS transistors Tp592 and Tp602.

The line 215*d* of the second metal wiring layer to which the address signal A6 is supplied is arranged to extend in the longitudinal direction (the second direction). As illustrated in FIG. 19B and FIG. 20F, the line 215*d* of the second metal wiring layer is connected to the gate line 206*c* via a contact 214*m*2, a line 213*m*2 of the first metal wiring layer, and a contact 211*m*2, and is then connected to the gate electrodes of the NMOS transistors Tn52 and Tn62 and the gate electrodes of the PMOS transistors Tp52 and Tp62. Also, the line 215*d* of the second metal wiring layer is connected to the gate line 206*c* via the contact 214*m*2, the line 213*m*2 of the first metal wiring layer, and the contact 211*m*2, and is then connected to the gate electrodes of the NMOS transistors Tn72 and Tn82 and the gate electrodes of the PMOS transistors Tp72 and Tp82.

The line 215*e* of the second metal wiring layer to which the address signal A5 is supplied is arranged to extend in the longitudinal direction (the second direction). As illustrated in FIG. 19A and FIG. 20C, the line 215*e* of the second metal wiring layer is connected to the gate line 206*c* via a contact 214*m*1, a line 213*m*1 of the first metal wiring layer, and a contact 211*m*1, and is then connected to the gate electrodes of the NMOS transistors Tn12 and Tn22 and the gate electrodes of the PMOS transistors Tp12 and Tp22. Also, as illustrated in FIG. 20E, the line 215*e* of the second metal wiring layer is connected to the gate line 206*c* via the contact 214*m*1, the line 213*m*1 of the first metal wiring layer, and the contact 211*m*1, and is then connected to the gate electrodes of the NMOS transistors Tn32 and Tn42 and the gate electrodes of the PMOS transistors Tp32 and Tp42.

The line 215*f* of the second metal wiring layer to which the address signal A4 is supplied is arranged to extend in the longitudinal direction (the second direction). As illustrated in FIG. 19A and FIG. 20E, the line 215*f* of the second metal wiring layer is connected to the gate line 206*b* via the contact 214*k*4, the line 213*k*4 of the first metal wiring layer arranged to extend in the lateral direction (the first direction), and the contact 211*k*4, and is then connected to the gate electrode of the PMOS transistor Tp41. In addition, the line 215*f* of the second metal wiring layer is also connected to the gate electrode of the NMOS transistor Tn41 via the gate line 206*a*.

Likewise, as illustrated in FIG. 19B, the line 215*f* of the second metal wiring layer is connected to the gate line 206*b* via the contact 214*k*4, the line 213*k*4 of the first metal wiring layer arranged to extend in the lateral direction (the first direction), and the contact 211*k*4, and is then connected to the gate electrode of the PMOS transistor Tp81. In addition, the line 215*f* of the second metal wiring layer is also connected to the gate electrode of the NMOS transistor Tn81 via the gate line 206*a*.

Also, as illustrated in FIG. 19C, the line 215*f* of the second metal wiring layer is connected to the gate line 206*b* via the contact 214*k*4, the line 213*k*4 of the first metal wiring layer arranged to extend in the lateral direction (the first direction), and the contact 211*k*4, and is then connected to the gate electrode of the PMOS transistor Tp601. In addition, the line 215*f* of the second metal wiring layer is also connected to the gate electrode of the NMOS transistor Tn601 via the gate line 206*a*.

Further, as illustrated in FIG. 19D, the line 215*f* of the second metal wiring layer is connected to the gate line 206*b* via the contact 214*k*4, the line 213*k*4 of the first metal wiring layer arranged to extend in the lateral direction (the first direction), and the contact 211*k*4, and is then connected to the gate electrode of the PMOS transistor Tp641. In addition, the line 215*f* of the second metal wiring layer is also connected to the gate electrode of the NMOS transistor Tn641 via the gate line 206*a*.

The line 215*g* of the second metal wiring layer to which the address signal A3 is supplied is arranged to extend in the longitudinal direction (the second direction). As illustrated in FIG. 19A and FIG. 20D, the line 215*g* of the second metal wiring layer is connected to the gate line 206*b* via the contact 214*k*3, the line 213*k*3 of the first metal wiring layer arranged to extend in the longitudinal direction (the second direction), and the contact 211*k*3, and is then connected to the gate electrode of the PMOS transistor Tp31. In addition, the line 215*g* of the second metal wiring layer is also connected to the gate electrode of the NMOS transistor Tn31 via the gate line 206*a*.

Likewise, as illustrated in FIG. 19B, the line 215*g* of the second metal wiring layer is connected to the gate line 206*b* via the contact 214*k*3, the line 213*k*3 of the first metal wiring layer arranged to extend in the longitudinal direction (the second direction), and the contact 211*k*3, and is then connected to the gate electrode of the PMOS transistor Tp71. In addition, the line 215*g* of the second metal wiring layer is also connected to the gate electrode of the NMOS transistor Tn71 via the gate line 206*a*.

Also, as illustrated in FIG. 19C, the line 215*g* of the second metal wiring layer is connected to the gate line 206*b* via the contact 214*k*3, the line 213*k*3 of the first metal wiring layer arranged to extend in the lateral direction (the first direction), and the contact 211*k*3, and is then connected to the gate electrode of the PMOS transistor Tp591. In addition, the line 215*g* of the second metal wiring layer is also connected to the gate electrode of the NMOS transistor Tn591 via the gate line 206*a*.

Further, as illustrated in FIG. 19D, the line 215*g* of the second metal wiring layer is connected to the gate line 206*b* via the contact 214*k*3, the line 213*k*3 of the first metal wiring layer arranged to extend in the longitudinal direction (the second direction), and the contact 211*k*3, and is then connected to the gate electrode of the PMOS transistor Tp631. In addition, the line 215*g* of the second metal wiring layer is also connected to the gate electrode of the NMOS transistor Tn631 via the gate line 206*a*.

The line 215*h* of the second metal wiring layer to which the address signal A2 is supplied is arranged to extend in the longitudinal direction (the second direction). As illustrated in FIG. 19A and FIG. 20C, the line 215*h* of the second metal wiring layer is connected to the gate line 206*b* via the contact 214*k*2, the line 213*k*2 of the first metal wiring layer arranged to extend in the lateral direction (the first direction), and the contact 211*k*2, and is then connected to the gate electrode of the PMOS transistor Tp21. In addition, the line 215*h* of the second metal wiring layer is also connected to the gate electrode of the NMOS transistor Tn21 via the gate line 206*a*.

Likewise, as illustrated in FIG. 19B, the line 215*h* of the second metal wiring layer is connected to the gate line 206*b* via the contact 214*k*2, the line 213*k*2 of the first metal wiring layer arranged to extend in the lateral direction (the first direction), and the contact 211*k*2, and is then connected to the gate electrode of the PMOS transistor Tp61. In addition, the line 215*h* of the second metal wiring layer is also connected to the gate electrode of the NMOS transistor Tn61 via the gate line 206*a*.

Also, as illustrated in FIG. 19C, the line 215*h* of the second metal wiring layer is connected to the gate line 206*b* via the contact 214*k*2, the line 213*k*2 of the first metal wiring layer arranged to extend in the lateral direction (the first direction), and the contact 211*k*2, and is then connected to the gate electrode of the PMOS transistor Tp581. In addition, the line 215*h* of the second metal wiring layer is also connected to the gate electrode of the NMOS transistor Tn581 via the gate line 206*a*.

Further, as illustrated in FIG. 19D, the line 215*h* of the second metal wiring layer is connected to the gate line 206*b* via the contact 214*k*2, the line 213*k*2 of the first metal wiring layer arranged to extend in the lateral direction (the first direction), and the contact 211*k*2, and is then connected to the gate electrode of the PMOS transistor Tp621. In addition, the line 215*h* of the second metal wiring layer is also connected to the gate electrode of the NMOS transistor Tn621 via the gate line 206*a*.

The line 215*i* of the second metal wiring layer to which the address signal A1 is supplied is arranged to extend in the longitudinal direction (the second direction). As illustrated in FIG. 19A and FIG. 20A, the line 215*i* of the second metal wiring layer is connected to the gate line 206*b* via the contact 214*k*1, the line 213*k*1 of the first metal wiring layer arranged to extend in the lateral direction (the first direction), and the contact 211*k*1, and is then connected to the gate electrode of the PMOS transistor Tp11. In addition, the line 215*i* of the second metal wiring layer is also connected to the gate electrode of the NMOS transistor Tn11 via the gate line 206*a*.

Likewise, as illustrated in FIG. 19B, the line 215*i* of the second metal wiring layer is connected to the gate line 206*b* via the contact 214*k*1, the line 213*k*1 of the first metal wiring layer arranged to extend in the lateral direction (the first direction), and the contact 211*k*1, and is then connected to the gate electrode of the PMOS transistor Tp51. In addition, the line 215*i* of the second metal wiring layer is also connected to the gate electrode of the NMOS transistor Tn51 via the gate line 206*a*.

Also, as illustrated in FIG. 19C, the line 215*i* of the second metal wiring layer is connected to the gate line 206*b* via the contact 214*k*1, the line 213*k*1 of the first metal wiring layer arranged to extend in the lateral direction (the first direction), and the contact 211*k*1, and is then connected to the gate electrode of the PMOS transistor Tp571. In addition, the line 215*i* of the second metal wiring layer is also connected to the gate electrode of the NMOS transistor Tn571 via the gate line 206*a*.

Further, as illustrated in FIG. 19D, the line 215*i* of the second metal wiring layer is connected to the gate line 206*b* via the contact 214*k*1, the line 213*k*1 of the first metal wiring layer arranged to extend in the lateral direction (the first direction), and the contact 211*k*1, and is then connected to the gate electrode of the PMOS transistor Tp611. In addition, the line 215*i* of the second metal wiring layer is also connected to the gate electrode of the NMOS transistor Tn611 via the gate line 206*a*.

In FIGS. 19A to 19D, the line 215*j* of the second metal wiring layer to which the power supply Vcc is supplied is arranged to extend in the second direction, and is connected to the silicide layer 203, which is shared to connect the lower diffusion layers 202*pb*, which are the source regions of the PMOS transistors Tp13 to Tp83 and Tp573 to Tp643, via contacts 214*b*, lines 213*d* of the first metal wiring layer, and contacts 212*b*. Note that each of the connection portions (214*b*, 213*d*, and 212*b*) is provided at a plurality of locations. In addition, the lower diffusion layer 202*pb* and the silicide layer 203, which cover the lower diffusion layer 202*pb*, are shared by upper and lower adjacent decoders and are connected.

The arrangement and connections described above can provide sixty-four decoders with a minimum area at a minimum pitch in both the lateral direction and the longitudinal direction.

In this exemplary embodiment, the address signal lines A1 to A12 are set to provide sixty-four decoders. It is easy to increase the number of address signal lines to increase the number of decoders. For an additional address signal line, similarly to the address signal lines A1 to A12, a line of the second metal wiring layer is arranged to extend in the longitudinal direction (the second direction) and is connected to the gate line 206*b*, 206*c*, or 206*d* or 206*e* by using a line of the first metal wiring layer arranged to extend in the lateral direction (the first direction). This configuration enables the additional line of the second metal wiring layer to also be arranged at a minimum pitch that is determined by processing. Thus, large-scale decoders with a minimum area can be achieved.

In the third exemplary embodiment (FIG. 9A), the number of address signal lines A1 to A6 is set to be as small as six and no line of the first metal wiring layer extending in the lateral direction is needed to connect a line of the second metal wiring layer extending in the longitudinal direction to a gate line. In contrast, as in the sixth exemplary embodiment (FIG. 19A), when twelve or more address signal lines are set, similarly to the sixth exemplary embodiment, a line of the second metal wiring layer extending in the longitudinal direction is replaced with at least a line of the first metal wiring layer extending in the lateral direction and the line of the first metal wiring layer is connected to a gate line. This configuration enables the number of address signal lines to be readily increased.

According to this exemplary embodiment, a plurality of decoders (200), each including eight SGTs that constitute a 3-input NOR decoder (201) and an inverter (202) and that are arranged in a line in a first direction, are arranged adjacent to each other, the reference power supply line Vss, the power supply line Vcc, and address signal lines (A1 to A12) are arranged to extend in a second direction perpendicular to the first direction, and any one of the address signal lines (A1 to A12) is connected to a gate line of a 3-input NOR decoder at least via a line of a first metal wiring layer arranged to extend in the first direction. This configuration provides a semiconductor device including 3-input NAND decoders and inverters with a minimum area, which can be arranged at a minimum pitch in both the first direction and the second direction without any limitation as to the number of input address signal lines and also without using any extra lines or contact regions.

While in this exemplary embodiment, eight SGTs are arranged such that the PMOS transistor Tp14, the NMOS transistors Tn14, Tn13, Tn12, and Tn11, and the PMOS transistors Tp11, Tp12, and Tp13 are arranged in order from right to left, the essence of the present invention is that eight SGTs constituting a 3-input NOR decoder and an inverter are arranged in a line to provide a decoder with a minimum area, in which connections to lines of lower diffusion layers (silicide layers), lines of upper metal layers, and gate lines are made by effectively using lines of a second metal wiring layer and lines of a first metal wiring layer. The arrangement of the SGTs, the method for providing gate lines, the positions of the gate lines, the method for providing lines of metal wiring layers, the positions of the lines of the metal wiring layers, and so on not illustrated in the drawings of the exemplary embodiments also fall within the technical scope of the present invention so long as these are based on the arrangement methods disclosed herein.

In this exemplary embodiment, a NOR decoder including six SGTs and an inverter including two SGTs, which is also used as a buffer, are combined to provide an eight-SGT negative logic decoder. The essence of the present invention is that a 3-input NOR decoder including six SGTs is efficiently arranged to have a minimum wiring area, and includes the layout arrangement of a NOR decoder including six SGTs. In this case, a decoder with a positive logic output (the output of a selected decoder is logic "1") is provided.

While the foregoing exemplary embodiments have been described as adopting the BOX structure, the exemplary embodiments may be easily achieved by using a typical CMOS structure and are not limited to the BOX structure.

In the exemplary embodiments, for convenience of description, a silicon pillar of an NMOS transistor is defined as being formed of a p-type silicon layer and a silicon pillar of a PMOS transistor is defined as being formed of an n-type silicon layer. In a process for miniaturization, however, it is difficult to control densities through impurity implantation. Thus, a so-called neutral (or intrinsic) semiconductor with no impurity implantation is used for silicon pillars of both an NMOS transistor and a PMOS transistor, and differences in work function that is unique to a metal gate material may be used for channel control, that is, thresholds of NMOS and PMOS transistors.

In the exemplary embodiments, furthermore, lower diffusion layers or upper diffusion layers are covered with silicide layers. Silicide is used to make resistance low and any other low-resistance material may be used. A general term of metal composites is defined as silicide.

What is claimed is:

1. A semiconductor device comprising a NOR decoder including six transistors, each having a source, a drain, and a gate arranged in a layered manner in a direction perpendicular to a substrate, the six transistors being arranged on the substrate in a line in a first direction, each of the six transistors including a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located, the six transistors including a first n-channel MOS transistor, a second n-channel MOS transistor, a third n-channel MOS transistor, a first p-channel MOS transistor, a second p-channel MOS transistor, and a third p-channel MOS transistor, the gate of the first n-channel MOS transistor and the gate of the first p-channel MOS transistor being connected to each other, the gate of the second n-channel MOS transistor and the gate of the second p-channel MOS transistor being connected to each other, the gate of the third n-channel MOS transistor and the gate of the third p-channel MOS transistor being connected to each other, the drain regions of the first n-channel MOS transistor, the second n-channel MOS transistor, the third n-channel MOS transistor, and the first p-channel MOS transistor being located closer to the substrate than the silicon pillars of the first n-channel MOS transistor, the second n-channel MOS transistor, the third n-channel MOS transistor, and the first p-channel MOS transistor, respectively, and being connected to one another via silicide regions to form an output terminal, the source region of the second p-channel MOS transistor and the drain region of the third p-channel MOS transistor being located closer to the substrate than the silicon pillars of the second p-channel MOS transistor and the third p-channel MOS transistor, the source region of the first p-channel MOS transistor being connected to the drain region of the second p-channel MOS transistor via a contact, the source region of the second p-channel MOS transistor being connected to the drain region of the third p-channel MOS transistor via a lower diffusion layer and a silicide layer, the source regions of the first n-channel MOS transistor, the second n-channel MOS transistor, and the third n-channel MOS transistor being connected to a reference power supply line via contacts, the source region of the third p-channel MOS transistor being connected to a power supply line via a contact, the decoder further including a first address signal line, a second address signal line, and a third address signal line, the gate of the first n-channel MOS transistor and the gate of the first p-channel MOS transistor, which are connected to each other, being connected to the first address signal line, the gate of the second n-channel MOS transistor and the gate of the second p-channel MOS transistor, which are connected to each other, being connected to the second address signal line, the gate of the third n-channel MOS transistor and the gate of the third p-channel MOS transistor, which are connected to each other, being connected to the third address signal line, the power supply line, the reference power supply line, the first address signal line, the second address signal line, and the third address signal line being arranged to extend in a second direction perpendicular to the first direction.

2. The semiconductor device according to claim 1, wherein the six transistors are arranged in a line in an order of the third n-channel MOS transistor, the second n-channel MOS transistor, the first n-channel MOS transistor, the first p-channel MOS transistor, the second p-channel MOS transistor, and the third p-channel MOS transistor.

3. The semiconductor device according to claim 1, wherein at least the gates of the first n-channel MOS transistor and the first p-channel MOS transistor, the gates of the second n-channel MOS transistor and the second p-channel MOS transistor, or the gates of the third n-channel MOS transistor and the third p-channel MOS transistor are connected to the corresponding one of the first to third address signal lines, each of which is formed of a line of a second metal wiring layer arranged to extend in the second direction, at least via a line of a first metal wiring layer arranged to extend in the first direction.

4. A semiconductor device comprising:

a first address signal lines, the number of which is equal to a;

b second address signal lines, the number of which is equal to b;

c third address signal lines, the number of which is equal to c; and a×b×c NOR decoders, the number of which is given by a×b×c, each of the a×b×c NOR decoders including six transistors, each having a source, a drain, and a gate arranged in a layered manner in a direction perpendicular to a substrate, the six transistors being arranged on the substrate in a line in a first direction, each of the six transistors including a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located, the six transistors at least including a first n-channel MOS transistor, a second n-channel MOS transistor, a third n-channel MOS transistor, a first p-channel MOS transistor, a second p-channel MOS transistor, and a third p-channel MOS transistor, the gate of the first n-channel MOS transistor and the gate of the first p-channel MOS transistor being connected to each other, the gate of the second n-channel MOS transistor and the gate of the second p-channel MOS transistor being connected to each other, the gate of the third n-channel MOS transistor and the gate of the third p-channel MOS transistor being connected to each other, the drain regions of the first n-channel MOS transistor, the second n-channel MOS transistor, the third n-channel MOS transistor, and the first p-channel MOS transistor being located closer to the substrate than the silicon pillars of the first n-channel MOS transistor, the second n-channel MOS transistor, the third n-channel MOS transistor, and the first p-channel MOS transistor, respectively, and being connected to one another via silicide regions to form an output terminal, the source region of the second p-channel MOS transistor and the drain region of the third p-channel MOS transistor being located closer to the substrate than the silicon pillars of the second p-channel MOS transistor and the third p-channel MOS transistor, the source region of the first p-channel MOS transistor being connected to the drain region of the second p-channel MOS transistor via a contact, the source region of the second p-channel MOS transistor being connected to the drain region of the third p-channel MOS transistor via a lower diffusion layer and a silicide layer, the source regions of the first n-channel MOS transistor, the second n-channel MOS transistor, and the third n-channel MOS transistor being connected to a reference power supply line via contacts, the source region of the third p-channel MOS transistor being connected to a power supply line via a contact, each of the a×b×c NOR decoders being configured such that the gate of the first n-channel MOS transistor and the gate of the first p-channel MOS transistor, which are connected to each other, are connected to any one of the a first address signal lines, the gate of the second n-channel MOS transistor and the gate of the second p-channel MOS transistor, which are connected to each other, are connected to any one of the b second address signal lines, and the gate of the third n-channel MOS transistor and the gate of the third p-channel MOS transistor, which are connected to each other, are connected to any one of the c third address signal lines, the power supply line, the reference power supply line, the a first address signal lines, the b second address signal lines, and the c third address signal lines being arranged to extend in a second direction perpendicular to the first direction.

5. The semiconductor device according to claim 4, wherein the six transistors are arranged in a line in an order of the third n-channel MOS transistor, the second n-channel MOS transistor, the first n-channel MOS transistor, the first p-channel MOS transistor, the second p-channel MOS transistor, and the third p-channel MOS transistor.

6. The semiconductor device according to claim 4, wherein in each of the a×b×c NOR decoders, at least the gates of the first n-channel MOS transistor and the first p-channel MOS transistor, the gates of the second n-channel MOS transistor and the second p-channel MOS transistor, or the gates of the third n-channel MOS transistor and the third p-channel MOS transistor are connected to the corresponding one of the first to third address signal lines, each of which is formed of a line of a second metal wiring layer arranged to extend in the second direction, at least via a line of a first metal wiring layer arranged to extend in the first direction.

7. A semiconductor device comprising a NOR decoder including six transistors, each having a source, a drain, and a gate arranged in a layered manner in a direction perpendicular to a substrate, the six transistors being arranged on the substrate in a line in a first direction, each of the six transistors including a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located, the six transistors including a first n-channel MOS transistor, a second n-channel MOS transistor, a third n-channel MOS transistor, a first p-channel MOS transistor, a second p-channel MOS transistor, and a third p-channel MOS transistor, the gate of the first n-channel MOS transistor and the gate of the first p-channel MOS transistor being connected to each other, the gate of the second n-channel MOS transistor and the gate of the second p-channel MOS transistor being connected to each other, the gate of the third n-channel MOS transistor and the gate of the third p-channel MOS transistor being connected to each other, the source regions of the first n-channel MOS transistor, the second n-channel MOS transistor, the third n-channel MOS transistor, and the first p-channel MOS transistor being located closer to the substrate than the silicon pillars of the first n-channel MOS transistor, the second n-channel MOS transistor, the third n-channel MOS transistor, and the first p-channel MOS transistor, the drain region of the second p-channel MOS transistor and the source region of the third p-channel MOS transistor being located closer to the substrate than the silicon pillars of the second p-channel MOS transistor and the third p-channel MOS transistor, the drain regions of the first n-channel MOS transistor, the second n-channel MOS transistor, the third n-channel MOS transistor, and the first p-channel MOS transistor being connected to one another via contacts to form an output terminal, the source regions of the first n-channel MOS transistor, the second n-channel MOS transistor, and the third n-channel MOS transistor being connected to a reference power supply line via lower diffusion layers and silicide regions, the source region of the first p-channel MOS transistor being connected to the drain region of the second p-channel MOS transistor via a lower diffusion layer and a silicide region, the source region of the second p-channel MOS transistor being connected to the drain region of the third p-channel MOS transistor via a contact, the source region of the third p-channel MOS transistor being connected to a power supply line via a lower diffusion layer and a silicide region, the NOR decoder further including a first address signal line, a second address signal line, and a third address signal line, the gate of the first n-channel MOS transistor and the gate of the first p-channel MOS transistor, which are connected to each other, being connected to the first address signal line, the gate of the second n-channel MOS transistor and the gate of the second p-channel MOS transistor, which are connected to each other, being connected to the second address signal line, the gate of the third n-channel MOS transistor and the gate of the third p-channel MOS transistor, which are connected to each other, being connected to the third address signal line, the power supply line, the reference power supply line, the first address signal line, the second address signal line, and the third address signal line being arranged to extend in a second direction perpendicular to the first direction.

8. The semiconductor device according to claim 7, wherein the six transistors are arranged in a line in an order of the third n-channel MOS transistor, the second n-channel MOS transistor, the first n-channel MOS transistor, the first p-channel MOS transistor, the second p-channel MOS transistor, and the third p-channel MOS transistor.

9. The semiconductor device according to claim 7, wherein at least the gates of the first n-channel MOS transistor and the first p-channel MOS transistor, the gates of the second n-channel MOS transistor and the second p-channel MOS transistor, or the gates of the third n-channel MOS transistor and the third p-channel MOS transistor are connected to the corresponding one of the first to third address signal lines, each of which is formed of a line of a second metal wiring layer arranged to extend in the second direction, at least via a line of a first metal wiring layer arranged to extend in the first direction.

10. A semiconductor device comprising:

a first address signal lines, the number of which is equal to a;

b second address signal lines, the number of which is equal to b;

c third address signal lines, the number of which is equal to c; and a×b×c NOR decoders, the number of which is given by a×b×c, each of the a×b×c NOR decoders including six transistors, each having a source, a drain, and a gate arranged in a layered manner in a direction perpendicular to a substrate, the six transistors being arranged on the substrate in a line in a first direction, each of the six transistors including a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located, the six transistors at least including a first n-channel MOS transistor, a second n-channel MOS transistor, a third n-channel MOS transistor, a first p-channel MOS transistor, a second p-channel MOS transistor, and a third p-channel MOS transistor, the gate of the first n-channel MOS transistor and the gate of the first p-channel MOS transistor being connected to each other, the gate of the second n-channel MOS transistor and the gate of the second p-channel MOS transistor being connected to each other, the gate of the third n-channel MOS transistor and the gate of the third p-channel MOS transistor being connected to each other, the source regions of the first n-channel MOS transistor, the second n-channel MOS transistor, the third n-channel MOS transistor, and the first p-channel MOS transistor being located closer to the substrate than the silicon pillars of the first n-channel MOS transistor, the second n-channel MOS transistor, the third n-channel MOS transistor, and the first p-channel MOS transistor, the drain region of the second p-channel MOS transistor and the source region of the third p-channel MOS transistor being located closer to the substrate than the silicon pillars of the second p-channel MOS transistor and the third p-channel MOS transistor, the drain regions of the first n-channel MOS transistor, the second n-channel MOS transistor, the third n-channel MOS transistor, and the first p-channel MOS transistor being connected to one another via contacts to form an output terminal, the source regions of the first n-channel MOS transistor, the second n-channel MOS transistor, and the third n-channel MOS transistor being connected to a reference power supply line via lower diffusion layers and silicide layers, the source region of the first p-channel MOS transistor being connected to the drain region of the second p-channel MOS transistor via a lower diffusion layer and a silicide layer, the source region of the second p-channel MOS transistor being connected to the drain region of the third p-channel MOS transistor via a contact, the source region of the third p-channel MOS transistor being connected to a power supply line via a lower diffusion layer and a silicide layer, each of the a×b×c NOR decoders being configured such that the gate of the first n-channel MOS transistor and the gate of the first p-channel MOS transistor, which are connected to each other, are connected to any one of the a first address signal lines, the gate of the second n-channel MOS transistor and the gate of the second p-channel MOS transistor, which are connected to each other, are connected to any one of the b second address signal lines, and the gate of the third n-channel MOS transistor and the gate of the third p-channel MOS transistor, which are connected to each other, are connected to any one of the c third address signal lines, the power supply line, the reference power supply line, the a first address signal lines, the b second address signal lines, and the c third address signal lines being arranged to extend in a second direction perpendicular to the first direction.

11. The semiconductor device according to claim 10, wherein the six transistors are arranged in a line in an order of the third n-channel MOS transistor, the second n-channel MOS transistor, the first n-channel MOS transistor, the first p-channel MOS transistor, the second p-channel MOS transistor, and the third p-channel MOS transistor.

12. The semiconductor device according to claim 10, wherein the source regions of the first n-channel MOS transistors, the second n-channel MOS transistors, and the third n-channel MOS transistors in the a×b×c NOR decoders are connected in common via a silicide layer.

13. The semiconductor device according to claim 10, wherein in each of the a×b×c NOR decoders, at least the gates of the first n-channel MOS transistor and the first p-channel MOS transistor, the gates of the second n-channel MOS transistor and the second p-channel MOS transistor, or the gates of the third n-channel MOS transistor and the third p-channel MOS transistor are connected to the corresponding one of the first to third address signal lines, each of which is formed of a line of a second metal wiring layer arranged to extend in the second direction, at least via a line of a first metal wiring layer arranged to extend in the first direction.

14. A semiconductor device comprising:

a NOR decoder; and an inverter, the NOR decoder and the inverter including eight transistors, each having a source, a drain, and a gate arranged in a layered manner in a direction perpendicular to a substrate, the eight transistors being arranged on the substrate in a line in a first direction, each of the eight transistors including a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located, the eight transistors including a first p-channel MOS transistor, a second p-channel MOS transistor, a third p-channel MOS transistor, a fourth p-channel MOS transistor, a first n-channel MOS transistor, a second n-channel MOS transistor, a third n-channel MOS transistor, and a fourth n-channel MOS transistor, the NOR decoder including the first n-channel MOS transistor, the second n-channel MOS transistor, the third n-channel MOS transistor, the first p-channel MOS transistor, the second p-channel MOS transistor, and the third p-channel MOS transistor, the inverter including the fourth n-channel MOS transistor, and the fourth p-channel MOS transistor, the gate of the first n-channel MOS transistor and the gate of the first p-channel MOS transistor being connected to each other, the gate of the second n-channel MOS transistor and the gate of the second p-channel MOS transistor being connected to each other, the gate of the third n-channel MOS transistor and the gate of the third p-channel MOS transistor being connected to each other, the drain regions of the first n-channel MOS transistor, the second n-channel MOS transistor, the third n-channel MOS transistor, and the first p-channel MOS transistor being located closer to the substrate than the silicon pillars of the first n-channel MOS transistor, the second n-channel MOS transistor, the third n-channel MOS transistor, and the first p-channel MOS transistor, respectively, and being connected to one another via silicide layers to form a first output terminal, the source region of the second p-channel MOS transistor and the drain region of the third p-channel MOS transistor being located closer to the substrate than the silicon pillars of the second p-channel MOS transistor and the third p-channel MOS transistor, the source regions of the first n-channel MOS transistor, the second n-channel MOS transistor, and the third n-channel MOS transistor being connected to a reference power supply line via contacts, the source region of the first p-channel MOS transistor being connected to the drain region of the second p-channel MOS transistor via a contact, the source region of the second p-channel MOS transistor being connected to the drain region of the third p-channel MOS transistor via a silicide layer, the source region of the third p-channel MOS transistor being connected to a power supply line via a contact, the gate of the fourth n-channel MOS transistor and the gate of the fourth p-channel MOS transistor being connected to each other and being connected to the first output terminal, the drain region of the fourth n-channel MOS transistor and the drain region of the fourth p-channel MOS transistor being connected to each other to form a second output terminal, the source region of the fourth n-channel MOS transistor and the source region of the fourth p-channel MOS transistor being respectively connected to the reference power supply line and the power supply line, the NOR decoder further including a first address signal line, a second address signal line, and a third address signal line, the gate of the first n-channel MOS transistor and the gate of the first p-channel MOS transistor, which are connected to each other, being connected to the first address signal line, the gate of the second n-channel MOS transistor and the gate of the second p-channel MOS transistor, which are connected to each other, being connected to the second address signal line, the gate of the third n-channel MOS transistor and the gate of the third p-channel MOS transistor, which are connected to each other, being connected to the third address signal line, the power supply line, the reference power supply line, the first address signal line, the second address signal line, and the third address signal line being arranged to extend in a second direction perpendicular to the first direction.

15. The semiconductor device according to claim 14, wherein the eight transistors are arranged in a line in an order of one of the fourth n-channel MOS transistor and the fourth p-channel MOS transistor, the other of the fourth n-channel MOS transistor and the fourth p-channel MOS transistor, the third p-channel MOS transistor, the second p-channel MOS transistor, the first p-channel MOS transistor, the first n-channel MOS transistor, the second n-channel MOS transistor, and the third n-channel MOS transistor.

16. The semiconductor device according to claim 14, wherein at least the gates of the first n-channel MOS transistor and the first p-channel MOS transistor, the gates of the second n-channel MOS transistor and the second p-channel MOS transistor, or the gates of the third n-channel MOS transistor and the third p-channel MOS transistor are connected to the corresponding one of the first to third address signal lines, each of which is formed of a line of a second metal wiring layer arranged to extend in the second direction, at least via a line of a first metal wiring layer arranged to extend in the first direction.

17. A semiconductor device comprising:

a first address signal lines, the number of which is equal to a;

b second address signal lines, the number of which is equal to b;

c third address signal lines, the number of which is equal to c; and a×b×c pairs of NOR decoders and inverters, the number of which is given by a×b×c, each of the a×b×c pairs of NOR decoders and inverters including eight transistors, each having a source, a drain, and a gate arranged in a layered manner in a direction perpendicular to a substrate, the eight transistors being arranged on the substrate in a line in a first direction, each of the eight transistors including a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located, the eight transistors including a first p-channel MOS transistor, a second p-channel MOS transistor, a third p-channel MOS transistor, a fourth p-channel MOS transistor, a first n-channel MOS transistor, a second n-channel MOS transistor, a third n-channel MOS transistor, and a fourth n-channel MOS transistor, the NOR decoder in each of the a×b×c pairs at least including the first n-channel MOS transistor, the second n-channel MOS transistor, the third n-channel MOS transistor, the first p-channel MOS transistor, the second p-channel MOS transistor, and the third p-channel MOS transistor, the inverter in each of the a×b×c pairs including the fourth n-channel MOS transistor, and the fourth p-channel MOS transistor, the gate of the first n-channel MOS transistor and the gate of the first p-channel MOS transistor being connected to each other, the gate of the second n-channel MOS transistor and the gate of the second p-channel MOS transistor being connected to each other, the gate of the third n-channel MOS transistor and the gate of the third p-channel MOS transistor being connected to each other, the drain regions of the first n-channel MOS transistor, the second n-channel MOS transistor, the third n-channel MOS transistor, and the first p-channel MOS transistor being located closer to the substrate than the silicon pillars of the first n-channel MOS transistor, the second n-channel MOS transistor, the third n-channel MOS transistor, and the first p-channel MOS transistor, respectively, and being connected to one another via silicide layers to form a first output terminal, the source region of the second p-channel MOS transistor and the drain region of the third p-channel MOS transistor being located closer to the substrate than the silicon pillars of the second p-channel MOS transistor and the third p-channel MOS transistor, the source regions of the first n-channel MOS transistor, the second n-channel MOS transistor, and the third n-channel MOS transistor being connected to a reference power supply line via contacts, the source region of the first p-channel MOS transistor being connected to the drain region of the second p-channel MOS transistor via a contact, the source region of the second p-channel MOS transistor being connected to the drain region of the third p-channel MOS transistor via a silicide layer, the source region of the third p-channel MOS transistor being connected to a power supply line via a contact, the gate of the fourth n-channel MOS transistor and the gate of the fourth p-channel MOS transistor being connected to each other and being connected to the first output terminal, the drain region of the fourth n-channel MOS transistor and the drain region of the fourth p-channel MOS transistor being connected to each other to form a second output terminal, the source region of the fourth n-channel MOS transistor and the source region of the fourth p-channel MOS transistor being respectively connected to the reference power supply line and the power supply line, each of the a×b×c pairs of NOR decoders and inverters being configured such that the gate of the first n-channel MOS transistor and the gate of the first p-channel MOS transistor, which are connected to each other, are connected to any one of the a first address signal lines, the gate of the second n-channel MOS transistor and the gate of the second p-channel MOS transistor, which are connected to each other, are connected to any one of the b second address signal lines, and the gate of the third n-channel MOS transistor and the gate of the third p-channel MOS transistor, which are connected to each other, are connected to any one of the c third address signal lines, the power supply line, the reference power supply line, the a first address signal lines, the b second address signal lines, and the c third address signal lines being arranged to extend in a second direction perpendicular to the first direction.

18. The semiconductor device according to claim 17, wherein the eight transistors are arranged in a line in an order of one of the fourth p-channel MOS transistor and the fourth n-channel MOS transistor, the other of the fourth re-channel MOS transistor and the fourth p-channel MOS transistor, the third re-channel MOS transistor, the second n-channel MOS transistor, the first n-channel MOS transistor, first p-channel MOS transistor, the second p-channel MOS transistor, and the third p-channel MOS transistor.

19. The semiconductor device according to claim 17, wherein in each of the a×b×c pairs of NOR decoders and inverters, at least the gates of the first n-channel MOS transistor and the first p-channel MOS transistor, the gates of the second n-channel MOS transistor and the second p-channel MOS transistor, or the gates of the third n-channel MOS transistor and the third p-channel MOS transistor are connected to the corresponding one of the first to third address signal lines, each of which is formed of a line of a second metal wiring layer arranged to extend in the second direction, at least via a line of a first metal wiring layer arranged to extend in the first direction.

20. A semiconductor device comprising:

a NOR decoder; and an inverter, the NOR decoder and the inverter including eight transistors, each having a source, a drain, and a gate arranged in a layered manner in a direction perpendicular to a substrate, the eight transistors being arranged on the substrate in a line in a first direction, each of the eight transistors including a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located, the eight transistors including a first p-channel MOS transistor, a second p-channel MOS transistor, a third p-channel MOS transistor, a fourth p-channel MOS transistor, a first n-channel MOS transistor, a second n-channel MOS transistor, a third n-channel MOS transistor, and a fourth n-channel MOS transistor, the NOR decoder including the first n-channel MOS transistor, the second n-channel MOS transistor, the third n-channel MOS transistor, the first p-channel MOS transistor, the second p-channel MOS transistor, and the third p-channel MOS transistor, the inverter including the fourth n-channel MOS transistor, and the fourth p-channel MOS transistor, the gate of the first n-channel MOS transistor and the gate of the first p-channel MOS transistor being connected to each other, the gate of the second n-channel MOS transistor and the gate of the second p-channel MOS transistor being connected to each other, the gate of the third n-channel MOS transistor and the gate of the third p-channel MOS transistor being connected to each other, the source regions of the first n-channel MOS transistor, the second n-channel MOS transistor, the third n-channel MOS transistor, and the first p-channel MOS transistor being located closer to the substrate than the silicon pillars of the first n-channel MOS transistor, the second n-channel MOS transistor, the third n-channel MOS transistor, and the first p-channel MOS transistor, the drain region of the second p-channel MOS transistor and the source region of the third p-channel MOS transistor being located closer to the substrate than the silicon pillars of the second p-channel MOS transistor and the third p-channel MOS transistor, the drain regions of the first n-channel MOS transistor, the second n-channel MOS transistor, the third n-channel MOS transistor, and the first p-channel MOS transistor being connected to one another via contacts to form a first output terminal, the source regions of the first n-channel MOS transistor, the second n-channel MOS transistor, and the third n-channel MOS transistor being connected to a reference power supply line via silicide regions, the source region of the first p-channel MOS transistor being connected to the drain region of the second p-channel MOS transistor via a silicide layer, the source region of the second p-channel MOS transistor being connected to the drain region of the third p-channel MOS transistor via a contact, the source region of the third p-channel MOS transistor being connected to a power supply line via a silicide layer, the gate of the fourth n-channel MOS transistor and the gate of the fourth p-channel MOS transistor being connected to each other and being connected to the first output terminal, the drain region of the fourth n-channel MOS transistor and the drain region of the fourth p-channel MOS transistor being connected to each other to form a second output terminal, the source region of the fourth n-channel MOS transistor and the source region of the fourth p-channel MOS transistor being respectively connected to the reference power supply line and the power supply line, the NOR decoder further including a first address signal line, a second address signal line, and a third address signal line, the gate of the first n-channel MOS transistor and the gate of the first p-channel MOS transistor, which are connected to each other, being connected to the first address signal line, the gate of the second n-channel MOS transistor and the gate of the second p-channel MOS transistor, which are connected to each other, being connected to the second address signal line, the gate of the third n-channel MOS transistor and the gate of the third p-channel MOS transistor, which are connected to each other, being connected to the third address signal line, the power supply line, the reference power supply line, the first address signal line, the second address signal line, and the third address signal line being arranged to extend in a second direction perpendicular to the first direction.

21. The semiconductor device according to claim 20, wherein the eight transistors are arranged in a line in an order of one of the fourth p-channel MOS transistor and the fourth n-channel MOS transistor, the other of the fourth re-channel MOS transistor and the fourth p-channel MOS transistor, the third re-channel MOS transistor, the second n-channel MOS transistor, the first n-channel MOS transistor, the first p-channel MOS transistor, the second p-channel MOS transistor, and the third p-channel MOS transistor.

22. The semiconductor device according to claim 20, wherein the source regions of the fourth n-channel MOS transistor and the fourth p-channel MOS transistor being located closer to the substrate than the silicon pillars of the fourth n-channel MOS transistor and the fourth p-channel MOS transistor, and the eight transistors are arranged in a line in an order of the fourth p-channel MOS transistor, the fourth n-channel MOS transistor, the third n-channel MOS transistor, the second n-channel MOS transistor, the first n-channel MOS transistor, the first p-channel MOS transistor, the second p-channel MOS transistor, and the third p-channel MOS transistor.

23. The semiconductor device according to claim 20, wherein at least the gates of the first n-channel MOS transistor and the first p-channel MOS transistor, the gates of the second n-channel MOS transistor and the second p-channel MOS transistor, or the gates of the third n-channel MOS transistor and the third p-channel MOS transistor are connected to the corresponding one of the first to third address signal lines, each of which is formed of a line of a second metal wiring layer arranged to extend in the second direction, at least via a line of a first metal wiring layer arranged to extend in the first direction.

24. A semiconductor device comprising:

a first address signal lines, the number of which is equal to a;

b second address signal lines, the number of which is equal to b;

c third address signal lines, the number of which is equal to c; and a×b×c pairs of NOR decoders and inverters, the number of which is given by a×b×c, each of the a×b×c pairs of NOR decoders and inverters including eight transistors, each having a source, a drain, and a gate arranged in a layered manner in a direction perpendicular to a substrate, the eight transistors being arranged on the substrate in a line in a first direction, each of the eight transistors including a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located, the eight transistors including a first p-channel MOS transistor, a second p-channel MOS transistor, a third p-channel MOS transistor, a fourth p-channel MOS transistor, a first n-channel MOS transistor, a second n-channel MOS transistor, a third n-channel MOS transistor, and a fourth n-channel MOS transistor, the NOR decoder in each of the a×b×c pairs including the first n-channel MOS transistor, the second n-channel MOS transistor, the third n-channel MOS transistor, the first p-channel MOS transistor, the second p-channel MOS transistor, and the third p-channel MOS transistor, the inverter in each of the a×b×c pairs including the fourth n-channel MOS transistor, and the fourth n-channel MOS transistor, the gate of the first n-channel MOS transistor and the gate of the first p-channel MOS transistor being connected to each other, the gate of the second n-channel MOS transistor and the gate of the second p-channel MOS transistor being connected to each other, the gate of the third n-channel MOS transistor and the gate of the third p-channel MOS transistor being connected to each other, the source regions of the first n-channel MOS transistor, the second n-channel MOS transistor, the third n-channel MOS transistor, and the first p-channel MOS transistor being located closer to the substrate than the silicon pillars of the first n-channel MOS transistor, the second n-channel MOS transistor, the third n-channel MOS transistor, and the first p-channel MOS transistor, the drain region of the second p-channel MOS transistor and the source region of the third p-channel MOS transistor being located closer to the substrate than the silicon pillars of the second p-channel MOS transistor and the third p-channel MOS transistor, the drain regions of the first n-channel MOS transistor, the second n-channel MOS transistor, the third n-channel MOS transistor, and the first p-channel MOS transistor being connected to one another via contacts to form a first output terminal, the source regions of the first n-channel MOS transistor, the second n-channel MOS transistor, and the third n-channel MOS transistor being connected to a reference power supply line via silicide regions, the source region of the first p-channel MOS transistor being connected to the drain region of the second p-channel MOS transistor via a silicide layer, the source region of the second p-channel MOS transistor being connected to the drain region of the third p-channel MOS transistor via a contact, the source region of the third p-channel MOS transistor being connected to a power supply line via a silicide layer, the gate of the fourth n-channel MOS transistor and the gate of the fourth p-channel MOS transistor being connected to each other and being connected to the first output terminal, the drain region of the fourth n-channel MOS transistor and the drain region of the fourth p-channel MOS transistor being connected to each other to form a second output terminal, the source region of the fourth n-channel MOS transistor and the source region of the fourth p-channel MOS transistor being respectively connected to the reference power supply line and the power supply line, each of the a×b×c pairs of NOR decoders and inverters being configured such that the gate of the first n-channel MOS transistor and the gate of the first p-channel MOS transistor, which are connected to each other, are connected to any one of the a first address signal lines, the gate of the second n-channel MOS transistor and the gate of the second p-channel MOS transistor, which are connected to each other, are connected to any one of the b second address signal lines, and the gate of the third n-channel MOS transistor and the gate of the third p-channel MOS transistor, which are connected to each other, are connected to any one of the c third address signal lines, the power supply line, the reference power supply line, the a first address signal lines, the b second address signal lines, and the c third address signal lines being arranged to extend in a second direction perpendicular to the first direction.

25. The semiconductor device according to claim 24, wherein the eight transistors are arranged in a line in an order of one of the fourth p-channel MOS transistor and the fourth n-channel MOS transistor, the other of the fourth re-channel MOS transistor and the fourth p-channel MOS transistor, the third re-channel MOS transistor, the second n-channel MOS transistor, the first n-channel MOS transistor, the first p-channel MOS transistor, the second p-channel MOS transistor, and the third p-channel MOS transistor.

26. The semiconductor device according to claim 25, wherein the source regions of the fourth n-channel MOS transistor and the fourth p-channel MOS transistor are located closer to the substrate than the silicon pillars of the fourth n-channel MOS transistor and the fourth p-channel MOS transistor, and the eight transistors are arranged in a line in an order of the fourth p-channel MOS transistor, the fourth n-channel MOS transistor, the third n-channel MOS transistor, the second n-channel MOS transistor, the first n-channel MOS transistor, the first p-channel MOS transistor, the second p-channel MOS transistor, and the third p-channel MOS transistor.

27. The semiconductor device according to claim 26, wherein the source regions of the first n-channel MOS transistors, the second n-channel MOS transistors, the third n-channel MOS transistors, and the fourth n-channel MOS transistors in the a×b×c NOR decoders and the a×b×c inverters are connected in common via a silicide layer.

28. The semiconductor device according to claim 24, wherein in each of the a×b×c pairs of NOR decoders and inverters, at least the gates of the first n-channel MOS transistor and the first p-channel MOS transistor, the gates of the second n-channel MOS transistor and the second p-channel MOS transistor, or the gates of the third n-channel MOS transistor and the third p-channel MOS transistor are connected to the corresponding one of the first to third address signal lines, each of which is formed of a line of a second metal wiring layer arranged to extend in the second direction, at least via a line of a first metal wiring layer arranged to extend in the first direction.

* * * * *

UNITED STATES PATENT AND TRADEMARK OFFICE
CERTIFICATE OF CORRECTION

PATENT NO. : 9,641,179 B2
APPLICATION NO. : 15/214880
DATED : May 2, 2017
INVENTOR(S) : Fujio Masuoka et al.

It is certified that error appears in the above-identified patent and that said Letters Patent is hereby corrected as shown below:

On the Title Page

Left Column, item (72), after "Asano," replace "Musashino" with --Tokyo--.

In the Claims

In Column 59, Claim 18, Line 22, before "MOS transistor and" replace "re-channel" with --n-channel--.

In Column 59, Claim 18, Line 23, before "MOS transistor, the" replace "re-channel" with --n-channel--.

In Column 61, Claim 21, Line 22, before "MOS transistor and" replace "re-channel" with --n-channel--.

In Column 61, Claim 21, Line 23, before "MOS transistor, the" replace "re-channel" with --n-channel--.

In Column 63, Claim 25, Line 39, before "MOS transistor and" replace "re-channel" with --n-channel--.

In Column 64, Claim 25, Line 1, before "MOS transistor, the" replace "re-channel" with --n-channel--.

Signed and Sealed this
Ninth Day of October, 2018

Andrei Iancu
*Director of the United States Patent and Trademark Office*